US012740232B2

(12) United States Patent
Okamoto et al.

(10) Patent No.: US 12,740,232 B2
(45) Date of Patent: Sep. 15, 2026

(54) DISPLAY DEVICE

(71) Applicant: SEMICONDUCTOR ENERGY LABORATORY CO., LTD., Atsugi (JP)

(72) Inventors: Yuki Okamoto, Ebina (JP); Susumu Kawashima, Atsugi (JP); Tatsuya Onuki, Atsugi (JP); Hidetomo Kobayashi, Isehara (JP); Munehiro Kozuma, Atsugi (JP); Takanori Matsuzaki, Atsugi (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 290 days.

(21) Appl. No.: 18/555,286

(22) PCT Filed: Apr. 1, 2022

(86) PCT No.: PCT/IB2022/053053

§ 371 (c)(1),
(2) Date: Oct. 13, 2023

(87) PCT Pub. No.: WO2022/219447

PCT Pub. Date: Oct. 20, 2022

(65) Prior Publication Data

US 2024/0196653 A1 Jun. 13, 2024

(30) Foreign Application Priority Data

Apr. 16, 2021 (JP) ................................ 2021-069693
May 13, 2021 (JP) ................................ 2021-081559
(Continued)

(51) Int. Cl.
*H10K 59/131* (2023.01)
*G09G 3/3233* (2016.01)
(Continued)

(52) U.S. Cl.
CPC ........... *H10K 50/19* (2023.02); *G09G 3/3233* (2013.01); *H05B 33/06* (2013.01); *H05B 33/14* (2013.01);
(Continued)

(58) Field of Classification Search
CPC ...... G09G 3/20; G09G 3/3233; G09G 3/3241; G09G 2330/021; H05B 33/06;
(Continued)

(56) References Cited

U.S. PATENT DOCUMENTS 7,399,991 B2 7/2008 Seo et al.
7,663,149 B2 2/2010 Seo et al.
(Continued)

FOREIGN PATENT DOCUMENTS

CN 104134680 A 11/2014
CN 107358916 A 11/2017
(Continued)

OTHER PUBLICATIONS

K.-H. Seol, Y. I. Kim, S. Park and H. Nam, "Simultaneous Emission AC-OLED Pixel Circuit for Extended Lifetime of OLED Display," in IEEE Journal of the Electron Devices Society, vol. 6, pp. 835-840, 2018, doi: 10.1109/JEDS.2018.2859271 https://ieeexplore.ieee.org/document/8418746. (Year: 2018).*
(Continued)

*Primary Examiner* — Zandra V Smith
*Assistant Examiner* — Douglas Yap
(74) *Attorney, Agent, or Firm* — Fish & Richardson P.C.

(57) ABSTRACT

A novel display device is provided. The display device includes a first layer including a driver circuit, a second layer including a plurality of pixel circuits, and a third layer including a plurality of light-emitting elements; the second layer is provided over the first layer; the third layer is provided over the second layer; and a conductive layer is
(Continued)

provided between the driver circuit and the plurality of pixel circuits. The driver circuit has a function of controlling operations of the plurality of pixel circuits. One of the plurality of pixel circuits is electrically connected to one of the plurality of light-emitting elements. The pixel circuit has a function of controlling emission luminance of the light-emitting element.

16 Claims, 86 Drawing Sheets

(30) Foreign Application Priority Data

| | | |
|---|---|---|
| Jun. 17, 2021 | (JP) | 2021-100982 |
| Aug. 17, 2021 | (JP) | 2021-132894 |
| Dec. 22, 2021 | (JP) | 2021-208061 |
| Jan. 7, 2022 | (JP) | 2022-001844 |

(51) Int. Cl.

| | |
|---|---|
| ***H05B 33/06*** | (2006.01) |
| ***H05B 33/14*** | (2006.01) |
| ***H10K 50/00*** | (2023.01) |
| ***H10K 50/19*** | (2023.01) |
| ***H10K 59/00*** | (2023.01) |
| ***H10K 59/121*** | (2023.01) |

(52) U.S. Cl.
CPC ............ *H10K 50/00* (2023.02); *H10K 59/00* (2023.02); *H10K 59/1213* (2023.02); *H10K 59/131* (2023.02); *G09G 2300/0852* (2013.01); *G09G 2330/021* (2013.01)

(58) Field of Classification Search
CPC .. H10K 59/131; H10K 59/1213; H10K 50/19; H10K 59/31
See application file for complete search history.

(56) References Cited

U.S. PATENT DOCUMENTS

| | | | | |
|---|---|---|---|---|
| 8,957,889 | B2 | 2/2015 | Miyake | |
| 9,305,988 | B2 | 4/2016 | Miyake | |
| 9,666,655 | B2 | 5/2017 | Miyake | |
| 9,853,068 | B2 | 12/2017 | Miyake | |
| 10,083,991 | B2 | 9/2018 | Toyotaka et al. | |
| 10,417,967 | B2 | 9/2019 | Zhu et al. | |
| 10,453,873 | B2 | 10/2019 | Miyake | |
| 10,777,136 | B2 | 9/2020 | Shibusawa | |
| 10,784,285 | B2 | 9/2020 | Toyotaka et al. | |
| 11,069,718 | B2 | 7/2021 | Toyotaka et al. | |
| 11,417,273 | B2 | 8/2022 | Toyotaka et al. | |
| 11,501,695 | B2 | 11/2022 | Yamazaki et al. | |
| 11,664,391 | B2 | 5/2023 | Miyake | |
| 11,791,344 | B2 | 10/2023 | Toyotaka et al. | |
| 11,869,417 | B2 | 1/2024 | Yamazaki et al. | |
| 12,165,575 | B2 | 12/2024 | Yamazaki et al. | |
| 12,396,263 | B2 | 8/2025 | Toyotaka et al. | |
| 2012/0133683 | A1 | 5/2012 | Goden et al. | |
| 2013/0063413 | A1 | 3/2013 | Miyake | |
| 2014/0327664 | A1 | 11/2014 | Kanda et al. | |
| 2015/0171156 | A1* | 6/2015 | Miyake | G09G 3/3233 257/43 |
| 2017/0278894 | A1* | 9/2017 | Sato | H10K 59/35 |
| 2018/0032189 | A1* | 2/2018 | Lee | G09G 3/3233 |
| 2019/0197950 | A1 | 6/2019 | Shibusawa | |
| 2020/0320930 | A1 | 10/2020 | Toyotaka et al. | |
| 2022/0284860 | A1* | 9/2022 | Lin | G09G 3/3266 |
| 2023/0261010 | A1 | 8/2023 | Miyake | |
| 2025/0311433 | A1 | 10/2025 | Toyotaka et al. | |

FOREIGN PATENT DOCUMENTS

| | | | | |
|---|---|---|---|---|
| CN | 111406280 | A | 7/2020 | |
| JP | 2002-324673 | A | 11/2002 | |
| JP | 2012-113980 | A | 6/2012 | |
| JP | 2013-076994 | A | 4/2013 | |
| JP | 2014-219440 | A | 11/2014 | |
| JP | 2015-132816 | A | 7/2015 | |
| JP | 2016-212418 | A | 12/2016 | |
| JP | 2018-081293 | A | 5/2018 | |
| JP | 2019-113728 | A | 7/2019 | |
| KR | 2014-0130630 | A | 11/2014 | |
| KR | 2020-0096237 | A | 8/2020 | |
| WO | WO-2017/115210 | | 7/2017 | |
| WO | WO-2019008482 | A1 * | 1/2019 | H04N 23/60 |
| WO | WO-2019/111137 | | 6/2019 | |
| WO | WO-2020/053701 | | 3/2020 | |

OTHER PUBLICATIONS

English translation of Fukai (WO-2019/008482) (Year: 2019).*
International Search Report (Application No. PCT/IB2022/053053), dated Jul. 5, 2022.
Written Opinion (Application No. PCT/IB2022/053053), dated Jul. 5, 2022.

* cited by examiner

FIG. 57A1
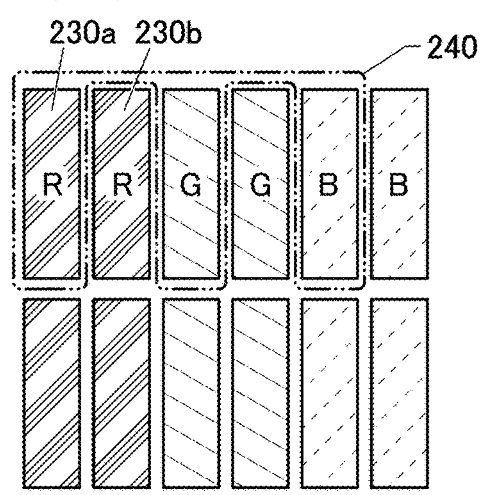
FIG. 57A2
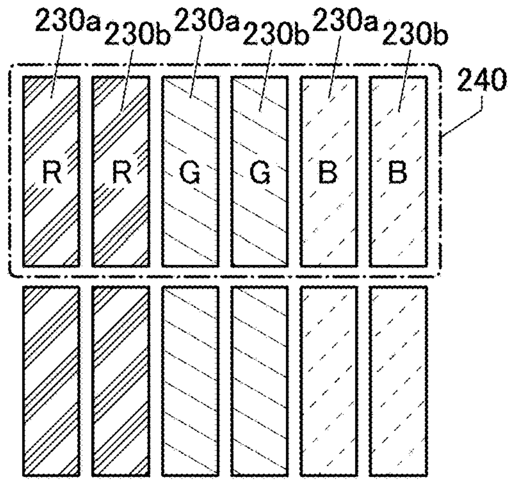
FIG. 57B
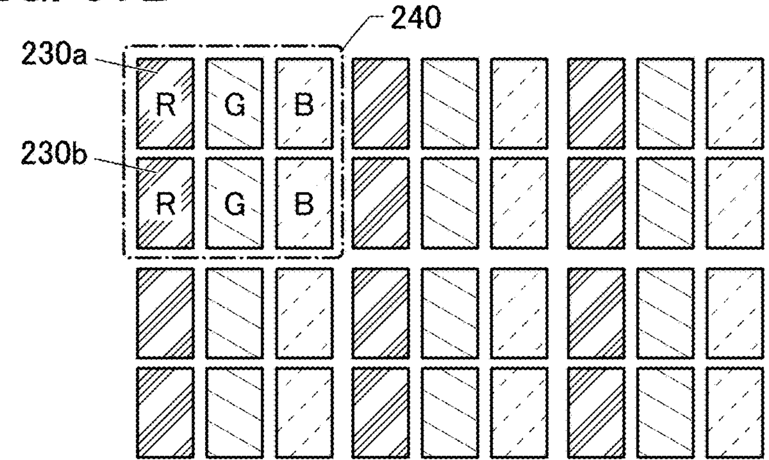
FIG. 57C
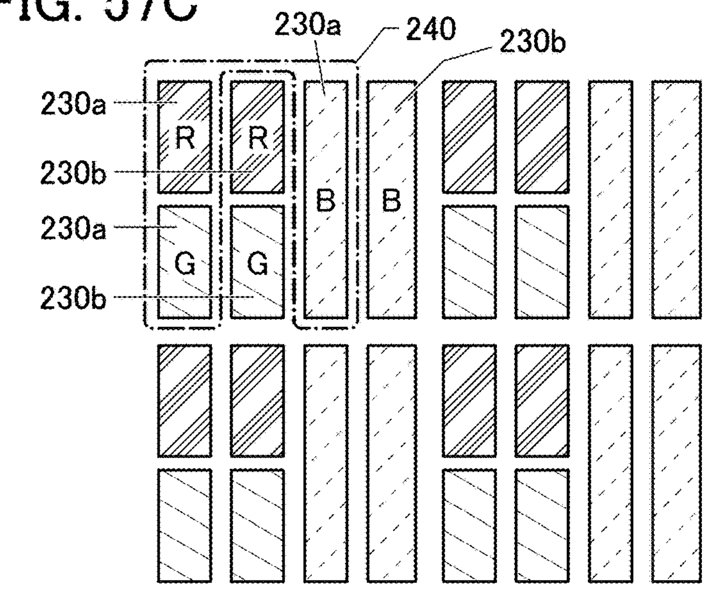

FIG. 59A
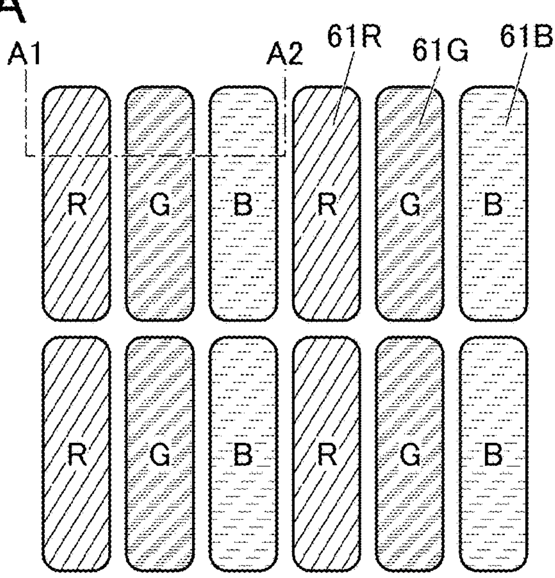
FIG. 59B
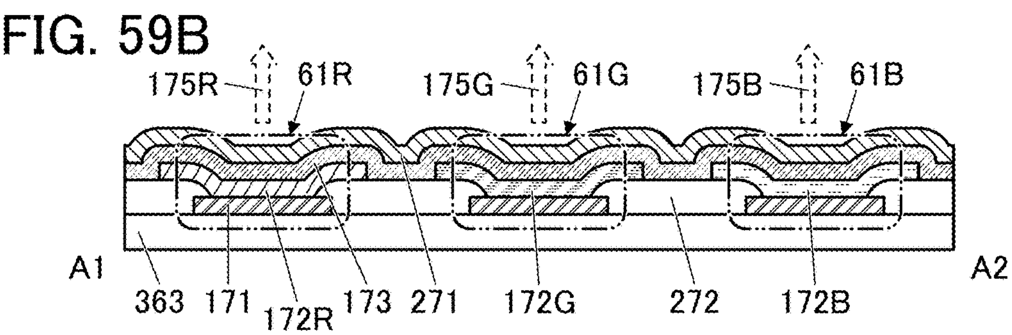
FIG. 59C
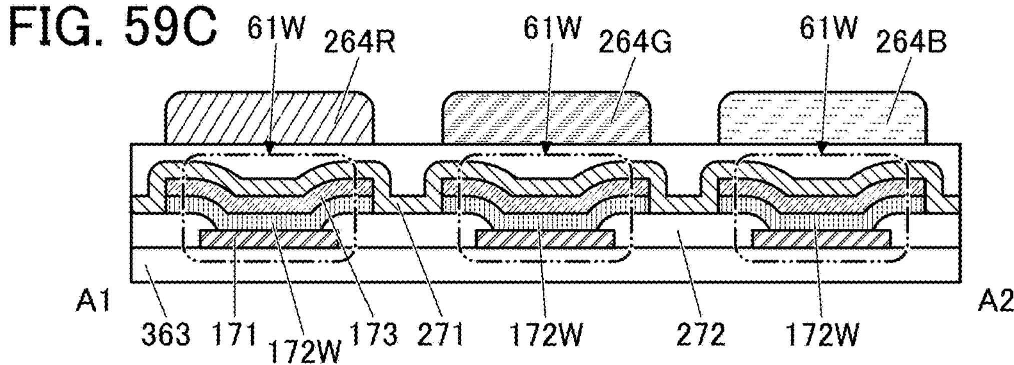
FIG. 59D
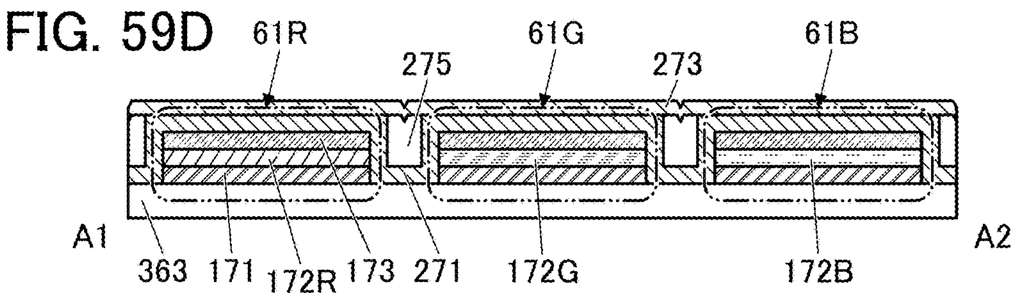

FIG. 60A
61R 61G 61B
273 275
A1 A2
363 171 172R 173 271 172G 172B
FIG. 60B
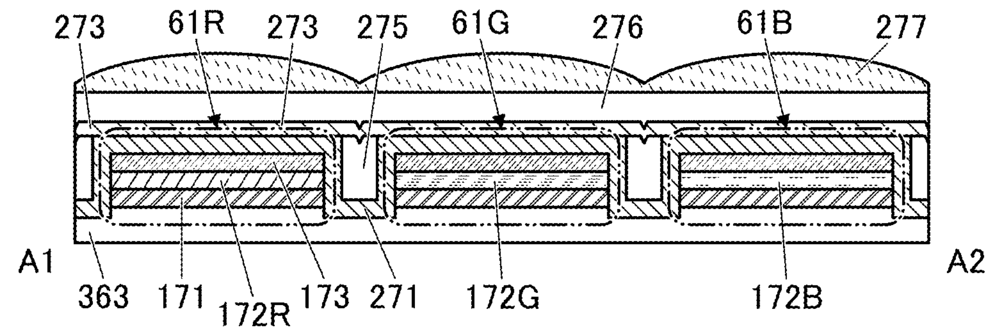
FIG. 60C
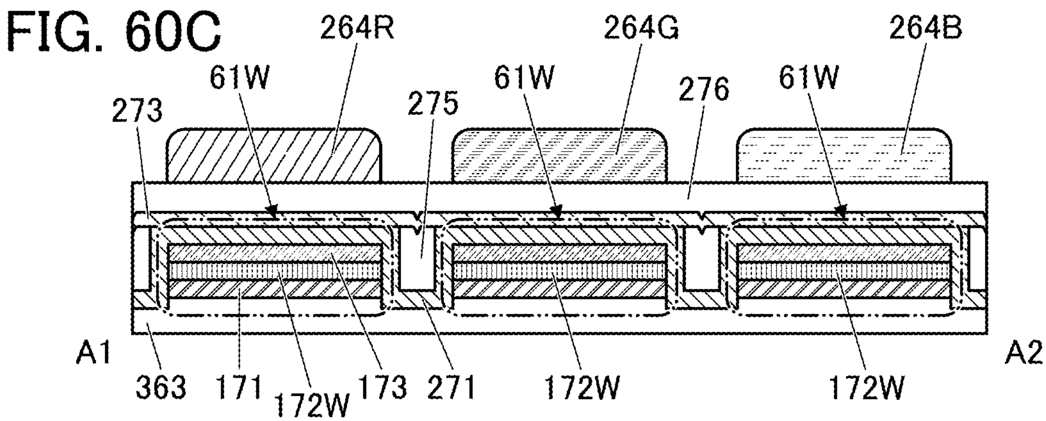
FIG. 60D
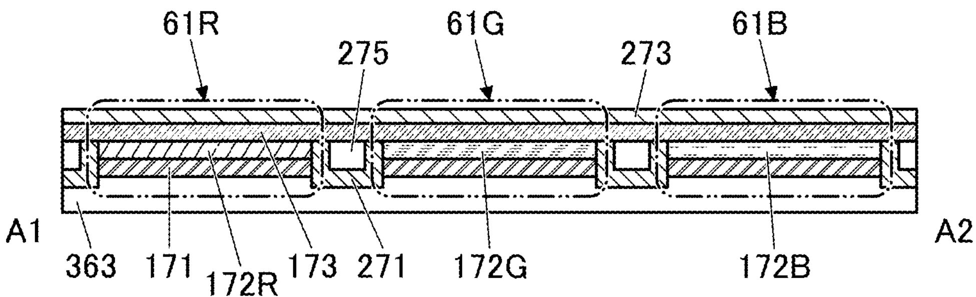

60
50
40
415
61B
273
271
420
61G
419
363
61R
275
256
255
243
265
246
264
274
326
332
701
263
252
262
251
261
271
301A
245
241
329
320
333
701
310A

FIG. 80A
Intermediate state
New crystalline phase
| Amorphous | Crystalline | Crystal |
| --- | --- | --- |
| ▪completely amorphous | ▪CAAC<br>▪nc<br>▪CAC<br>excluding single crystal and poly crystal | ▪single crystal<br>▪poly crystal |
FIG. 80B
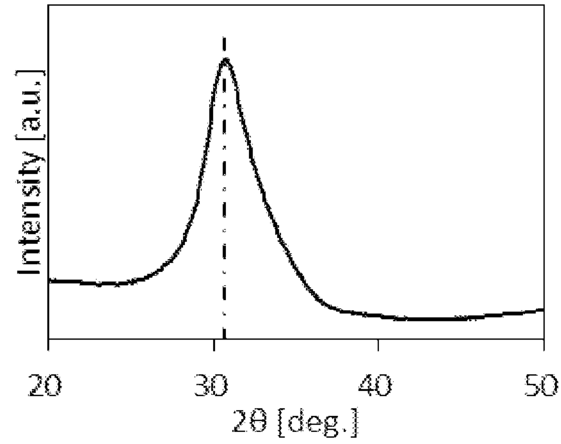
FIG. 80C
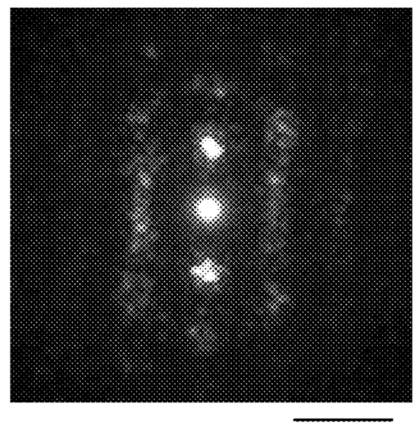

DISPLAY DEVICE

CROSS REFERENCE TO RELATED APPLICATIONS

This application is a U.S. National Phase Application under 35 U.S.C. § 371 of International Application PCT/IB2022/053053, filed on Apr. 1, 2022, which is incorporated by reference and claims the benefit of foreign priority applications filed in Japan on Apr. 16, 2021, as Application No. 2021-069693, on May 13, 2021, as Application No. 2021-081559, on Jun. 17, 2021, as Application No. 2021-100982, on Aug. 17, 2021, as Application No. 2021-132894, on Dec. 22, 2021, as Application No. 2021-208061, and on Jan. 7, 2022, as Application No. 2022-001844.

TECHNICAL FIELD

One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof.

BACKGROUND ART

In recent years, electronic devices including display devices, such as smartphones and tablet terminals, have been widespread. Typical examples of the display devices include a liquid crystal display device, a light-emitting apparatus including a light-emitting element such as an organic EL (Electro Luminescence) element or a light-emitting diode (LED), and electronic paper performing display by an electrophoretic method or the like.

For example, the basic structure of an organic EL element is a structure in which a layer containing a light-emitting organic compound is provided between a pair of electrodes. By applying voltage to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

Patent Document 2 discloses a circuit structure of a pixel circuit for controlling the emission luminance of an organic EL element, in which a threshold value variation between transistors is corrected in each pixel to improve the display quality of a display device.

REFERENCES

Patent Documents

[Patent Document 1] Japanese Published Patent Application No. 2002-324673

[Patent Document 2] Japanese Published Patent Application No. 2015-132816

SUMMARY OF THE INVENTION

Problems to be Solved by the Invention

Meanwhile, a high voltage is sometimes needed for driving an organic EL element, depending on its structure. Driving such an organic EL element requires a power source for generating a high voltage.

An object of one embodiment of the present invention is to provide a downsized display device. Another object of one embodiment of the present invention is to provide a display device in which high color reproducibility is achieved. Another object of one embodiment of the present invention is to provide a high-definition display device. Another object of one embodiment of the present invention is to provide a highly reliable display device. Another object of one embodiment of the present invention is to provide a display device with reduced power consumption. Another object of one embodiment of the present invention is to provide a novel display device.

Note that the description of these objects does not preclude the existence of other objects. One embodiment of the present invention does not have to achieve all these objects. Objects other than these can be derived from the description of the specification, the drawings, the claims, and the like.

Means for Solving the Problems (1) One embodiment of the present invention is a semiconductor device including first and second transistors, first to fifth switches, first to third capacitors, and a display element; the first transistor has a back gate; a gate of the first transistor is electrically connected to the first switch; the second switch and the first capacitor are provided between the gate and a source of the first transistor; the back gate of the first transistor is electrically connected to the third switch; the second capacitor is provided between the back gate and the source of the first transistor; the source of the first transistor is electrically connected to the fourth switch and a drain of the second transistor; a gate of the second transistor is electrically connected to the fifth switch; the third capacitor is provided between the gate and a source of the second transistor; and the source of the second transistor is electrically connected to one terminal of the display element.

In (1), the first switch may have a function of selecting whether to establish electrical continuity between a first wiring and the gate of the first transistor. The second switch may have a function of selecting whether to establish electrical continuity between the gate and the source of the first transistor. The third switch may have a function of selecting whether to establish electrical continuity between a second wiring and the back gate of the first transistor. The fourth switch may have a function of selecting whether to establish electrical continuity between a third wiring and the source of the first transistor. The fifth switch may have a function of selecting whether to establish electrical continuity between a fourth wiring and the gate of the second transistor.

In (1), transistors can be used as the first to fifth switches. The fourth switch and the fifth switch may be p-channel transistors. The fourth switch and the fifth switch may be transistors each containing silicon in a semiconductor layer where a channel is formed.

(2) Another embodiment of the present invention is a semiconductor device including first and second transistors, first to fifth switches, first to third capacitors, a first display element, and a second display element; the first transistor has a back gate; a gate of the first transistor is electrically connected to the first switch; the second switch and the first capacitor are provided between the gate and a source of the first transistor; the back gate of the first transistor is electrically connected to the third switch; the second capacitor is provided between the back gate and the source of the first transistor; the source of the first transistor is electrically connected to the fourth switch and a drain of the second transistor; a gate of the second transistor is electrically connected to the fifth switch; the third capacitor is provided between the gate and a source of the second transistor; and the source of the second transistor is electrically connected to one terminal of the first display element and one terminal of the second display element.

In (2), the first switch may have a function of selecting whether to establish electrical continuity between a first wiring and the gate of the first transistor. The second switch may have a function of selecting whether to establish electrical continuity between the gate and the source of the first transistor. The third switch may have a function of selecting whether to establish electrical continuity between a second wiring and the back gate of the first transistor. The fourth switch may have a function of selecting whether to establish electrical continuity between a third wiring and the source of the first transistor. The fifth switch may have a function of selecting whether to establish electrical continuity between a fourth wiring and the gate of the second transistor.

In (2), the first capacitor may have a function of retaining a potential difference between the gate and the source of the first transistor. The second capacitor may have a function of retaining a potential difference between the back gate and the source of the first transistor. The third capacitor may have a function of retaining a potential difference between the gate and the source of the second transistor.

In (2), a drain of the first transistor may be electrically connected to a fifth wiring. For example, the other terminal of the first display element may be electrically connected to a sixth wiring, and the other terminal of the second display element may be electrically connected to a seventh wiring.

A display device may be formed by arranging the semiconductor devices each of which is described in (2) in a matrix. For example, the first display elements are arranged in odd-numbered rows, and the second display elements are arranged in even-numbered rows. The display device having a function of performing interlace driving can be achieved by making the first display elements emit light in an odd-numbered frame period and making the second display elements emit light in an even-numbered frame period.

(3) Another embodiment of the present invention is a semiconductor device including first to eighth transistors, first to third capacitors, and a display element; a gate of the first transistor and a gate of the sixth transistor are electrically connected to a first wiring; a gate of the third transistor and a gate of the fourth transistor are electrically connected to a second wiring; a gate of the seventh transistor is electrically connected to a third wiring; a gate of the eighth transistor is electrically connected to a fourth wiring; one of a source and a drain of the first transistor is electrically connected to a fifth wiring; the other of the source and the drain of the first transistor is electrically connected to a gate of the second transistor, one of a source and a drain of the third transistor, and one terminal of the first capacitor; one of a source and a drain of the second transistor is electrically connected to a sixth wiring; one of a source and a drain of the fourth transistor is electrically connected to a seventh wiring; the other of the source and the drain of the fourth transistor is electrically connected to one terminal of the second capacitor; the other of the source and the drain of the second transistor is electrically connected to the other of the source and the drain of the third transistor, the other terminal of the first capacitor, the other terminal of the second capacitor, one of a source and a drain of the fifth transistor, and one of a source and a drain of the sixth transistor; one of a source and a drain of the seventh transistor is electrically connected to the seventh wiring; a gate of the fifth transistor is electrically connected to the other of the source and the drain of the seventh transistor, one of a source and a drain of the eighth transistor, and one terminal of the third capacitor; the other of the source and the drain of the sixth transistor and the other of the source and the drain of the eighth transistor are electrically connected to an eighth wiring; the other of the source and the drain of the fifth transistor is electrically connected to the other terminal of the third capacitor and one terminal of the display element; the other terminal of the display element is electrically connected to a ninth wiring; the second transistor has a back gate; and the back gate is electrically connected to the other of the source and the drain of the fourth transistor and the one terminal of the second capacitor.

In (3), a transistor containing an oxide semiconductor in a semiconductor where a channel is formed may be used as the second transistor. The second transistor includes one of the source and the drain, the other of the source and the drain, the gate, and the back gate. A gate potential and a back gate potential of the second transistor can have a function of being changed in accordance with a potential change of the other of the source and the drain.

In (3), a transistor containing an oxide semiconductor in a semiconductor where a channel is formed may be used as the fifth transistor. The fifth transistor includes one of the source and the drain, the other of the source and the drain, and the gate. A gate potential of the fifth transistor can have a function of being changed in accordance with a potential change of the other of the source and the drain.

(4) Another embodiment of the present invention is a semiconductor device including first and second transistors, first to sixth switches, first to third capacitors, and a display element; the first transistor has a back gate; a gate of the first transistor is electrically connected to the first switch; the second switch and the first capacitor are provided between the gate and a source of the first transistor; the back gate of the first transistor is electrically connected to the third switch; the second capacitor is provided between the back gate and the source of the first transistor; the source of the first transistor is electrically connected to the fourth switch and a drain of the second transistor; a gate of the second transistor is electrically connected to the fifth switch and the sixth switch; the third capacitor is provided between the gate and a source of the second transistor; and the source of the second transistor is electrically connected to the display element.

In (4), the first switch may have a function of selecting whether to establish electrical continuity between a first wiring and the gate of the first transistor, the second switch may have a function of selecting whether to establish electrical continuity between the gate and the source of the first transistor, the third switch may have a function of selecting whether to establish electrical continuity between a second wiring and the back gate of the first transistor, the fourth switch may have a function of selecting whether to establish electrical continuity between a third wiring and the source of the first transistor, the fifth switch may have a function of selecting whether to establish electrical continuity between the second wiring and the gate of the second transistor, and the sixth switch may have a function of selecting whether to establish electrical continuity between the third wiring and the gate of the second transistor.

In (4), the first capacitor may have a function of retaining a potential difference between the gate and the source of the first transistor, the second capacitor may have a function of retaining a potential difference between the back gate and the source of the first transistor, and the third capacitor may have a function of retaining a potential difference between the gate and the source of the second transistor.

In any of (1), (2), (3), and (4), the oxide semiconductor preferably contains at least one of indium and zinc. As the display element, an organic EL element with a single structure or an organic EL element with a tandem structure may be used.

(5) Another embodiment of the present invention is a display device including a first layer including a driver circuit, a second layer including a plurality of pixel circuits, and a third layer including a plurality of light-emitting elements; the second layer is provided over the first layer; the third layer is provided over the second layer; the driver circuit has a function of controlling operations of the plurality of pixel circuits; one of the plurality of pixel circuits is electrically connected to one of the plurality of light-emitting elements; the pixel circuit has a function of controlling emission luminance of the light-emitting element; and a conductive layer is provided between the driver circuit and the plurality of pixel circuits.

In (5), the conductive layer and the plurality of pixel circuits preferably have an overlapping region. The conductive layer may have a net-like shape.

In (5), the driver circuit may include a Si transistor, for example. The pixel circuits may each include an OS transistor, for example. The light-emitting elements may each be an organic EL element, for example. The light-emitting elements may each be a light-emitting element with a tandem structure.

Effect of the Invention

According to one embodiment of the present invention, a downsized display device can be provided. Alternatively, a display device in which high color reproducibility is achieved can be provided. Alternatively, a high-definition display device can be provided. Alternatively, a highly reliable display device can be provided. According to another embodiment of the present invention, a display device with reduced power consumption can be provided. Alternatively, a novel display device can be provided.

Note that the description of these effects does not preclude the existence of other effects. One embodiment of the present invention does not need to have all of these effects. Effects other than these can be derived from the description of the specification, the drawings, the claims, and the like.

BRIEF DESCRIPTION OF THE DRAWINGS

FIG. 55B1 to FIG. 55B7 are diagrams illustrating structure examples of pixels.

FIG. 57A1, FIG. 57A2, FIG. 57B, and FIG. 57C are diagrams illustrating structure examples of pixels.

FIG. 59A to FIG. 59D are diagrams illustrating structure examples of light-emitting elements.

FIG. 60A to FIG. 60D are diagrams illustrating structure examples of light-emitting elements.

FIG. 80A is a diagram showing classification of crystal structures. FIG. 80B is a diagram showing an XRD spectrum of a CAAC-IGZO film. FIG. 80C is a diagram showing a nanobeam electron diffraction pattern of the CAAC-IGZO film.

FIG. 82A to FIG. 82F are diagrams illustrating examples of electronic devices.

MODE FOR CARRYING OUT THE INVENTION

Figure 1:
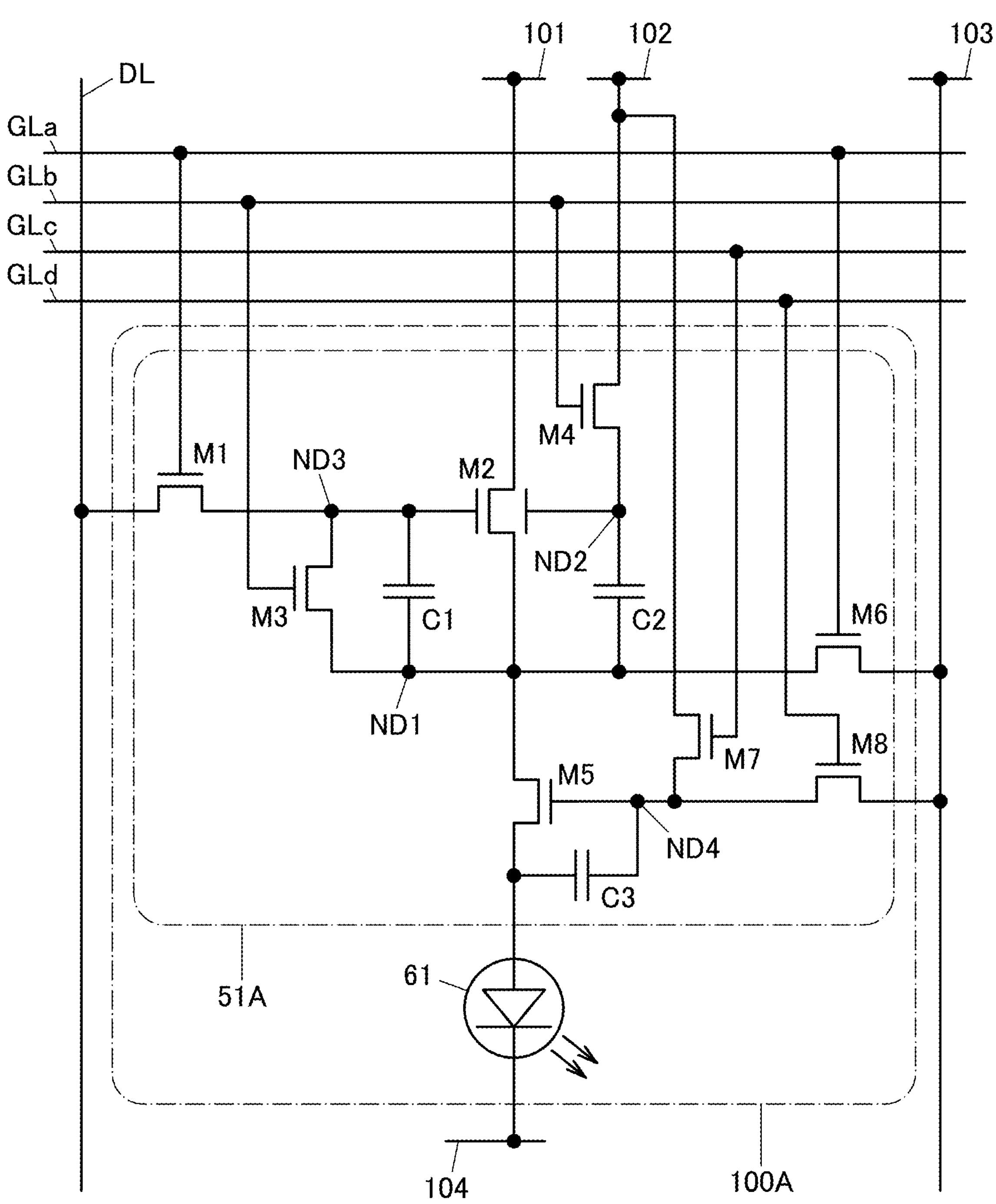
FIG. 1 is a diagram illustrating a semiconductor device.

Hereinafter, embodiments will be described with reference to the drawings. Note that the embodiments can be implemented in many different modes, and it is readily understood by those skilled in the art that modes and details thereof can be changed in various ways without departing from the spirit and scope thereof. Thus, the present invention should not be interpreted as being limited to the following description of the embodiments.

In this specification and the like, a semiconductor device refers to a device that utilizes semiconductor characteristics, and means a circuit including a semiconductor element (e.g., a transistor, a diode, or a photodiode), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting apparatus, a lighting device, an electronic device, and the like themselves may be semiconductor devices and may each include a semiconductor device.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, e.g., a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y.

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; a control circuit; or the like) can be connected between X and Y. For instance, even if another circuit is interposed between X and Y, X and Y are regarded as being functionally connected when a signal output from X is transmitted to Y.

Note that an explicit description that X and Y are electrically connected includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; conversely, the term "capacitance" can be replaced with the terms "capacitor", "parasitic capacitance", "gate capacitance", and the like. The term "a pair of electrodes" of a "capacitor" can be replaced with "a pair of conductors", "a pair of conductive regions", "a pair of regions", and the like. Note that the electrostatic capacitance value can be higher than or equal to 0.05 fF and lower than or equal to 10 pF, for example. As another example, the electrostatic capacitance value may be higher than or equal to 1 pF and lower than or equal to 10 μF.

In this specification and the like, a transistor includes three terminals called a gate, a source, and a drain. The gate is a control terminal for controlling the amount of current flowing between the source and the drain. Two terminals functioning as the source and the drain are input/output terminals of the transistor. One of the two input/output terminals serves as the source and the other serves as the drain depending on the conductivity type (n-channel type or p-channel type) of the transistor and the levels of potentials supplied to the three terminals of the transistor. Thus, the terms "source" and "drain" can be replaced with each other in this specification and the like. Furthermore, in this specification and the like, expressions "one of a source and a drain" (or a first electrode or a first terminal) and "the other of the source and the drain" (or a second electrode or a second terminal) are used in the description of the connection relationship of a transistor. Depending on the transistor structure, a transistor may include aback gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, a "node" can be referred to as a terminal, a wiring, an electrode, a conductive layer, a conductor, an impurity region, or the like depending on the circuit structure, the device structure, or the like. Furthermore, a terminal, a wiring, or the like can be referred to as a "node".

Ordinal numbers such as "first", "second", and "third" in this specification and the like are used to avoid confusion among components. Thus, the ordinal numbers do not limit the number of components. In addition, the ordinal numbers do not limit the order of components. For example, a "first" component in one embodiment in this specification and the like can be referred to as a "second" component in other embodiments, the scope of claims, or the like. Furthermore, for example, a "first" component in one embodiment in this specification and the like can be omitted in other embodiments, the scope of claims, or the like.

In this specification and the like, terms for describing arrangement, such as "over", "under", "above", and "below" are sometimes used for convenience to describe the positional relationship between components with reference to drawings. The positional relationship between components is changed as appropriate in accordance with a direction in which each component is described. Thus, the positional relationship is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing illustrating these components is rotated by 180°.

The term "over" or "under" does not necessarily mean that a component is placed directly over or directly under and directly in contact with another component. For example, the expression "electrode B over insulating layer A" does not necessarily mean that the electrode B is formed over and in direct contact with the insulating layer A, and does not exclude the case where another component is provided between the insulating layer A and the electrode B.

Furthermore, the term "overlap", for example, in this specification and the like does not limit a state such as the stacking order of components. For example, the expression "electrode B overlapping with insulating layer A" does not necessarily mean the state where the electrode B is formed over the insulating layer A, and does not exclude the state where the electrode B is formed under the insulating layer A and the state where the electrode B is formed on the right side (or the left side) of the insulating layer A.

The terms "adjacent" and "proximity" in this specification and the like do not necessarily mean that a component is directly in contact with another component. For example, the expression "electrode B adjacent to insulating layer A" does not necessarily mean that the electrode B is formed in direct contact with the insulating layer A and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. For another example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. Alternatively, the term "conductor" can be changed into the term "conductive layer" or "conductive film" in some cases. Furthermore, for example, the term "insulating layer" or "insulating film" can be changed into the term "insulator" in some cases. Alternatively, the term "insulator" can be changed into the term "insulating layer" or "insulating film" in some cases.

In addition, in this specification and the like, the term such as "electrode", "wiring", or "terminal" does not limit the function of a component. For example, an "electrode" is used as part of a wiring in some cases, and vice versa. Furthermore, the term "electrode" or "wiring" also includes, for example, the case where a plurality of "electrodes" or "wirings" are formed in an integrated manner. For example, a "terminal" is used as part of a "wiring" or an "electrode" in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region", for example.

In addition, in this specification and the like, the terms such as "wiring", "signal line", and "power supply line" can be interchanged with each other depending on the case or the situation. For example, the term "wiring" can be changed into the term "signal line" in some cases. For another example, the term "wiring" can be changed into the term "power supply line" or the like in some cases. Conversely, the term such as "signal line" or "power supply line" can be changed into the term "wiring" in some cases. The term "power supply line" or the like can be changed into the term "signal line" or the like in some cases. Conversely, the term "signal line" or the like can be changed into the term "power supply line" or the like in some cases. Moreover, the term "potential" that is applied to a wiring can be sometimes changed into the term such as "signal" depending on the case or the situation. Conversely, the term "signal" or the like can be changed into the term "potential" in some cases.

In this specification and the like, a "switch" includes a plurality of terminals and has a function of switching (selecting) electrical continuity and discontinuity between the terminals. For example, in the case where a switch includes two terminals and electrical continuity is established between the two terminals, the switch is in a "conduction state" or an "on state". In the case where electrical continuity is not established between the two terminals, the switch is in a "non-conduction state" or an "off state". Note that switching to one of a conduction state and a non-conduction state or maintaining one of a conduction state and a non-conduction state is sometimes referred to as "controlling a conduction state".

That is, a switch has a function of controlling whether current flows therethrough or not. Alternatively, a switch has a function of selecting and changing a current path. For example, an electrical switch or a mechanical switch can be used. That is, a switch can be any element capable of controlling current, and is not limited to a particular element.

Examples of a switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case where a transistor is used as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch using a MEMS (micro electro mechanical systems) technology. Such a switch includes an electrode that can be moved mechanically, and selects conduction or non-conduction with the movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Note that in this specification and the like, the terms "identical", "the same", "equal", "uniform", and the like (including synonyms thereof) used in describing calculation values and measurement values contain an error of ±20% unless otherwise specified.

Embodiments described in this specification are described with reference to the drawings. Note that the embodiments can be implemented in many different modes, and it will be readily understood by those skilled in the art that the modes and details can be changed in various ways without departing from the spirit and scope thereof. Therefore, the present invention should not be interpreted as being limited to the description in the embodiments. Note that in the structures of the invention in the embodiments, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases. Moreover, some components are omitted in a perspective view, a top view, and the like for easy understanding of the drawings in some cases.

In addition, in the drawings and the like in this specification, the size, the layer thickness, or the region is exaggerated for clarity in some cases. Therefore, embodiments of the present invention are not limited to the size, aspect ratio, and the like illustrated in the drawings. Note that the drawings schematically illustrate ideal examples, and embodiments of the present invention are not limited to shapes, values, and the like illustrated in the drawings. For example, variation in signal, voltage, or current due to noise or variation in signal, voltage, or current due to difference in timing can be included.

In the drawings and the like in this specification, arrows indicating the X direction, the Y direction, and the Z direction are illustrated in some cases. In this specification and the like, the "X direction" is a direction along the X-axis, and the forward direction and the reverse direction are not distinguished in some cases, unless otherwise specified. The same applies to the "Y direction" and the "Z direction". The X direction, the Y direction, and the Z direction are directions intersecting with each other. More specifically, the X direction, the Y direction, and the Z direction are directions orthogonal to each other. In this specification and the like, one of the X direction, the Y direction, and the Z direction is referred to as a "first direction" in some cases. Another one of the directions is referred to as a "second direction" in some cases. The remaining one of the directions is referred to as a "third direction" in some cases.

In this specification and the like, when a plurality of components are denoted by the same reference numerals, and in particular need to be distinguished from each other, an identification sign such as "A", "b", "_1", "[n]", or "[m, n]" is sometimes added to the reference numerals.

Embodiment 1

A semiconductor device 100A of one embodiment of the present invention will be described. The semiconductor device 100A of one embodiment of the present invention can be used as a pixel of a display device, for example.

Structure Example

FIG. 1 illustrates a circuit structure example of the semiconductor device 100A. The semiconductor device 100A includes a pixel circuit 51A and a light-emitting element 61. The pixel circuit 51A includes a transistor M1 to a transistor M8 and a capacitor C1 to a capacitor C3. In this embodiment and the like, unless otherwise specified, the transistor M1 to the transistor M8 are enhancement (normally-off) n-channel field-effect transistors. Thus, the threshold voltage (also referred to as "Vth") is higher than 0 V.

A gate of the transistor M1 is electrically connected to a wiring GLa, one of a source and a drain of the transistor M1 is electrically connected to a wiring DL, and the other of the source and the drain of the transistor M1 is electrically connected to a gate of the transistor M2. The transistor M1 has a function of selecting whether to establish electrical continuity between the gate of the transistor M2 and the wiring DL.

The gate of the transistor M2 is electrically connected to one terminal of the capacitor C1, one of a source and a drain of the transistor M2 is electrically connected to a wiring 101, and the other of the source and the drain of the transistor M2 is electrically connected to the other terminal of the capacitor C1. The transistor M2 has aback gate. The back gate of the transistor M2 is electrically connected to one terminal of the capacitor C2. The other terminal of the capacitor C2 is electrically connected to the other of the source and the drain of the transistor M2.

A gate of the transistor M3 is electrically connected to a wiring GLb, one of a source and a drain of the transistor M3 is electrically connected to the one terminal of the capacitor C1, and the other of the source and the drain of the transistor M3 is electrically connected to the other terminal of the capacitor C1. The transistor M3 has a function of selecting whether to establish electrical continuity between the gate and the source of the transistor M2.

A gate of the transistor M4 is electrically connected to the wiring GLb, one of a source and a drain of the transistor M4 is electrically connected to a wiring 102, and the other of the source and the drain of the transistor M4 is electrically connected to the one terminal of the capacitor C2. The transistor M4 has a function of selecting whether to establish electrical continuity between the wiring 102 and the one terminal of the capacitor C2.

A gate of the transistor M5 is electrically connected to one terminal of the capacitor C3, and one of a source and a drain of the transistor M5 is electrically connected to the other of the source and the drain of the transistor M2. The other of the source and the drain of the transistor M5 is electrically connected to the other terminal of the capacitor C3 and one terminal (e.g., an anode terminal) of the light-emitting element 61. The other terminal (e.g., a cathode terminal) of the light-emitting element 61 is electrically connected to a wiring 104.

A gate of the transistor M6 is electrically connected to the wiring GLa, one of a source and a drain of the transistor M6 is electrically connected to the other of the source and the drain of the transistor M2, and the other of the source and the drain of the transistor M6 is electrically connected to a wiring 103. The transistor M6 has a function of selecting whether to establish electrical continuity between the other of the source and the drain of the transistor M2 and the wiring 103.

A gate of the transistor M7 is electrically connected to a wiring GLc, one of a source and a drain of the transistor M7 is electrically connected to the wiring 102, and the other of the source and the drain of the transistor M7 is electrically connected to the gate of the transistor M5. The transistor M7 has a function of selecting whether to establish electrical continuity between the gate of the transistor M5 and the wiring 102.

A gate of the transistor M8 is electrically connected to a wiring GLd, one of a source and a drain of the transistor M8 is electrically connected to the gate of the transistor M5, and the other of the source and the drain of the transistor M8 is electrically connected to the wiring 103. The transistor M8 has a function of selecting whether to establish electrical continuity between the gate of the transistor M5 and the wiring 103.

A region where the other terminals of the capacitor C1 and the capacitor C2, the other of the source and the drain of the transistor M2, the other of the source and the drain of the transistor M3, the one of the source and the drain of the transistor M5, and the one of the source and the drain of the transistor M6 are electrically connected to one another is referred to as anode ND1.

A region where the one terminal of the capacitor C2, the back gate of the transistor M2, and the other of the source and the drain of the transistor M4 are electrically connected to one another is referred to as a node ND2.

A region where the other of the source and the drain of the transistor M1, the one of the source and the drain of the transistor M3, the one terminal of the capacitor C1, and the gate of the transistor M2 are electrically connected to one another is referred to as a node ND3.

A region where the gate of the transistor M5, the one terminal of the capacitor C3, the other of the source and the drain of the transistor M7, and the one of the source and the drain of the transistor M8 are electrically connected to one another is referred to as a node ND4.

The capacitor C1 has a function of retaining a potential difference between the other of the source and the drain of the transistor M2 and the gate of the transistor M2 at the time when the node ND3 is in a floating state. The capacitor C2 has a function of retaining a potential difference between the other of the source and the drain of the transistor M2 and the back gate of the transistor M2 at the time when the node ND2 is in a floating state. The capacitor C3 has a function of retaining a potential difference between the other of the source and the drain of the transistor M5 and the gate of the transistor M5 at the time when the node ND4 is in a floating state.

A transistor containing any of various semiconductors can be used in the pixel circuit 51A of one embodiment of the present invention. For example, a transistor containing a single crystal semiconductor, a polycrystalline semiconductor, a microcrystalline semiconductor, or an amorphous semiconductor in a channel formation region can be used. Furthermore, a compound semiconductor (e.g., silicon germanium (SiGe) or gallium arsenide (GaAs)), an oxide semiconductor, or the like as well as a single element semiconductor whose main component is a single element (e.g., silicon (Si) or germanium (Ge)) can be used.

In this embodiment and the like, an example is described in which the semiconductor device 100A is formed using n-channel transistors; however, one embodiment of the present invention is not limited thereto. As some or all of the transistors included in the semiconductor device 100A, p-channel transistors may be used.

Figure 2:
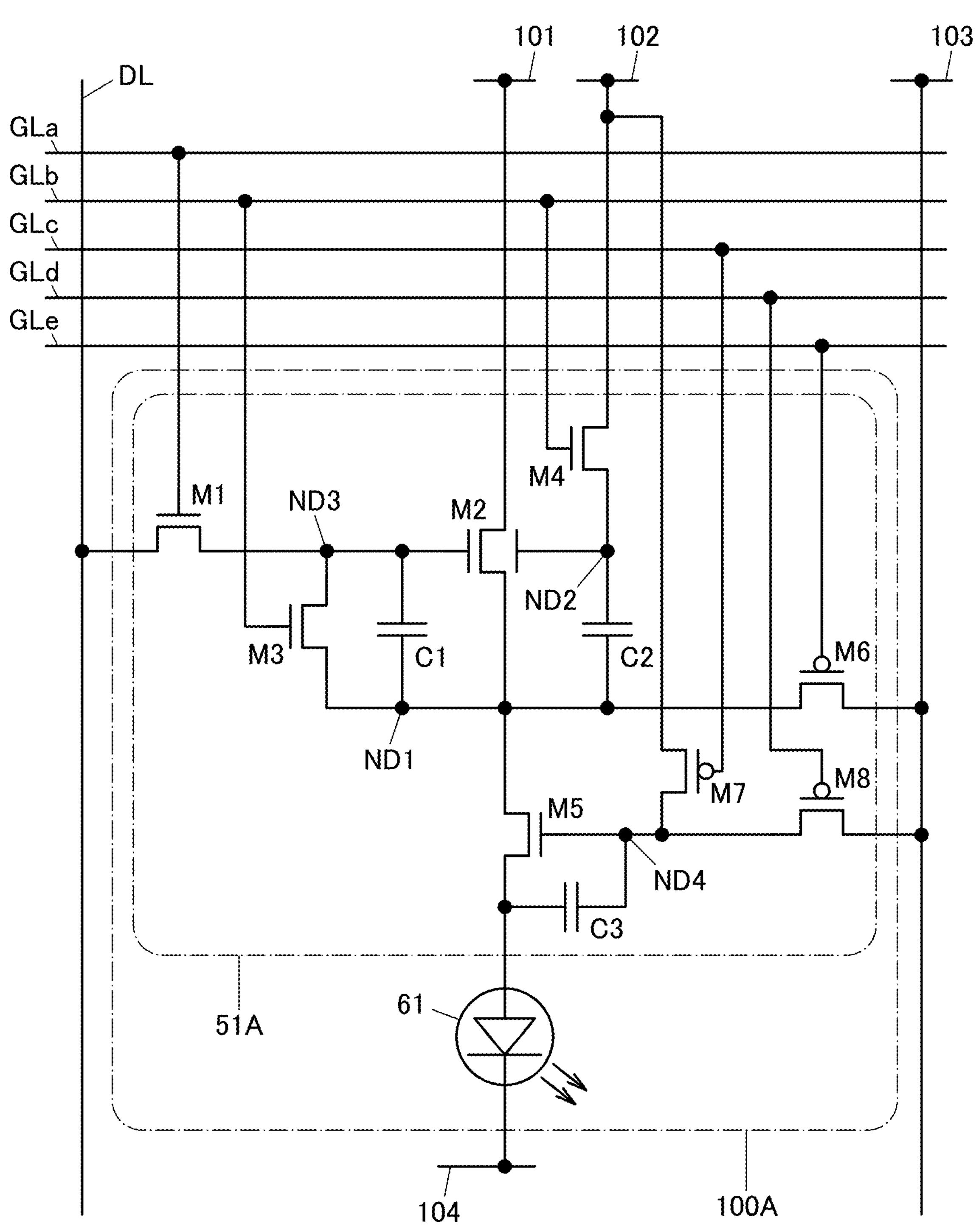
FIG. 2 is a diagram illustrating a semiconductor device.

For example, FIG. 2 illustrates a circuit structure example of the semiconductor device 100A in which p-channel transistors are used as the transistor M6 to the transistor M8 among the transistors included in the pixel circuit 51A. In the circuit structure illustrated in FIG. 2, the gate of the transistor M6 is electrically connected to a wiring GLe.

Any of transistors having a variety of structures can be used in the pixel circuit 51A of one embodiment of the present invention. For example, any of transistors having a variety of structures such as a planar type, a FIN-type, a TRI-GATE type, a top-gate type, a bottom-gate type, and a double-gate type (a structure in which gates are placed above and below a channel) can be used. A MOS transistor, a junction transistor, a bipolar transistor, or the like can be used as the transistor of one embodiment of the present invention.

As each of the transistors included in the pixel circuit 51A, an OS transistor (a transistor containing an oxide semiconductor in a semiconductor layer where a channel is formed) may be used, for example. An oxide semiconductor has a band gap of 2 eV or more and thus has an extremely low off-state current.

The off-state current value per micrometer of channel width of the OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor (a transistor containing silicon in a semiconductor layer where a channel is formed) at room temperature is higher than or equal to 1 fA ($1\times10^{-15}$ A) and lower than or equal to 1 pA ($1\times10^{-12}$ A). Thus, the off-state current of the OS transistor is lower than the off-state current of the Si transistor by approximately ten orders of magnitude.

When the OS transistor is used as each of the transistors included in the pixel circuit 51A, charge written to the nodes can be retained for a long period. For example, in the case of displaying a still image for which rewriting every frame is not required, displaying an image can be kept even when the operation of a peripheral driver circuit is stopped. Such a driving method in which the operation of a peripheral driver circuit is stopped during displaying a still image is also referred to as "idling stop driving". The power consumption of a display device can be reduced by performing idling stop driving.

The off-state current of the OS transistor hardly increases even in a high-temperature environment. Specifically, the off-state current hardly increases even at an environment temperature higher than or equal to room temperature and lower than or equal to 200° C. Furthermore, the on-state current is unlikely to decrease even in a high-temperature environment. A semiconductor device including the OS transistor can operate stably and have high reliability even in a high-temperature environment.

Moreover, the OS transistor has a high source-drain breakdown voltage. The use of the OS transistor as each of the transistors included in the pixel circuit 51A makes the operation stable even in the case where a potential difference between a potential Va and a potential Vc is large, so that the semiconductor device can have high reliability. It is particularly preferable to use the OS transistor as one or both of the transistor M2 and the transistor M5.

The semiconductor layer of the OS transistor preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as "IGZO") for the semiconductor layer. Alternatively, an oxide containing indium (In), aluminum (Al), and zinc (Zn) (also referred to as "IAZO") may be used for the semiconductor layer. Alternatively, an oxide containing indium (In), aluminum (Al), gallium (Ga), and zinc (Zn) (also referred to as "IAGZO") may be used for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

Note that the transistor M2 has a function of controlling the amount of current Ie flowing through the light-emitting element 61. That is, the transistor M2 has a function of controlling the amount of light emitted from the light-emitting element 61. Thus, the transistor M2 is also referred to as a "driving transistor".

The transistor M5 has a function of switching electrical continuity and discontinuity between the transistor M2 and the light-emitting element 61. The light-emitting element 61 is off when the transistor M5 is in the off state, and the light-emitting element 61 can emit light when the transistor M5 is in the on state. Thus, the transistor M5 is also referred to as a "light-emitting transistor". In order to surely supply current with the amount determined by the driving transistor to the light-emitting element 61, the transistor M5 needs to be surely turned on regardless of the values of the source potential and the drain potential.

Among the transistors included in the pixel circuit 51A, the transistor M1, the transistor M3, the transistor M4, the transistor M6, the transistor M7, and the transistor M8 function as switches. Hence, the semiconductor device 100A can be illustrated as in FIG. 3.

Figure 4:
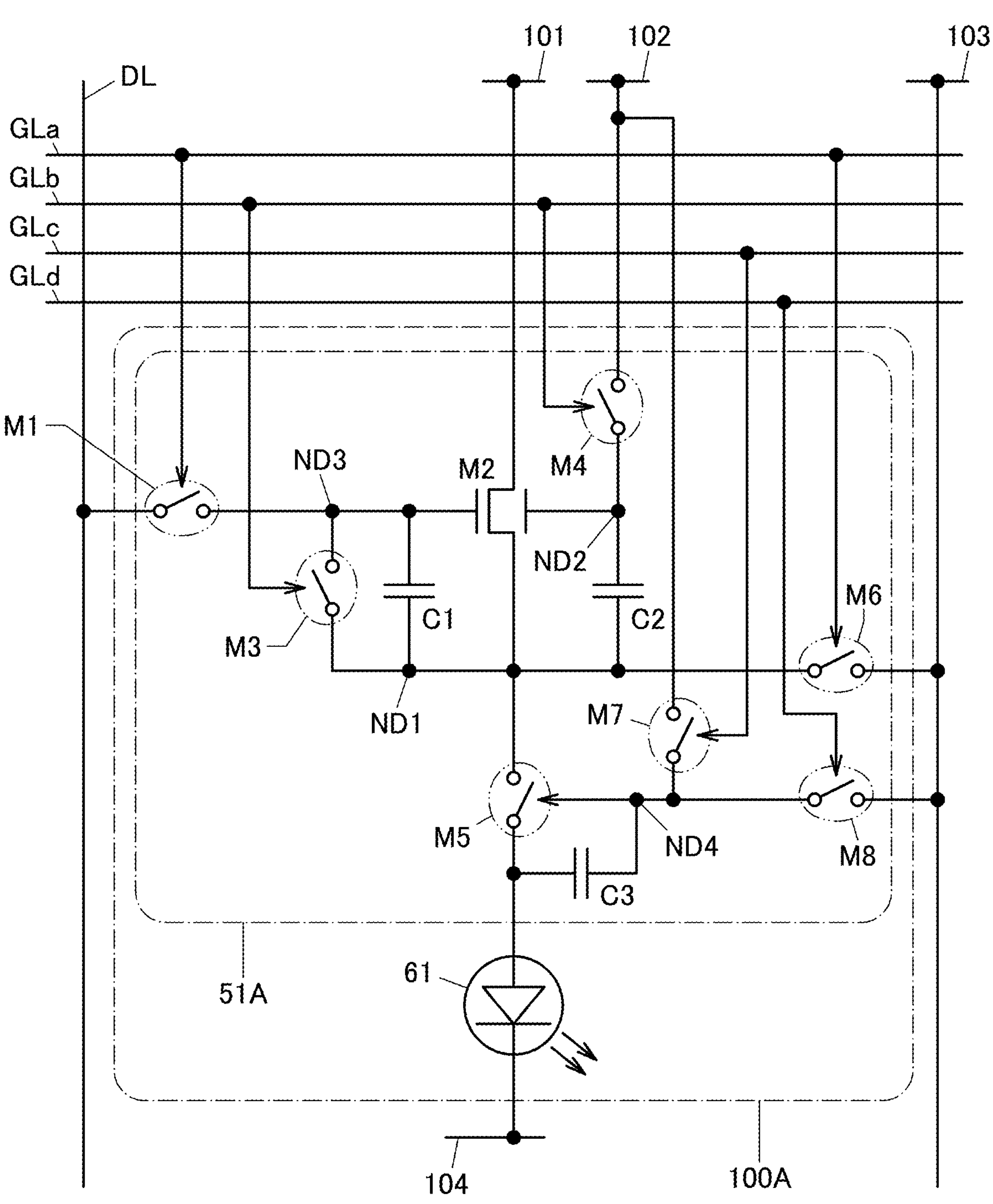
FIG. 4 is a diagram illustrating a semiconductor device.

The transistor M5 also functions as a switch. Hence, the semiconductor device 100A can also be illustrated as in FIG. 4. The transistor M1 and the transistor M3 to the transistor M8 can be replaced with elements that can function as switches.

The transistors included in the pixel circuit 51A may each be a transistor having a back gate. By providing the back gate, an electric field generated outside the transistor is unlikely to affect a channel formation region; thus, the operation of the semiconductor device is stabilized and the reliability of the semiconductor device can be increased. By controlling the potential of the back gate, the threshold voltage of the transistor can be changed.

Figure 5:
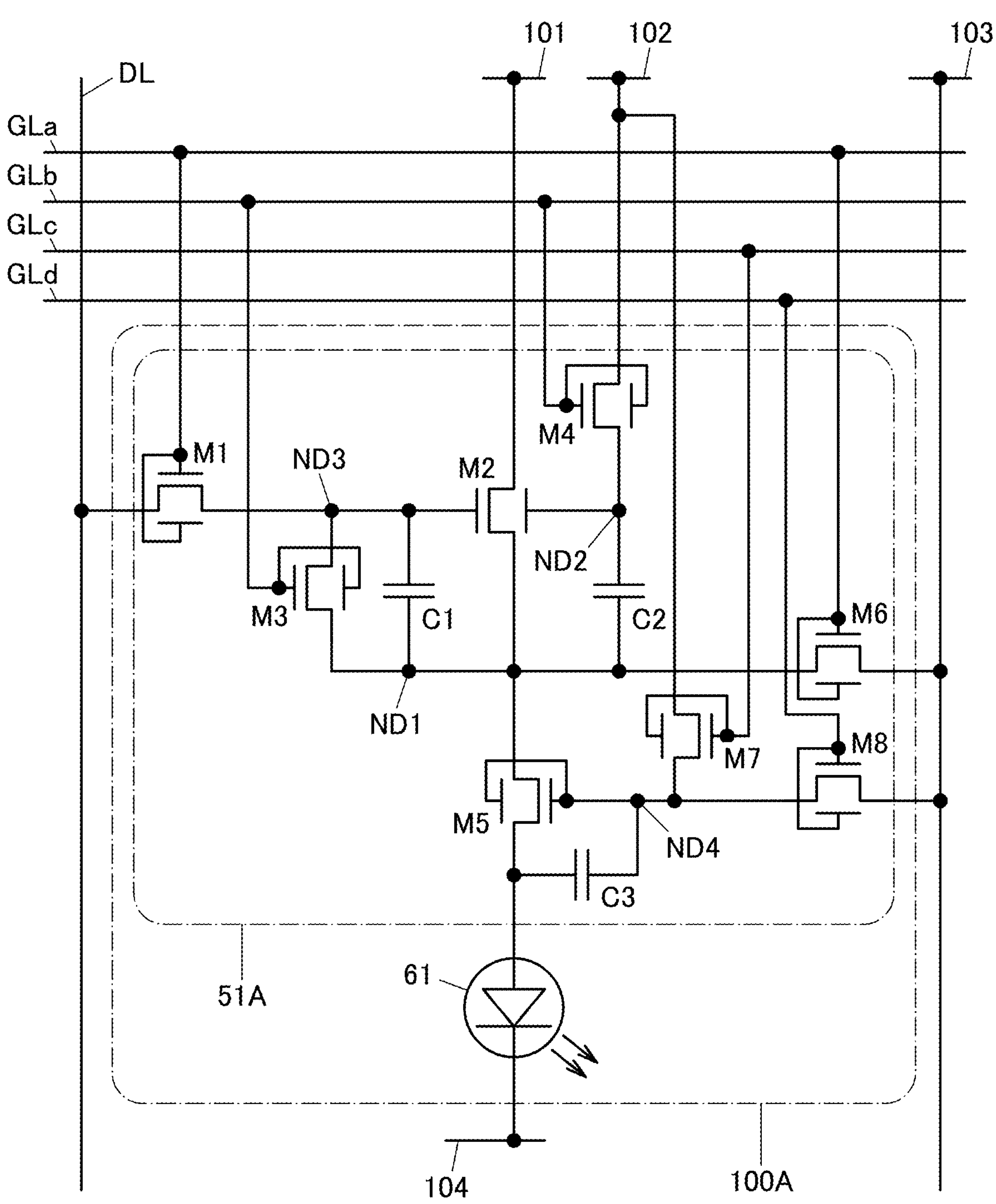
FIG. 5 is a diagram illustrating a semiconductor device.

FIG. 5 illustrates a circuit structure example of the semiconductor device 100A in which a transistor having a back gate is used not only as the transistor M2 but also as each of the transistor M1 and the transistor M3 to the transistor M8. FIG. 5 illustrates an example in which the gate and the back gate of each of the transistor M1 and the transistor M3 to the transistor M8 are electrically connected to each other. Note that not all the transistors included in the semiconductor device necessarily have back gates.

It is not necessary to electrically connect the gate and the back gate, and a given potential may be supplied to the back gate. Note that the potential supplied to the back gate is not limited to a fixed potential. The potentials supplied to the back gates of the transistors included in the semiconductor device may be different from one another or may be the same.

Figure 6:
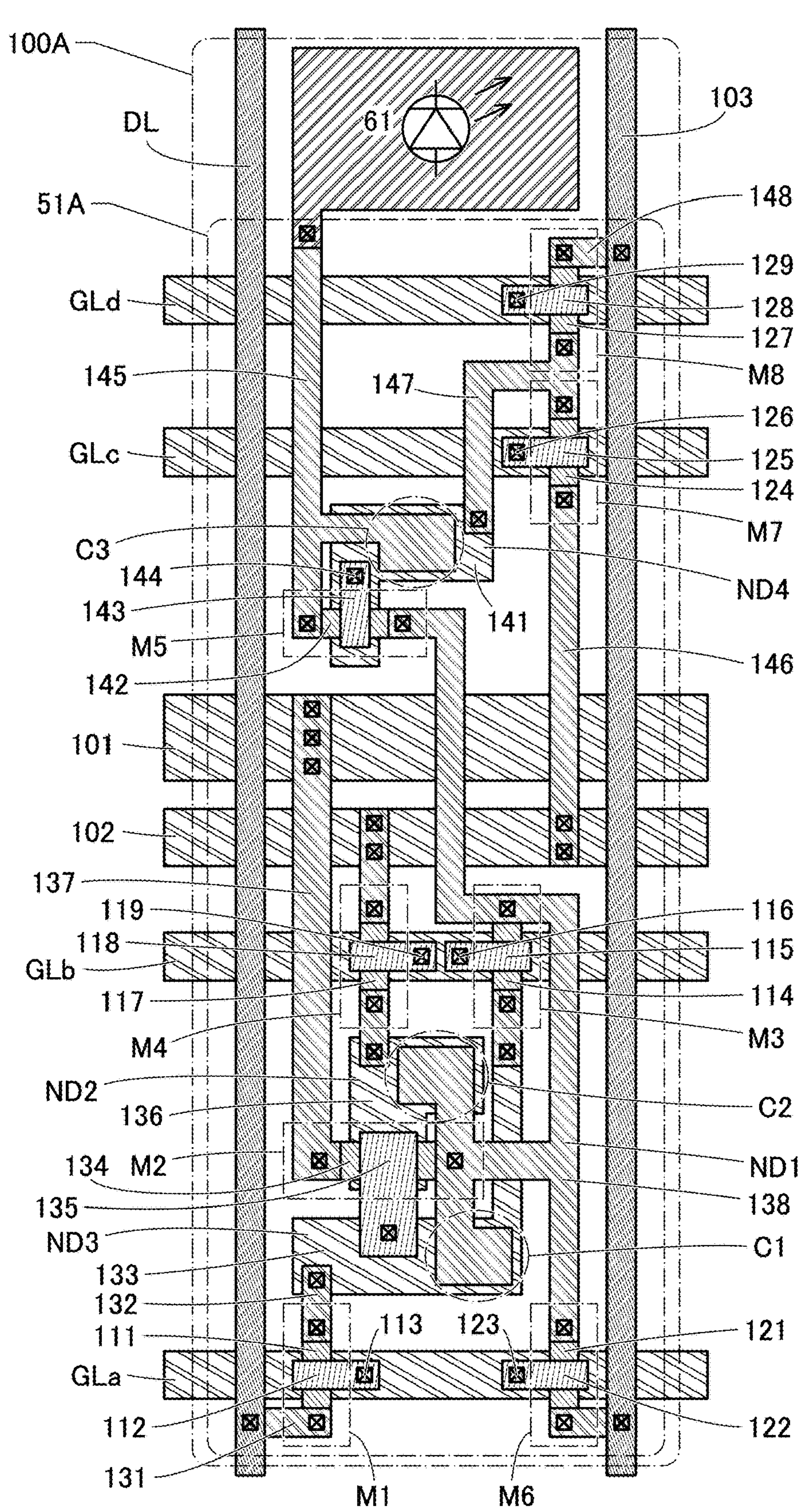
FIG. 6 is a diagram illustrating a planar layout of a semiconductor device.

FIG. 6 illustrates a planar layout of the semiconductor device 100A illustrated in FIG. 5. In the planar layout illustrated in FIG. 6, a semiconductor layer 111 of the transistor M1 is provided over the wiring GLa. The wiring GLa and the semiconductor layer 111 have an overlapping region. Part of the wiring GLa functions as the back gate of the transistor M1. A conductor 112 functions as the gate of the transistor M1 and is electrically connected to the wiring GLa in a contact hole 113.

A semiconductor layer 114 of the transistor M3 is provided over the wiring GLb. The wiring GLb and the semiconductor layer 114 have an overlapping region. Part of the wiring GLb functions as the back gate of the transistor M3. A conductor 115 functions as the gate of the transistor M3 and is electrically connected to the wiring GLb in a contact hole 116.

A semiconductor layer 117 of the transistor M4 is provided over the wiring GLb. The wiring GLb and the semiconductor layer 117 have an overlapping region. Part of the wiring GLb functions as the back gate of the transistor M4. A conductor 118 functions as the gate of the transistor M4 and is electrically connected to the wiring GLb in a contact hole 119.

A semiconductor layer 121 of the transistor M6 is provided over the wiring GLa. The wiring GLa and the semiconductor layer 121 have an overlapping region. Part of the wiring GLa functions as the back gate of the transistor M6. A conductor 122 functions as the gate of the transistor M6 and is electrically connected to the wiring GLa in a contact hole 123.

A semiconductor layer 124 of the transistor M7 is provided over the wiring GLc. The wiring GLc and the semiconductor layer 124 have an overlapping region. Part of the wiring GLc functions as the back gate of the transistor M7. A conductor 125 functions as the gate of the transistor M7 and is electrically connected to the wiring GLc in a contact hole 126.

A semiconductor layer 127 of the transistor M8 is provided over the wiring GLd. The wiring GLd and the semiconductor layer 127 have an overlapping region. Part of the wiring GLd functions as the back gate of the transistor M8. A conductor 128 functions as the gate of the transistor M8 and is electrically connected to the wiring GLd in a contact hole 129.

The one of the source and the drain of the transistor M1 is electrically connected to the wiring DL through a conductive layer 131. The other of the source and the drain of the transistor M1 is electrically connected to a conductive layer 133 through a conductive layer 132.

A semiconductor layer 134 of the transistor M2 is provided over a conductive layer 136. The conductive layer 136 and the semiconductor layer 134 have an overlapping region. Part of the conductive layer 136 functions as the back gate of the transistor M2. A conductive layer 135 electrically connected to the conductive layer 133 functions as the gate of the transistor M2.

The one of the source and the drain of the transistor M2 is electrically connected to the wiring 101 through a conductive layer 137. The other of the source and the drain of the transistor M2 is electrically connected to a conductive layer 138. A region where the conductive layer 133 and the conductive layer 138 overlap with each other functions as the capacitor C1. A region where the conductive layer 136 and the conductive layer 138 overlap with each other functions as the capacitor C2.

A semiconductor layer 142 of the transistor M5 is provided over a conductive layer 141. The conductive layer 141 and the semiconductor layer 142 have an overlapping region. Part of the conductive layer 141 functions as the back gate of the transistor M5. A conductor 143 functions as the gate of the transistor M5 and is electrically connected to the wiring GLc in a contact hole 144.

The one of the source and the drain of the transistor M5 is electrically connected to the conductive layer 138. The other of the source and the drain of the transistor M5 is electrically connected to a conductive layer 145. A region where the conductive layer 141 and the conductive layer 145 overlap with each other functions as the capacitor C3. The conductive layer 145 is electrically connected to the light-emitting element 61.

The one of the source and the drain of the transistor M5 is electrically connected to the wiring 102 through a conductive layer 146. The other of the source and the drain of the transistor M5 and the one of the source and the drain of the transistor M8 are electrically connected to the conductive layer 141 through a conductive layer 147. The other of the source and the drain of the transistor M8 is electrically connected to the wiring 103 through a conductive layer 148.

The conductive layer 138 functions as the node ND1. The conductive layer 136 functions as the node ND2. The conductive layer 133 functions as the node ND3. The conductive layer 141 functions as the node ND4.

Figure 7:
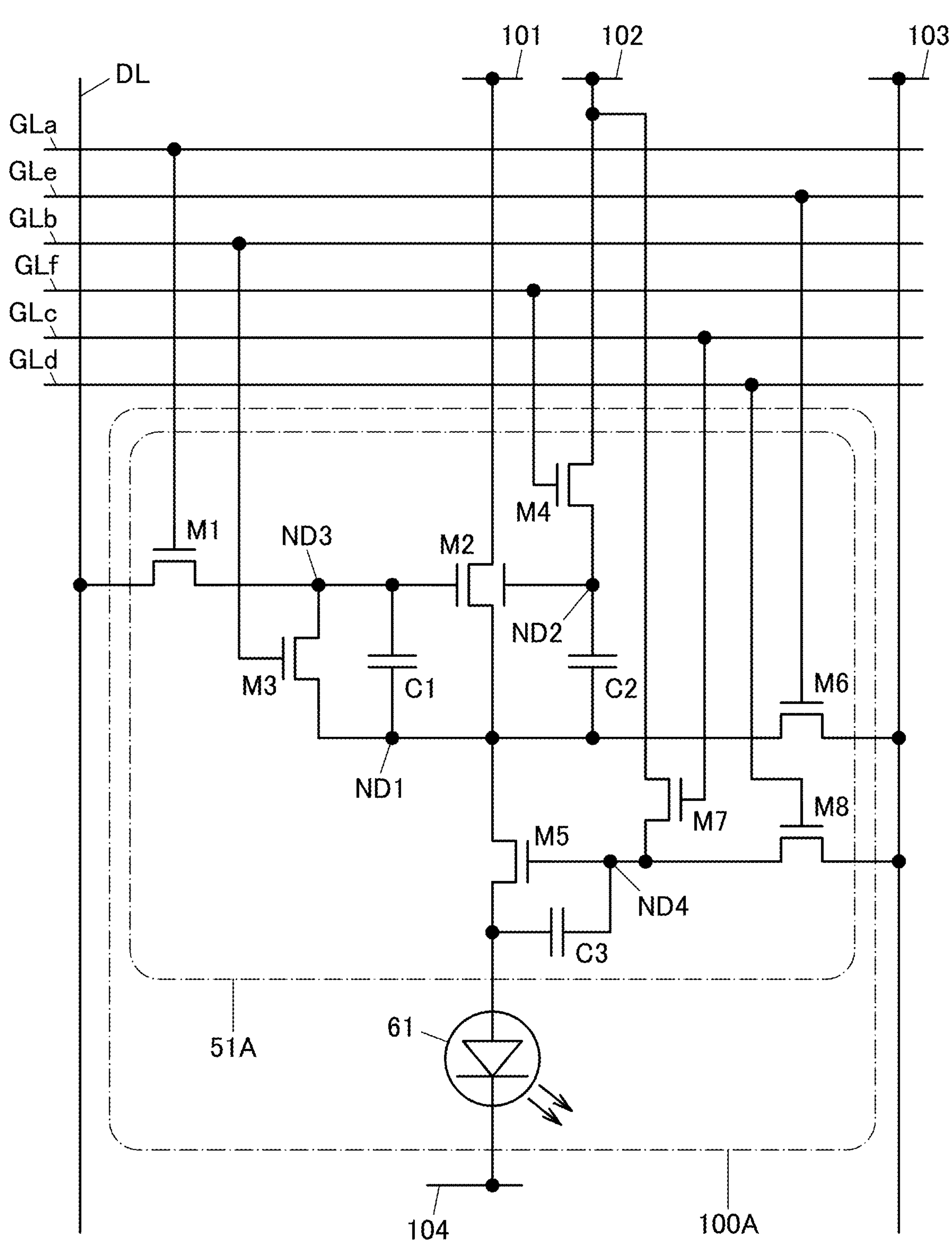
FIG. 7 is a diagram illustrating a semiconductor device.

As illustrated in FIG. 7, a wiring GLe may be provided such that the gate of the transistor M6 and the wiring GLe are electrically connected to each other. In addition, a wiring GLf may be provided such that the gate of the transistor M4 and the wiring GLf are electrically connected to each other. Providing the wiring GLe and the wiring GLf enables the on states and the off states of the transistor M1 to the transistor M8 to be controlled independently.

Figure 8:
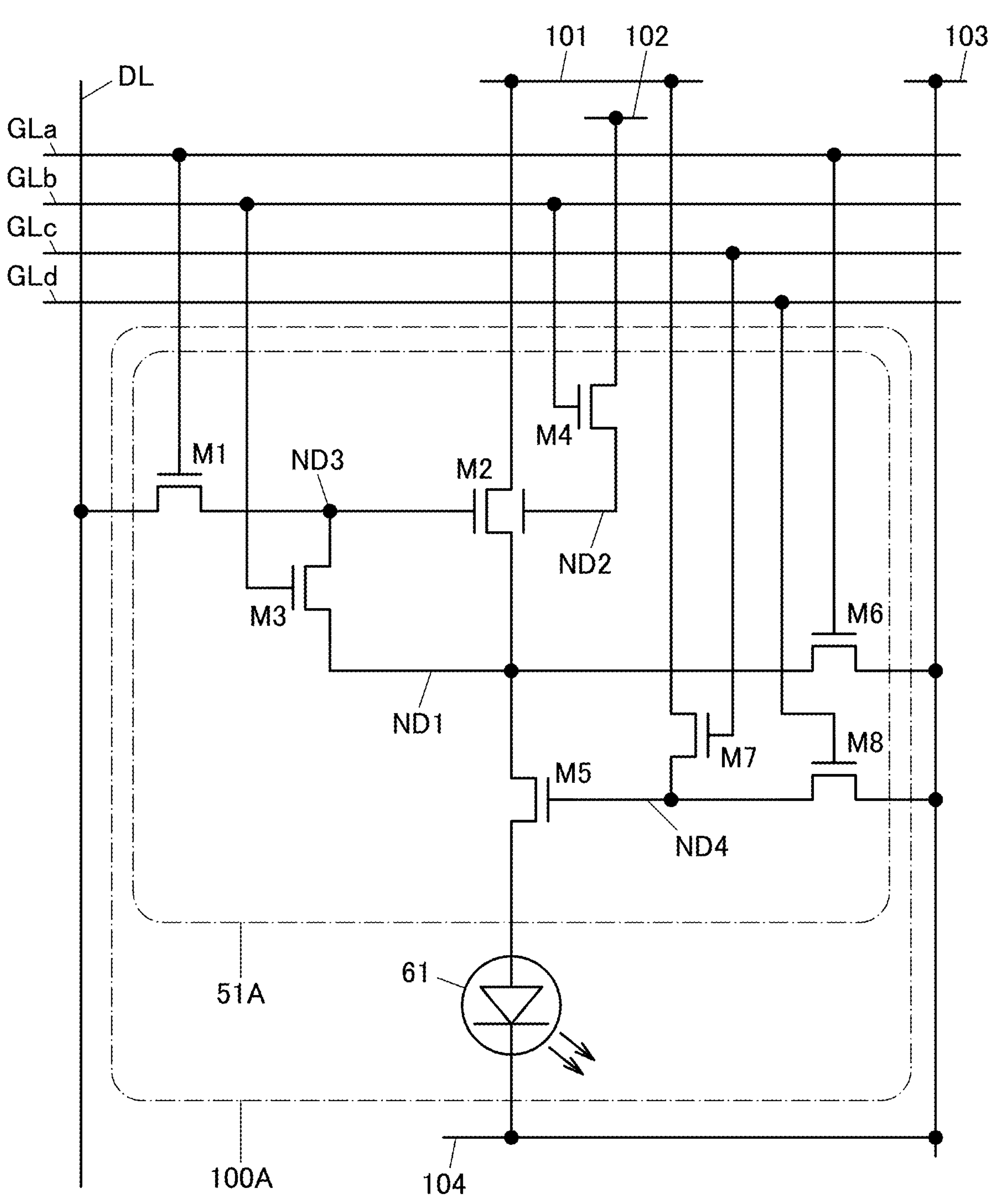
FIG. 8 is a diagram illustrating a semiconductor device.

As illustrated in FIG. 8, the one of the source and the drain of the transistor M2 and the one of the source and the drain of the transistor M7 may be electrically connected to the wiring 101. In addition, the wiring 103 and the wiring 104 may be electrically connected to each other. That is, the cathode of the light-emitting element 61 and the wiring 103 may be electrically connected to each other.

In the case where the gate capacitance of the transistor M2 is sufficiently large, the capacitor C1 is not necessarily formed. In the case where the back gate capacitance of the transistor M2 is sufficiently large, the capacitor C2 is not necessarily formed. In the case where the gate capacitance of the transistor M5 is sufficiently large, the capacitor C3 is not necessarily formed.

Figure 9:
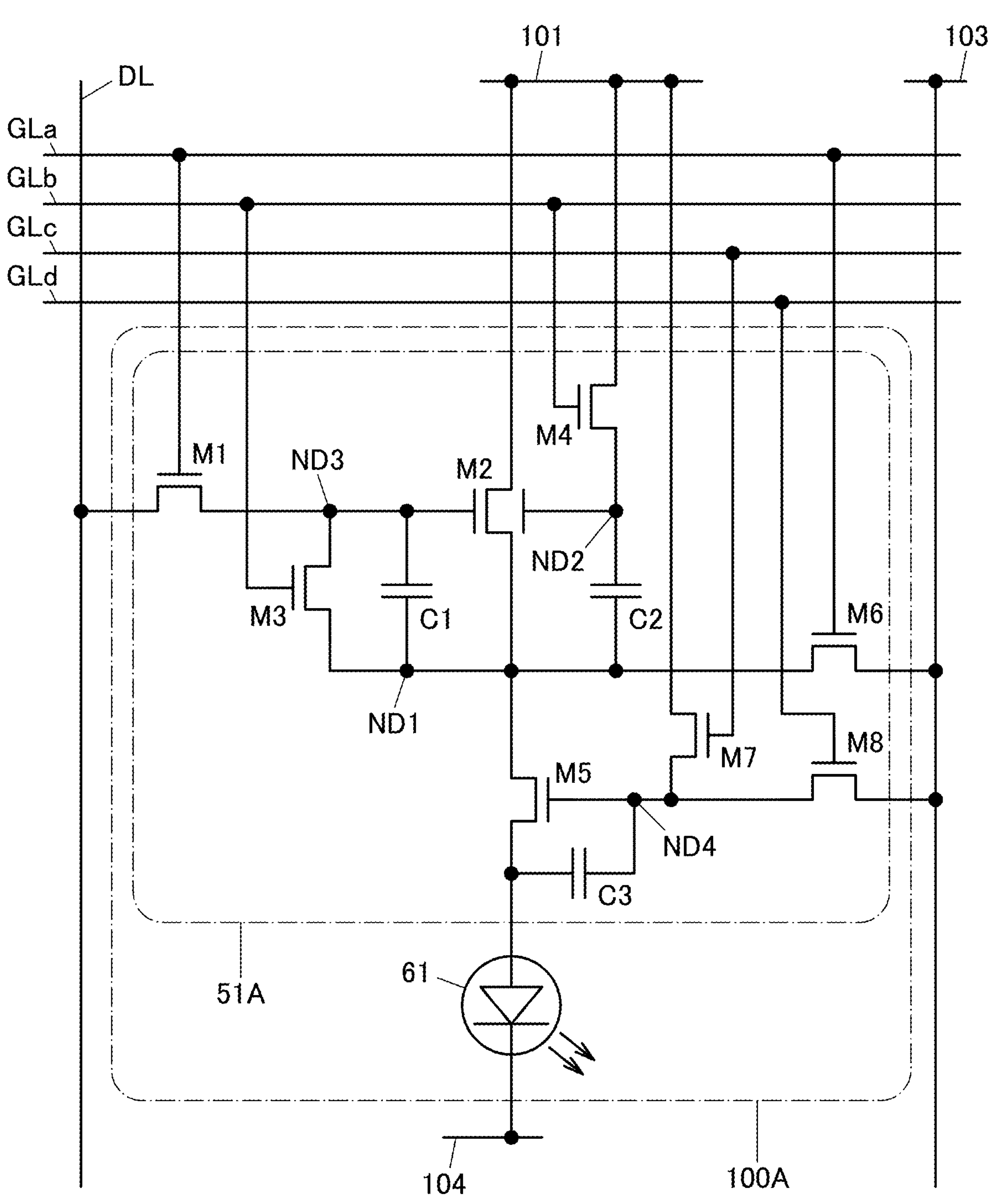
FIG. 9 is a diagram illustrating a semiconductor device.

As illustrated in FIG. 9, the one of the source and the drain of the transistor M2, the one of the source and the drain of the transistor M4, and the one of the source and the drain of the transistor M7 may be electrically connected to the wiring 101.

Figure 10:
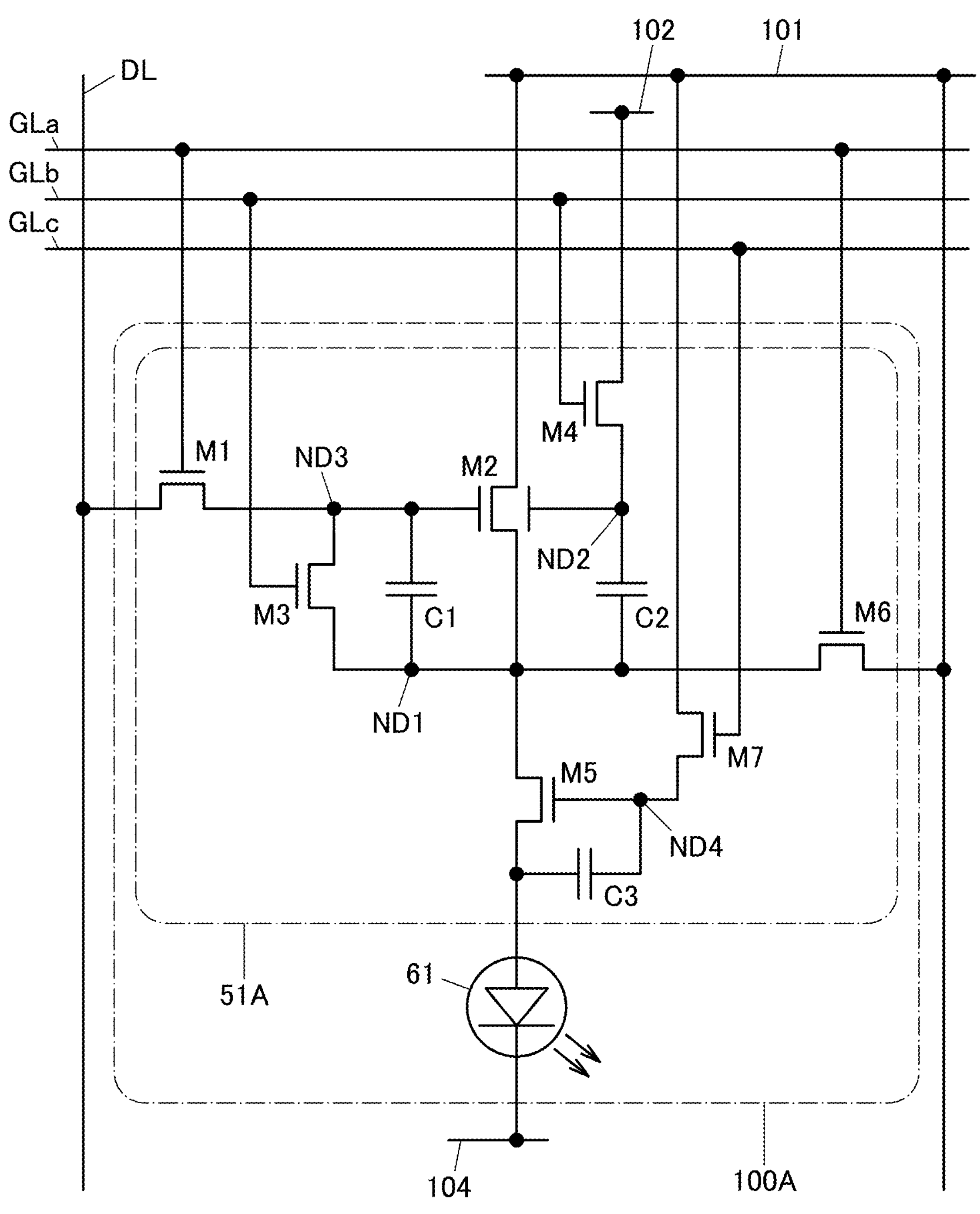
FIG. 10 is a diagram illustrating a semiconductor device.

As illustrated in FIG. 10, the one of the source and the drain of the transistor M2, the one of the source and the drain of the transistor M7, and the other of the source and the drain of the transistor M6 may be electrically connected to the wiring 101.

Figure 11:
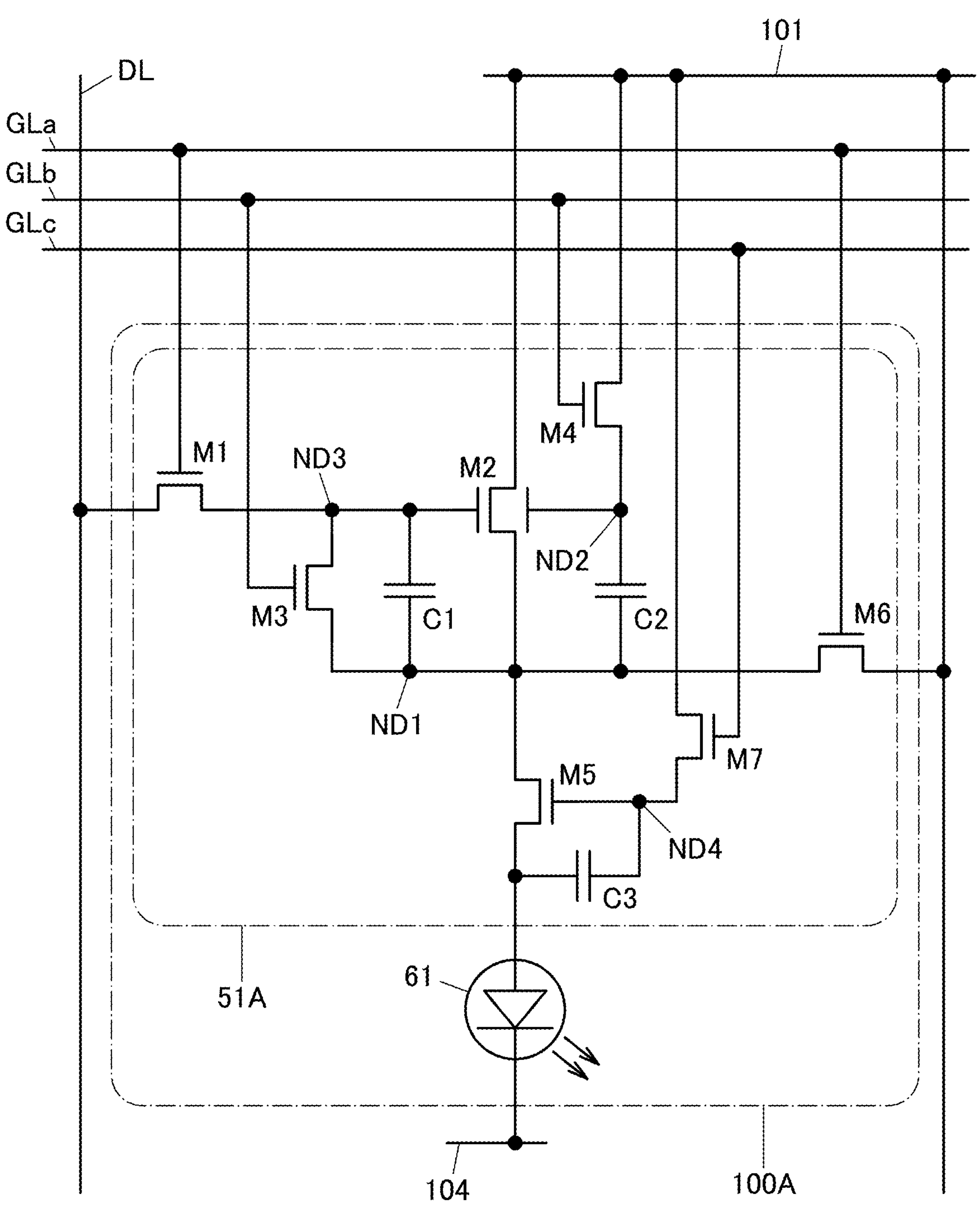
FIG. 11 is a diagram illustrating a semiconductor device.

As illustrated in FIG. 11, the one of the source and the drain of the transistor M2, the one of the source and the drain of the transistor M4, the one of the source and the drain of the transistor M7, and the other of the source and the drain of the transistor M6 may be electrically connected to the wiring 101. In the circuit structures illustrated in FIG. 10 and FIG. 11, the formation of the transistor M8 and the wiring GLd can be omitted.

Figure 12:
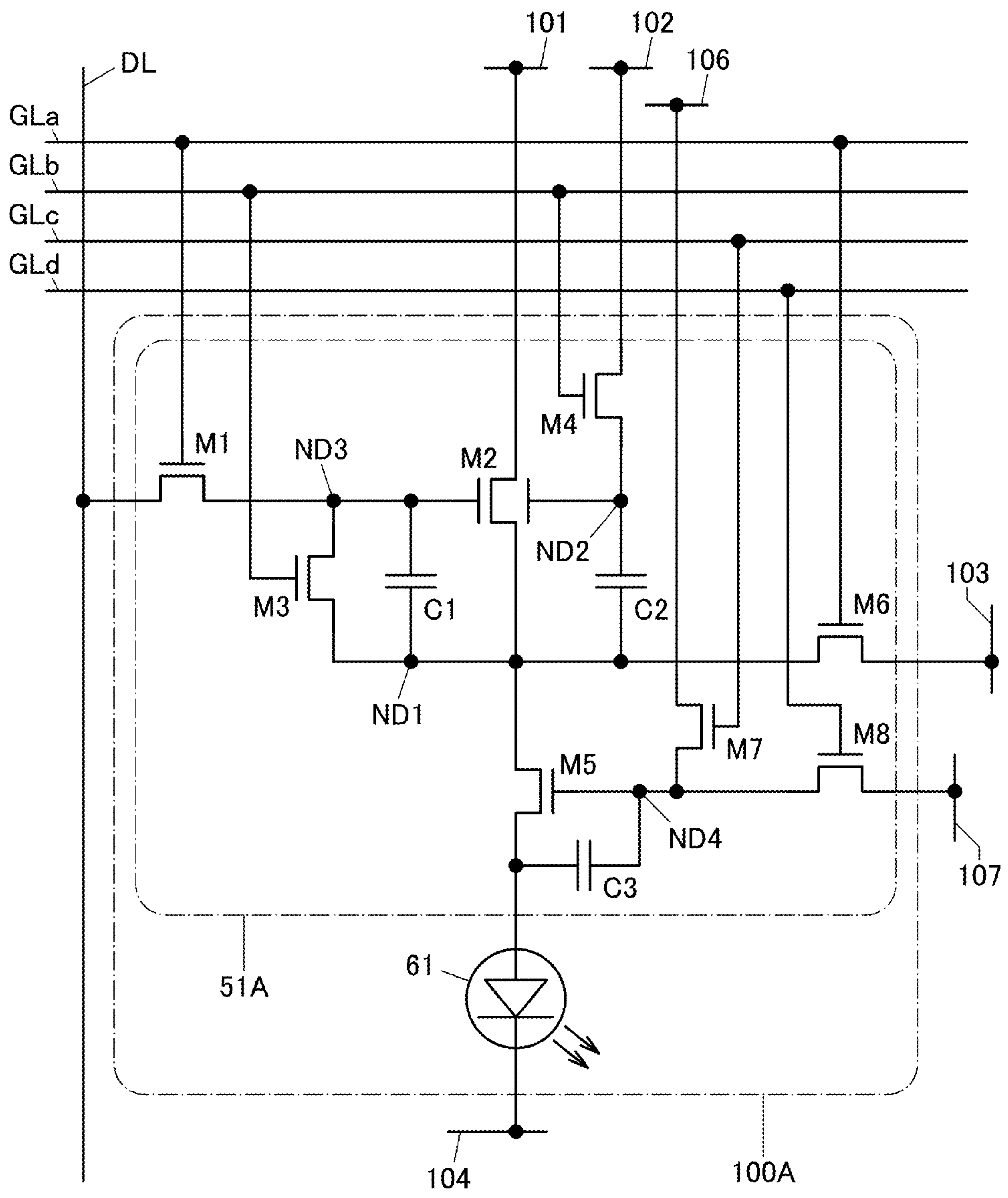
FIG. 12 is a diagram illustrating a semiconductor device.

As illustrated in FIG. 12, the one of the source and the drain of the transistor M4 may be electrically connected to the wiring 102, and the one of the source and the drain of the transistor M7 may be electrically connected to a wiring 106. The other of the source and the drain of the transistor M6 may be electrically connected to the wiring 103, and the one of the source and the drain of the transistor M8 may be electrically connected to a wiring 107.

Figure 13:
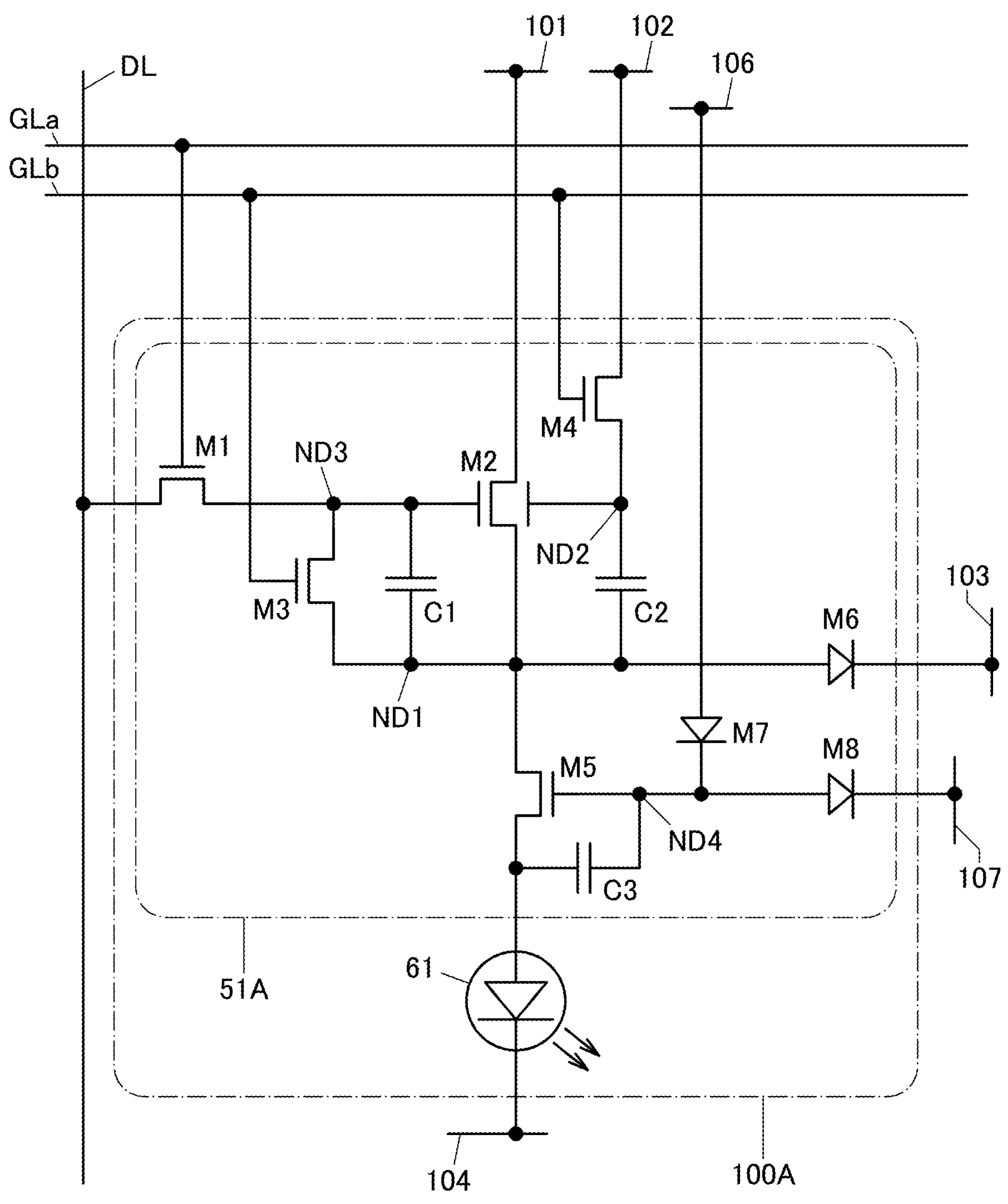
FIG. 13 is a diagram illustrating a semiconductor device.

As illustrated in FIG. 13, some or all of the transistor M6, the transistor M7, and the transistor M8 may be replaced with a diode. When the transistor M7 is replaced with a diode, the formation of the wiring GLc can be omitted. When the transistor M8 is replaced with a diode, the formation of the wiring GLd can be omitted.

Figure 14:
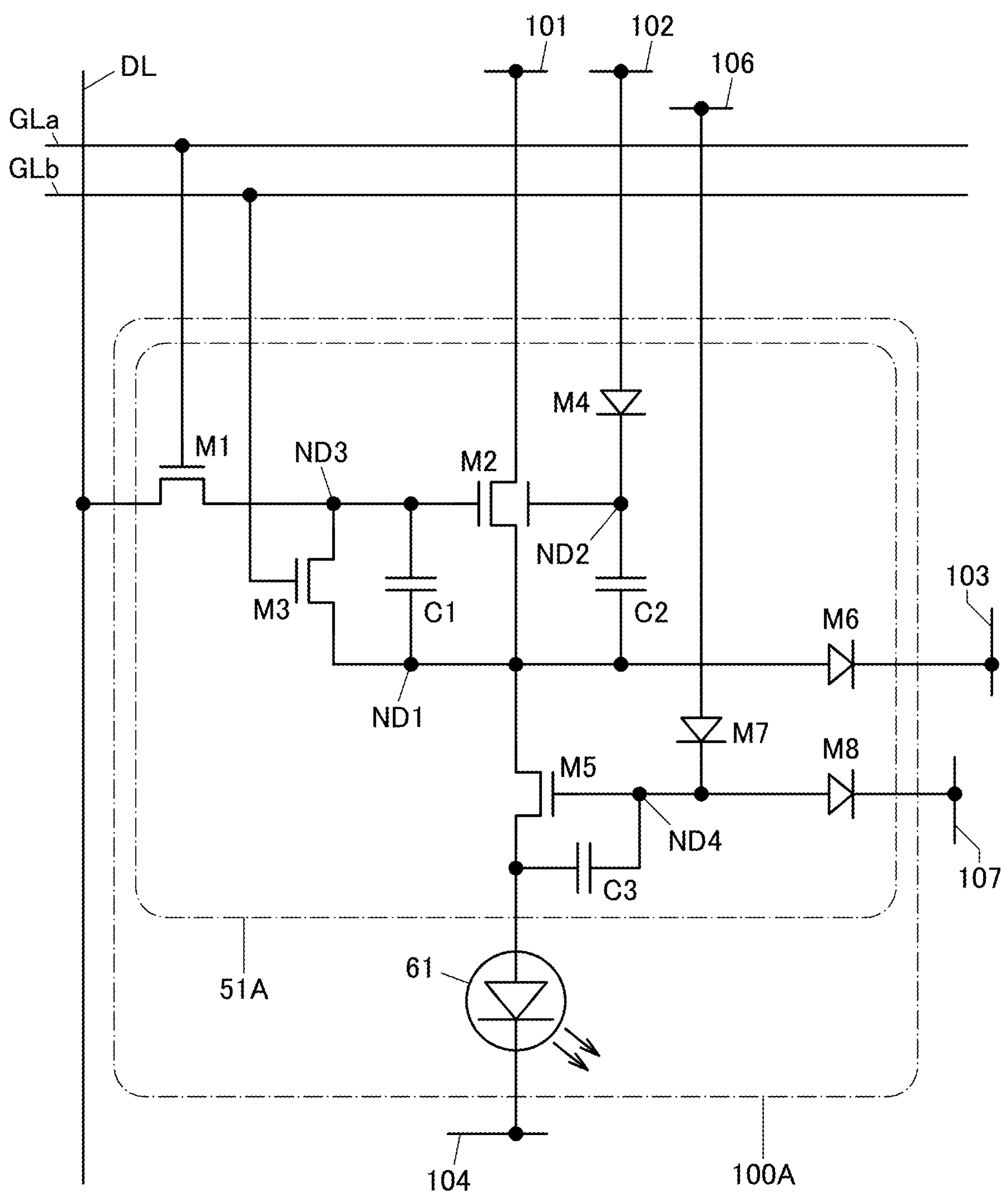
FIG. 14 is a diagram illustrating a semiconductor device.

As illustrated in FIG. 14, some or all of the transistor M4, the transistor M6, the transistor M7, and the transistor M8 may be replaced with a diode.

Figure 15:
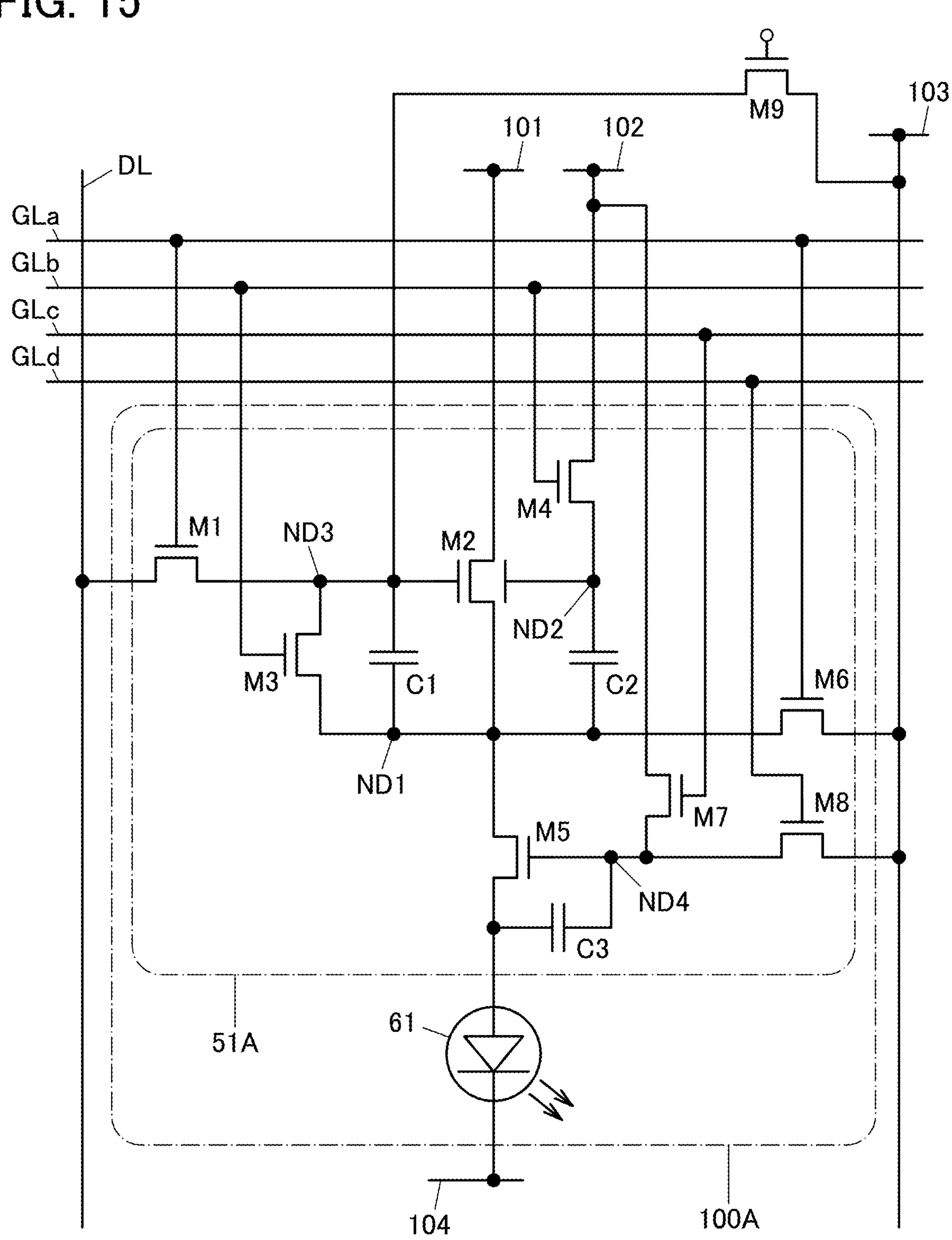
FIG. 15 is a diagram illustrating a semiconductor device.

As illustrated in FIG. 15, a transistor M9 may be provided between the gate of the transistor M2 and the wiring 103.

Figure 16A:
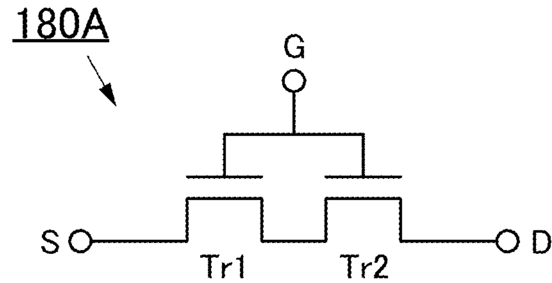
FIG. 16A to FIG. 16C are diagrams illustrating circuit symbols of transistors.

The transistors included in the pixel circuit 51A may each be a single-gate transistor having one gate between a source and a drain, or a double-gate transistor. FIG. 16A illustrates a circuit symbol example of a double-gate transistor 180A.

The transistor 180A has a structure in which a transistor Tr and a transistor Tr2 are connected in series. FIG. 16A illustrates a state in which one of a source and a drain of the transistor Tr is electrically connected to a terminal S, the other of the source and the drain of the transistor Tr is electrically connected to one of a source and a drain of the transistor Tr2, and the other of the source and the drain of the transistor Tr2 is electrically connected to a terminal D. FIG. 16A illustrates a state in which gates of the transistor Tr and the transistor Tr2 are electrically connected to each other and electrically connected to a terminal G.

The transistor 180A illustrated in FIG. 16A has a function of switching electrical continuity and discontinuity between the terminal S and the terminal D by changing the potential of the terminal G. Thus, the transistor 180A that is a double-gate transistor functions as one transistor including the transistor Tr1 and the transistor Tr2. That is, it can be said that in FIG. 16A, one of a source and a drain of the transistor 180A is electrically connected to the terminal S, the other of the source and the drain of the transistor 180A is electrically connected to the terminal D, and a gate of the transistor 180A is electrically connected to the terminal G.

Figure 16B:
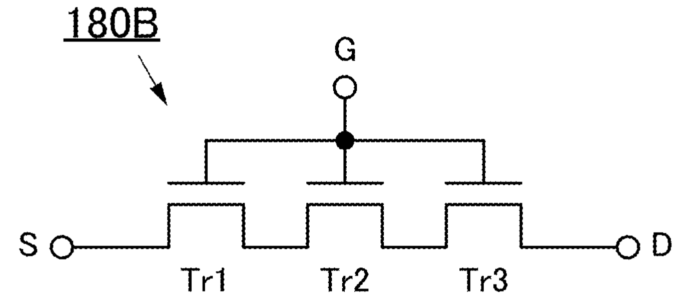

The transistors included in the pixel circuit 51A may each be a triple-gate transistor. FIG. 16B illustrates a circuit symbol example of a triple-gate transistor 180B.

The transistor 180B has a structure in which the transistor Tr1, the transistor Tr2, and a transistor Tr3 are connected in series. FIG. 16B illustrates a state in which the one of the source and the drain of the transistor Tr is electrically connected to the terminal S, the other of the source and the drain of the transistor Tr is electrically connected to the one of the source and the drain of the transistor Tr2, the other of the source and the drain of the transistor Tr2 is electrically connected to one of a source and a drain of the transistor Tr3, and the other of the source and the drain of the transistor Tr3 is electrically connected to the terminal D. FIG. 16B illustrates a state in which gates of the transistor Tr1, the transistor Tr2, and the transistor Tr3 are electrically connected to each other and electrically connected to the terminal G.

The transistor 180B illustrated in FIG. 16B has a function of switching electrical continuity and discontinuity between the terminal S and the terminal D by changing the potential of the terminal G. Thus, the transistor 180B that is a triple-gate transistor functions as one transistor including the transistor Tr1, the transistor Tr2, and the transistor Tr3. That is, it can be said that in FIG. 16B, one of a source and a drain of the transistor 180B is electrically connected to the terminal S, the other of the source and the drain of the transistor 180B is electrically connected to the terminal D, and a gate of the transistor 180B is electrically connected to the terminal G.

Figure 16C:
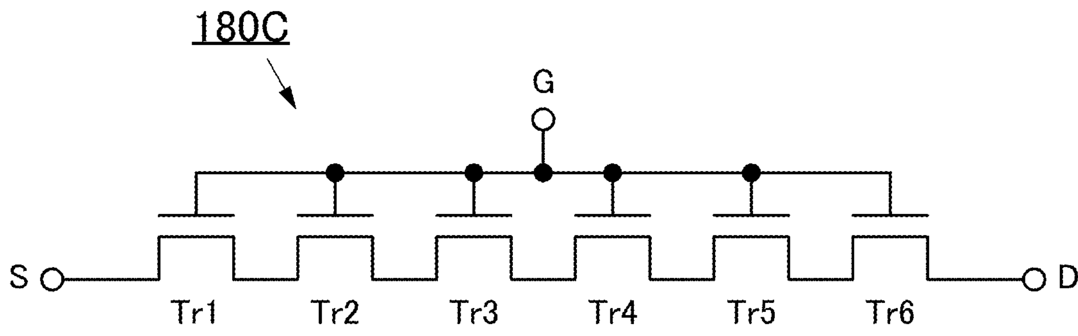

The transistors included in the pixel circuit 51A may each have a structure in which four or more transistors are connected in series. A transistor 180C illustrated in FIG. 16C is in a state in which six transistors (the transistor Tr1 to a transistor Tr6) are connected in series. A state is illustrated in which gates of the six transistors are electrically connected to each other and electrically connected to the terminal G.

The transistor 180C illustrated in FIG. 16C has a function of switching electrical continuity and discontinuity between the terminal S and the terminal D by changing the potential of the terminal G. Thus, the transistor 180C functions as one transistor including the transistor Tr1 to the transistor Tr6. That is, it can be said that in FIG. 16C, one of a source and a drain of the transistor 180C is electrically connected to the terminal S, the other of the source and the drain of the transistor 180C is electrically connected to the terminal D, and a gate of the transistor 180C is electrically connected to the terminal G.

Like the transistor 180A, the transistor 180B, and the transistor 180C, a transistor having a plurality of gates electrically connected to each other is referred to as a "multi-gate type transistor" or a "multi-gate transistor" in some cases.

In the case where a transistor operates in a saturation region, for example, the channel length of the transistor is sometimes lengthened so that its electrical characteristics in the saturation region can be improved. A multi-gate transistor may be used to achieve a transistor having a long channel length.

As the light-emitting element 61, it is possible to use any of a variety of display elements such as an EL element (e.g., an EL element containing an organic substance and an inorganic substance, an organic EL element, and an inorganic EL element), an LED (e.g., a white LED, a red LED, a green LED, and a blue LED), a micro LED, a QLED (Quantum-dot Light Emitting Diode), and an electron emitter element.

Operation Example

Figure 17:
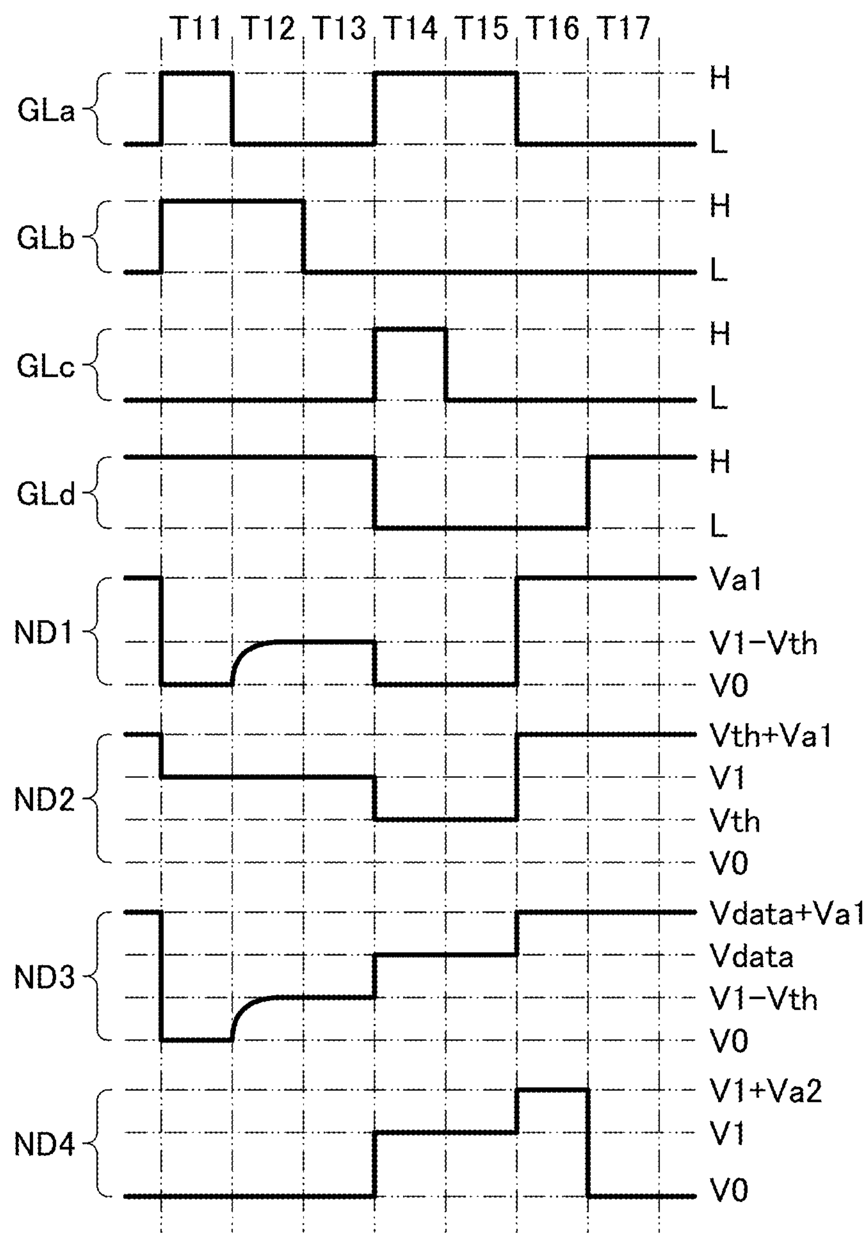
FIG. 17 is a timing chart showing an operation of a semiconductor device.
Figure 18:
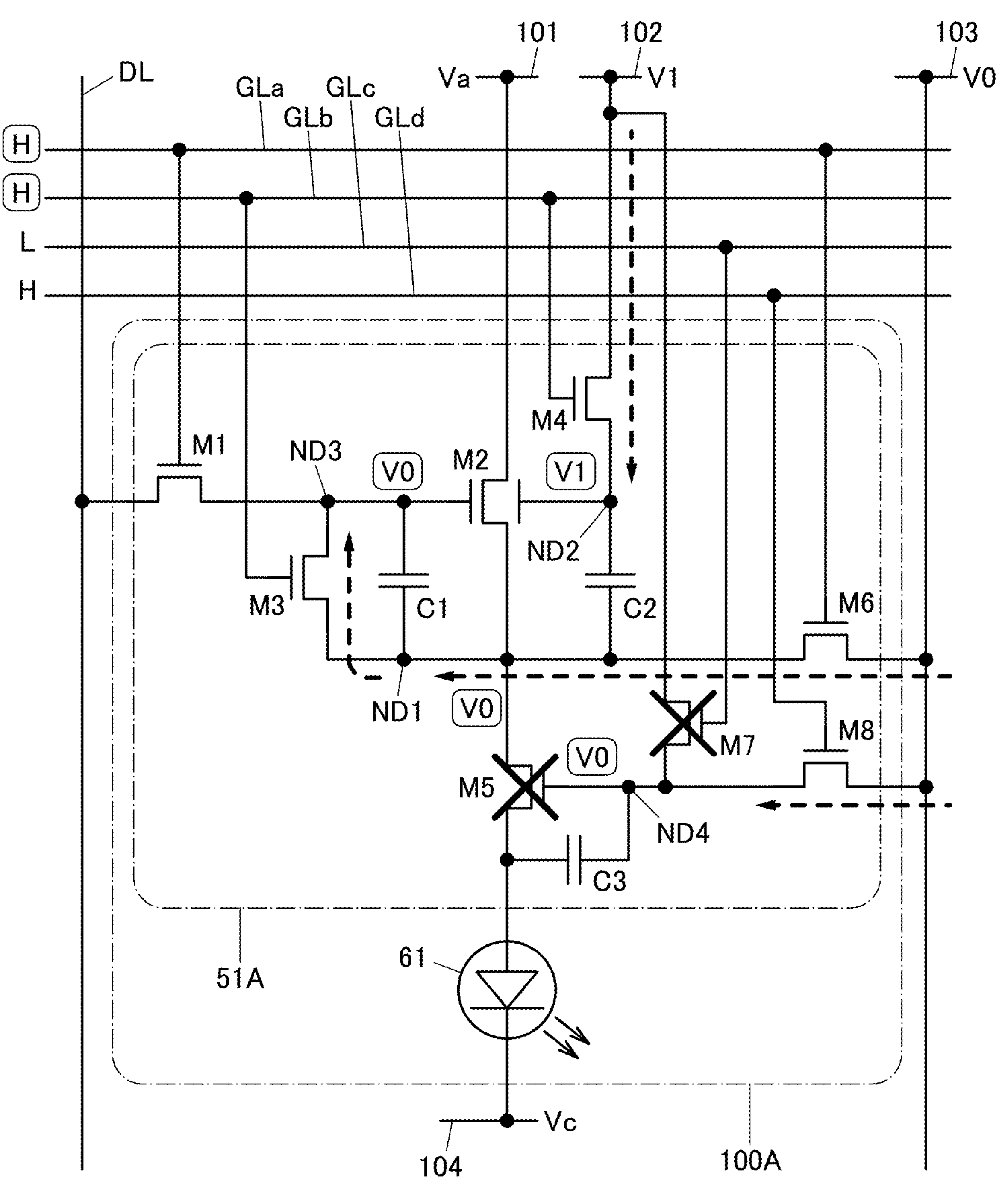
FIG. 18 is a diagram illustrating an operation of a semiconductor device.

Next, an operation example of the semiconductor device 100A illustrated in FIG. 1 will be described with reference to drawings. FIG. 17 is a timing chart showing the operation example of the semiconductor device 100A. FIG. 18 to FIG. 24 are circuit diagrams illustrating the operation example of the semiconductor device 100A.

A video signal Vdata is supplied to the wiring DL. The potential Va is supplied to the wiring 101, a potential V1 is supplied to the wiring 102, a potential V0 is supplied to the wiring 103, and the potential Vc is supplied to the wiring 104. A potential H or a potential L is supplied to the wiring GLa, the wiring GLb, the wiring GLc, and the wiring GLd.

The potential Va is an anode potential and the potential Vc is a cathode potential. The potential V1 is a potential higher than the potential V0, and is a potential at which a transistor can be turned on when the potential V1 is supplied to a gate of the transistor. The potential V0 is a potential at which a transistor can be turned off when the potential V0 is supplied to a gate of the transistor. The potential V0 is, for example, 0 V or the potential L. In this embodiment and the like, the potential V0 is 0 V and the potential V1 is 3 V. In addition, the potential Va is 15 V and the potential Vc is 0 V.

The semiconductor device 100A has a function of controlling the amount of current Ie (see FIG. 23) flowing through the light-emitting element 61 on the basis of the video signal Vdata supplied from the wiring DL. The emission luminance of the light-emitting element 61 is controlled by the amount of current Ie.

Note that in the drawings, a symbol showing a potential (also referred to as a "potential symbol") such as "H", "L", "V0", or "V1" is sometimes illustrated adjacent to a terminal, a wiring, or the like. For easy understanding of changes in potentials of terminals, wirings, and the like, a potential symbol of a terminal, a wiring, or the like whose potential has changed is sometimes enclosed. Furthermore, a symbol "x" sometimes overlaps with an off-state transistor.

The current Ie flowing through the light-emitting element 61 is determined mainly by the video signal Vdata and Vth of the transistor M2. Thus, even when the same video signal Vdata is supplied to a plurality of pixel circuits, a Vth variation between the transistors M2 included in the pixel circuits makes the current Ie different between the pixels. Accordingly, the Vth variation between the transistors M2 is a factor in reducing display quality.

In view of this, Vth of the transistor M2 in each pixel is obtained and a variation in the current Ie is reduced. Note that an operation of obtaining Vth of the transistor M2 is sometimes referred to as a "threshold correction operation".

[Vth Correction Operation]

First, a reset operation is performed in Period T11. Specifically, the potential H is supplied to the wiring GLa, the wiring GLb, and the wiring GLd, and the potential L is supplied to the wiring GLc (see FIG. 18). Note that in this specification and the like, the "potential H" is a potential at which an n-channel transistor is turned on and a p-channel transistor is turned off. The "potential L" is a potential at which an n-channel transistor is turned off and a p-channel transistor is turned on.

Thus, the transistor M1, the transistor M3, the transistor M4, the transistor M6, and the transistor M8 are turned on and the transistor M7 is turned off.

The potential V0 is supplied to the node ND1 through the transistor M6. Furthermore, the potential V0 is supplied to the node ND3 through the transistor M6 and the transistor M3. The potential V1 is supplied to the node ND2 through the transistor M4. The potential V0 is supplied to the node ND4 through the transistor M8. Accordingly, the transistor M5 is turned off.

In Period T11, electrical continuity is established between the wiring DL and the wiring 103 through the transistor M1, the transistor M3, and the transistor M6. Thus, in Period T11, it is preferable that the potentials of the wiring DL and the wiring 103 be equal to each other or the wiring DL be brought into a floating state. In the case where the pixel circuit 51A has the structure of FIG. 7, the wiring GLa and the wiring GLe are separate wirings; thus, supply of the potential L to the wiring GLa and the potential H to the wiring GLe enables the reset operation of Period T11 to be performed.

Figure 19:
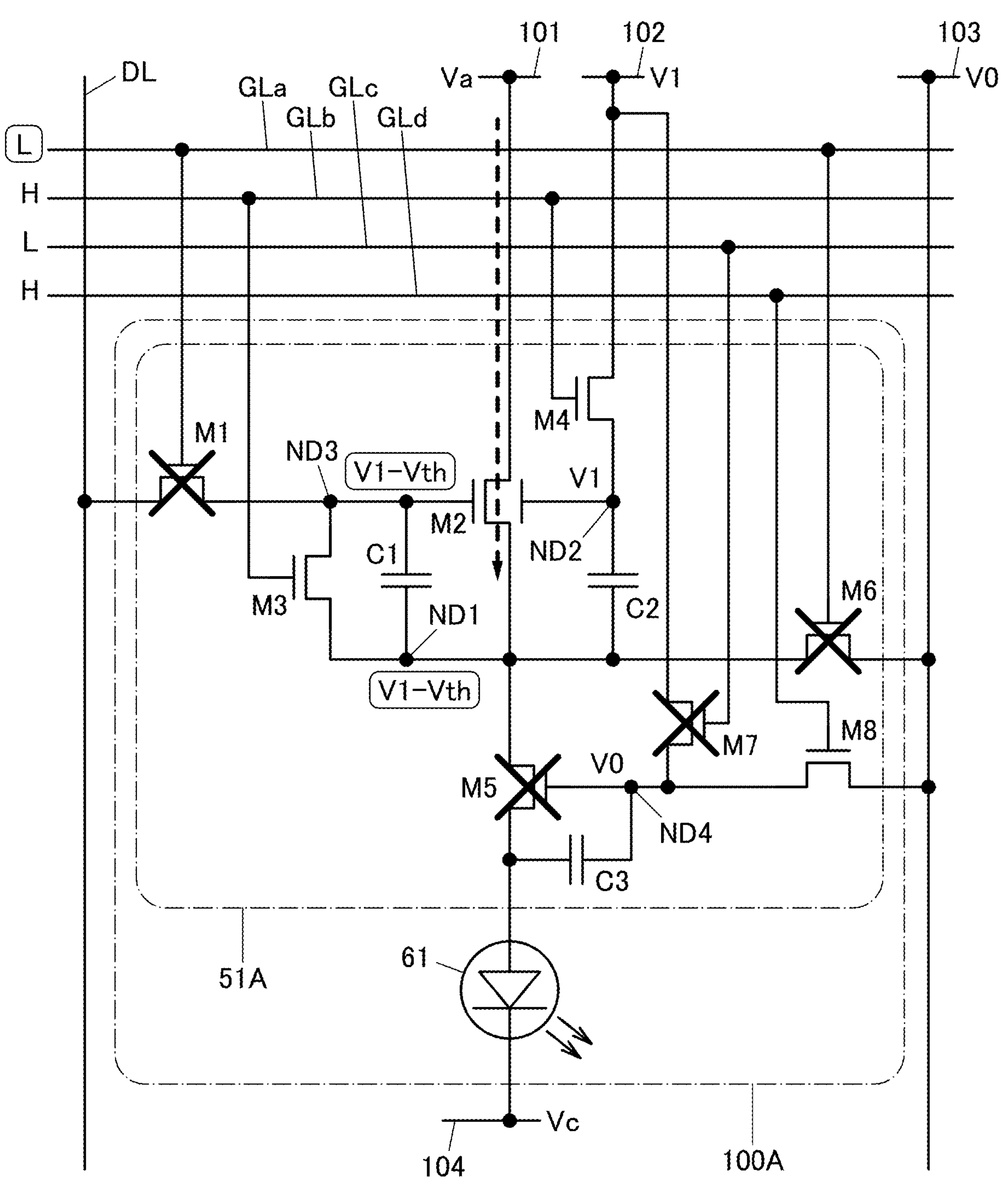
FIG. 19 is a diagram illustrating an operation of a semiconductor device.

Next, in Period T12, the potential L is supplied to the wiring GLa (see FIG. 19). Thus, the transistor M1 and the transistor M6 are turned off.

Since the potential of the node ND2 is the potential V1, the transistor M2 is in the on state. Thus, the potential of the node ND1 increases through the wiring 101 and the transistor M2. Since the transistor M3 is also in the on state, the potential of the node ND3 also increases. Specifically, the potentials of the node ND1 and the node ND3 each increase to a value obtained by subtracting Vth of the transistor M2 from the potential V1.

Figure 20:
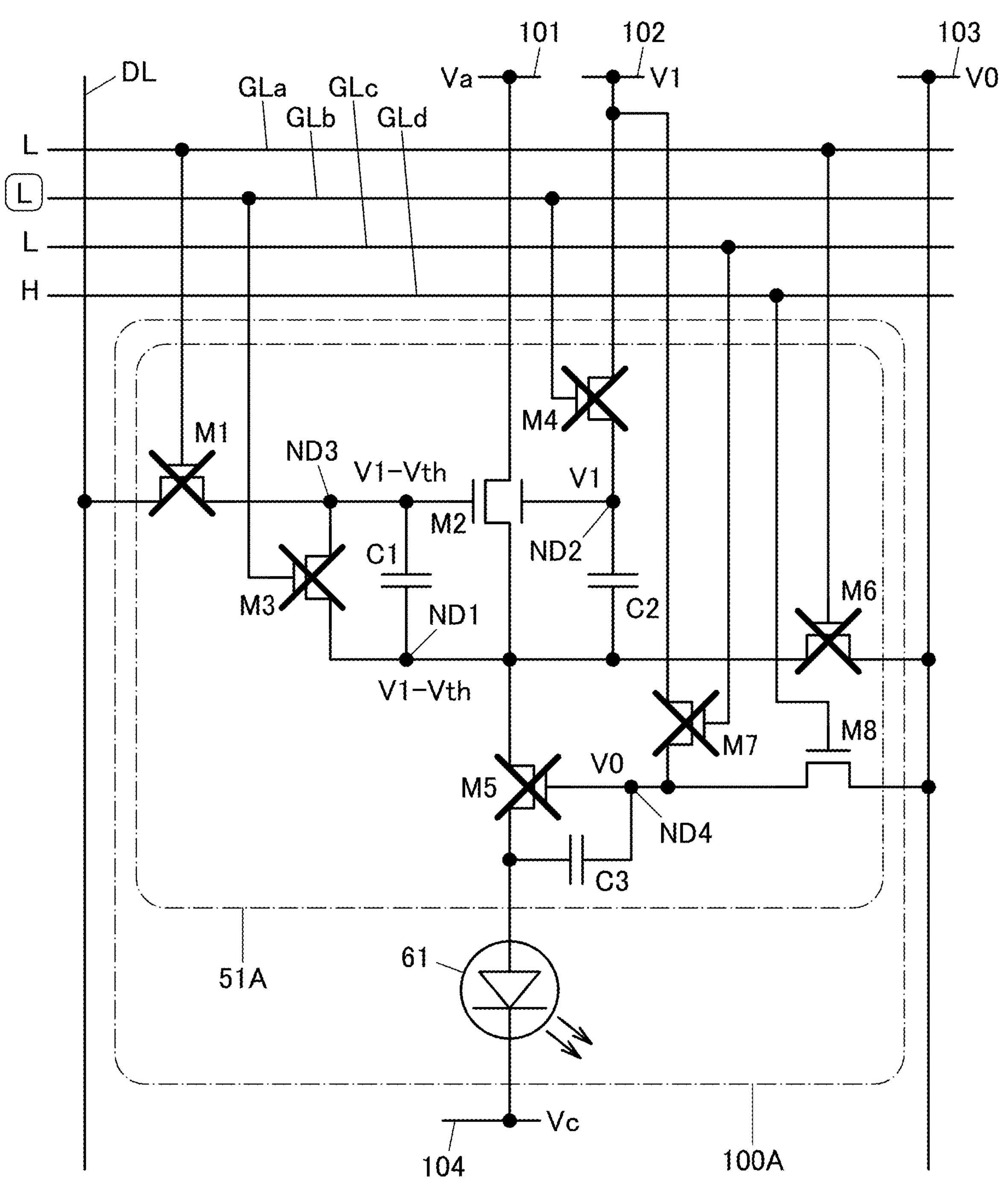
FIG. 20 is a diagram illustrating an operation of a semiconductor device.

Next, in Period T13, the potential L is supplied to the wiring GLb (see FIG. 20). Thus, the transistor M3 and the transistor M4 are turned off. Accordingly, the node ND1, the node ND2, and the node ND3 are brought into a floating state; hence, charge supplied to the nodes is retained.

[Data Writing Operation]

Figure 21:
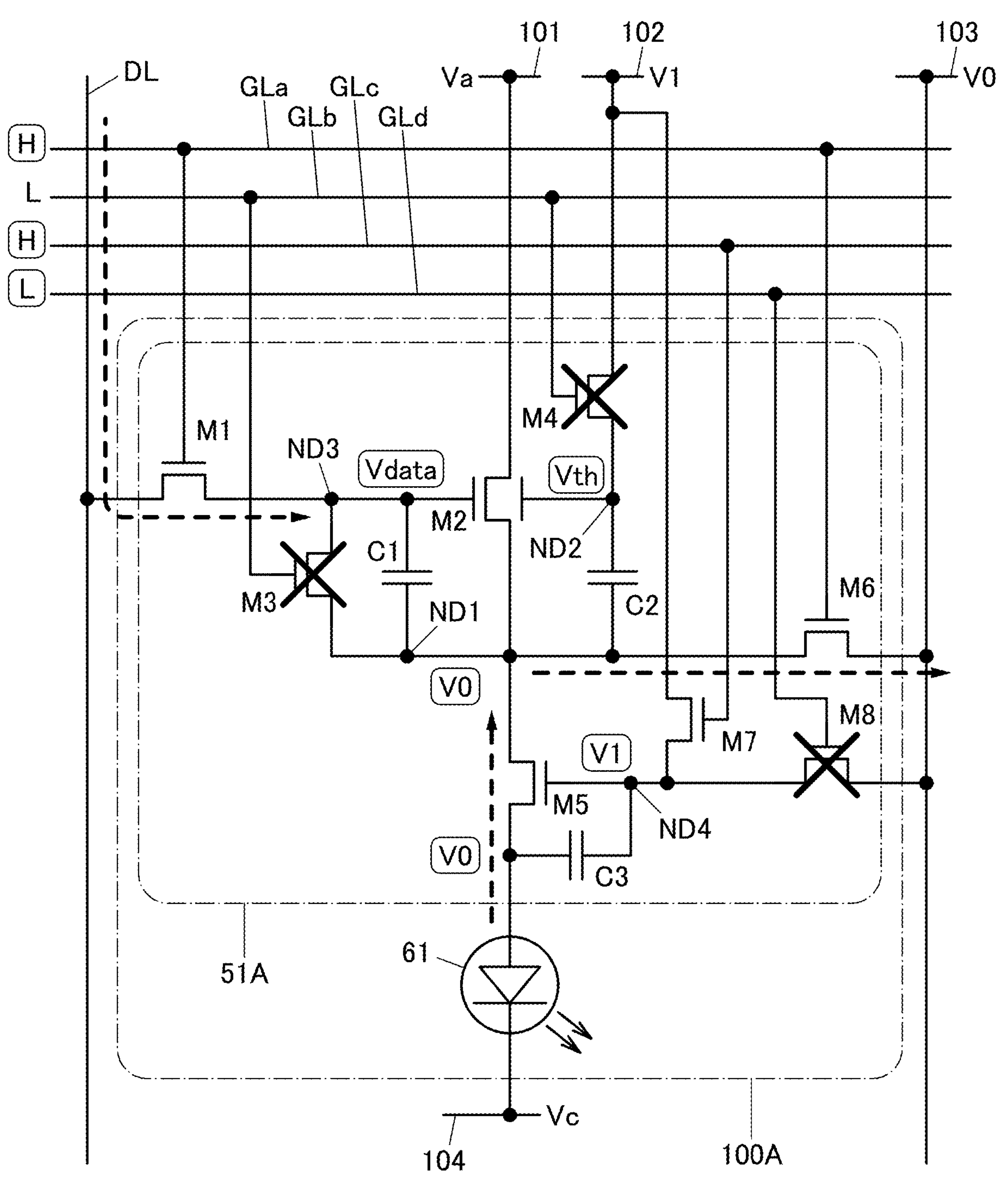
FIG. 21 is a diagram illustrating an operation of a semiconductor device.

In Period T14, the potential H is supplied to the wiring GLa, the potential H is supplied to the wiring GLc, and the potential L is supplied to the wiring GLd (see FIG. 21). Thus, the transistor M1 is turned on, and the video signal Vdata is supplied to the node ND3. The transistor M6 is also turned on, and the potential V0 is supplied to the node ND1.

The node ND1 and the node ND2 are capacitively coupled through the capacitor C2; thus, when the potential of the node ND1 changes from V1−Vth to V0, the potential of the node ND2 changes in a similar manner. Since the potential V0 is 0 V in this embodiment and the like, the potential of the node ND2 is represented by the potential V1−(the potential V1−Vth). That is, the potential of the node ND2 becomes Vth.

The transistor M7 is turned on and the transistor M8 is turned off, so that the potential V1 is supplied to the node ND4. Moreover, the transistor M5 is turned on, so that the potential of the anode terminal of the light-emitting element 61 becomes the potential V0.

Figure 22:
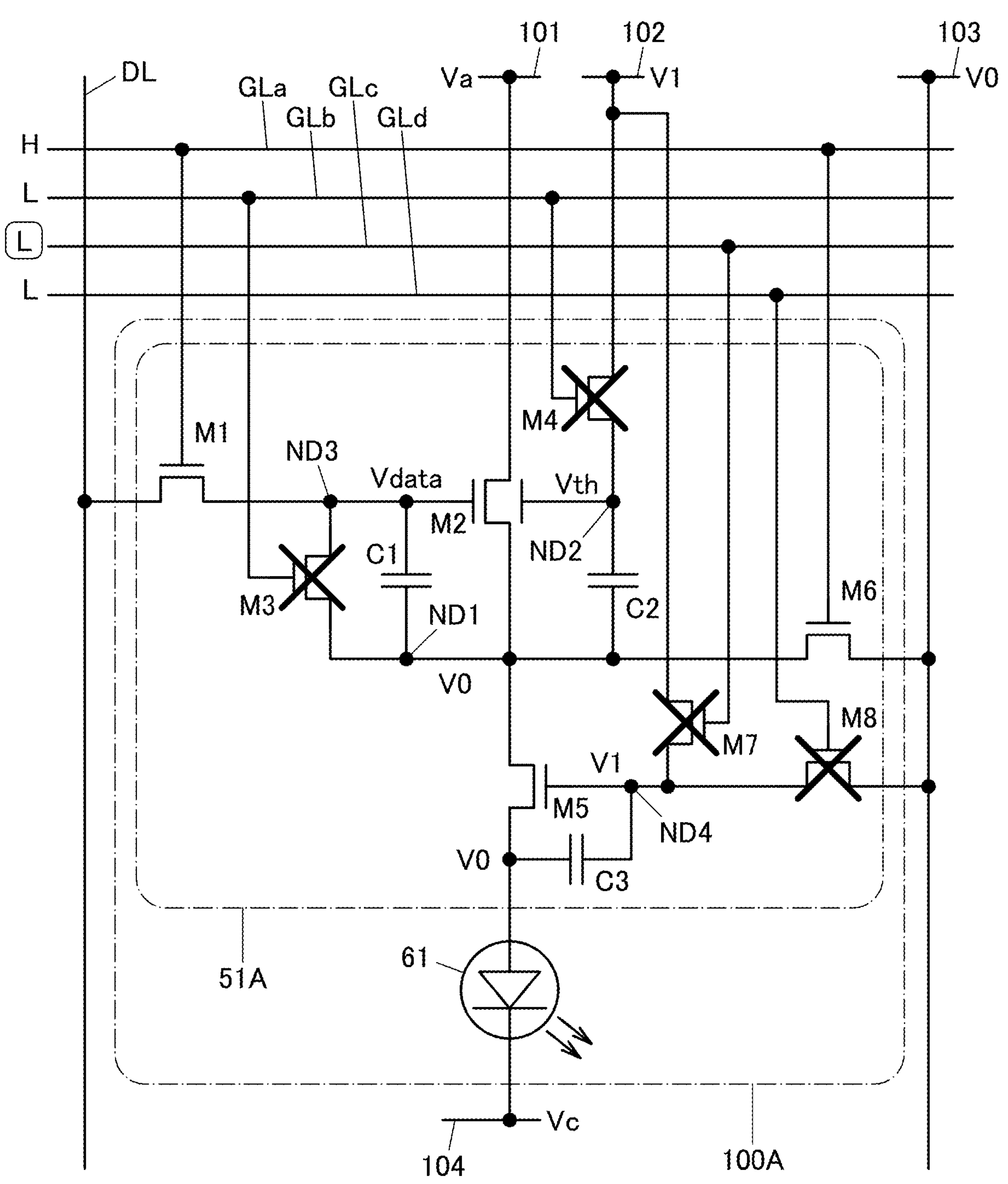
FIG. 22 is a diagram illustrating an operation of a semiconductor device.

Next, in Period T15, the potential L is supplied to the wiring GLc (see FIG. 22). Thus, the transistor M7 is turned off, and the node ND4 is brought into a floating state.

[Light-Emitting Operation]

Figure 23:
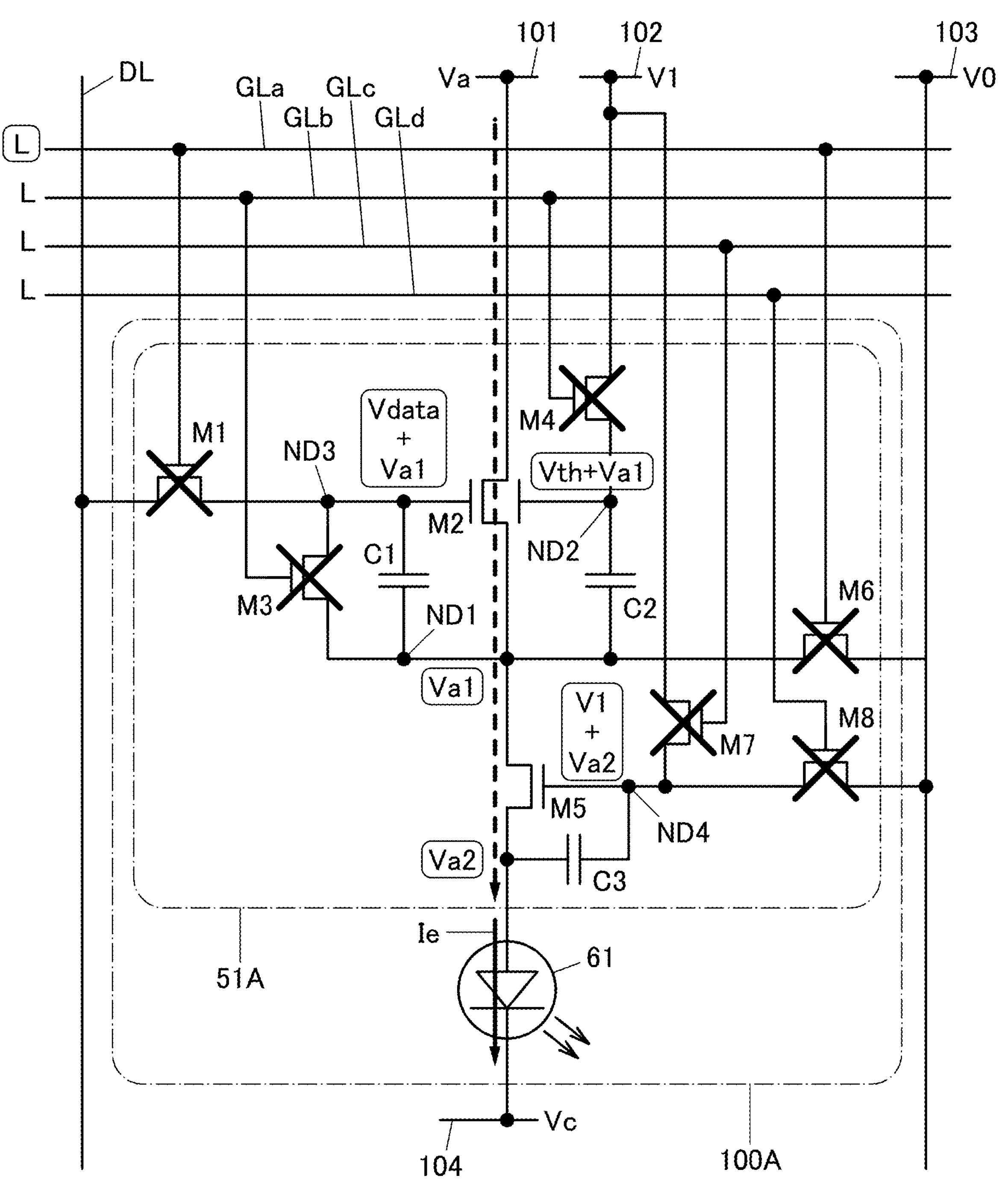
FIG. 23 is a diagram illustrating an operation of a semiconductor device.

In Period T16, the potential L is supplied to the wiring GLa (see FIG. 23). Thus, the transistor M1 and the transistor M6 are turned off. Current flows from the wiring 101 to the wiring 104. That is, the current Ie flows through the light-emitting element 61, and the light-emitting element 61 emits light with luminance corresponding to the current Ie. When current flows from the wiring 101 to the wiring 104, the potentials of the node ND1 and the anode terminal of the light-emitting element 61 increase.

The node ND2 and the node ND3 are brought into a floating state. The node ND1 and the node ND3 are capacitively coupled through the capacitor C1. In Period T16, when the potential of the node ND1 changes from the potential V0 to a potential Va1, the potential of the node ND3 changes in a similar manner. Here, the potential of the node ND3 becomes the video signal Vdata+the potential Va1. That is, even when the source potential of the transistor M2 changes, the potential difference (voltage) between the gate and the source of the transistor M2 is kept at the video signal Vdata.

Similarly, the potential of the node ND2 changes to Vth+the potential Va1 in accordance with the potential change of the node ND1. Thus, the potential difference between the back gate and the source of the transistor M2 is kept at Vth.

The anode terminal of the light-emitting element 61 and the node ND4 are capacitively coupled through the capacitor C3. Thus, when the potential of the anode terminal of the light-emitting element 61 changes from the potential V0 to a potential Va2, the potential of the node ND4 changes in a similar manner. Here, the potential of the node ND4 becomes the potential V1+the potential Va2. That is, even when the potential of the anode terminal of the light-emitting element 61 changes, the potential difference (voltage) between the gate and the source of the transistor M5 is kept at the potential V1−the potential V0.

In the case where the gate of the transistor M5 has a fixed potential, for example, an increase in the source potential of the transistor M5 reduces the potential difference between its gate and source. When the potential difference between the gate and the source falls below the threshold voltage of the transistor M5, the transistor M5 is turned off Thus, increasing the anode potential requires supply of a high potential also to the gate, which creates the need for adding a power source or a power supply circuit for supplying the high potential.

In the semiconductor device 100A of one embodiment of the present invention, the capacitor C3 is provided between the gate and the source of the transistor M5 so that a bootstrap circuit can be formed; thus, even when the anode potential is increased, the transistor M5 can be kept in the on state without addition of a power supply circuit. Accordingly, the current Ie can be stably supplied to the light-emitting element 61. Note that the capacitor C3 is sometimes referred to as a "bootstrap capacitor". The capacitor C1 and the capacitor C2 each also function as a bootstrap capacitor.

The semiconductor device 100A of one embodiment of the present invention can be suitably used not only in a light-emitting element with a single structure but also in a light-emitting element with a tandem structure that requires a higher driving voltage than the light-emitting element with a single structure. Note that the structures of a light-emitting element will be described later.

As described above, the amount of current Ie flowing through the light-emitting element 61 is determined by the video signal Vdata and Vth of the transistor M2. When the threshold correction operation is performed in the semiconductor device 100A of one embodiment of the present invention, the amount of current Ie flowing through the light-emitting element 61 can be controlled by the video signal Vdata.

Since the emission luminance of the light-emitting element 61 is controlled by the video signal Vdata, the transistor M5 needs to be surely turned on at the time of the light-emitting operation. In the semiconductor device 100A of one embodiment of the present invention, the transistor M5 can be surely turned on at the time of the light-emitting operation. When the semiconductor device 100A of one embodiment of the present invention is used for a display device, the current Ie can be accurately controlled so that the color reproducibility of halftones can be increased. Consequently, the display quality of the display device can be improved.

[Turn-Off Operation]

Figure 24:
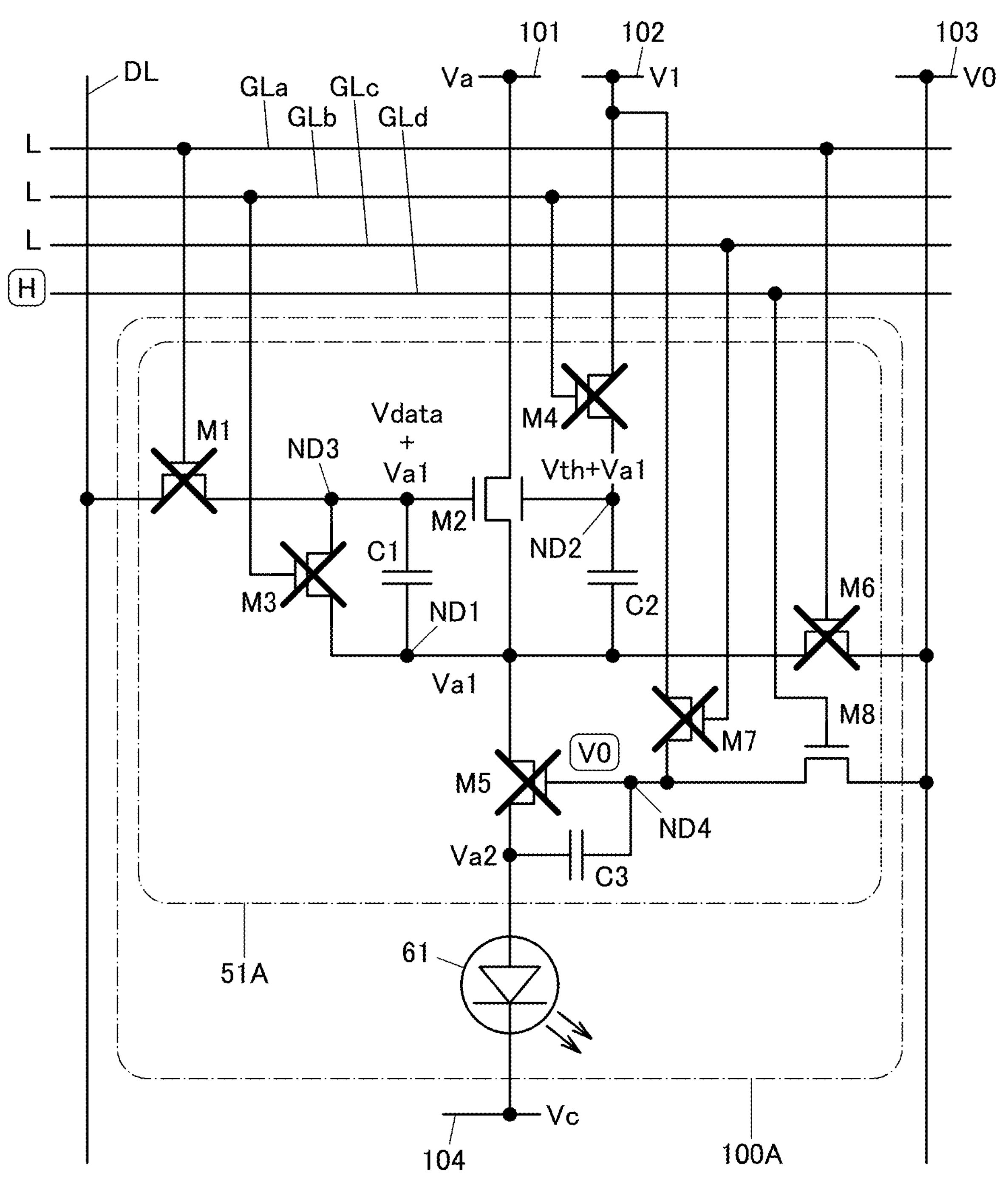
FIG. 24 is a diagram illustrating an operation of a semiconductor device.

In Period T17, the potential H is supplied to the wiring GLd (see FIG. 24). Thus, the transistor M8 is turned on. Then, the potential V0 is supplied from the wiring 103 to the node ND4, so that the transistor M5 is turned off. Current does not flow through the light-emitting element 61 when the transistor M5 is in the off state; thus, light emission from the light-emitting element 61 is stopped.

In a display device using a light-emitting element such as an EL element as a display element, the light-emitting element can continuously emit light during one frame period. Such a driving method is also referred to as a "hold type" or "hold-type driving". When the hold-type driving is used as a driving method of a display device, a flicker phenomenon or the like on a display screen can be reduced. However, the hold-type driving is likely to cause an afterimage, an image blur, and the like in moving image display. The resolution that is perceived by a person in displaying moving images is also referred to as "moving image resolution". That is, the hold-type driving is likely to decrease the moving image resolution.

In addition, "black insertion driving" that reduces an afterimage, an image blur, and the like in moving image display is known. The "black insertion driving" is also referred to as a "pseudo impulsive type" or "pseudo impulsive driving". The black insertion driving refers to a driving method in which black display is performed in every other frame or black display is performed for a certain period in one frame.

The semiconductor device 100A of one embodiment of the present invention easily achieves the black insertion driving by the turn-off operation. A display device using the semiconductor device 100A of one embodiment of the present invention can achieve high-quality moving image display whose moving image resolution is unlikely to decrease.

The structure described in this embodiment can be used in an appropriate combination with any of the structures described in the other embodiments and examples.

Embodiment 2

In this embodiment, a semiconductor device 100B of one embodiment of the present invention will be described. The semiconductor device 100B is a modification example of the semiconductor device 100A. Thus, in order to reduce repeated description, differences of the semiconductor device 100B from the semiconductor device 100A are mainly described.

Structure Example

Figure 25:
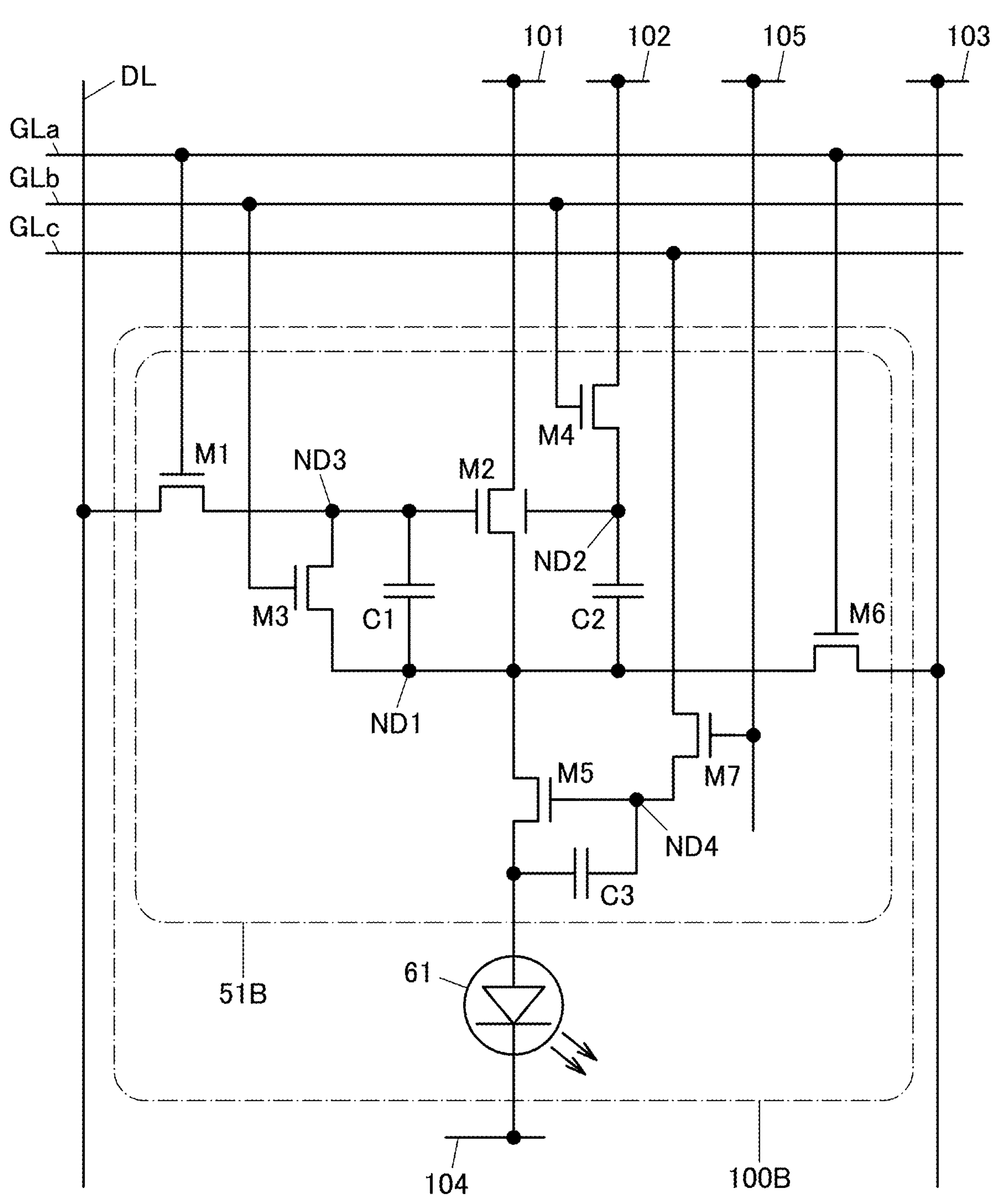
FIG. 25 is a diagram illustrating a semiconductor device.

FIG. 25 illustrates a circuit structure example of the semiconductor device 100B. The semiconductor device 100B includes a pixel circuit 51B and the light-emitting element 61. The pixel circuit 51B has a structure in which the transistor M8 is removed from the pixel circuit 51A. Thus, the wiring GLd electrically connected to the gate of the transistor M8 can be eliminated. The one of the source and the drain of the transistor M7 is electrically connected to the wiring GLc, and the gate of the transistor M7 is electrically connected to a wiring 105.

Operation Example

Figure 26:
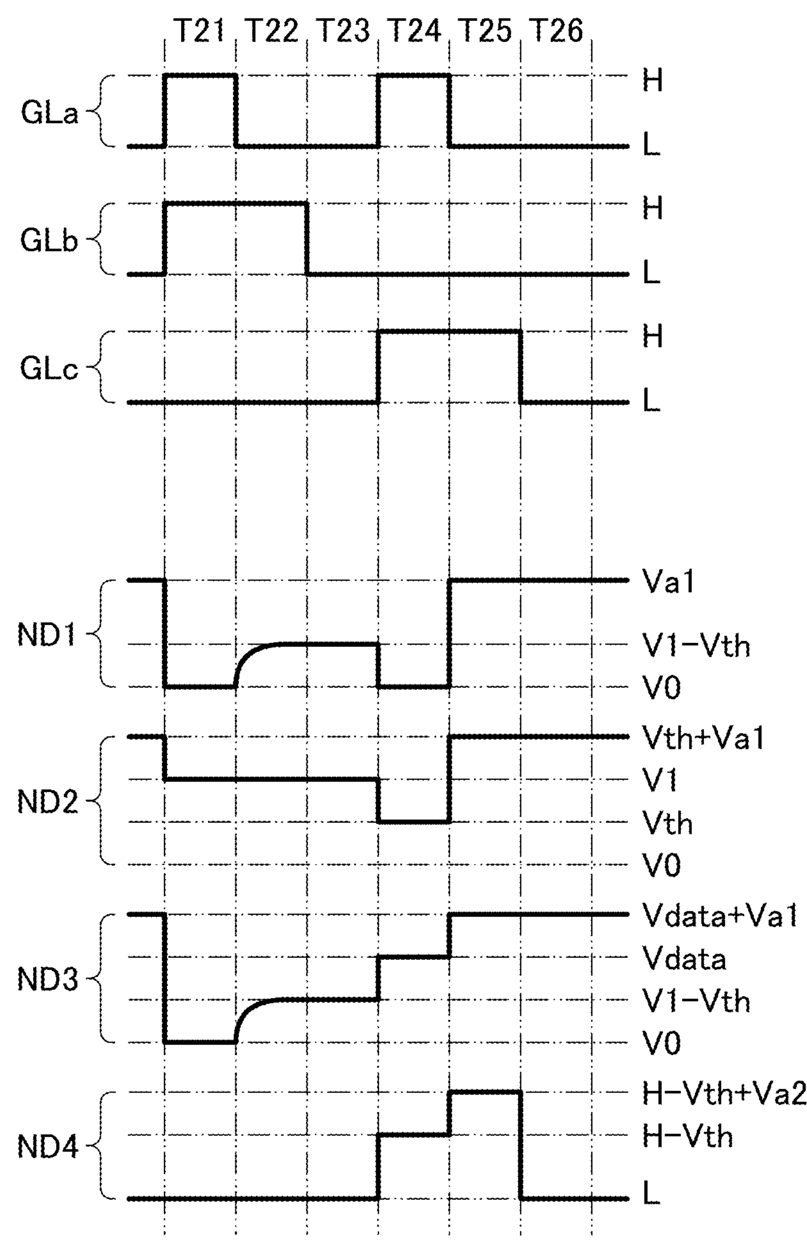
FIG. 26 is a timing chart showing an operation of a semiconductor device.
Figure 27:
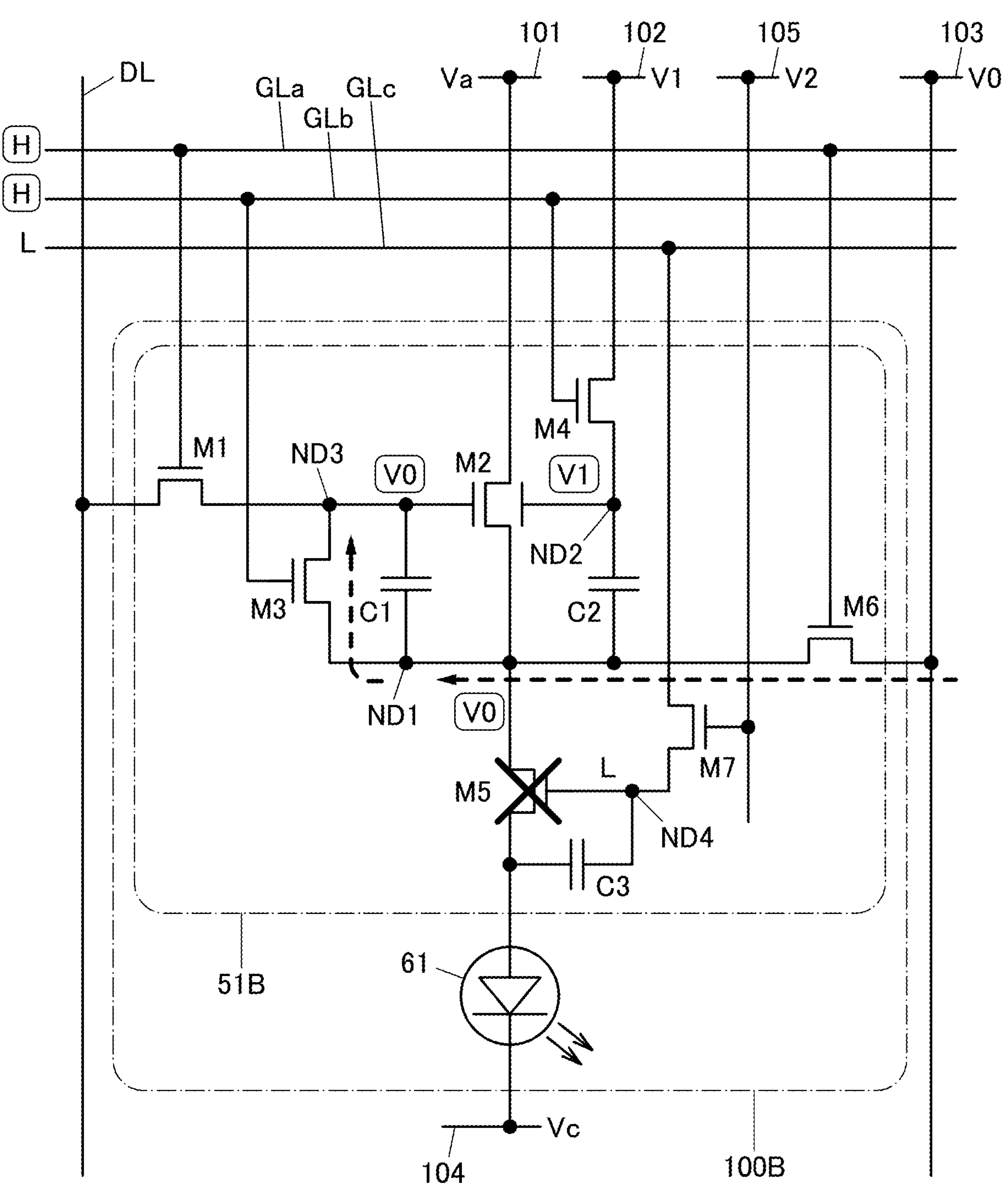
FIG. 27 is a diagram illustrating an operation of a semiconductor device.

Next, an operation example of the semiconductor device 100B will be described with reference to drawings. FIG. 26 is a timing chart showing the operation example of the semiconductor device 100B. FIG. 27 to FIG. 32 are circuit diagrams illustrating the operation example of the semiconductor device 100B.

A potential V2 is supplied to the wiring 105. The potential V2 is a potential higher than the potential V1. The potential V2 is a potential lower than or equal to the potential H. In this embodiment and the like, the potential V2 is 6 V.

[Vth Correction Operation]

First, a reset operation is performed in Period T21. Specifically, the potential H is supplied to the wiring GLa and the wiring GLb, and the potential L is supplied to the wiring GLc (see FIG. 27). Thus, the transistor M1, the transistor M3, the transistor M4, the transistor M6, and the transistor M7 are turned on.

The potential V0 is supplied to the node ND1 through the transistor M6. Furthermore, the potential V0 is supplied to the node ND3 through the transistor M6 and the transistor M3. The potential V1 is supplied to the node ND2 through the transistor M4. The potential L is supplied to the node ND4 through the transistor M7. Accordingly, the transistor M5 is turned off.

As in Period T11 described above, it is preferable in Period T21 that the potentials of the wiring DL and the wiring 103 be equal to each other or the wiring DL be brought into a floating state.

Figure 28:
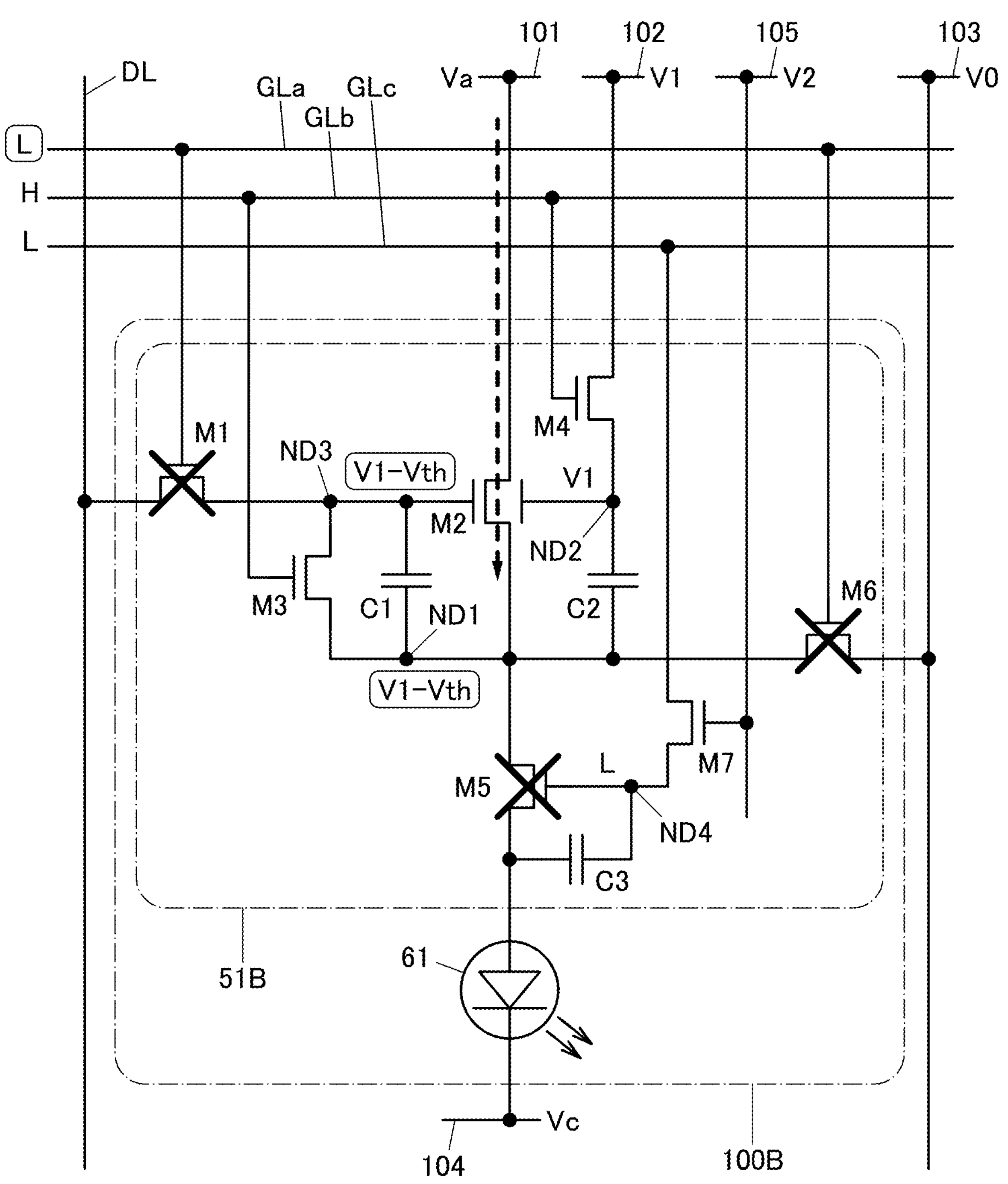
FIG. 28 is a diagram illustrating an operation of a semiconductor device.

Next, in Period T22, the potential L is supplied to the wiring GLa (see FIG. 28). Thus, the transistor M1 and the transistor M6 are turned off. As in Period T12 described above, the potentials of the node ND1 and the node ND3 each increase to a value obtained by subtracting Vth of the transistor M2 from the potential V1.

Figure 29:
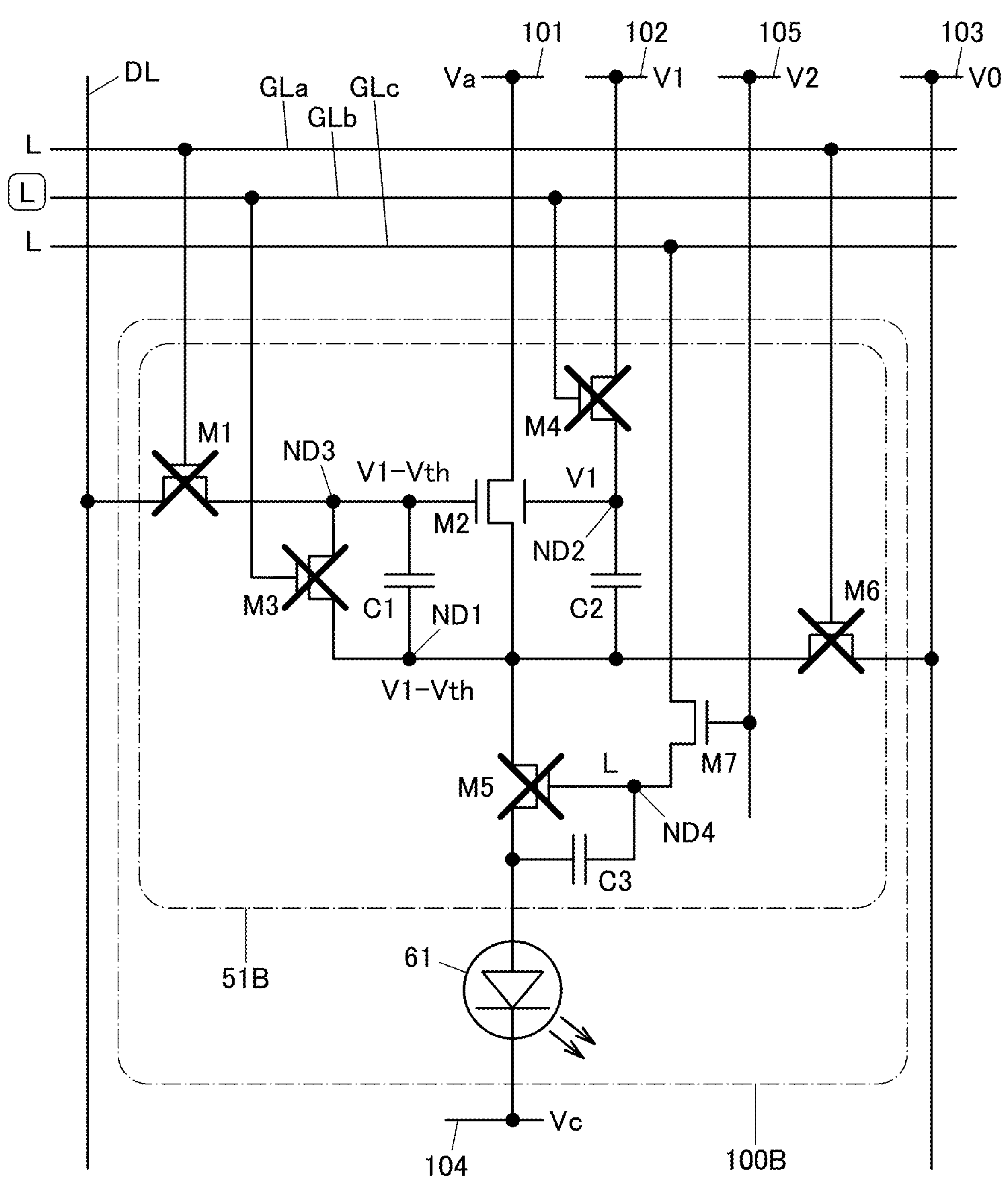
FIG. 29 is a diagram illustrating an operation of a semiconductor device.

Next, in Period T23, the potential L is supplied to the wiring GLb (see FIG. 29). Thus, the transistor M3 and the transistor M4 are turned off. The node NDT, the node ND2, and the node ND3 are brought into a floating state; hence, charge supplied to the nodes is retained.

[Data Writing Operation]

Figure 30:
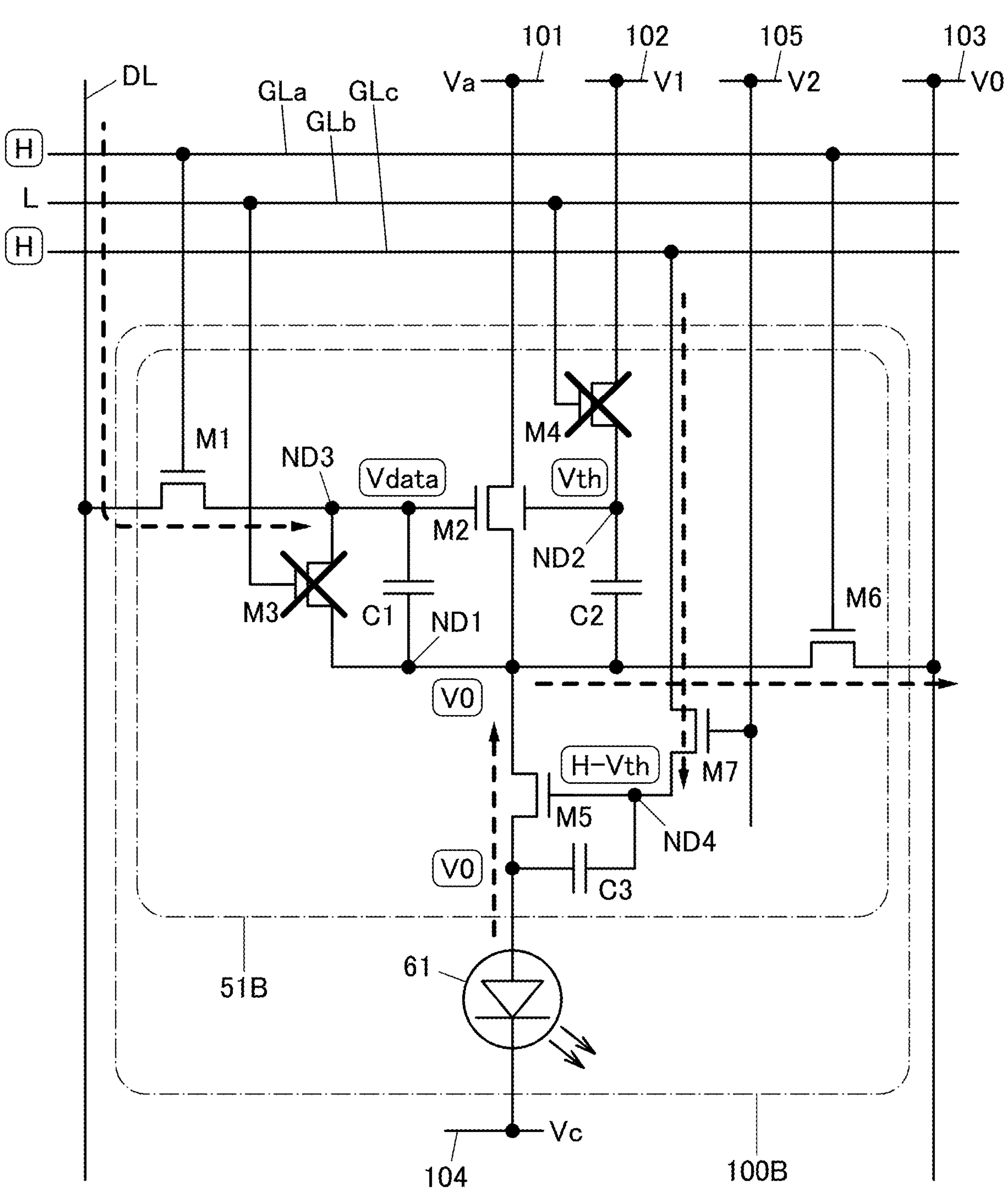
FIG. 30 is a diagram illustrating an operation of a semiconductor device.

In Period T24, the potential H is supplied to the wiring GLa, and the potential H is supplied to the wiring GLc (see FIG. 30). Thus, the transistor M1 is turned on, and the video signal Vdata is supplied to the node ND3. The transistor M6 is also turned on, and the potential V0 is supplied to the node ND1. As in Period T14 described above, the potential of the node ND2 becomes Vth.

Since the transistor M7 is in the on state, charge is supplied from the wiring GLc to the node ND4. The potential of the node ND4 increases to a value obtained by subtracting Vth of the transistor M7 from the potential H. In this embodiment and the like, the potential H is 6 V. When Vth of each of the transistor M5 and the transistor M7 is 1 V, the potential of the node ND4, (the potential H−Vth), becomes 5 V. Thus, the transistor M5 is turned on.

[Light-Emitting Operation]

Figure 31:
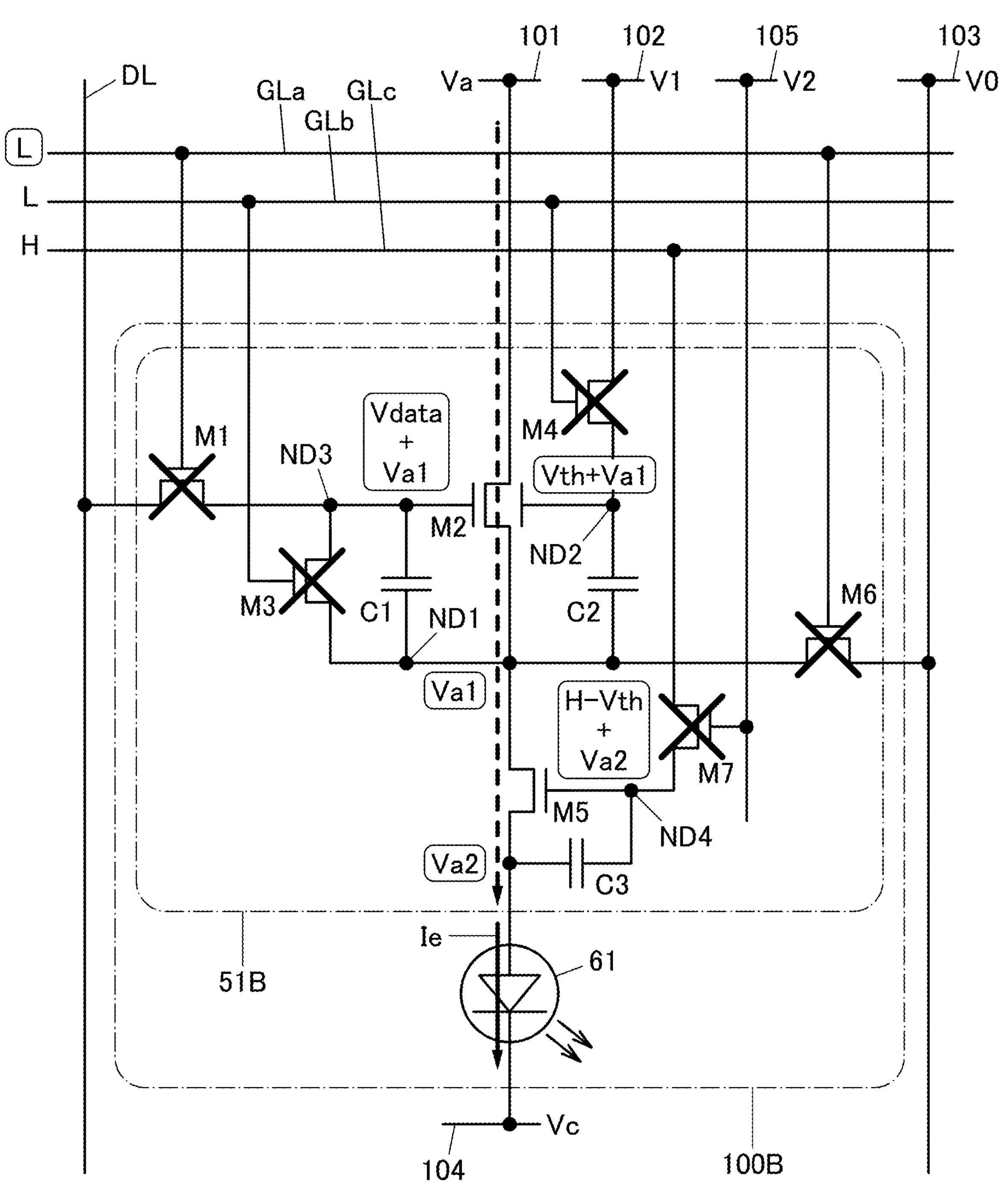
FIG. 31 is a diagram illustrating an operation of a semiconductor device.

In Period T25, the potential L is supplied to the wiring GLa (see FIG. 31). Thus, the transistor M1 and the transistor M6 are turned off. As in Period T16 described above, current flows from the wiring 101 to the wiring 104, and the light-emitting element 61 emits light with luminance corresponding to the current Ie. The potentials of the node ND1 and the anode terminal of the light-emitting element 61 increase. The potential of the node ND1 becomes the potential Va1, and the potential of the anode terminal becomes the potential Va2. The potential of the node ND3 becomes the video signal Vdata+the potential Va1, and the potential of the node ND2 becomes Vth+the potential Va1.

The node ND4 is in a floating state and the potential difference between the node ND4 and the anode terminal is kept through the capacitor C3. Thus, the potential of the node ND4 changes in accordance with the potential change of the anode terminal of the light-emitting element 61. When the potential of the anode terminal increases from the potential V0 to the potential Va2, the potential of the node ND4 becomes the potential H−Vth+the potential Va2. That is, even when the potential of the anode terminal corresponding to the source side of the transistor M5 increases, the on state of the transistor M5 is surely kept.

In this embodiment, the potential H and the potential V2 are both 6 V (the same potential). Thus, the potential of the node ND4 is higher than the potentials of the gate and the one of the source and the drain of the transistor M7, so that the transistor M7 is turned off

[Turn-Off Operation]

Figure 32:
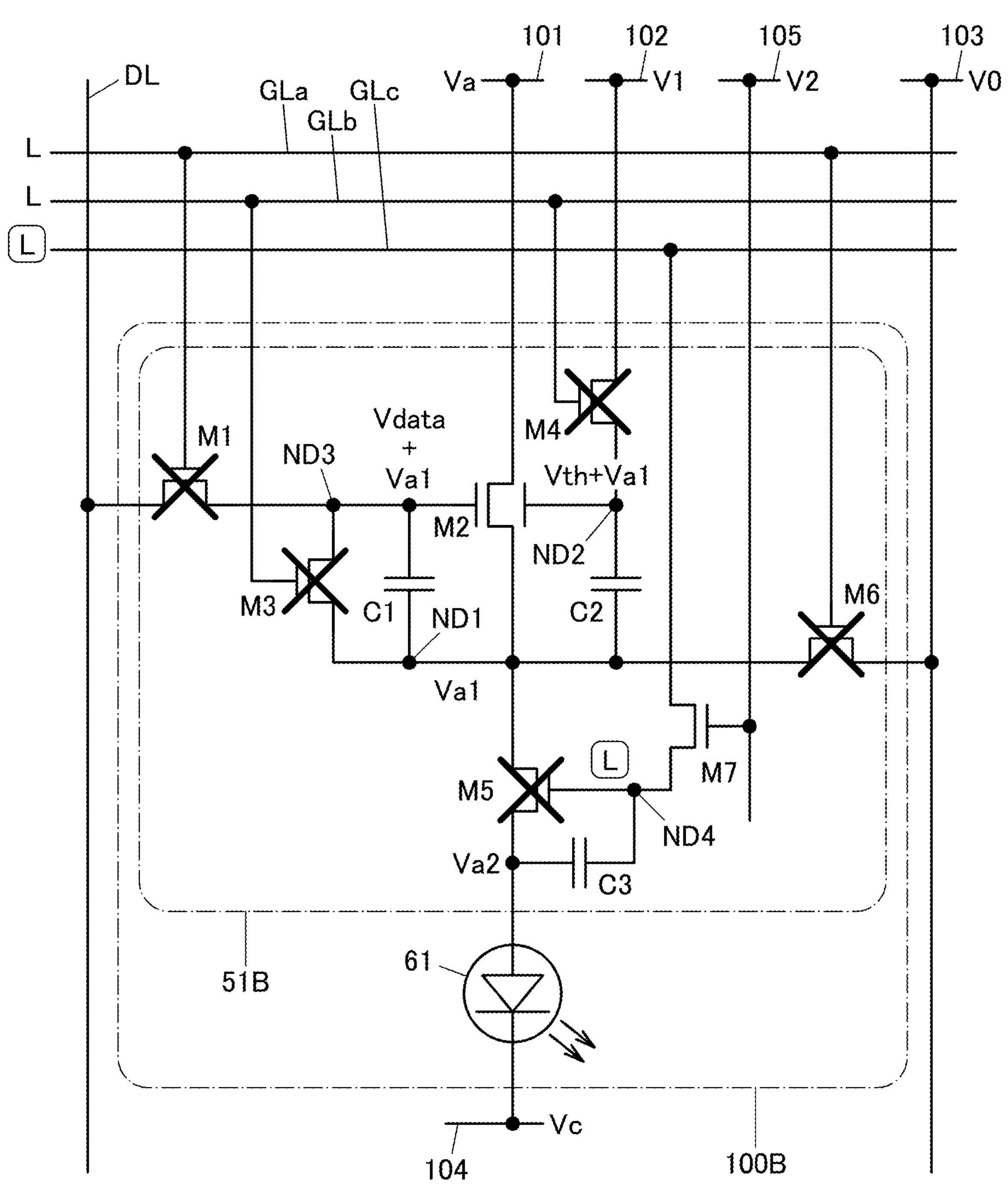
FIG. 32 is a diagram illustrating an operation of a semiconductor device.

In Period T26, the potential L is supplied to the wiring GLc (see FIG. 32). Thus, the transistor M7 is turned on, and the potential of the node ND4 becomes the L potential. When the potential of the node ND4 becomes the L potential, the transistor M5 is turned off and thus light emission from the light-emitting element 61 is stopped.

Like the semiconductor device 100A, the semiconductor device 100B can be suitably used not only in a light-emitting element with a single structure but also in a light-emitting element with a tandem structure that requires a higher driving voltage than the light-emitting element with a single structure. In addition, as in the semiconductor device 100A, the black insertion driving can be performed. A display device using the semiconductor device 100B of one embodiment of the present invention can achieve high-quality moving image display whose moving image resolution is unlikely to decrease.

The structure described in this embodiment can be used in an appropriate combination with any of the structures described in the other embodiments and examples.

Embodiment 3

In this embodiment, a semiconductor device 100C of one embodiment of the present invention will be described. The semiconductor device 100C is a modification example of the semiconductor device 100B. Thus, the semiconductor device 100C is also a modification example of the semiconductor device 100A. In order to reduce repeated description, differences of the semiconductor device 100C from the semiconductor device 100A and the semiconductor device 100B are mainly described.

Structure Example

Figure 33:
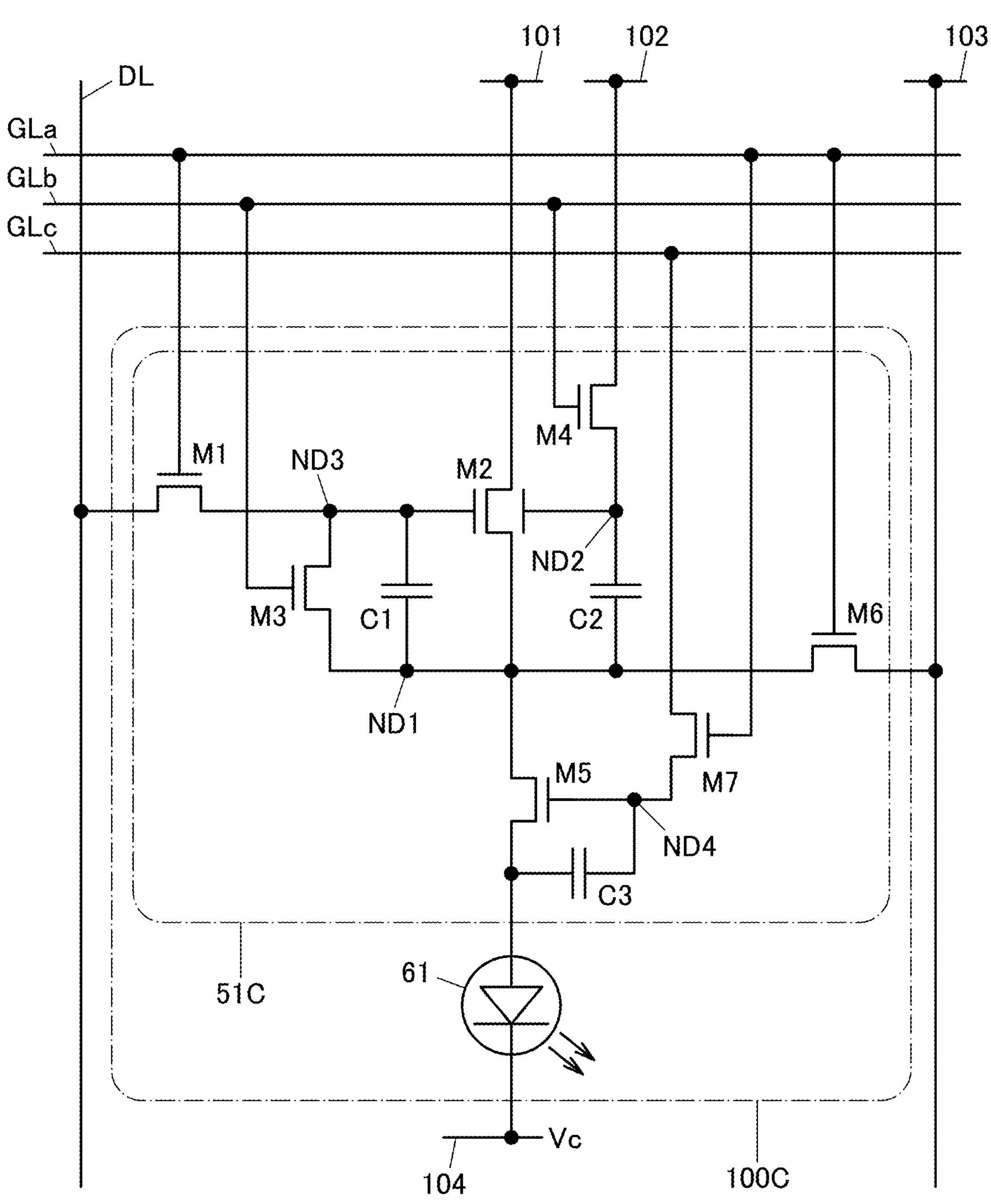
FIG. 33 is a diagram illustrating a semiconductor device.

FIG. 33 illustrates a circuit structure example of the semiconductor device 100C. The semiconductor device 100C includes a pixel circuit 51C and the light-emitting element 61. The pixel circuit 51C is different from the pixel circuit 51B in that the gate of the transistor M7 is electrically connected to the wiring GLa. Thus, the wiring 105 illustrated in FIG. 25 is not necessarily provided. Accordingly, the formation of the wiring 105 can be omitted.

Figure 34:
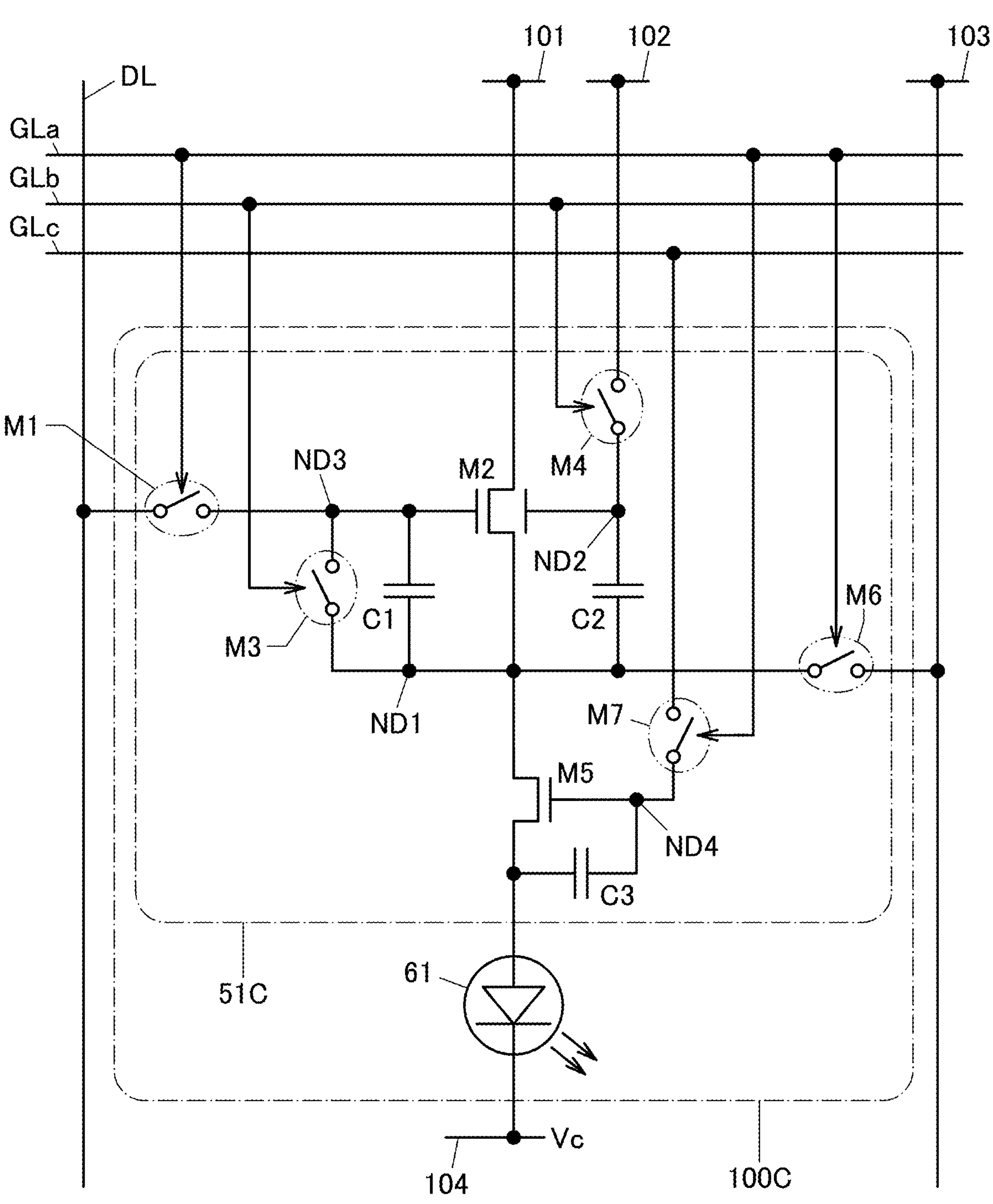
FIG. 34 is a diagram illustrating a semiconductor device.

Among the transistors included in the pixel circuit 51C, the transistor M1, the transistor M3, the transistor M4, the transistor M6, and the transistor M7 function as switches. Hence, the semiconductor device 100C can be illustrated as in FIG. 34.

Operation Example

Figure 35:
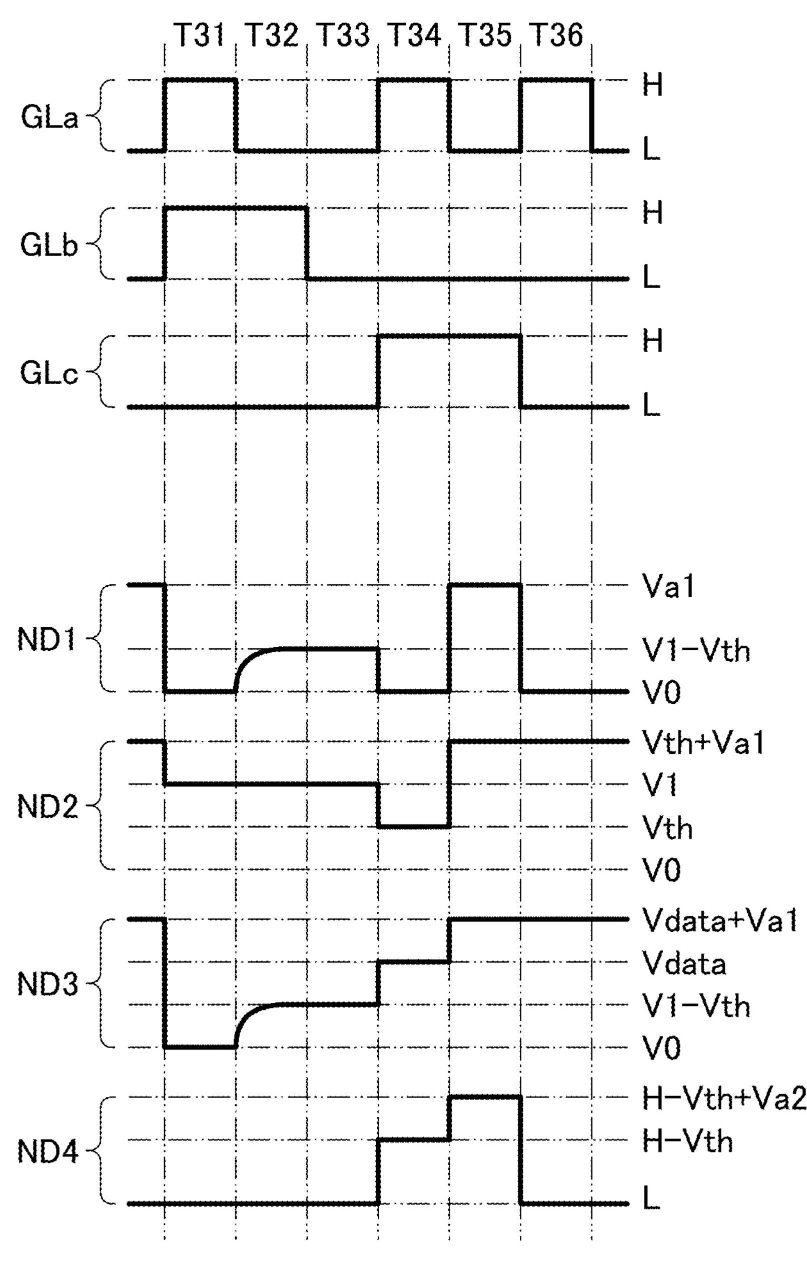
FIG. 35 is a timing chart showing an operation of a semiconductor device.
Figure 36:
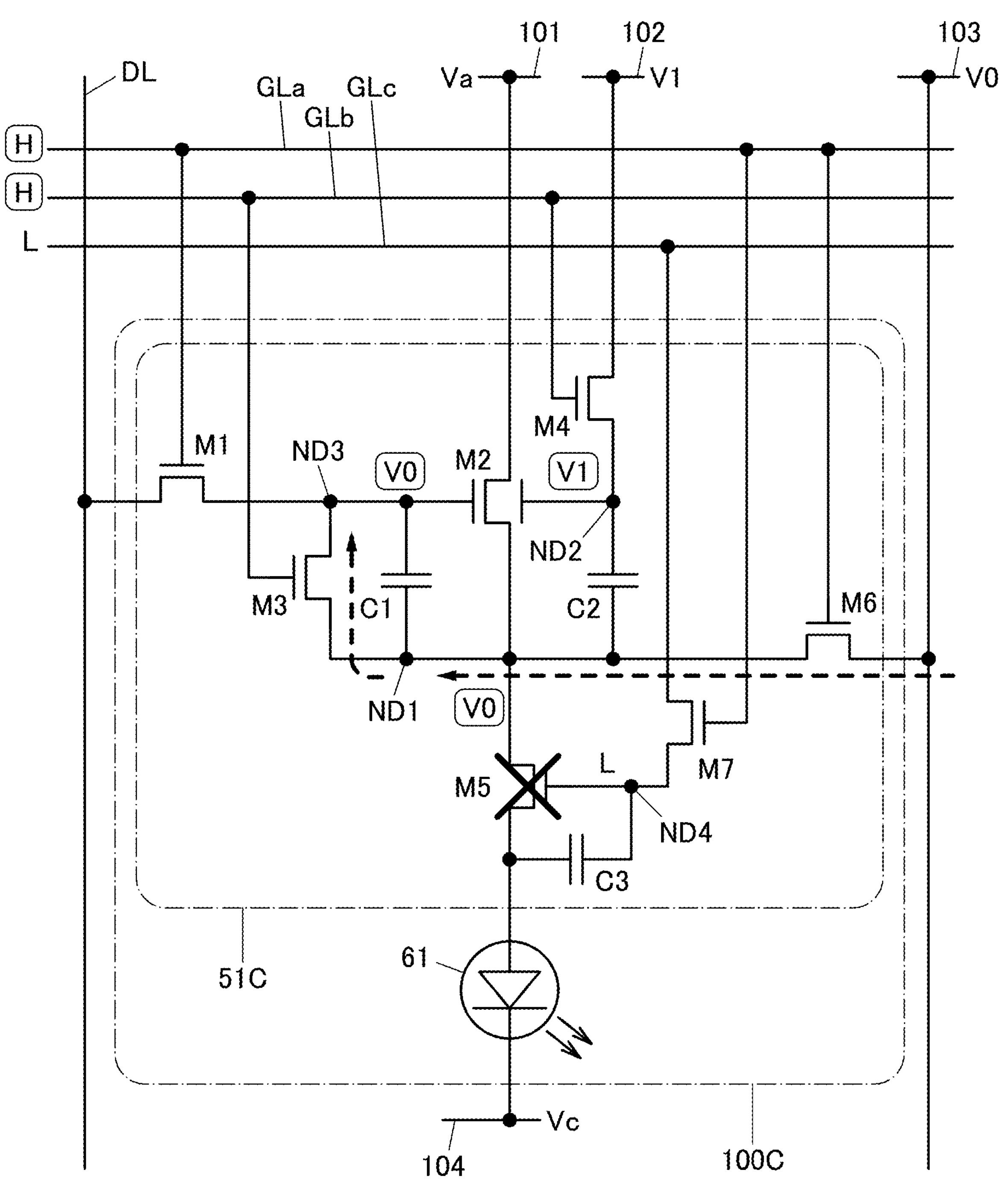
FIG. 36 is a diagram illustrating an operation of a semiconductor device.

Next, an operation example of the semiconductor device 100C will be described with reference to drawings. FIG. 35 is a timing chart showing the operation example of the semiconductor device 100C. FIG. 36 to FIG. 41 are circuit diagrams illustrating the operation example of the semiconductor device 100C

[Vth Correction Operation]

First, a reset operation similar to that in Period T21 is performed in Period T31. Specifically, the potential H is supplied to the wiring GLa and the wiring GLb, and the potential L is supplied to the wiring GLc (see FIG. 36). In Period T31, the transistor M1, the transistor M3, the transistor M4, the transistor M6, and the transistor M7 are turned on.

The potential V0 is supplied to the node ND1 through the transistor M6. Furthermore, the potential V0 is supplied to the node ND3 through the transistor M6 and the transistor M3. The potential V1 is supplied to the node ND2 through the transistor M4. The potential L is supplied to the node ND4 through the transistor M7. Accordingly, the transistor M5 is turned off.

As in Period T21 described above, it is preferable in Period T31 that the potentials of the wiring DL and the wiring 103 be equal to each other or the wiring DL be brought into a floating state.

Figure 37:
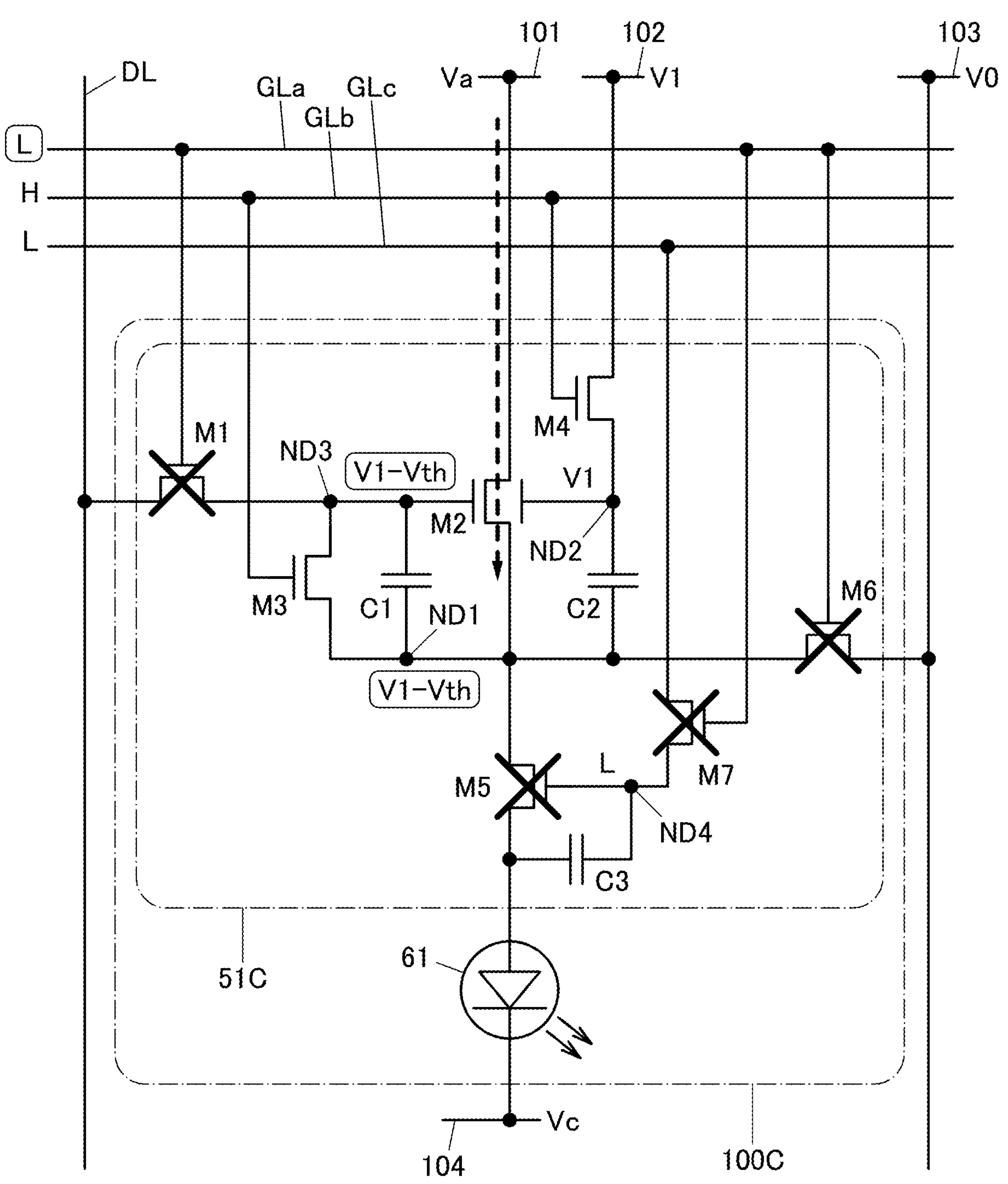
FIG. 37 is a diagram illustrating an operation of a semiconductor device.

Next, in Period T32, the potential L is supplied to the wiring GLa (see FIG. 37). Thus, the transistor M1, the transistor M6, and the transistor M7 are turned off. As in Period T12 described above, the potentials of the node ND1 and the node ND3 each increase to a value obtained by subtracting Vth of the transistor M2 from the potential V1. The node ND4 is brought into a floating state; hence, charge supplied to the node ND4 is retained.

Figure 38:
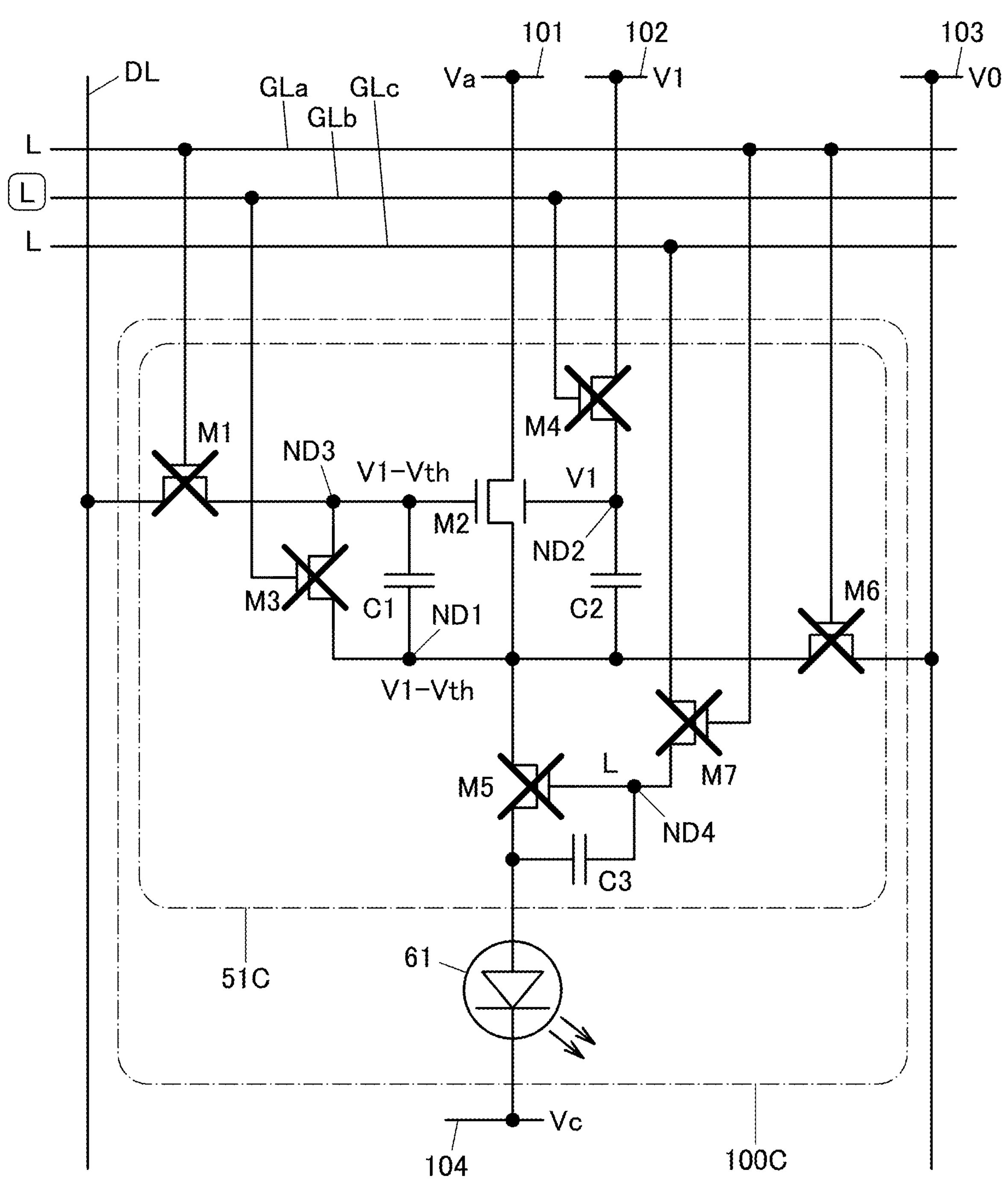
FIG. 38 is a diagram illustrating an operation of a semiconductor device.

Next, in Period T33, the potential L is supplied to the wiring GLb (see FIG. 38). Thus, the transistor M3 and the transistor M4 are turned off. The node ND1, the node ND2, and the node ND3 are brought into a floating state; hence, charge supplied to the nodes is retained.

[Data Writing Operation]

Figure 39:
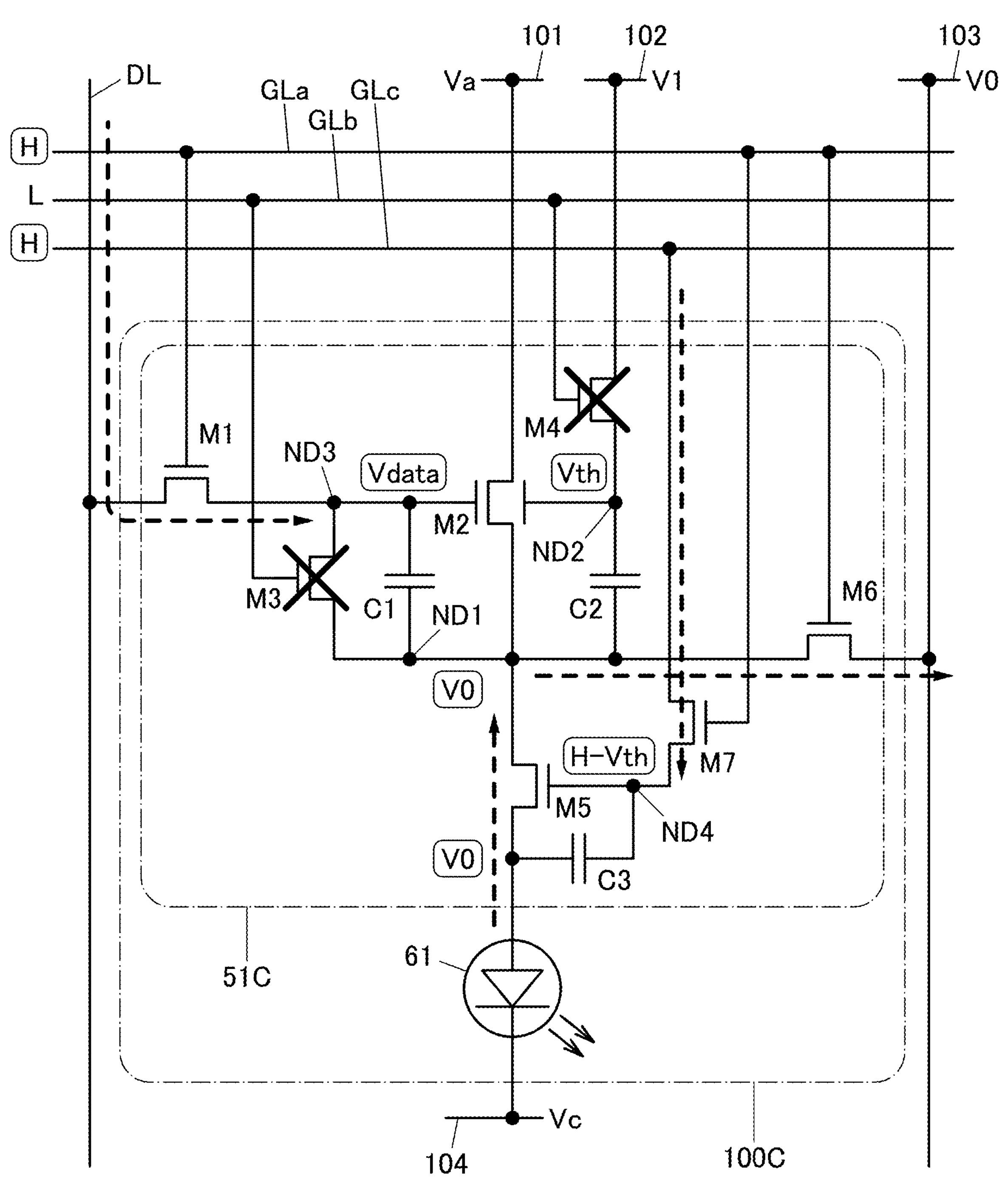
FIG. 39 is a diagram illustrating an operation of a semiconductor device.

In Period T34, the potential H is supplied to the wiring GLa, and the potential H is supplied to the wiring GLc (see FIG. 39). Thus, the transistor M1 is turned on, and the video signal Vdata is supplied to the node ND3. The transistor M6 is also turned on, and the potential V0 is supplied to the node ND1. As in Period T24 described above, the potential of the node ND2 becomes Vth.

The transistor M7 is turned on, and charge is supplied from the wiring GLc to the node ND4. The potential of the node ND4 increases to a value obtained by subtracting Vth of the transistor M7 from the potential H. Since the potential H is 6 V in this embodiment and the like, when Vth of each of the transistor M5 and the transistor M7 is 1 V, the potential of the node ND4, (the potential H−Vth), becomes 5 V. Thus, the transistor M5 is turned on.

[Light-Emitting Operation]

Figure 40:
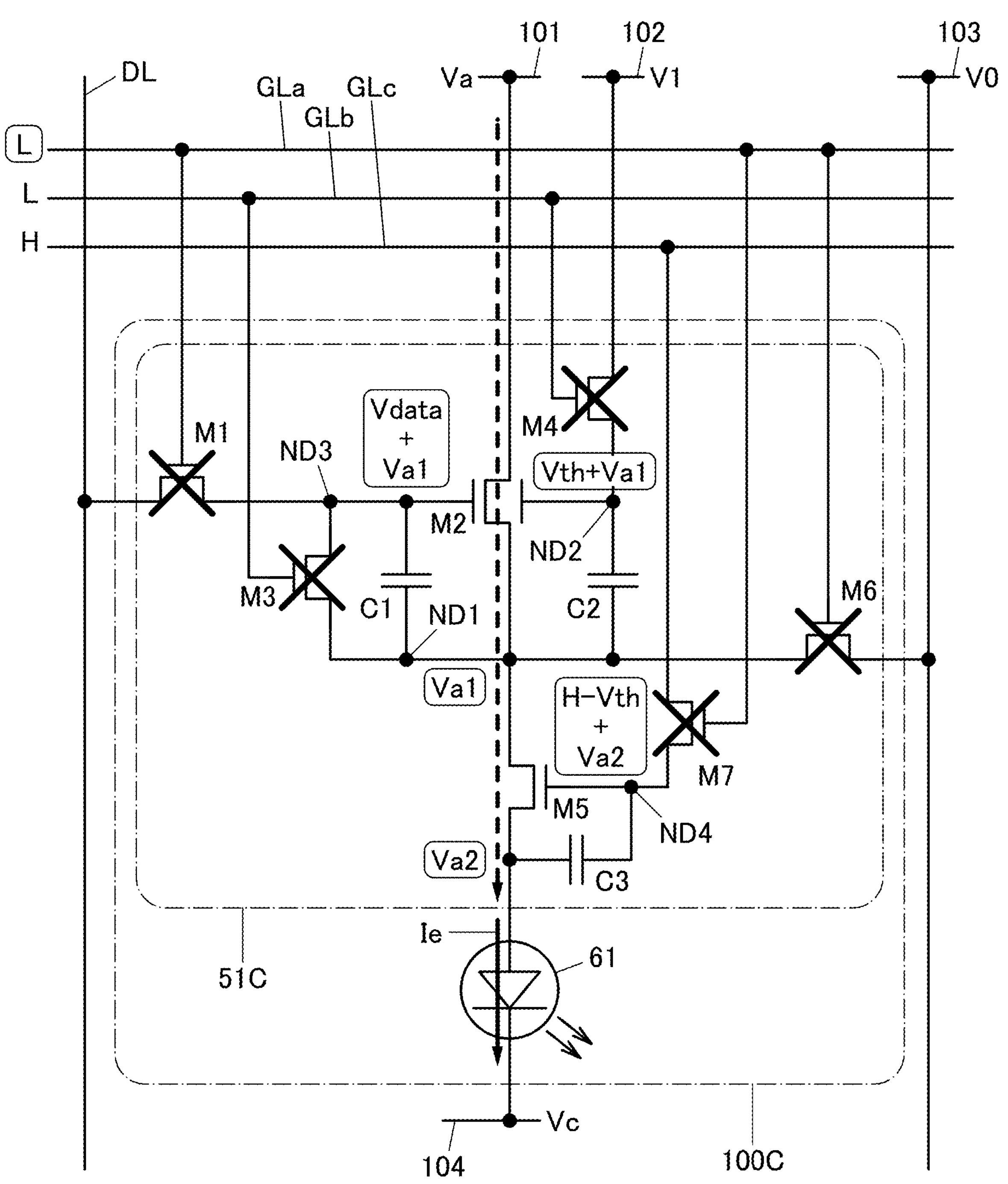
FIG. 40 is a diagram illustrating an operation of a semiconductor device.

In Period T35, the potential L is supplied to the wiring GLa (see FIG. 40). Thus, the transistor M1 and the transistor M6 are turned off. As in Period T25 described above, current flows from the wiring 101 to the wiring 104, and the light-emitting element 61 emits light with luminance corresponding to the current Ie. At this time, the potentials of the node ND1 and the anode terminal of the light-emitting element 61 increase. The potential of the node ND1 becomes the potential Va1, and the potential of the anode terminal becomes the potential Va2. The potential of the node ND3 becomes the video signal Vdata+the potential Va1, and the potential of the node ND2 becomes Vth+the potential Va1.

The node ND4 is in a floating state and the potential difference between the node ND4 and the anode terminal is kept through the capacitor C3. Thus, the potential of the node ND4 changes in accordance with the potential change of the anode terminal. When the potential of the anode terminal increases from the potential V0 to the potential Va2, the potential of the node ND4 becomes the potential H−Vth+the potential Va2. That is, even when the potential of the anode terminal corresponding to the source side of the transistor M5 increases, the on state of the transistor M5 is surely kept.

[Turn-Off Operation]

Figure 41:
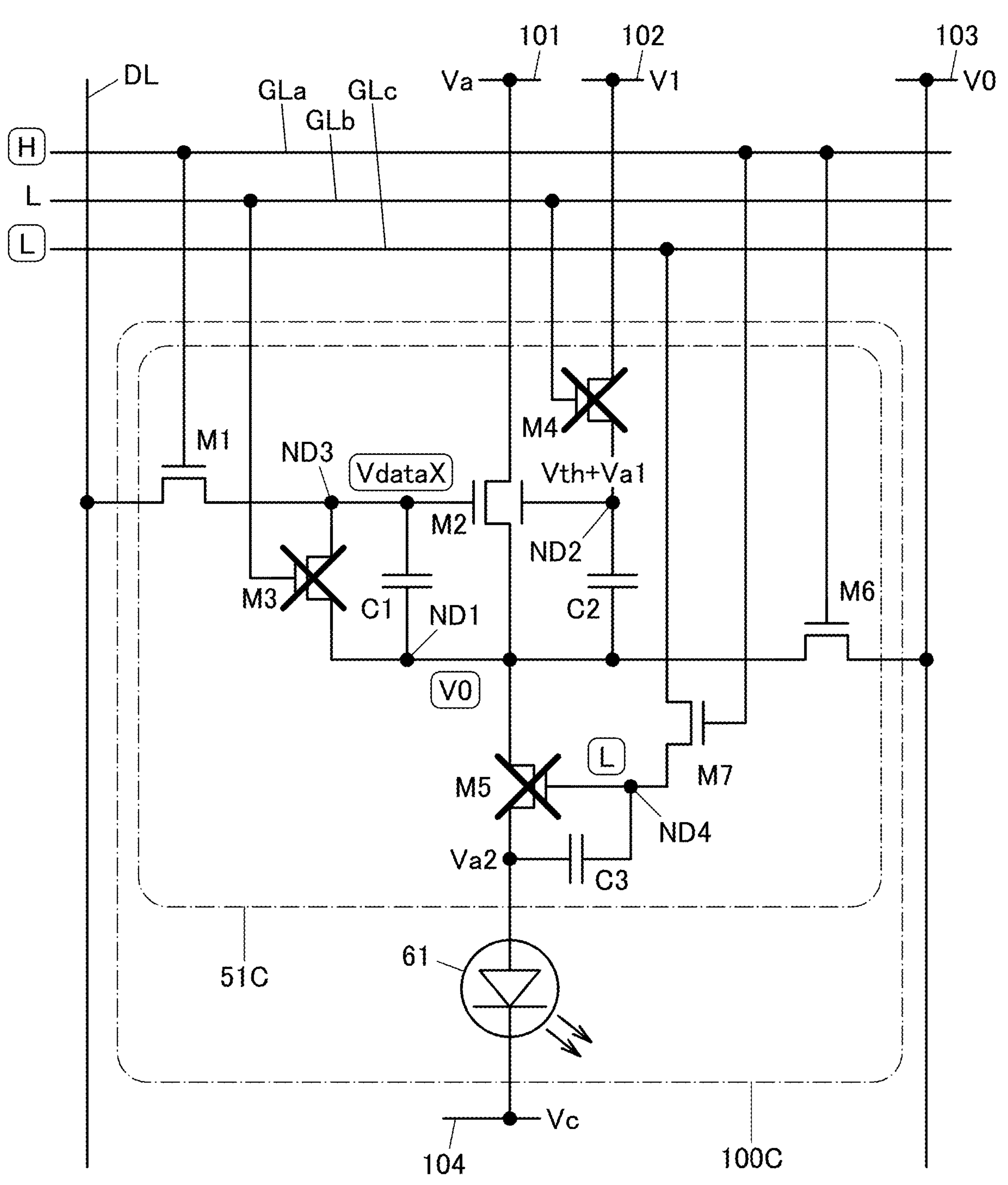
FIG. 41 is a diagram illustrating an operation of a semiconductor device.

In Period T36, the potential H is supplied to the wiring GLa, and the potential L is supplied to the wiring GLc (see FIG. 41). Thus, the transistor M1, the transistor M6, and the transistor M7 are turned on, the potential of the node ND1 becomes the potential V0, and the potential of the node ND4 becomes the L potential. When the potential of the node ND4 becomes the L potential, the transistor M5 is turned off and thus light emission from the light-emitting element 61 is stopped.

Although the video signals Vdata to be written to the other semiconductor devices 100C electrically connected to the wiring DL are sometimes supplied to the node ND3 through the transistor M1 in Period T36, the turn-off operation is not influenced by this operation because the transistor M5 is in the off state.

Like the semiconductor device 100A and the semiconductor device 100B, the semiconductor device 100C can be suitably used not only in a light-emitting element with a single structure but also in a light-emitting element with a tandem structure that requires a higher driving voltage than the light-emitting element with a single structure. In addition, as in the semiconductor device 100A and the semiconductor device 100B, the black insertion driving can be performed. A display device using the semiconductor device 100C of one embodiment of the present invention can achieve high-quality moving image display whose moving image resolution is unlikely to decrease.

Modification Example 1

Figure 42:
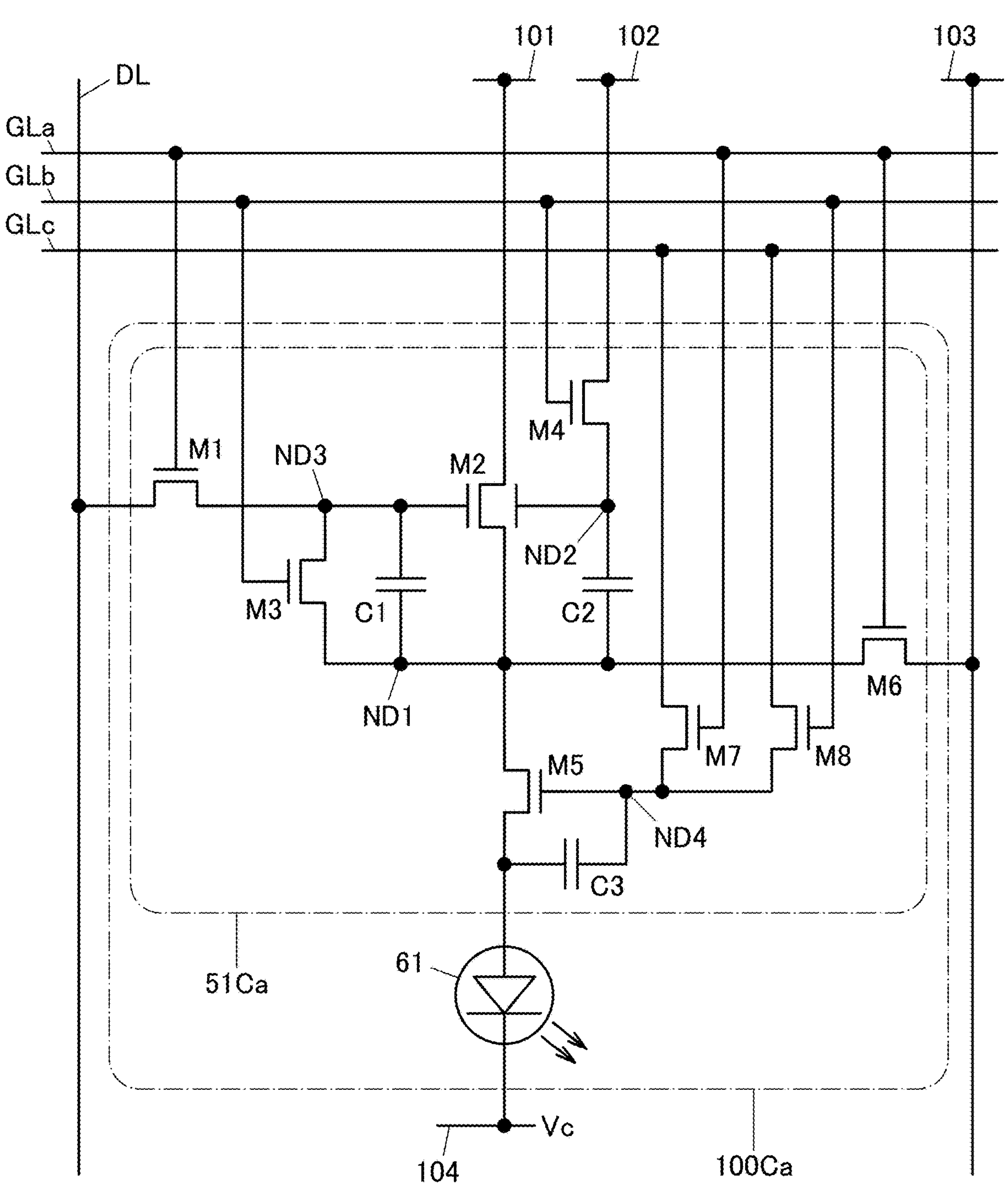
FIG. 42 is a diagram illustrating a semiconductor device.

FIG. 42 illustrates a semiconductor device 100Ca, which is a modification example of the semiconductor device 100C. The semiconductor device 100Ca illustrated in FIG. 42 includes a pixel circuit 51Ca. The pixel circuit 51Ca is different from the pixel circuit 51C illustrated in FIG. 33 in that the transistor M8 is provided between the wiring GLc and the node ND4.

Specifically, the gate of the transistor M8 is electrically connected to the wiring GLb, one of the source and the drain of the transistor M8 is electrically connected to the wiring GLc, and the other of the source and the drain of the transistor M8 is electrically connected to the node ND4.

In the circuit structure example illustrated in FIG. 33, the node ND4 is brought into a floating state in Period T32 during which the Vth correction operation is performed; thus, the potential of the node ND4 might change to bring the transistor M5 into a state close to the on state.

Figure 43:
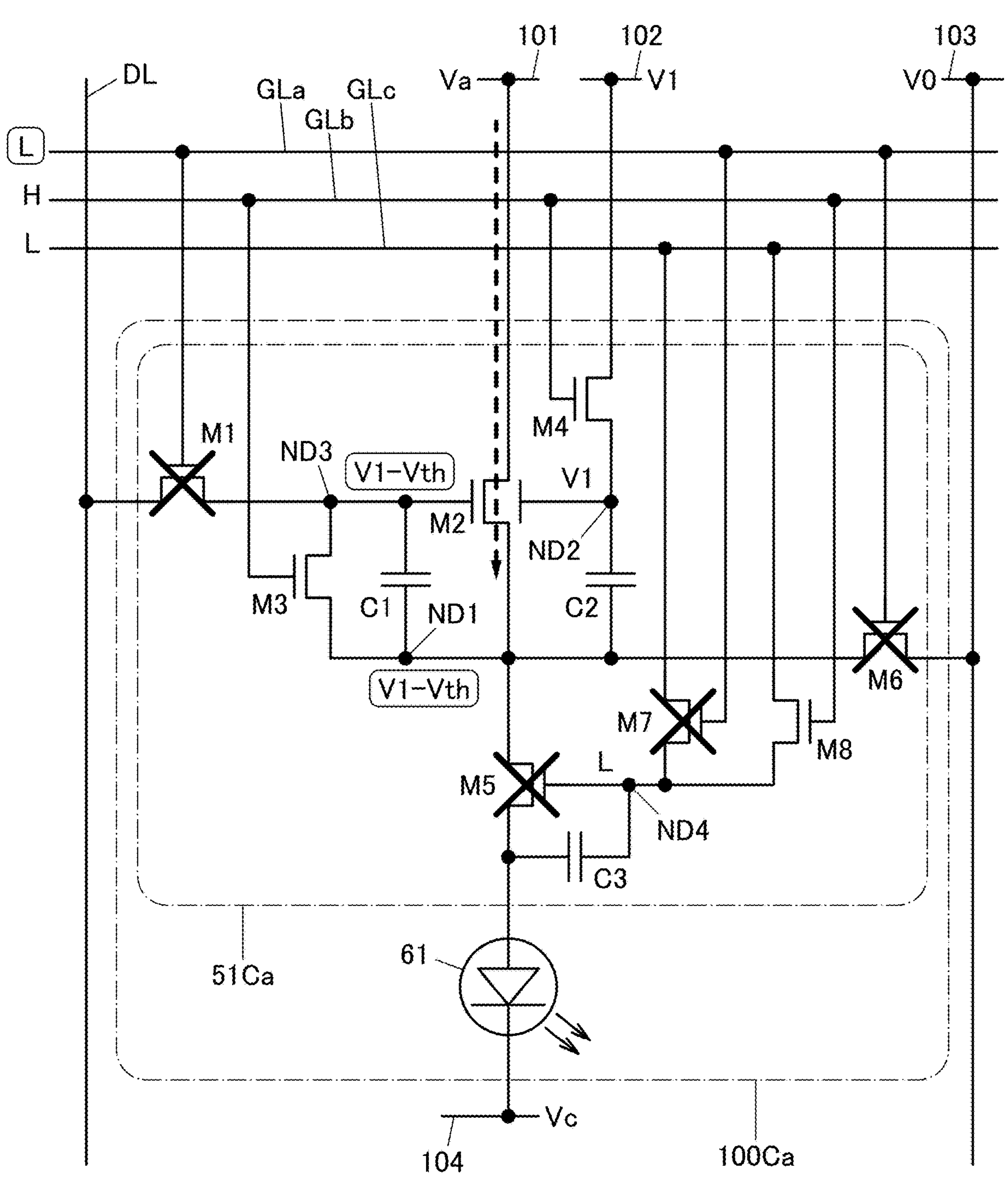
FIG. 43 is a diagram illustrating an operation of a semiconductor device.

FIG. 43 is a circuit diagram illustrating an operation state of the semiconductor device 100Ca illustrated in FIG. 42 in Period T32. The transistor M8 can prevent the node ND4 from being brought into a floating state in Period T32 during which the Vth correction operation is performed, so that the potential of the node ND4 can be fixed to the potential L. With the transistor M8, an accurate Vth correction operation can be performed. Consequently, the display quality of the semiconductor device 100Ca can be improved.

Modification Example 2

Figure 44:
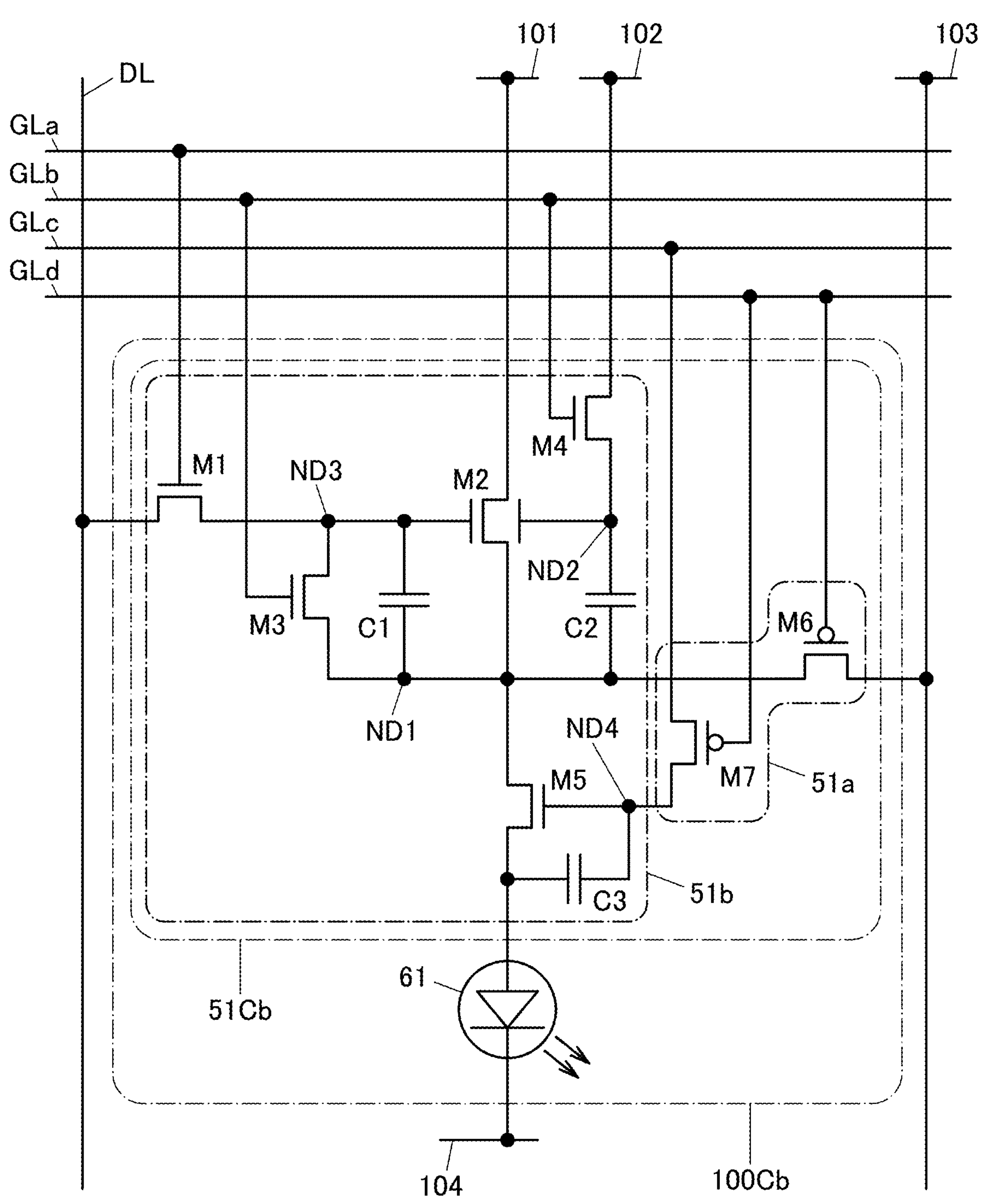
FIG. 44 is a diagram illustrating a semiconductor device.

FIG. 44 illustrates a semiconductor device 100Cb, which is a modification example of the semiconductor device 100C illustrated in FIG. 33. The semiconductor device 100Cb includes a pixel circuit 51Cb. The pixel circuit 51Cb is different from the pixel circuit 51C in that p-channel transistors are used as the transistor M6 and the transistor M7. The gates of the transistor M6 and the transistor M7 are electrically connected to the wiring GLd. As described in the above embodiment, p-channel transistors may be used as at least some of the transistors included in the semiconductor device 100C.

As described in the above embodiment, a transistor containing any of various semiconductors can be used as transistors included in a semiconductor device. For example, single crystal silicon, polycrystalline silicon, or the like is used for a p-channel transistor. As polycrystalline silicon, low-temperature polysilicon (LTPS) may be used.

In the case where n-channel transistors are used as the transistor M1 to the transistor M5 and p-channel transistors are used as the transistor M6 and the transistor M7, for example, n-channel OS transistors may be stacked over p-channel Si transistors using single crystal silicon in their semiconductor layers.

In FIG. 44, a region 51*a* including the Si transistors and a region 51*b* including the OS transistors in the pixel circuit 51Cb are indicated by dashed double-dotted lines.

Figure 45:
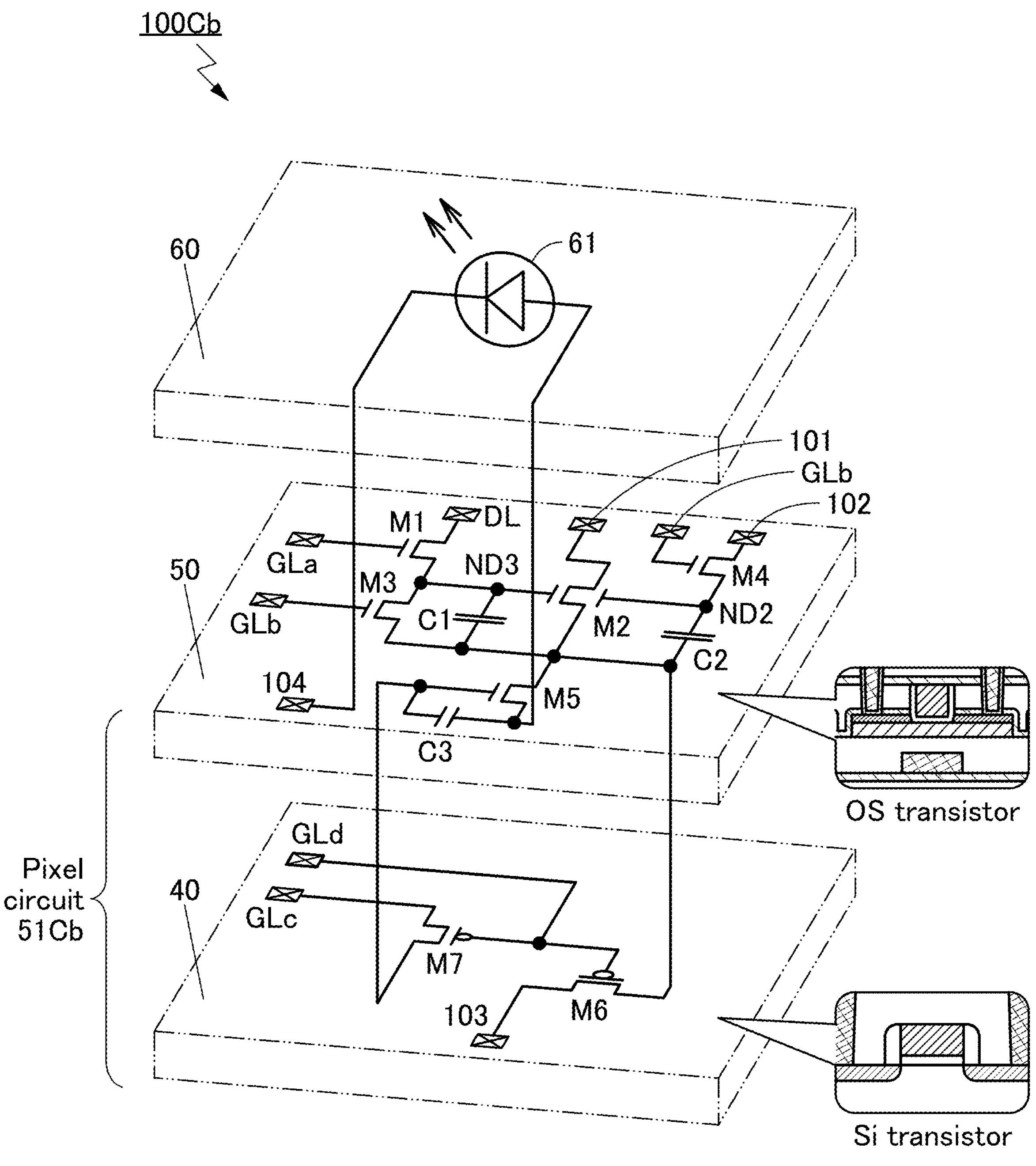
FIG. 45 is a diagram illustrating a semiconductor device.

The semiconductor device 100Cb may have a stacked-layer structure of a layer 40, a layer 50, and a layer 60, for example. FIG. 45 is a schematic perspective view of the semiconductor device 100Cb having the stacked-layer structure of the layer 40, the layer 50, and the layer 60. FIG. 45 illustrates an example in which the transistor M6 and the transistor M7, which are the p-channel Si transistors, are formed in the layer 40 and the transistor M1 to the transistor M5, which are the n-channel OS transistors, are formed in the layer 50. Thus, the region 51*a* is formed in the layer 40 and the region 51*b* is formed in the layer 50 (the regions are not illustrated in FIG. 45). That is, the region 51*a* and the region 51*b* can be provided to overlap with each other. FIG. 45 also illustrates an example in which the light-emitting element 61 is formed in the layer 60.

In FIG. 45, some of the transistors included in the pixel circuit 51Cb are provided in the layer 40 and the others are provided in the layer 50. Stacking the transistors included in the pixel circuit 51Cb can reduce the area occupied by the semiconductor device 100Cb. Thus, the mounting density of the semiconductor device 100Cb can be increased. In addition, the restrictions on the arrangement and sizes of the transistors included in the semiconductor device 100Cb are eased, so that the design flexibility of the semiconductor device is increased. Consequently, the reliability of the semiconductor device can be improved.

The OS transistor with a low off-state current and the Si transistor with higher operation speed than the OS transistor are used in combination in the semiconductor device 100Cb, so that the operation speed can be improved and the power consumption can be reduced.

For example, the semiconductor device 100Cb or the like using the Si transistor can perform a high-speed reset operation. With the use of the OS transistor, the video signal Vdata written to the node ND3 can be retained for a long time. Thus, the power consumption of a display device using the semiconductor device 100Cb or the like as a pixel can be reduced by performing idling stop driving or decreasing the frame frequency in still image display. With the use of the OS transistor, the gray level of the pixel can be kept even when the frame frequency is extremely low (e.g., 1 fps or less).

In the case where the light-emitting element 61 is a bottom-emission light-emitting element, the layer 60 is provided under the layer 40 and the layer 50. The layer 40 may be formed over the layer 50.

Modification Example 3

Figure 46:
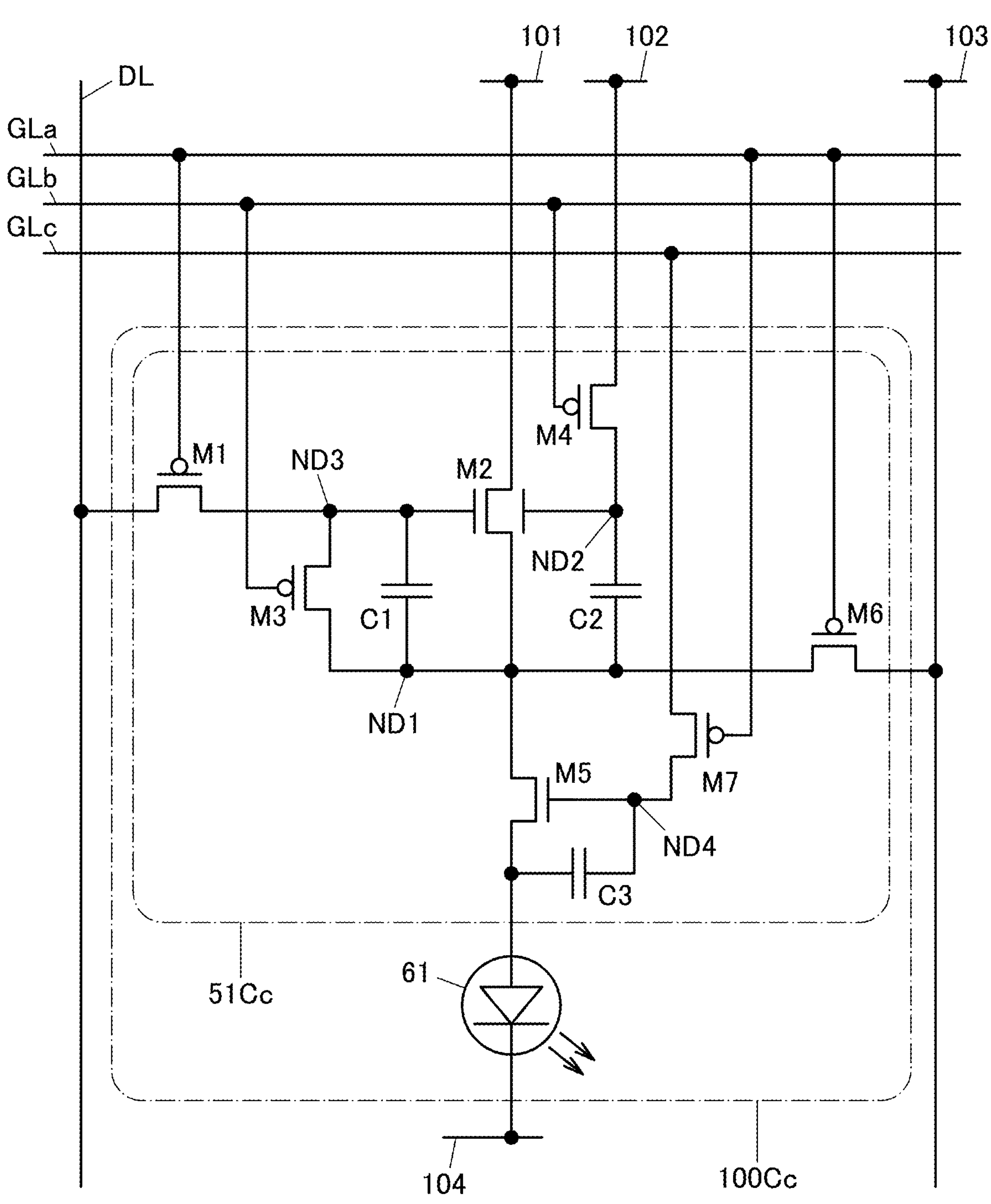
FIG. 46 is a diagram illustrating a semiconductor device.

FIG. 46 illustrates a semiconductor device 100Cc, which is a modification example of the semiconductor device 100C. The semiconductor device 100Cc includes a pixel circuit 51Cc. In the pixel circuit 51Cc, n-channel OS transistors are used as the transistor M2 and the transistor M5 among the transistor M1 to the transistor M7 included in the pixel circuit 51C, and p-channel Si transistors are used as the other transistors.

Modification Example 4

Figure 47:
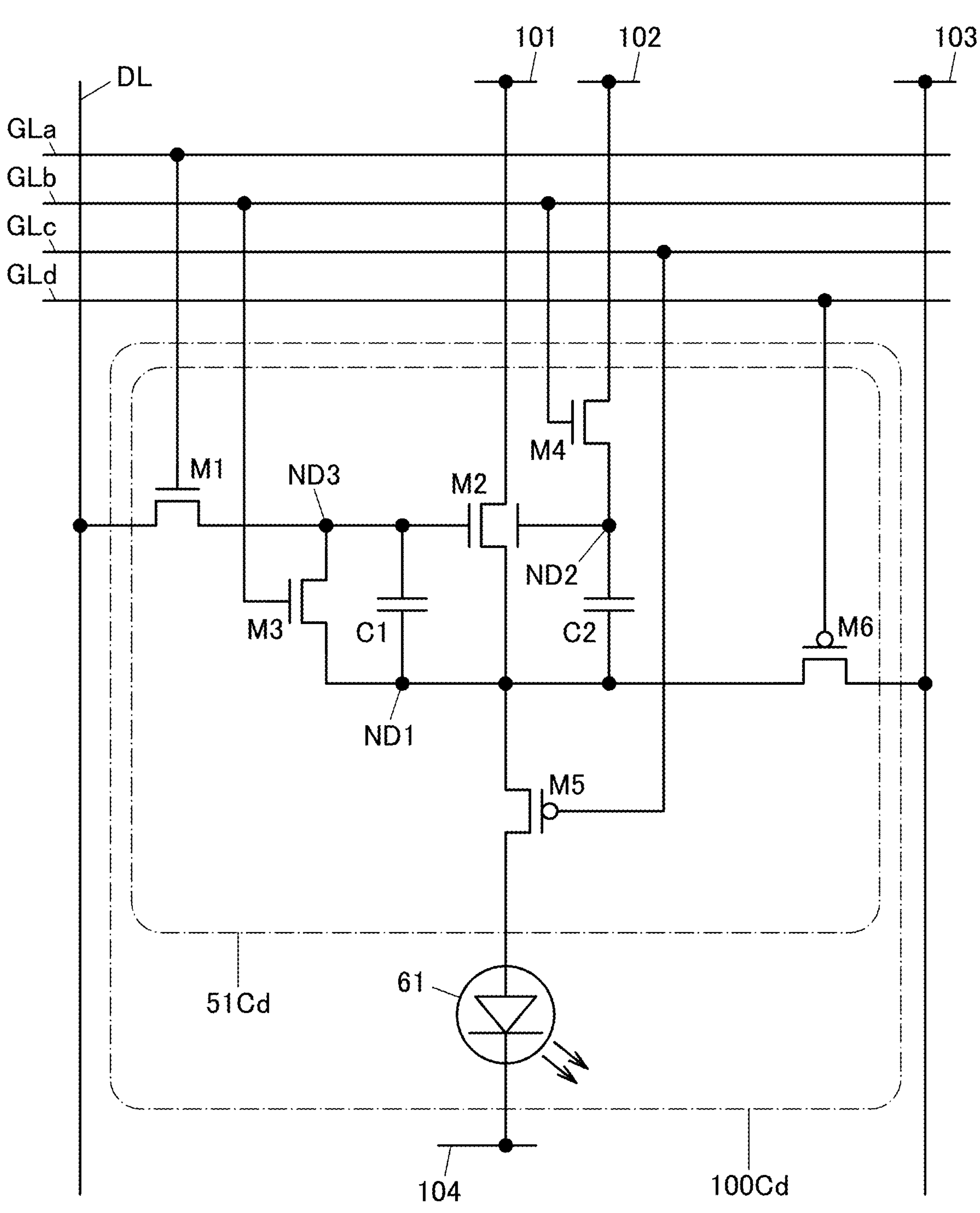
FIG. 47 is a diagram illustrating a semiconductor device.

FIG. 47 illustrates a semiconductor device 100Cd, which is a modification example of the semiconductor device 100C. The semiconductor device 100Cd includes a pixel circuit 51Cd. In the pixel circuit 51Cd, p-channel Si transistors are used as the transistor M5 and the transistor M6 among the transistor M1 to the transistor M7 included in the pixel circuit 51C, and n-channel OS transistors are used as the transistor M1 to the transistor M4. The gate of the transistor M6 is electrically connected to the wiring GLd. The transistor M7 and the capacitor C3 are not provided. When a p-channel transistor is used as the transistor M5, the formation of the transistor M7 and the capacitor C3 can be omitted.

Modification Example 5

Figure 48:
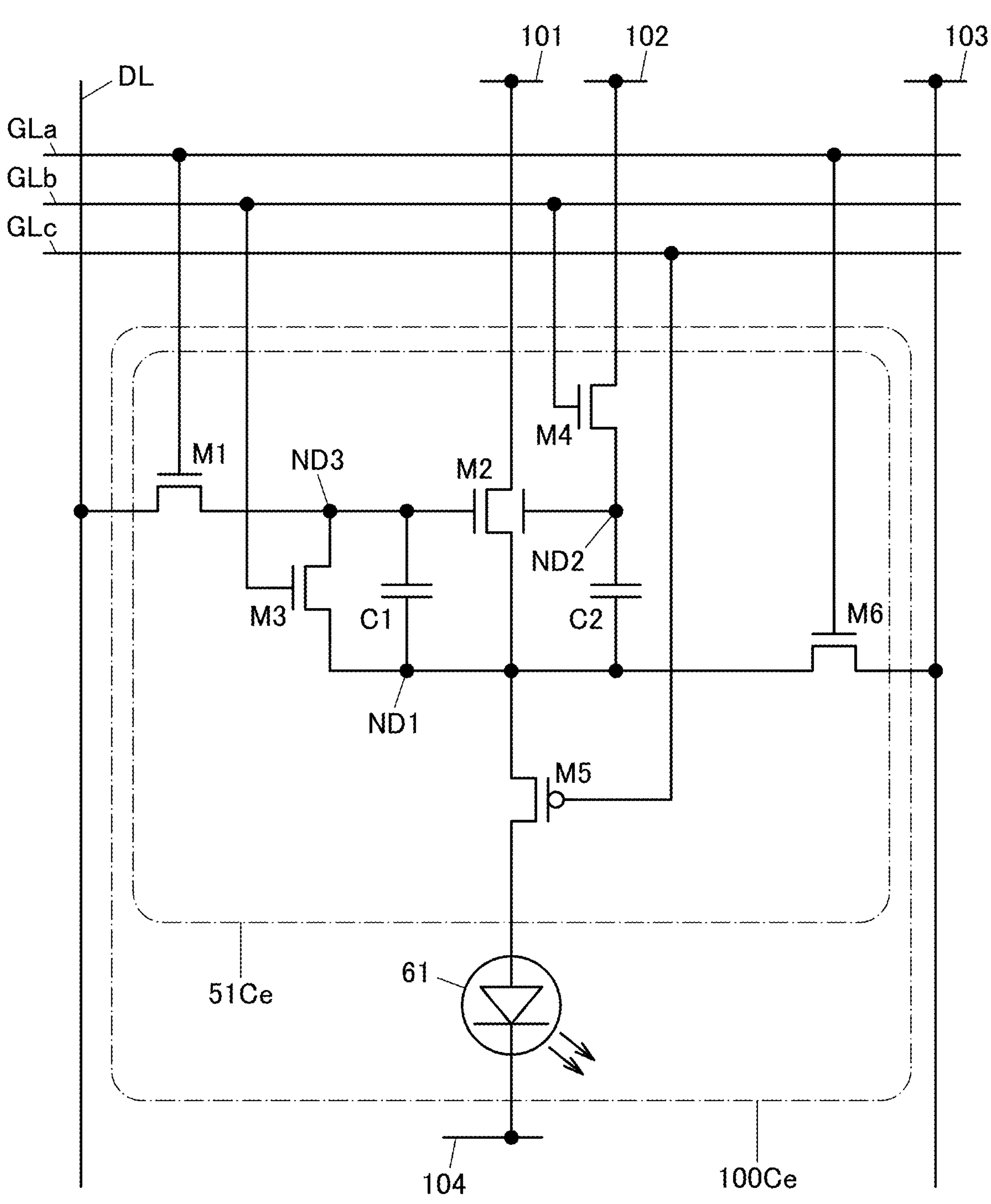
FIG. 48 is a diagram illustrating a semiconductor device.

FIG. 48 illustrates a semiconductor device 100Ce, which is a modification example of the semiconductor device 100Cd. As illustrated in FIG. 48, a p-channel Si transistor may be used as the transistor M5, and n-channel OS transistors may be used as the transistor M1 to the transistor M4 and the transistor M6. The gate of the transistor M6 is electrically connected to the wiring GLa.

The structure described in this embodiment can be used in an appropriate combination with any of the structures described in the other embodiments and examples.

Embodiment 4

Figure 49A:
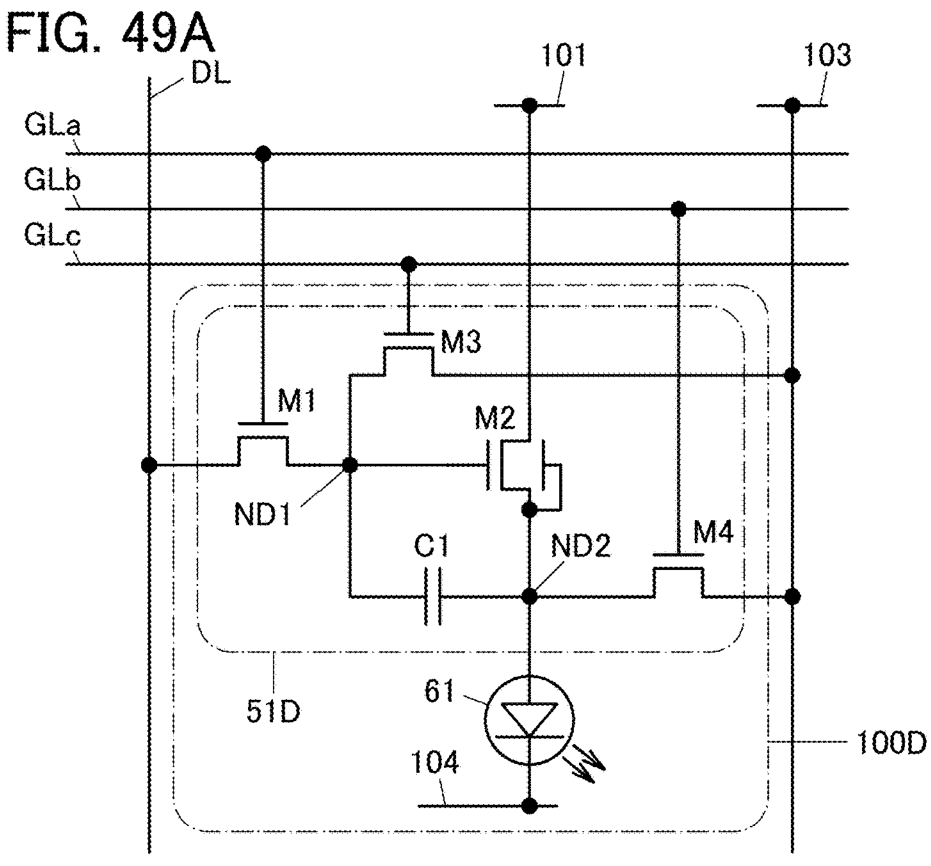
FIG. 49A and FIG. 49B are diagrams illustrating a semiconductor device.

In this embodiment, a semiconductor device 100D including four transistors, one capacitor, and one light-emitting element will be described. FIG. 49A illustrates a circuit structure example of the semiconductor device 100D. The semiconductor device 100D includes a pixel circuit 51D and the light-emitting element 61. The pixel circuit 51D includes the transistor M1 to the transistor M4 and the capacitor C1.

The gate of the transistor M1 is electrically connected to the wiring GLa, one of the source and the drain of the transistor M1 is electrically connected to the wiring DL, and the other of the source and the drain of the transistor M1 is electrically connected to the gate of the transistor M2. The transistor M1 has a function of selecting whether to establish electrical continuity between the gate of the transistor M2 and the wiring DL.

The gate of the transistor M2 is electrically connected to one terminal of the capacitor C1, one of the source and the drain of the transistor M2 is electrically connected to the wiring 101, and the other of the source and the drain of the transistor M2 is electrically connected to the other terminal of the capacitor C1. The transistor M2 has the back gate. The back gate of the transistor M2 is electrically connected to the other terminal of the capacitor C1.

The gate of the transistor M3 is electrically connected to the wiring GLc, one of the source and the drain of the transistor M3 is electrically connected to the one terminal of the capacitor C1, and the other of the source and the drain of the transistor M3 is electrically connected to the wiring 103. The transistor M3 has a function of selecting whether to establish electrical continuity between the gate of the transistor M2 and the wiring 103.

The gate of the transistor M4 is electrically connected to the wiring GLb, and one of the source and the drain of the transistor M4 is electrically connected to the other of the source and the drain of the transistor M2. The other of the source and the drain of the transistor M4 is electrically connected to the wiring 103. The transistor M4 has a function of selecting whether to establish electrical continuity between the wiring 103 and the other of the source and the drain of the transistor M2.

The other of the source and the drain of the transistor M2 is electrically connected to one terminal (e.g., the anode terminal) of the light-emitting element 61. The other terminal (e.g., the cathode terminal) of the light-emitting element 61 is electrically connected to the wiring 104.

A region where the one terminal of the capacitor C1, the other of the source and the drain of the transistor M1, the gate of the transistor M2, and the one of the source and the drain of the transistor M3 are electrically connected to one another is referred to as the node ND1.

A region where the other terminal of the capacitor C1, the other of the source and the drain of the transistor M2, and the one terminal of the light-emitting element 61 are electrically connected to one another is referred to as the node ND2.

Figure 49B:
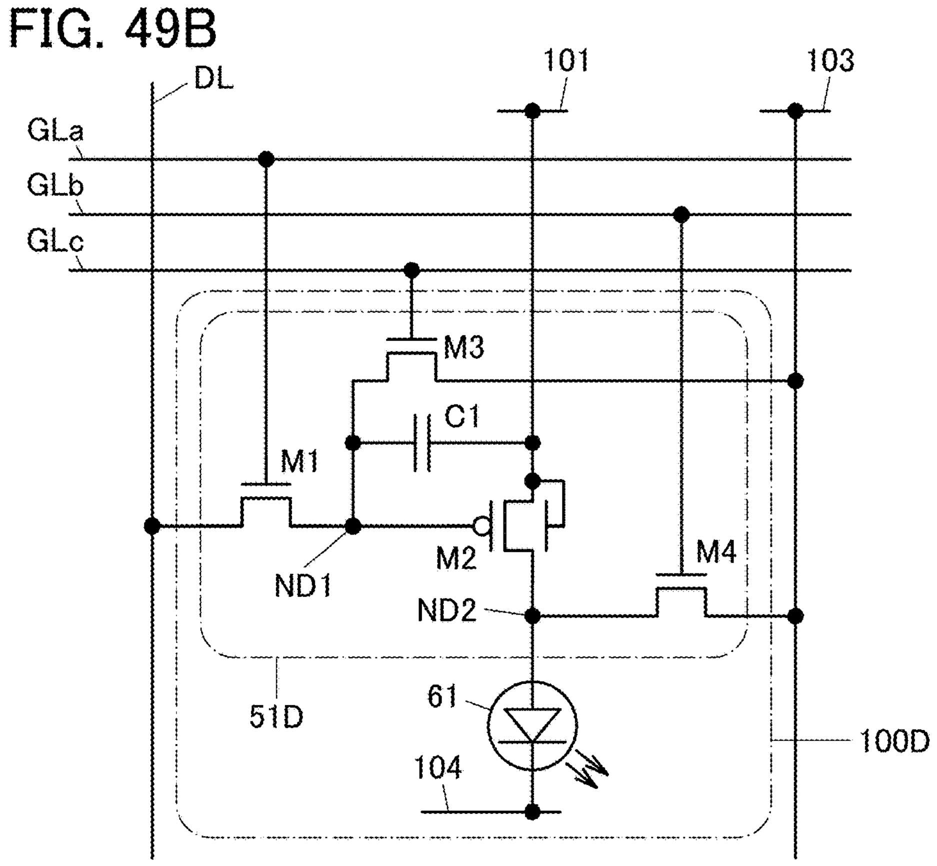

As illustrated in FIG. 49B, a p-channel transistor may be used as the transistor M2. In that case, the other terminal of the capacitor C1 is electrically connected to the wiring 101.

The number of transistors in the semiconductor device 100D described in this embodiment can be reduced and accordingly the occupied area thereof can be reduced.

Figure 50A:
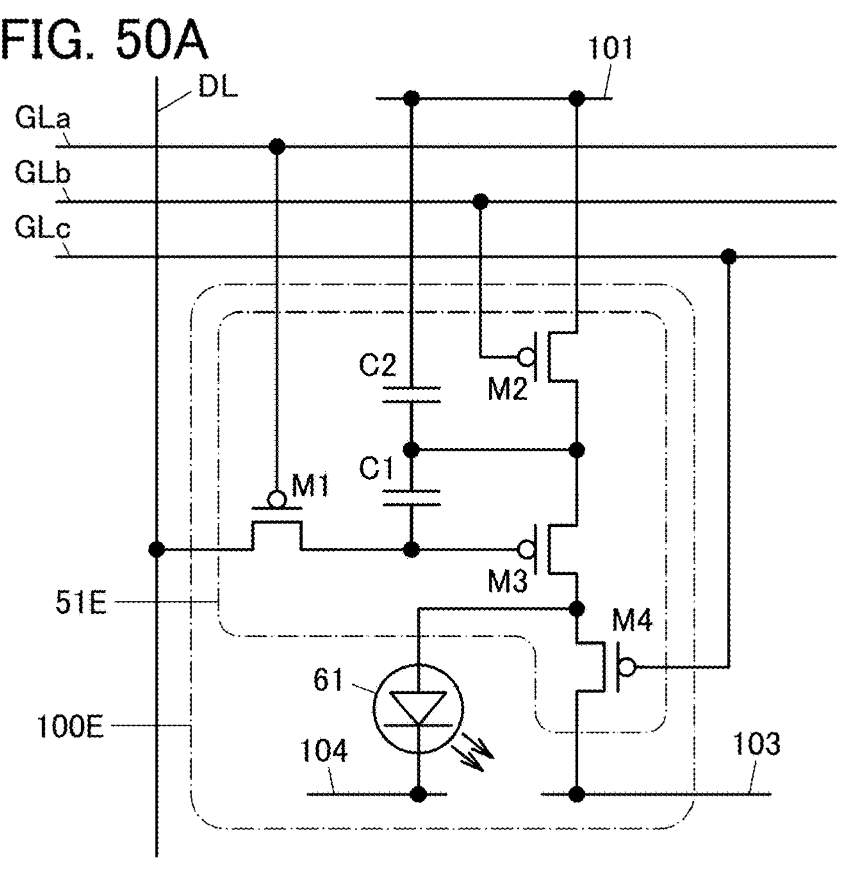
FIG. 50A and FIG. 50B are diagrams illustrating a semiconductor device.

A semiconductor device 100E that is illustrated in FIG. 50A and includes four p-channel transistors, two capacitors, and one light-emitting element may be employed. The semiconductor device 100E includes a pixel circuit 51E and the light-emitting element 61. The pixel circuit 51E includes the transistor M1 to the transistor M4, the capacitor C1, and the capacitor C2.

The gate of the transistor M1 is electrically connected to the wiring GLa, one of the source and the drain of the transistor M1 is electrically connected to the wiring DL, and the other of the source and the drain of the transistor M1 is electrically connected to the gate of the transistor M3. The transistor M1 has a function of selecting whether to establish electrical continuity between the gate of the transistor M3 and the wiring DL.

The gate of the transistor M2 is electrically connected to the wiring GLb, one of the source and the drain of the transistor M2 is electrically connected to the wiring 101, and the other of the source and the drain of the transistor M2 is electrically connected to one of the source and the drain of the transistor M3.

The other of the source and the drain of the transistor M3 is electrically connected to one of the source and the drain of the transistor M4. The gate of the transistor M4 is electrically connected to the wiring GLc, and the other of the source and the drain of the transistor M4 is electrically connected to the wiring 103.

The other of the source and the drain of the transistor M3 is electrically connected to one terminal of the light-emitting element 61. The other terminal of the light-emitting element 61 is electrically connected to the wiring 104.

One terminal of the capacitor C1 is electrically connected to the one of the source and the drain of the transistor M3. The other terminal of the capacitor C1 is electrically connected to the gate of the transistor M3. One terminal of the capacitor C2 is electrically connected to the wiring 101. The other terminal of the capacitor C2 is electrically connected to the one terminal of the capacitor C1.

Figure 50B:
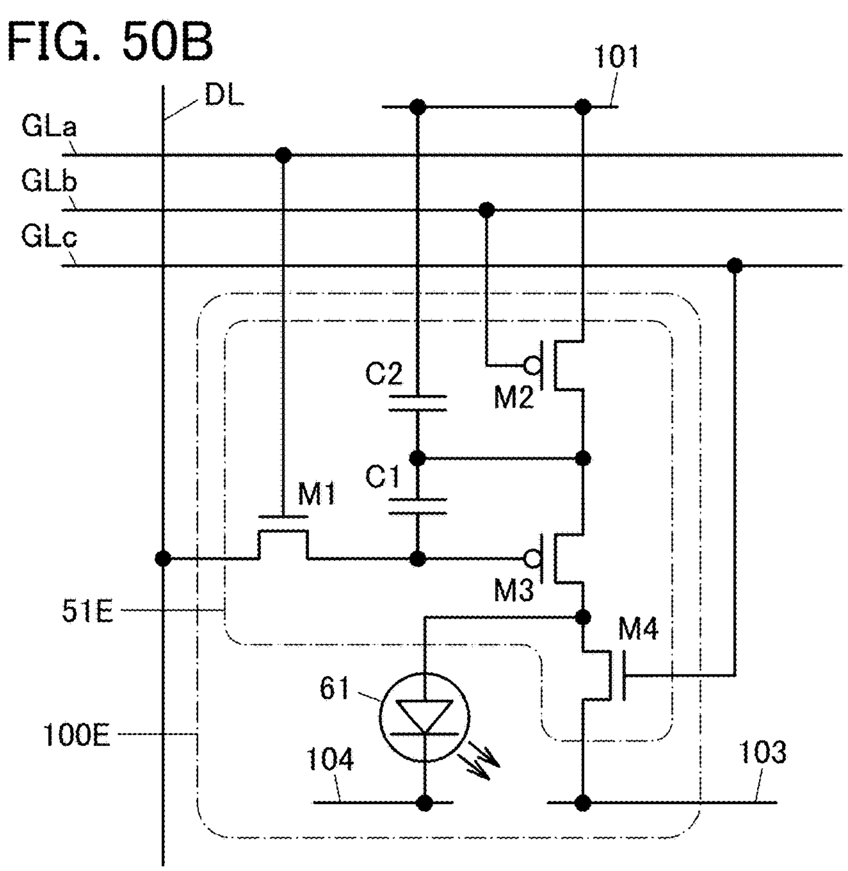

As illustrated in FIG. 50B, n-channel transistors may be used as the transistor M1 and the transistor M4.

The structure described in this embodiment can be used in an appropriate combination with any of the structures described in the other embodiments and examples.

Embodiment 5

In this embodiment, a semiconductor device 100F of one embodiment of the present invention will be described. The semiconductor device 100F is a modification example of the semiconductor device 100C illustrated in FIG. 41. In order to reduce repeated description, differences of the semiconductor device 100F from the semiconductor device 100C illustrated in FIG. 41 are mainly described.

Structure Example

Figure 51:
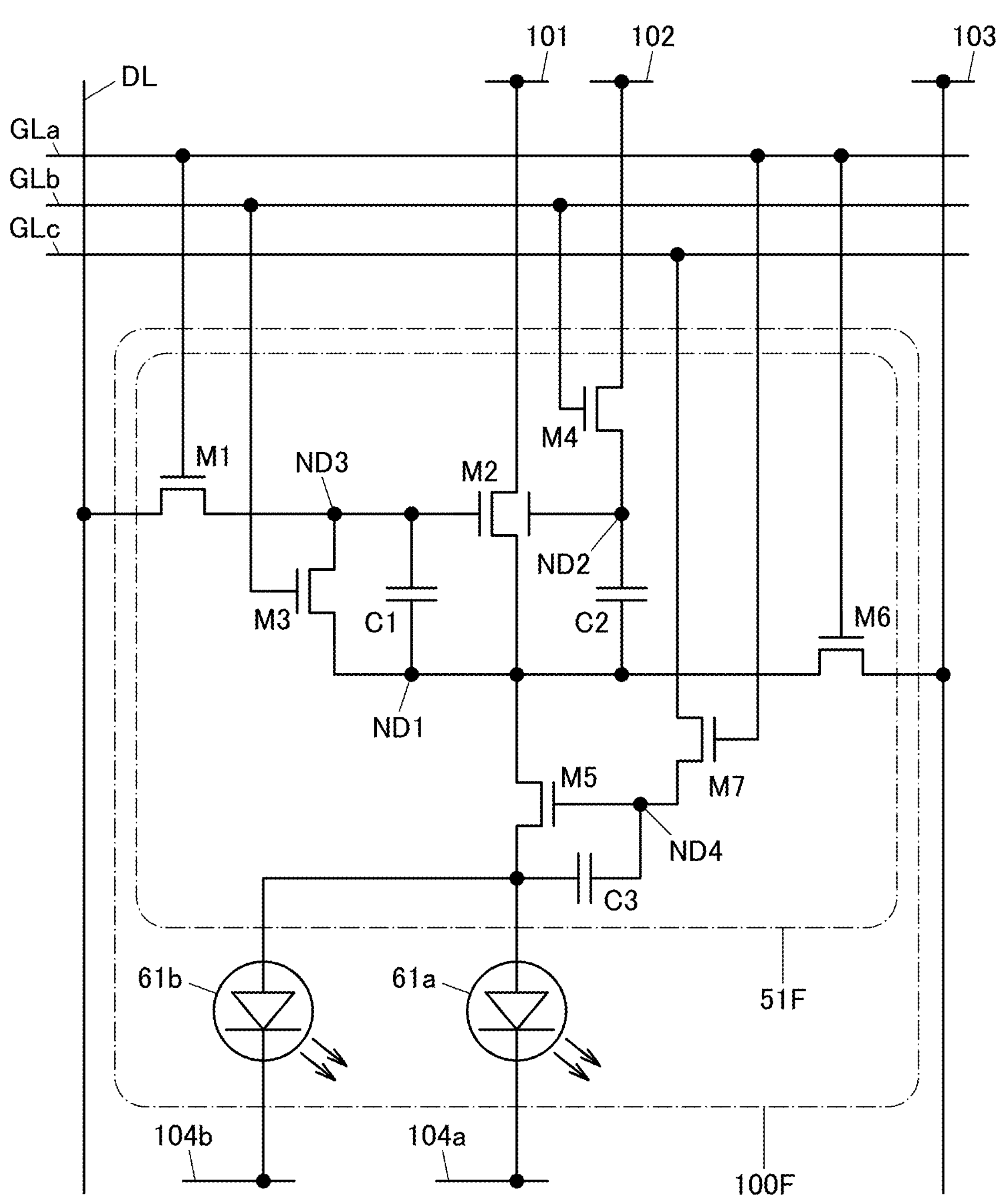
FIG. 51 is a diagram illustrating a semiconductor device.

FIG. 51 illustrates a circuit structure example of the semiconductor device 100F. The semiconductor device 100F includes a pixel circuit 51F, a light-emitting element 61*a*, and a light-emitting element 61*b*. The pixel circuit 51F has the same structure as the pixel circuit 51C illustrated in FIG. 41 except that the other of the source and the drain of the transistor M5, one terminal (e.g., an anode terminal) of the light-emitting element 61*a*, and one terminal (e.g., an anode terminal) of the light-emitting element 61*b* are electrically connected to one another.

The other terminal (e.g., a cathode terminal) of the light-emitting element 61*a* is electrically connected to a wiring 104*a*. The other terminal (e.g., a cathode terminal) of the light-emitting element 61*b* is electrically connected to a wiring 104*b*.

Figure 52:
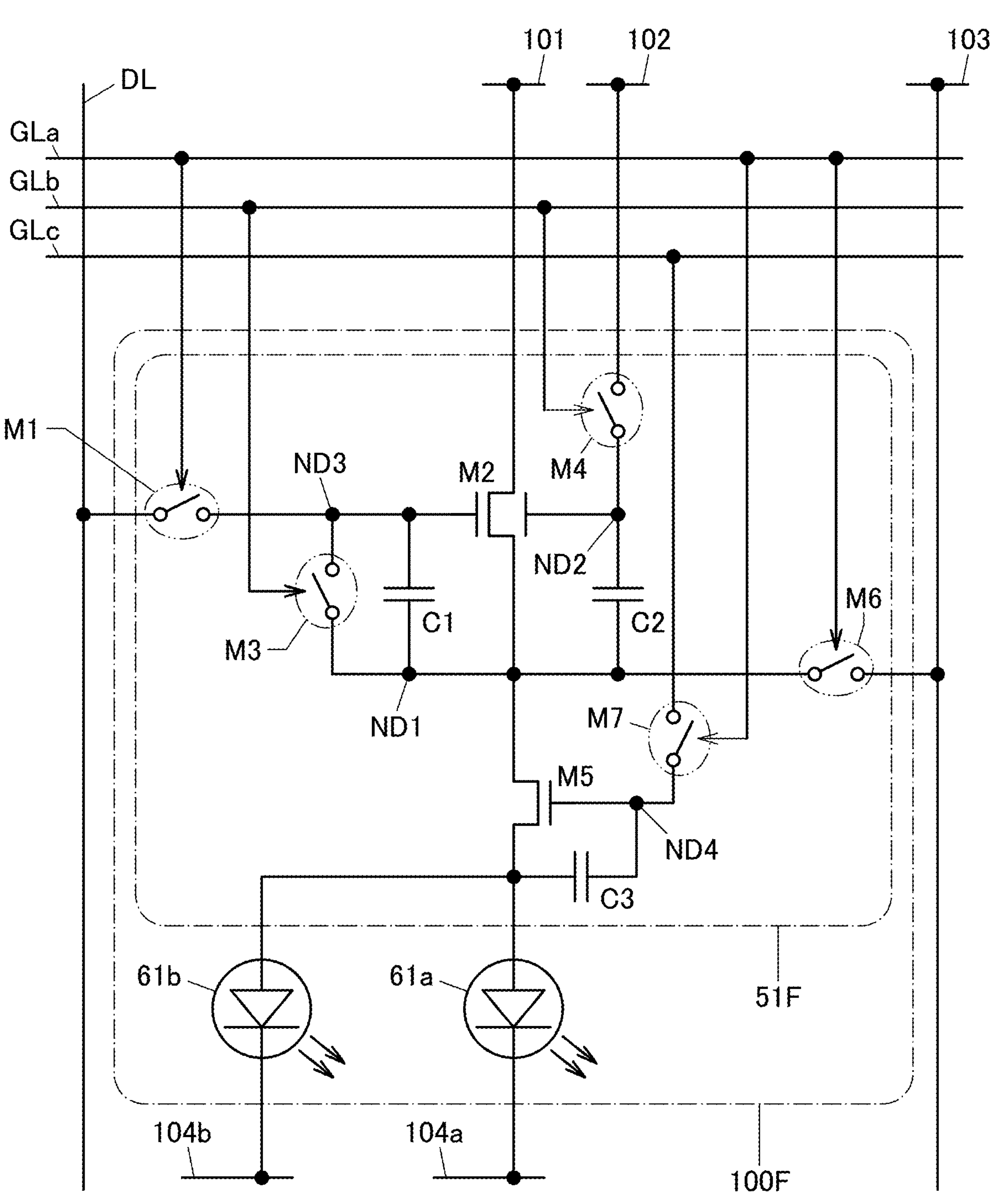
FIG. 52 is a diagram illustrating a semiconductor device.

Among the transistors included in the pixel circuit 51F, the transistor M1, the transistor M3, the transistor M4, the transistor M6, and the transistor M7 function as switches. Hence, the semiconductor device 100F can be illustrated as in FIG. 52.

Operation Example

In the semiconductor device 100F, control of the potentials of the wiring 104*a* and the wiring 104*b* enables light emission from the light-emitting element 61*a* and the light-emitting element 61*b* to be controlled. In the case where the light-emitting element 61*a* is made to emit light, for example, the potential Vc is supplied to the wiring 104*a* and a potential higher than or equal to the potential Va is supplied to the wiring 104*b*. In the case where the light-emitting element 61*b* is made to emit light, the potential Vc is supplied to the wiring 104*b* and a potential higher than or equal to the potential Va is supplied to the wiring 104*a*.

In the case where both the light-emitting element 61*a* and the light-emitting element 61*b* are made to emit light, the potential Vc is supplied to both the wiring 104*a* and the wiring 104*b*.

In the semiconductor device 100F, one pixel circuit 51F can control light emission from two light-emitting elements 61 (the light-emitting element 61*a* and the light-emitting element 61*b*). This reduces the area occupied by the pixel circuit per pixel, which facilitates an improvement in the pixel density of a display device. A reduction in the area necessary for one pixel circuit increases the design flexibility of a semiconductor device and a display device. Thus, it is easy to obtain a semiconductor device and a display device that have higher functionality and improved reliability.

The structure described in this embodiment is applicable to the semiconductor device 100A and the semiconductor device 100B.

The structure described in this embodiment can be used in an appropriate combination with any of the structures described in the other embodiments and examples.

Embodiment 6

In this embodiment, a semiconductor device 100G of one embodiment of the present invention will be described. The semiconductor device 100G is a modification example of the semiconductor device 100C illustrated in FIG. 41 and is thus also a modification example of the semiconductor device 100F. In order to reduce repeated description, differences of the semiconductor device 100G from the semiconductor device 100C illustrated in FIG. 41 are mainly described.

Structure Example

Figure 53:
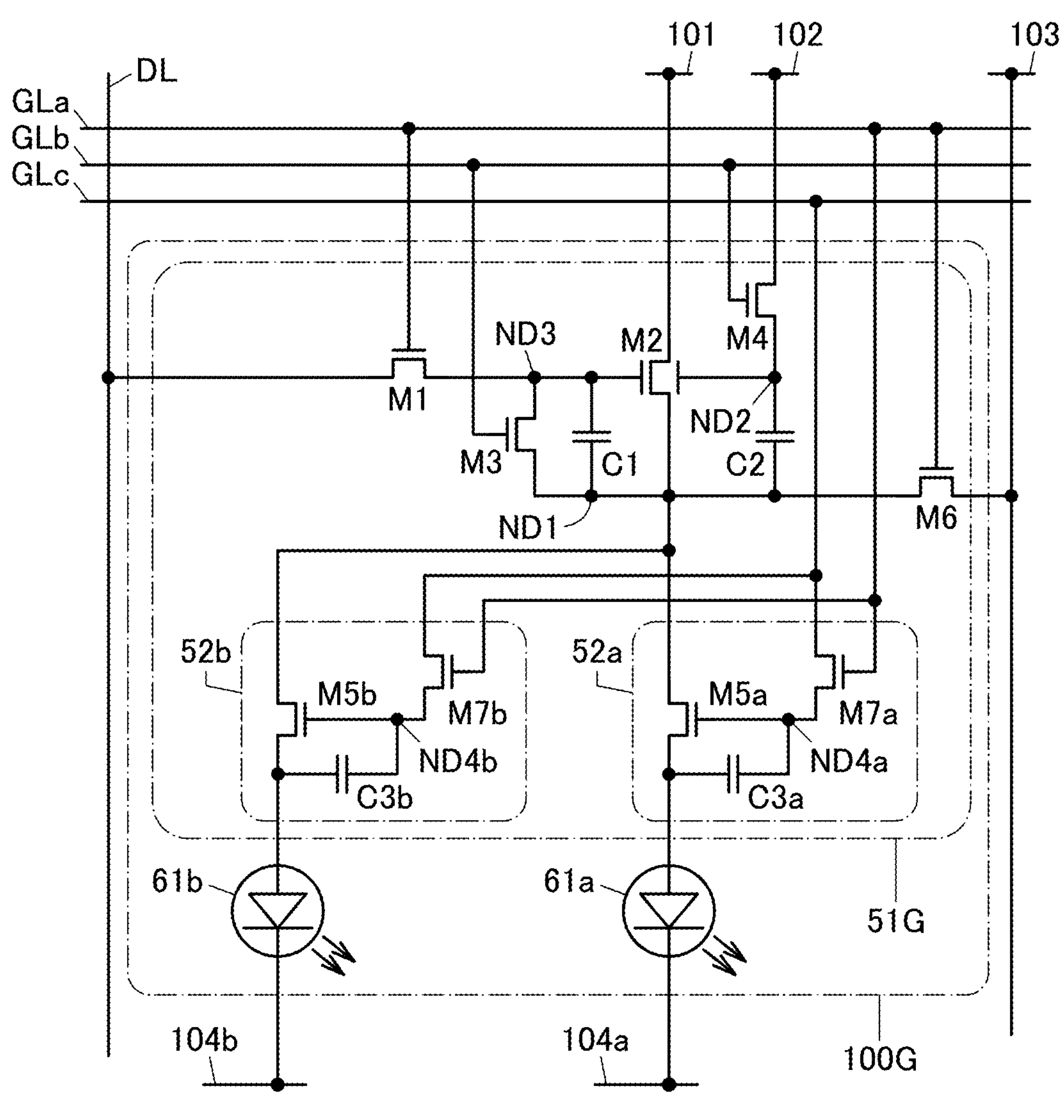
FIG. 53 is a diagram illustrating a semiconductor device.

FIG. 53 illustrates a circuit structure example of the semiconductor device 100G. The semiconductor device 100G includes a pixel circuit 51G, the light-emitting element 61*a*, and the light-emitting element 61*b*. The pixel circuit 51G includes a circuit 52*a* and a circuit 52*b*.

The circuit 52*a* includes a transistor M5*a*, a transistor M7*a*, and a capacitor C3*a*. A gate of the transistor M5*a* is electrically connected to one terminal of the capacitor C3*a*, and one of a source and a drain of the transistor M5*a* is electrically connected to the other of the source and the drain of the transistor M2. The other of the source and the drain of the transistor M5*a* is electrically connected to the other terminal of the capacitor C3*a* and the one terminal (e.g., the anode terminal) of the light-emitting element 61*a*. The other terminal (e.g., the cathode terminal) of the light-emitting element 61*a* is electrically connected to the wiring 104*a*. A gate of the transistor M7*a* is electrically connected to the wiring GLa, one of a source and a drain of the transistor M7*a* is electrically connected to the wiring GLc, and the other of the source and the drain of the transistor M7*a* is electrically connected to the gate of the transistor M5*a*.

A region where the gate of the transistor M5*a*, the one terminal of the capacitor C3*a*, and the other of the source and the drain of the transistor M7*a* are electrically connected to one another is referred to as a node ND4*a*.

The circuit 52*b* includes a transistor M5*b*, a transistor M7*b*, and a capacitor C3*b*. A gate of the transistor M5*b* is electrically connected to one terminal of the capacitor C3*b*, and one of a source and a drain of the transistor M5*b* is electrically connected to the other of the source and the drain of the transistor M2. The other of the source and the drain of the transistor M5*b* is electrically connected to the other terminal of the capacitor C3*b* and the one terminal (e.g., the anode terminal) of the light-emitting element 61*b*. The other terminal (e.g., the cathode terminal) of the light-emitting element 61*b* is electrically connected to the wiring 104*b*. A gate of the transistor M7*b* is electrically connected to the wiring GLa, one of a source and a drain of the transistor M7*b* is electrically connected to the wiring GLc, and the other of the source and the drain of the transistor M7*b* is electrically connected to the gate of the transistor M5*b*.

A region where the gate of the transistor M5*b*, the one terminal of the capacitor C3*b*, and the other of the source and the drain of the transistor M7*b* are electrically connected to one another is referred to as a node ND4*b*.

That is, the transistor M5*a* and the transistor M5*b* each correspond to the transistor M5. The transistor M7*a* and the transistor M7*b* each correspond to the transistor M7. The capacitor C3*a* and the capacitor C3*b* each correspond to the capacitor C3. The node ND4*a* and the node ND4*b* each correspond to the node ND4. The light-emitting element 61*a* and the light-emitting element 61*b* each correspond to the light-emitting element 61, and the wiring 104*a* and the wiring 104*b* each correspond to the wiring 104.

Operation Example

In the semiconductor device 10G, control of the potentials of the wiring 104*a* and the wiring 104*b* enables light emission from the light-emitting element 61*a* and the light-emitting element 61*b* to be controlled. In the case where the light-emitting element 61*a* is made to emit light, for example, the potential Vc is supplied to the wiring 104*a* and a potential higher than or equal to the potential Va is supplied to the wiring 104*b*. In the case where the light-emitting element 61*b* is made to emit light, the potential Vc is supplied to the wiring 104*b* and a potential higher than or equal to the potential Va is supplied to the wiring 104*a*.

In the case where both the light-emitting element 61*a* and the light-emitting element 61*b* are made to emit light, the potential Vc is supplied to both the wiring 104*a* and the wiring 104*b*.

In the semiconductor device 100G, light emission from the two light-emitting elements 61 (the light-emitting element 61*a* and the light-emitting element 61*b*) can be controlled using a set of the transistor M1, the transistor M2, the transistor M3, the transistor M4, the transistor M6, the capacitor C1, and the capacitor C2. This reduces the area occupied by the pixel circuit per pixel, which facilitates an improvement in the pixel density of a display device. A reduction in the area necessary for one pixel circuit increases the design flexibility of a semiconductor device and a display device. Thus, it is easy to obtain a semiconductor device and a display device that have higher functionality and improved reliability.

The structure described in this embodiment is applicable to the semiconductor device 100A and the semiconductor device 100B.

The structure described in this embodiment can be used in an appropriate combination with any of the structures described in the other embodiments and examples.

Embodiment 7

In this embodiment, a semiconductor device 100H of one embodiment of the present invention will be described. The semiconductor device 100H is a modification example of the semiconductor device 100G illustrated in FIG. 53. In order to reduce repeated description, differences of the semiconductor device 100H from the semiconductor device 100G are mainly described.

Structure Example

Figure 54:
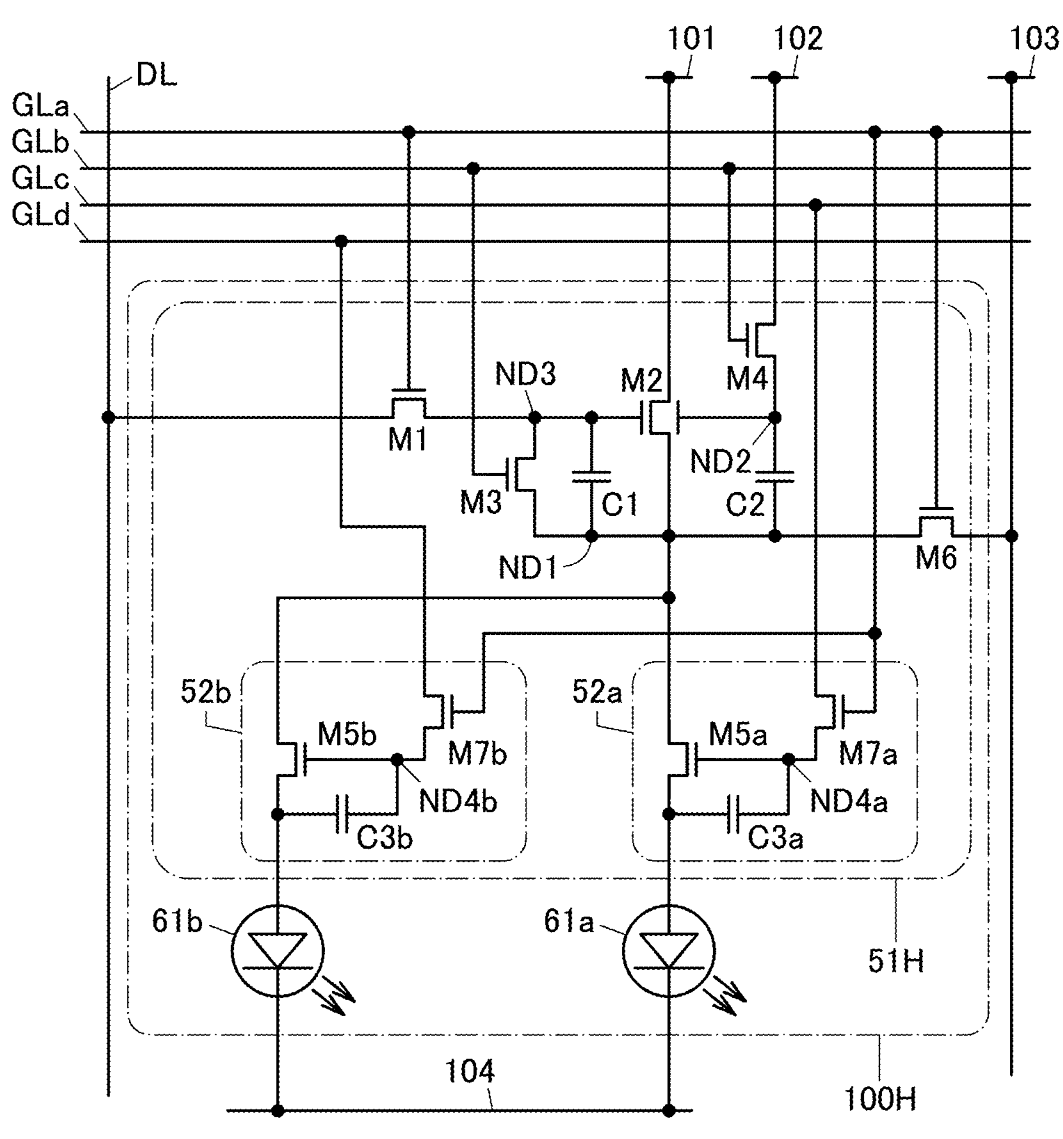
FIG. 54 is a diagram illustrating a semiconductor device.

FIG. 54 illustrates a circuit structure example of the semiconductor device 100H. The semiconductor device 100H includes a pixel circuit 51H, the light-emitting element 61*a*, and the light-emitting element 61*b*. The pixel circuit 51H includes the circuit 52*a* and the circuit 52*b*.

The semiconductor device 100H is different from the semiconductor device 100G in that the one of the source and the drain of the transistor M7*b* included in the circuit 52*b* is electrically connected to the wiring GLd and both the cathode of the light-emitting element 61*a* and the cathode of the light-emitting element 61*b* are electrically connected to the wiring 104.

Operation Example

In the semiconductor device 100H, control of the potentials of the wiring GLc and the wiring GLd enables light emission from the light-emitting element 61*a* and the light-emitting element 61*b* to be controlled. In the case where only the light-emitting element 61*a* is made to emit light, for example, the potential H is supplied to the wiring GLc and the potential L is supplied to the wiring GLd in Period T34 described in the above embodiment. In the case where only the light-emitting element 61*b* is made to emit light, the potential L is supplied to the wiring GLc and the potential H is supplied to the wiring GLd in Period T34 described in the above embodiment.

In the case where both the light-emitting element 61*a* and the light-emitting element 61*b* are made to emit light, the potential H is supplied to both the wiring GLc and the wiring GLd in Period T34 described in the above embodiment.

In the semiconductor device 100H, as in the semiconductor device 100G, light emission from the two light-emitting elements 61 (the light-emitting element 61*a* and the light-emitting element 61*b*) can be controlled using a set of the transistor M1, the transistor M2, the transistor M3, the transistor M4, the transistor M6, the capacitor C1, and the capacitor C2. This reduces the area occupied by the pixel circuit per pixel, which facilitates an improvement in the pixel density of a display device. A reduction in the area necessary for one pixel circuit increases the design flexibility of a semiconductor device and a display device. Thus, it is easy to obtain a semiconductor device and a display device that have higher functionality and improved reliability.

The structure described in this embodiment is applicable to the semiconductor device 100A and the semiconductor device 100B.

The structure described in this embodiment can be used in an appropriate combination with any of the structures described in the other embodiments and examples.

Embodiment 8

Figure 55A:
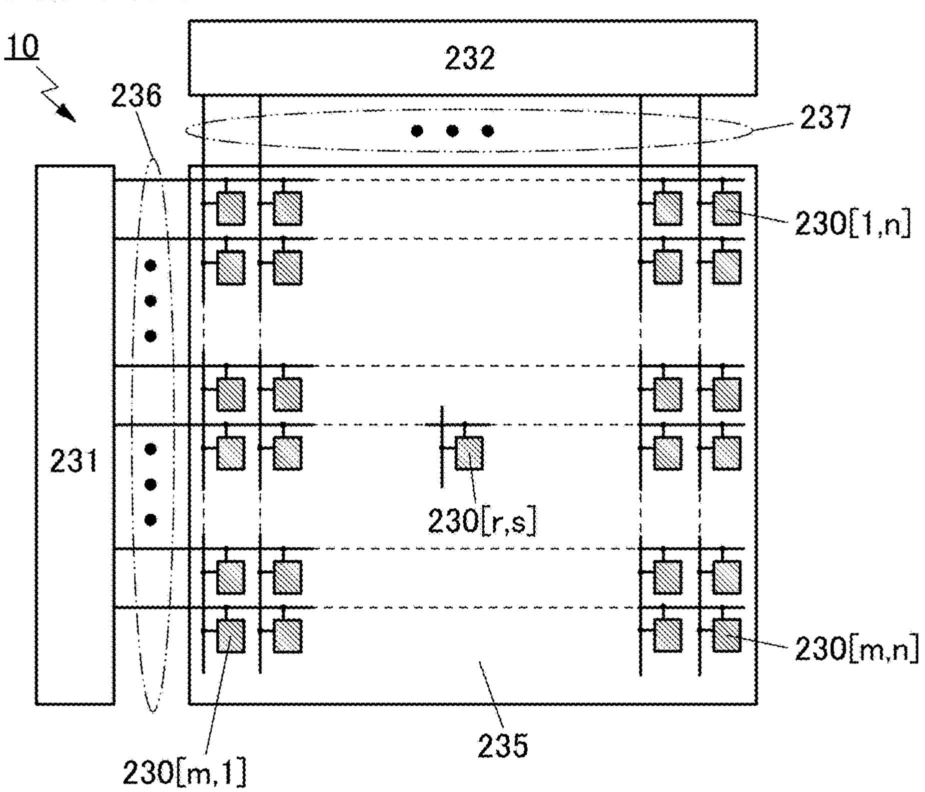
FIG. 55A is a diagram illustrating a display device.
Figure 55A:
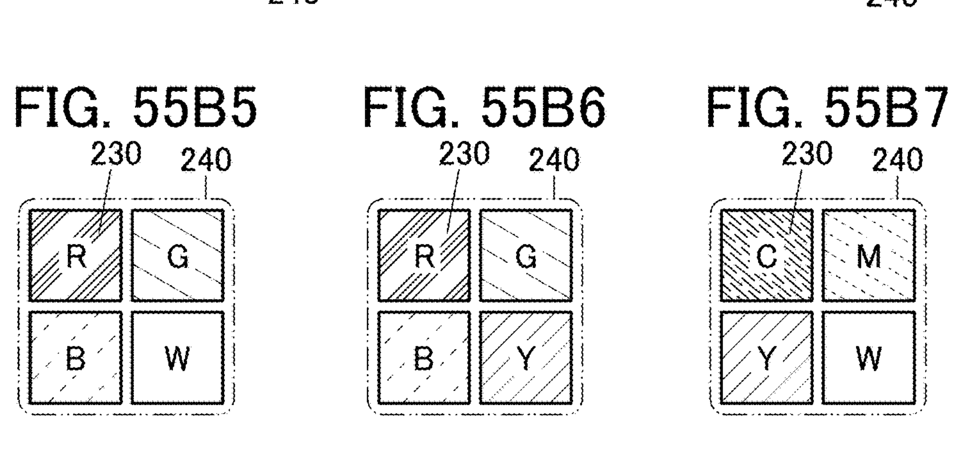

In this embodiment, a structure example of a display device 10 using a semiconductor device 100 (the semiconductor device 100A, the semiconductor device 100B, the semiconductor device 100C, the semiconductor device 100Ca, the semiconductor device 100Cb, the semiconductor device 100Cc, the semiconductor device 100Cd, the semiconductor device 100Ce, the semiconductor device 100D, the semiconductor device 100E, the semiconductor device 100F, the semiconductor device 100G, or the semiconductor device 100H) will be described. FIG. 55A is a block diagram illustrating the display device 10. The display device 10 includes a display region 235, a first driver circuit portion 231, and a second driver circuit portion 232. The display region 235 includes a plurality of pixels 230 arranged in a matrix. The semiconductor device 100 of one embodiment of the present invention can be used as each of the pixels 230.

A circuit included in the first driver circuit portion 231 functions as, for example, a scan line driver circuit. A circuit included in the second driver circuit portion 232 functions as, for example, a signal line driver circuit. Some sort of circuit may be provided to face the first driver circuit portion 231 with the display region 235 positioned therebetween. Some sort of circuit may be provided to face the second driver circuit portion 232 with the display region 235 positioned therebetween. Note that the circuits included in the first driver circuit portion 231 and the second driver circuit portion 232 are sometimes collectively referred to as a "peripheral driver circuit" or a "driver circuit".

Any of various circuits such as a shift register, a level shifter, an inverter, a latch, an analog switch, and a logic circuit can be used as the peripheral driver circuit. In the peripheral driver circuit, a transistor, a capacitor, and the like can be used. Transistors included in the peripheral driver circuit may be formed in the same steps as the transistors included in the pixels 230.

For example, OS transistors may be used as the transistors included in the pixels 230 and Si transistors may be used as the transistors included in the peripheral driver circuit. The off-state current of the OS transistor is low, so that power consumption can be reduced. Since the Si transistor has a higher operation speed than the OS transistor, the Si transistor is suitably used in the peripheral driver circuit. The display device may include the OS transistors as both the transistors included in the pixels 230 and the transistors included in the peripheral driver circuit. The display device may include the Si transistors as both the transistors included in the pixels 230 and the transistors included in the peripheral driver circuit. The display device may include the Si transistors as the transistors included in the pixels 230 and the OS transistors as the transistors included in the peripheral driver circuit.

Both the Si transistor and the OS transistor may be used as the transistors included in the pixels 230. Both the Si transistor and the OS transistor may be used as the transistors included in the peripheral driver circuit.

The display device 10 includes m (m is an integer greater than or equal to 1) wirings 236 which are arranged substantially parallel to each other and whose potentials are controlled by the circuit included in the first driver circuit portion 231, and n (n is an integer greater than or equal to 1) wirings 237 which are arranged substantially parallel to each other and whose potentials are controlled by the circuit included in the second driver circuit portion 232.

FIG. 55A illustrates an example in which the wirings 236 and the wirings 237 are connected to the pixels 230. Note that the wirings 236 and the wirings 237 are examples, and the wirings connected to the pixels 230 are not limited to the wirings 236 and the wirings 237.

The display region 235 includes the plurality of pixels 230 arranged in a matrix of m rows and n columns. For example, the pixels 230 arranged in the r-th row (r represents a given number, and is an integer greater than or equal to 1 and less than or equal to m in this embodiment and the like) are electrically connected to the first driver circuit portion 231 through the r-th wiring 236. The pixels 230 arranged in the s-th column (s represents a given number, and is an integer greater than or equal to 1 and less than or equal to n in this embodiment and the like) are electrically connected to the second driver circuit portion 232 through the s-th wiring 237.

Full-color display can be achieved by making the pixel 230 that controls red light, the pixel 230 that controls green light, and the pixel 230 that controls blue light, which are arranged in a stripe pattern, collectively function as one pixel 240 and by controlling the amount of light emission (emission luminance) from each of the pixels 230. Thus, each of the three pixels 230 functions as a subpixel. That is, three subpixels control the emission amount or the like of red light, green light, and blue light (see FIG. 55B1). Note that the colors of light controlled by the three subpixels are not limited to a combination of red (R), green (G), and blue (B) and may be cyan (C), magenta (M), and yellow (Y) (see FIG. 55B2).

Figure 3:
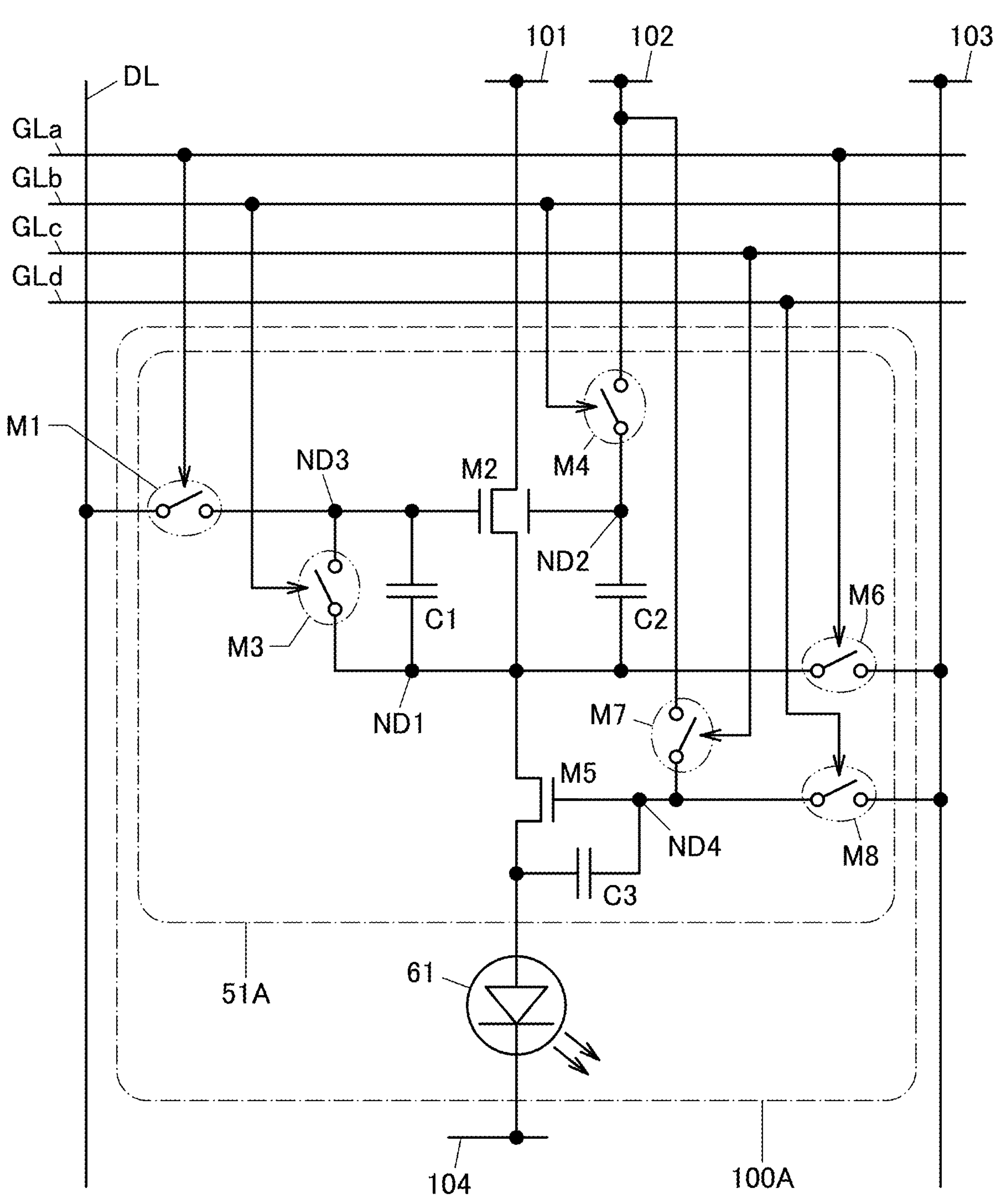
FIG. 3 is a diagram illustrating a semiconductor device.

Alternatively, the three pixels 230 constituting one pixel 240 may be arranged in a delta pattern (see FIG. 55B3). Specifically, arrangement may be employed in which a line connecting the center points of the three pixels 230 constituting one pixel 240 forms a triangle.

The areas of the three subpixels (pixels 230) are not necessarily equal to each other. In the case where the emission efficiency, reliability, and the like are different depending on emission colors, the areas of subpixels may be different depending on emission colors (see FIG. 55B4). Note that the arrangement of the subpixels illustrated in FIG. 55B4 may be called "S stripe arrangement", for example.

Four subpixels may collectively function as one pixel. For example, a subpixel that controls white light may be added to the three subpixels that control red light, green light, and blue light (see FIG. 55B5). The addition of the subpixel that controls white light can increase the luminance of a display region. Alternatively, a subpixel that controls yellow light may be added to the three subpixels that control red light, green light, and blue light (see FIG. 55B6). Alternatively, a subpixel that controls white light may be added to the three subpixels that control cyan light, magenta light, and yellow light (see FIG. 55B7).

When the number of subpixels functioning as one pixel is increased and subpixels that control light of red, green, blue, cyan, magenta, yellow, and the like are used in an appropriate combination, the reproducibility of halftones can be increased. Thus, display quality can be increased.

Figure 56:
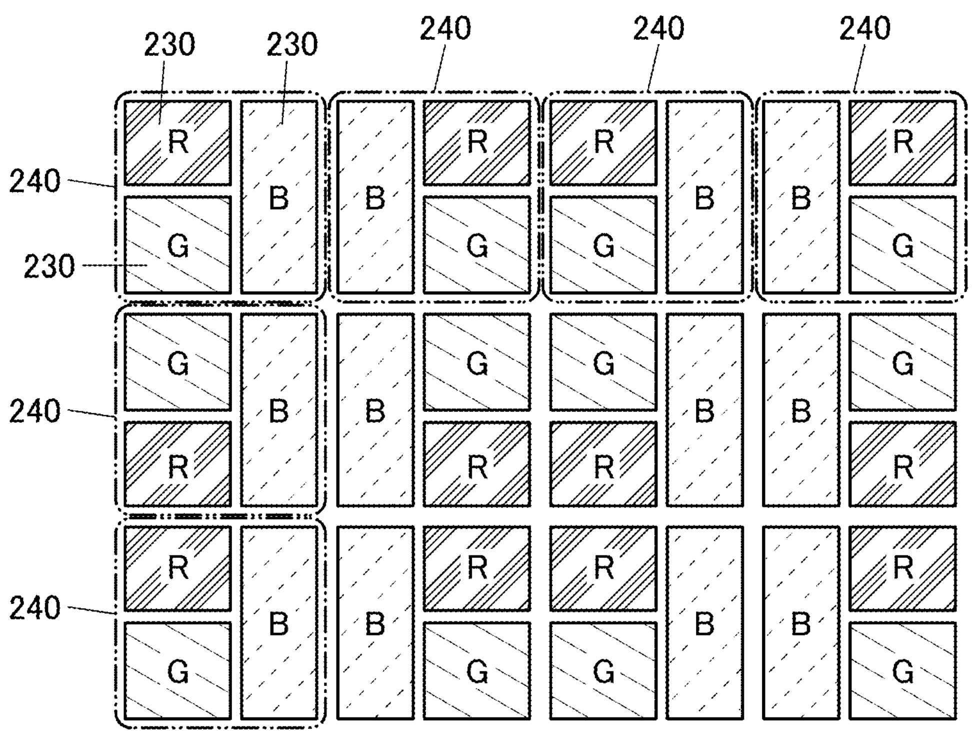
FIG. 56 is a diagram illustrating a structure example of a pixel.

As illustrated in FIG. 56, the subpixels (the pixels 230) that employ S stripe arrangement may be arranged such that the subpixels of the same emission color are adjacent to each other in the adjacent pixels 240.

As illustrated in FIG. 57A1 and FIG. 57A2, the pixels 230 that control the same emission color may be provided adjacent to each other in the adjacent pixels 240 in each of which the pixels 230 are arranged in a stripe pattern.

In FIG. 57A1 and FIG. 57A2, a pixel 230*a* and a pixel 230*b* that control red light are adjacent to each other in the row direction, the pixel 230*a* and the pixel 230*b* that control green light are adjacent to each other in the row direction, and the pixel 230*a* and the pixel 230*b* that control blue light are adjacent to each other in the row direction. The pixel 240 illustrated in each of FIG. 57A1 and FIG. 57A2 can be regarded as having a structure in which one pixel 230 is divided into two columns of pixels. Note that three or more pixels 230 of the same emission color may be adjacent to each other. That is, one pixel 230 may be divided into three or more pixels.

As illustrated in FIG. 57A1, the pixel 230*a* that controls red light, the pixel 230*a* that controls green light, and the pixel 230*a* that controls blue light may constitute one pixel 240. Alternatively, as illustrated in FIG. 57A2, the pixel 230*a* and the pixel 230*b* that control red light, the pixel 230*a* and the pixel 230*b* that control green light, and the pixel 230*a* and the pixel 230*b* that control blue light may constitute one pixel 240.

Providing a plurality of subpixels that control the same emission color in one pixel 240 can increase the number of gray levels that can be reproduced by the display device 10. Consequently, the display quality of the display device can be improved.

As illustrated in FIG. 57B, the pixel 230*a* and the pixel 230*b* that control the same emission color may be provided adjacent to each other in the column direction. The pixel structure illustrated in FIG. 57B can be regarded as a structure in which the pixel 240 illustrated in FIG. 55B1 is divided into two rows of pixels. Dividing the pixel 240 enables the pixel density of the display region 235 to be increased. Accordingly, an image with higher definition can be displayed.

Also in the pixel 240 with S stripe arrangement, the pixels 230 serving as the subpixels may each be divided into a plurality of pixels (see FIG. 57C), as in FIG. 57A1 and FIG. 57A2. The pixel 240 illustrated in FIG. 57C can function like the pixel 240 illustrated in each of FIG. 57A1 and FIG. 57A2.

The display device of one embodiment of the present invention can reproduce the color gamut of various standards. For example, the display device of one embodiment of the present invention can reproduce the color gamut of the PAL (Phase Alternating Line) standard and the NTSC (National Television System Committee) standard used for TV broadcasting; the sRGB (standard RGB) standard and the Adobe RGB standard widely used for display devices used in electronic devices such as personal computers, digital cameras, and printers; the ITU-R BT.709 (International Telecommunication Union Radiocommunication Sector Broadcasting Service (Television) 709) standard used for HDTV (High Definition Television, also referred to as Hi-Vision); the DCI-P3 (Digital Cinema Initiatives P3) standard used for digital cinema projection; the ITU-R BT.2020 (REC.2020 (Recommendation 2020)) standard used for UHDTV (Ultra High Definition Television, also referred to as Super Hi-Vision); and the like.

Using the pixels 240 arranged in a matrix of 1920×1080, the display device 10 that can perform full-color display with a resolution of what is called full high definition (also referred to as "2K resolution", "2K1K", "2K", or the like) can be obtained. For example, using the pixels 240 arranged in a matrix of 3840×2160, the display device 10 that can perform full-color display with a resolution of what is called ultrahigh definition (also referred to as "4K resolution", "4K2K", "4K", or the like) can be obtained. For example, using the pixels 240 arranged in a matrix of 7680×4320, the display device 10 that can perform full-color display with a resolution of what is called super high definition (also referred to as "8K resolution", "8K4K", "8K", or the like) can be obtained. By increasing the number of pixels 240, the display device 10 that can perform full-color display with 16K or 32K resolution can also be obtained.

The pixel density of the display region 235 is preferably higher than or equal to 100 ppi and lower than or equal to 10000 ppi, further preferably higher than or equal to 1000 ppi and lower than or equal to 10000 ppi. For example, the pixel density may be higher than or equal to 2000 ppi and lower than or equal to 6000 ppi, or higher than or equal to 3000 ppi and lower than or equal to 5000 ppi.

Note that there is no particular limitation on the aspect ratio of the display region 235. For example, the display region 235 of the display device 10 is compatible with a variety of aspect ratios such as 1:1 (a square), 4:3, 16:9, and 16:10.

The diagonal size of the display region 235 is at least greater than or equal to 0.1 inches and less than or equal to 100 inches and may be greater than or equal to 100 inches.

In the case where the display device 10 is used as a display device for virtual reality (VR) or augmented reality (AR), the diagonal size of the display region 235 can be greater than or equal to 0.1 inches and less than or equal to 5.0 inches, preferably greater than or equal to 0.5 inches and less than or equal to 2.0 inches, further preferably greater than or equal to 1 inch and less than or equal to 1.7 inches. For example, the diagonal size of the display region 235 may be 1.5 inches or approximately 1.5 inches. When the diagonal size of the display region 235 is less than or equal to 2.0 inches, preferably approximately 1.5 inches, the number of times of light exposure treatment performed with a light exposure apparatus (typically, a scanner apparatus) can be one; thus, the productivity of a manufacturing process can be improved.

The structure of transistors used in the display region 235 may be selected as appropriate depending on the diagonal size of the display region 235. In the case where single crystal Si transistors are used in the display region 235, for example, the diagonal size of the display region 235 is preferably greater than or equal to 0.1 inches and less than or equal to 3 inches. In the case where LTPS transistors are used in the display region 235, the diagonal size of the display region 235 is preferably greater than or equal to 0.1 inches and less than or equal to 30 inches, further preferably greater than or equal to 1 inch and less than or equal to 30 inches. In the case where LTPO (a structure in which an LTPS transistor and an OS transistor are combined) is employed in the display region 235, the diagonal size of the display region 235 is preferably greater than or equal to 0.1 inches and less than or equal to 50 inches, further preferably greater than or equal to 1 inch and less than or equal to 50 inches. In the case where OS transistors are used in the display region 235, the diagonal size of the display region 235 is preferably greater than or equal to 0.1 inches and less than or equal to 200 inches, further preferably greater than or equal to 50 inches and less than or equal to 100 inches.

With single crystal Si transistors, a size increase is extremely difficult because of the size of a single crystal Si substrate. Furthermore, since a laser crystallization apparatus is used in the manufacturing process, LTPS transistors are unlikely to respond to a size increase (typically to a screen diagonal size greater than 30 inches). By contrast, since the manufacturing process does not necessarily require a laser crystallization apparatus or the like or can be performed at a relatively low process temperature (typically, lower than or equal to 450° C.), OS transistors are applicable to a display panel with a relatively large area (typically, a diagonal size greater than or equal to 50 inches and less than or equal to 100 inches). In addition, LTPO is applicable to a display panel with a size midway between the case of using LTPS transistors and the case of using OS transistors (typically, a diagonal size greater than or equal to 1 inch and less than or equal to 50 inches).

<Structure Example of Light-Emitting Element>

A light-emitting element (also referred to as a light-emitting device) that can be used in the semiconductor device of one embodiment of the present invention will be described.

Figure 58A:
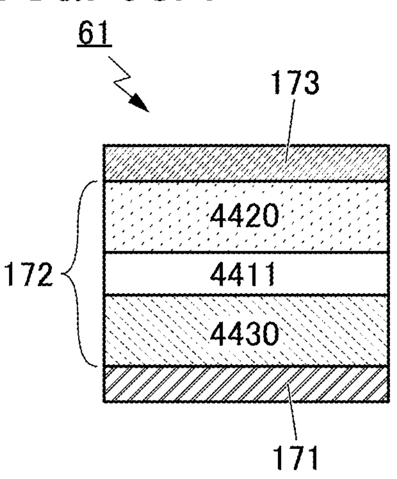
FIG. 58A to FIG. 58D are diagrams illustrating structure examples of a light-emitting element.

As illustrated in FIG. 58A, the light-emitting element 61 includes an EL layer 172 between a pair of electrodes (a conductive layer 171 and a conductive layer 173). The EL layer 172 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between the pair of electrodes, can serve as a single light-emitting unit, and the structure in FIG. 58A is referred to as a single structure in this specification and the like.

Figure 58B:
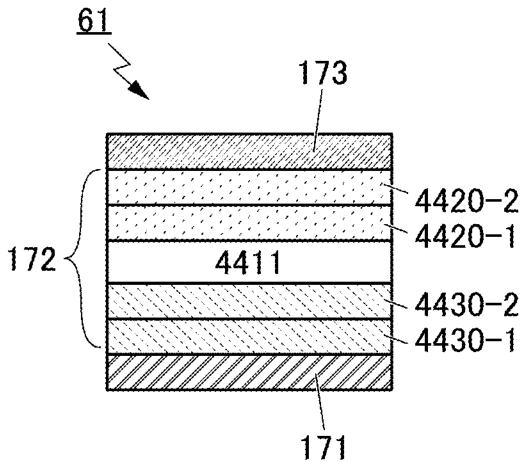

FIG. 58B is a modification example of the EL layer 172 included in the light-emitting element 61 illustrated in FIG. 58A. Specifically, the light-emitting element 61 illustrated in FIG. 58B includes a layer 4430-1 over the conductive layer 171, a layer 4430-2 over the layer 4430-1, the light-emitting layer 4411 over the layer 4430-2, a layer 4420-1 over the light-emitting layer 4411, a layer 4420-2 over the layer 4420-1, and the conductive layer 173 over the layer 4420-2. In the case where the conductive layer 171 is an anode and the conductive layer 173 is a cathode, for example, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, in the case where the conductive layer 171 is a cathode and the conductive layer 173 is an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layer structure, carriers can be efficiently injected to the light-emitting layer 4411, and the efficiency of the recombination of carriers in the light-emitting layer 4411 can be enhanced.

Figure 58C:
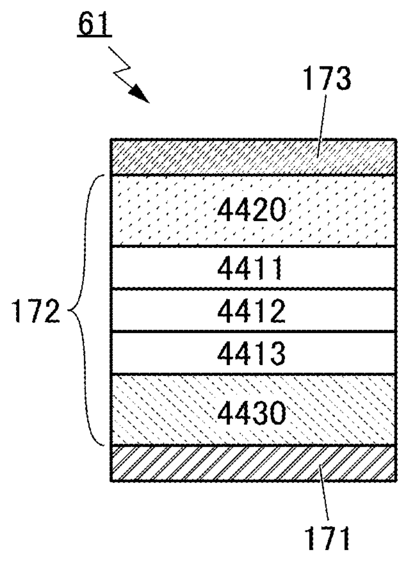

Note that a structure in which a plurality of light-emitting layers (the light-emitting layer 4411, a light-emitting layer 4412, and a light-emitting layer 4413) are provided between the layer 4420 and the layer 4430 as illustrated in FIG. 58C is another example of the single structure.

Figure 58D:
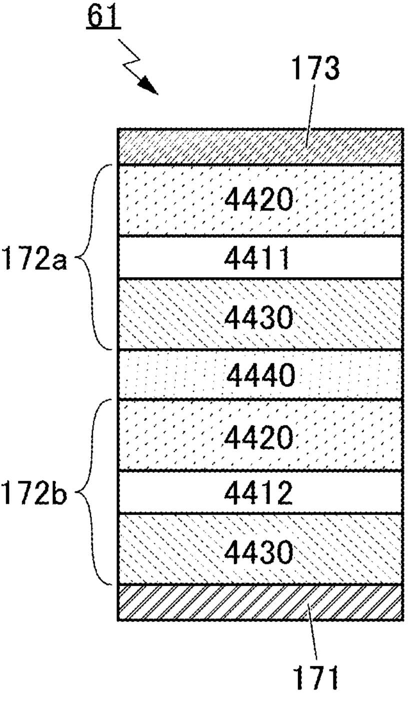

A structure in which a plurality of light-emitting units (an EL layer 172*a* and an EL layer 172*b*) are connected in series with an intermediate layer (charge-generation layer) 4440 therebetween as illustrated in FIG. 58D is referred to as a tandem structure or a stack structure in this specification and the like. Note that the tandem structure enables a light-emitting element to emit light with high luminance.

In the case where the light-emitting element 61 has the tandem structure illustrated in FIG. 58D, the EL layer 172*a* and the EL layer 172*b* may emit light of the same color. For example, the EL layer 172*a* and the EL layer 172*b* may both emit green light. Note that in the case where the display region 235 includes three subpixels of R, G, and B and each of the subpixels includes a light-emitting element, the tandem structure may be employed for the light-emitting element of each of the subpixels. Specifically, the EL layer 172*a* and the EL layer 172*b* in the subpixel of R each contain a material capable of emitting red light, the EL layer 172*a* and the EL layer 172*b* in the subpixel of G each contain a material capable of emitting green light, and the EL layer 172*a* and the EL layer 172*b* in the subpixel of B each contain a material capable of emitting blue light. In other words, the light-emitting layer 4411 and the light-emitting layer 4412 may contain the same material. When the EL layer 172*a* and the EL layer 172*b* emit light of the same color, the current density per unit emission luminance can be reduced. Thus, the reliability of the light-emitting element 61 can be increased.

The emission color of the light-emitting element can be red, green, blue, cyan, magenta, yellow, white, or the like depending on the material that constitutes the EL layer 172. Furthermore, the color purity can be further increased when the light-emitting element has a microcavity structure.

The light-emitting layer may contain two or more of light-emitting substances that emit light of R (red), G (green), B (blue), Y (yellow), O (orange), and the like. The light-emitting element that emits white light preferably contains two or more kinds of light-emitting substances in the light-emitting layer. To obtain white light emission by using two kinds of light-emitting substances, the light-emitting substances are selected such that the emission colors of the light-emitting substances are complementary. For another example, when the emission color of a first light-emitting layer and the emission color of a second light-emitting layer have a relationship of complementary colors, it is possible to obtain the light-emitting element that emits white light as a whole. The same applies to a light-emitting element including three or more light-emitting layers.

The light-emitting layer preferably contains two or more of light-emitting substances that emit light of R (red), G (green), B (blue), Y (yellow), O (orange), and the like. Alternatively, the light-emitting layer preferably contains two or more light-emitting substances that emit light containing two or more of spectral components of R, G, and B.

Examples of a light-emitting substance include a substance that emits fluorescent light (a fluorescent material), a substance that emits phosphorescent light (a phosphorescent material), an inorganic compound (a quantum dot material and the like), and a substance that exhibits thermally activated delayed fluorescence (a thermally activated delayed fluorescence (TADF) material). Note that as a TADF material, a material in which a singlet excited state and a triplet excited state are in a thermal equilibrium state may be used. Since such a TADF material enables a short emission lifetime (excitation lifetime), an efficiency decrease of a light-emitting element in a high-luminance region can be inhibited.

<Method for Forming Light-Emitting Element>

An example of a method for forming the light-emitting element 61 will be described below.

FIG. 59A illustrates a schematic top view of the light-emitting element 61. In FIG. 59A and the like, the light-emitting element 61 emitting red light is denoted as a light-emitting element 61R, the light-emitting element 61 emitting green light is denoted as a light-emitting element 61G, and the light-emitting element 61 emitting blue light is denoted as a light-emitting element 61B. In FIG. 59A, light-emitting regions of the light-emitting elements are denoted by R, G, and B to easily differentiate the light-emitting elements. Note that the structure of the light-emitting element 61 illustrated in FIG. 59A may be referred to as an SBS (Side By Side) structure. Although FIG. 59A illustrates the structure having three emission colors of red (R), green (G), and blue (B), one embodiment of the present invention is not limited thereto. For example, the structure may have four or more colors.

The light-emitting elements 61R, the light-emitting elements 61G, and the light-emitting elements 61B are arranged in a matrix. Although FIG. 59A illustrates what is called stripe arrangement in which the light-emitting elements of the same color are arranged in one direction, the arrangement method of the light-emitting elements is not limited thereto. As the arrangement method of the light-emitting elements, delta arrangement, zig-zag arrangement, S stripe arrangement, pentile arrangement, or the like can be employed.

As the light-emitting element 61R, the light-emitting element 61G, and the light-emitting element 61B, an organic EL device such as an OLED (Organic Light Emitting Diode) or a QOLED (Quantum-dot Organic Light Emitting Diode) is preferably used. Examples of a light-emitting substance contained in the light-emitting element include a substance that emits fluorescent light (a fluorescent material), a substance that emits phosphorescent light (a phosphorescent material), an inorganic compound (a quantum dot material and the like), and a substance that exhibits thermally activated delayed fluorescence (a thermally activated delayed fluorescent (TADF) material).

FIG. 59B is a cross-sectional schematic view taken along the dashed-dotted line A1-A2 in FIG. 59A. FIG. 59B illustrates cross sections of the light-emitting element 61R, the light-emitting element 61G, and the light-emitting element 61B. The light-emitting element 61R, the light-emitting element 61G, and the light-emitting element 61B are provided over an insulating layer 363 and include the conductive layer 171 functioning as a pixel electrode and the conductive layer 173 functioning as a common electrode. As the insulating layer 363, one or both of an inorganic insulating film and an organic insulating film can be used. An inorganic insulating film is preferably used as the insulating layer 363. Examples of the inorganic insulating film include oxide insulating films and nitride insulating films such as a silicon oxide film, a silicon oxynitride film, a silicon nitride oxide film, a silicon nitride film, an aluminum oxide film, an aluminum oxynitride film, and a hafnium oxide film.

The light-emitting element 61R includes an EL layer 172R between the conductive layer 171 functioning as a pixel electrode and the conductive layer 173 functioning as a common electrode. The EL layer 172R contains at least a light-emitting organic compound that emits light with intensity in a red wavelength range. An EL layer 172G included in the light-emitting element 61G contains at least a light-emitting organic compound that emits light with intensity in a green wavelength range. An EL layer 172B included in the light-emitting element 61B contains at least a light-emitting organic compound that emits light with intensity in a blue wavelength range.

The EL layer 172R, the EL layer 172G, and the EL layer 172B may each include one or more of an electron-injection layer, an electron-transport layer, a hole-injection layer, and a hole-transport layer in addition to the layer containing a light-emitting organic compound (the light-emitting layer).

The conductive layer 171 functioning as a pixel electrode is provided in each of the light-emitting elements. The conductive layer 173 functioning as a common electrode is provided as a continuous layer shared by the light-emitting elements. A conductive film that transmits visible light is used for either the conductive layer 171 functioning as a pixel electrode or the conductive layer 173 functioning as a common electrode, and a reflective conductive film is used for the other. When the conductive layer 171 functioning as a pixel electrode has a light-transmitting property and the conductive layer 173 functioning as a common electrode has a reflective property, a bottom-emission display device can be obtained, whereas when the conductive layer 171 functioning as a pixel electrode has a reflective property and the conductive layer 173 functioning as a common electrode has a light-transmitting property, a top-emission display device can be obtained. Note that when both the conductive layer 171 functioning as a pixel electrode and the conductive layer 173 functioning as a common electrode have a light-transmitting property, a dual-emission display device can be obtained.

For example, in the case where the light-emitting element 61R has a top-emission structure, light 175R is emitted from the light-emitting element 61R to the conductive layer 173 side. In the case where the light-emitting element 61G has a top-emission structure, light 175G is emitted from the light-emitting element 61G to the conductive layer 173 side. In the case where the light-emitting element 61B has a top-emission structure, light 175B is emitted from the light-emitting element 61B to the conductive layer 173 side.

An insulating layer 272 is provided to cover end portions of the conductive layer 171 functioning as a pixel electrode. End portions of the insulating layer 272 are preferably tapered. For the insulating layer 272, a material similar to the material that can be used for the insulating layer 363 can be used.

The insulating layer 272 is provided to prevent an unintentional electric short-circuit between adjacent light-emitting elements 61 and unintended light emission. The insulating layer 272 also has a function of preventing the contact of a metal mask with the conductive layer 171 in the case where the metal mask is used to form the EL layer 172.

The EL layer 172R, the EL layer 172G, and the EL layer 172B each include a region in contact with the top surface of the conductive layer 171 functioning as a pixel electrode and a region in contact with the surface of the insulating layer 272. End portions of the EL layer 172R, the EL layer 172G, and the EL layer 172B are positioned over the insulating layer 272.

As illustrated in FIG. 59B, there is a gap between the EL layers of the light-emitting elements that exhibit two different colors. In this manner, the EL layer 172R, the EL layer 172G, and the EL layer 172B are preferably provided so as not to be in contact with each other. This can suitably prevent unintentional light emission (also referred to as crosstalk) from being caused by current flowing through two adjacent EL layers. As a result, the contrast can be increased to achieve a display device with high display quality.

The EL layer 172R, the EL layer 172G, and the EL layer 172B can be formed separately by a vacuum evaporation method or the like using a shadow mask such as a metal mask. Alternatively, these layers may be formed separately by a photolithography method. The use of the photolithography method achieves a display device with high definition, which is difficult to obtain in the case of using a metal mask.

In this specification and the like, a device formed using a metal mask or an FMM (a fine metal mask or a high-definition metal mask) is sometimes referred to as a device having an MM (metal mask) structure. In this specification and the like, a device formed without using a metal mask or an FMM is sometimes referred to as a device having an MML (metal maskless) structure. A display device having an MML structure is formed without using a metal mask and thus has higher flexibility in designing the pixel arrangement, the pixel shape, and the like than a display device having an MM structure.

A protective layer 271 is provided over the conductive layer 173 functioning as a common electrode so as to cover the light-emitting element 61R, the light-emitting element 61G, and the light-emitting element 61B. The protective layer 271 has a function of preventing diffusion of impurities such as water into the light-emitting elements from above.

The protective layer 271 can have, for example, a single-layer structure or a stacked-layer structure at least including an inorganic insulating film. Examples of the inorganic insulating film include oxide films and nitride films such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as indium gallium oxide or indium gallium zinc oxide (IGZO) may be used for the protective layer 271. Note that the protective layer 271 is formed by an ALD method, a CVD method, or a sputtering method. Although the protective layer 271 includes an inorganic insulating film in this example, one embodiment of the present invention is not limited thereto. For example, the protective layer 271 may have a stacked-layer structure of an inorganic insulating film and an organic insulating film.

Note that in this specification, a nitride oxide refers to a compound that contains more nitrogen than oxygen. An oxynitride refers to a compound that contains more oxygen than nitrogen. The content of each element can be measured by Rutherford backscattering spectrometry (RBS), for example.

In the case where an indium gallium zinc oxide is used for the protective layer 271, the indium gallium zinc oxide can be processed by a wet etching method or a dry etching method. For example, in the case where IGZO is used for the protective layer 271, a chemical solution of oxalic acid or phosphoric acid, a mixed chemical solution (e.g., a mixed chemical solution of phosphoric acid, acetic acid, nitric acid, and water, which is also referred to as a mixed acid aluminum etchant), or the like can be used. Note that the volume ratio of phosphoric acid, acetic acid, nitric acid, and water mixed in the mixed acid aluminum etchant can be 53.3:6.7:3.3:36.7 or in the neighborhood thereof.

FIG. 59C illustrates an example different from the above example. Specifically, in FIG. 59C, light-emitting elements 61W that emit white light are provided. The light-emitting elements 61W each include an EL layer 172W that emits white light between the conductive layer 171 functioning as a pixel electrode and the conductive layer 173 functioning as a common electrode.

The EL layer 172W can have, for example, a structure in which two light-emitting layers that are selected so as to emit light of complementary colors are stacked. It is also possible to use a stacked EL layer in which a charge-generation layer is provided between light-emitting layers. The EL layer 172W may include three or more light-emitting layers.

FIG. 59C illustrates three light-emitting elements 61W arranged side by side. A coloring layer 264R is provided above the left light-emitting element 61W. The coloring layer 264R functions as a band path filter that transmits red light. Similarly, a coloring layer 264G that transmits green light is provided above the middle light-emitting element 61W, and a coloring layer 264B that transmits blue light is provided above the right light-emitting element 61W. Thus, the display device can display color images.

Here, the EL layer 172W and the conductive layer 173 functioning as a common electrode are each separated between adjacent two light-emitting elements 61W. This can prevent unintentional light emission from being caused by current flowing through the EL layers 172W of adjacent two light-emitting elements 61W. Particularly when a stacked EL layer in which a charge-generation layer is provided between two light-emitting layers is used as the EL layer 172W, the effect of crosstalk is more significant as the definition increases, i.e., as the distance between adjacent pixels decreases, leading to lower contrast. Thus, the above structure can achieve a display device having both high definition and high contrast.

The EL layer 172W and the conductive layer 173 functioning as a common electrode are each preferably separated by a photolithography method. This can decrease the distance between light-emitting elements, achieving a display device with a higher aperture ratio than that formed using, for example, a shadow mask such as a metal mask.

Note that in the case of a bottom-emission light-emitting element, a coloring layer may be provided between the conductive layer 171 functioning as a pixel electrode and the insulating layer 363.

FIG. 59D illustrates an example different from the above example. Specifically, in FIG. 59D, the insulating layers 272 are not provided between the light-emitting element 61R, the light-emitting element 61G, and the light-emitting element 61B. With such a structure, the display device can have a high aperture ratio. When the insulating layers 272 are not provided, unevenness formed by the light-emitting elements 61 can be reduced, so that the viewing angle of the display device can be improved. Specifically, the viewing angle can be greater than or equal to 150° and less than 180°, preferably greater than or equal to 160° and less than 180°, further preferably greater than or equal to 160° and less than 180°.

The protective layer 271 covers the side surfaces of the EL layer 172R, the EL layer 172G, and the EL layer 172B. With this structure, impurities (typically, water or the like) can be inhibited from entering the EL layer 172R, the EL layer 172G, and the EL layer 172B through their side surfaces. In addition, leakage current between adjacent light-emitting elements 61 is reduced, so that color saturation and contrast ratio are improved and power consumption is reduced.

In the structure illustrated in FIG. 59D, the top shapes of the conductive layer 171, the EL layer 172R, and the conductive layer 173 are substantially the same. This structure can be formed in the following manner: the conductive layer 171, the EL layer 172R, and the conductive layer 173 are formed and collectively processed using a resist mask or the like. In this process, the EL layer 172R and the conductive layer 173 are processed using the conductive layer 173 as a mask, and thus this process can be called self-alignment patterning. Although the EL layer 172R is described here, the EL layer 172G and the EL layer 172B can each have a similar structure.

In FIG. 59D, a protective layer 273 is further provided over the protective layer 271. For example, the protective layer 271 can be formed with an apparatus that can deposit a film with excellent coverage (typically, an ALD apparatus or the like), and the protective layer 273 can be formed with an apparatus that can deposit a film with coverage inferior to that of the protective layer 271 (typically, a sputtering apparatus or the like), whereby a region 275 can be provided between the protective layer 271 and the protective layer 273. In other words, the regions 275 are positioned between the EL layer 172R and the EL layer 172G and between the EL layer 172G and the EL layer 172B.

Note that the region 275 contains, for example, any one or more selected from air, nitrogen, oxygen, carbon dioxide, and Group 18 elements (typically, helium, neon, argon, xenon, krypton, and the like). Furthermore, for example, a gas used during the deposition of the protective layer 273 is sometimes contained in the region 275. For example, in the case where the protective layer 273 is deposited by a sputtering method, any one or more of the above-described Group 18 elements is sometimes contained in the region 275. In the case where a gas is contained in the region 275, a gas can be identified with a gas chromatography method or the like. Alternatively, in the case where the protective layer 273 is deposited by a sputtering method, a gas used in the sputtering is sometimes contained in the protective layer 273. In this case, an element such as argon is sometimes detected when the protective layer 273 is analyzed by an energy dispersive X-ray analysis (EDX analysis) or the like.

In the case where the refractive index of the region 275 is lower than the refractive index of the protective layer 271, light emitted from the EL layer 172R, the EL layer 172G, or the EL layer 172B is reflected at the interface between the protective layer 271 and the region 275. Thus, light emitted from the EL layer 172R, the EL layer 172G, or the EL layer 172B can be inhibited from entering an adjacent pixel in some cases. This can inhibit color mixture of light emitted from adjacent pixels and thus can improve the display quality of the display device.

In the case of the structure illustrated in FIG. 59D, a region between the light-emitting element 61R and the light-emitting element 61G or a region between the light-emitting element 61G and the light-emitting element 61B (hereinafter, simply referred to as a distance between the light-emitting elements) can be small. Specifically, the distance between the light-emitting elements can be less than or equal to 1 m, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display device includes a region where an interval between the side surface of the EL layer 172R and the side surface of the EL layer 172G or an interval between the side surface of the EL layer 172G and the side surface of the EL layer 172B is less than or equal to 1 m, preferably less than or equal to 0.5 m (500 nm), further preferably less than or equal to 100 nm.

In the case where the region 275 contains a gas, for example, the light-emitting elements can be separated from each other and color mixing of light or crosstalk between the light-emitting elements can be inhibited.

Alternatively, the region 275 may be filled with a filler. Examples of the filler include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. Alternatively, a photoresist may be used as the filler. The photoresist used as the filler may be a positive photoresist or a negative photoresist.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is suitably used. Meanwhile, the white-light-emitting device is suitable in terms of lower manufacturing cost or higher manufacturing yield because the manufacturing process of the white-light-emitting device is simpler than that of a light-emitting device having an SBS structure.

FIG. 60A illustrates an example different from the above example. Specifically, the structure illustrated in FIG. 60A is different from the structure illustrated in FIG. 59D in the structure of the insulating layer 363. The insulating layer 363 has a recessed portion in its top surface that is formed by being partially etched when the light-emitting element 61R, the light-emitting element 61G, and the light-emitting element 61B are processed. In addition, the protective layer 271 is formed in the recessed portion. In other words, in the cross-sectional view, a region is provided, in which the bottom surface of the protective layer 271 is positioned below the bottom surface of the conductive layer 171. With the region, impurities (typically, water or the like) can be suitably inhibited from entering the light-emitting element 61R, the light-emitting element 61G, and the light-emitting element 61B from the bottom. It is likely that the recessed portion can be formed when impurities (also referred to as residue) that could be attached to the side surfaces of the light-emitting element 61R, the light-emitting element 61G, and the light-emitting element 61B in processing of the light-emitting elements are removed by wet etching or the like. After the residue is removed, the side surfaces of the light-emitting elements are covered with the protective layer 271, whereby a highly reliable display device can be provided.

FIG. 60B illustrates an example different from the above example. Specifically, the structure illustrated in FIG. 60B includes an insulating layer 276 and a microlens array 277 in addition to the structure illustrated in FIG. 60A. The insulating layer 276 functions as an adhesive layer. Note that when the refractive index of the insulating layer 276 is lower than the refractive index of the microlens array 277, the microlens array 277 can condense light emitted from the light-emitting element 61R, the light-emitting element 61G, and the light-emitting element 61B. This can increase the light extraction efficiency of the display device. In particular, this is suitable, because a user can see bright images when the user sees the display surface from the front of the display surface of the display device. As the insulating layer 276, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

FIG. 60C illustrates an example different from the above example. Specifically, the structure illustrated in FIG. 60C includes three light-emitting elements 61W instead of the light-emitting element 61R, the light-emitting element 61G, and the light-emitting element 61B in the structure illustrated in FIG. 60A. In addition, the insulating layer 276 is provided over the three light-emitting elements 61W, and the coloring layer 264R, the coloring layer 264G, and the coloring layer 264B are provided over the insulating layer 276. Specifically, the coloring layer 264R that transmits red light is provided at a position overlapping with the left light-emitting element 61W, the coloring layer 264G that transmits green light is provided at a position overlapping with the middle light-emitting element 61W, and the coloring layer 264B that transmits blue light is provided at a position overlapping with the right light-emitting element 61W. Thus, the display device can display color images. The structure illustrated in FIG. 60C is also a modification example of the structure illustrated in FIG. 59C.

FIG. 60D illustrates an example different from the above example. Specifically, in the structure illustrated in FIG. 60D, the protective layer 271 is provided adjacent to the side surfaces of the conductive layer 171 and the EL layer 172. The conductive layer 173 is provided as a continuous layer shared by the light-emitting elements. In the structure illustrated in FIG. 60D, the region 275 is preferably filled with a filler.

The color purity of emitted light can be increased when the light-emitting element 61 has a microcavity structure. In order that the light-emitting element 61 has a microcavity structure, a product (optical path length) of a distance d between the conductive layer 171 and the conductive layer 173 and a refractive index n of the EL layer 172 is set to m times half of a wavelength λ (m is an integer of 1 or more). The distance d can be obtained by Formula 1.

$$d=m\times\lambda/(2\times n) \qquad \text{Formula 1}$$

According to Formula 1, in the light-emitting element 61 having the microcavity structure, the distance d is determined in accordance with the wavelength (emission color) of emitted light. The distance d corresponds to the thickness of the EL layer 172. Thus, the EL layer 172G is provided to have a larger thickness than the EL layer 172B, and the EL layer 172R is provided to have a larger thickness than the EL layer 172G, in some cases.

To be exact, the distance d is a distance from a reflection region in the conductive layer 171 functioning as a reflective electrode to a reflection region in the conductive layer 173 functioning as a transflective electrode. For example, in the case where the conductive layer 171 is a stack of silver and ITO (Indium Tin Oxide) that is a transparent conductive film and the ITO is positioned on the EL layer 172 side, the distance d suitable for the emission color can be set by adjusting the thickness of the ITO. That is, even when the EL layer 172R, the EL layer 172G, and the EL layer 172B have the same thickness, the distance d suitable for the emission color can be obtained by adjusting the thickness of the ITO.

However, it is sometimes difficult to determine the exact position of the reflection region in each of the conductive layer 171 and the conductive layer 173. In this case, it is assumed that the effect of the microcavity structure can be fully obtained with a certain position in each of the conductive layer 171 and the conductive layer 173 being supposed as the reflection region.

The light-emitting element 61 includes a hole-injection layer, a hole-transport layer, a light-emitting layer, an electron-transport layer, an electron-injection layer, and the like. Note that a specific structure example of the light-emitting element 61 will be described in another embodiment. In order to increase the light extraction efficiency in the microcavity structure, the optical path length from the conductive layer 171 functioning as a reflective electrode to the light-emitting layer is preferably set to an odd multiple of λ/4. In order to achieve this optical path length, the thicknesses of the layers included in the light-emitting element 61 are preferably adjusted as appropriate.

In the case where light is emitted from the conductive layer 173 side, the reflectance of the conductive layer 173 is preferably higher than the transmittance thereof. The light transmittance of the conductive layer 173 is preferably higher than or equal to 2% and lower than or equal to 50%, further preferably higher than or equal to 2% and lower than or equal to 3000, still further preferably higher than or equal to 2% and lower than or equal to 10%. When the transmittance of the conductive layer 173 is set low (the reflectance is set high), the effect of the microcavity structure can be enhanced.

Figure 61A:
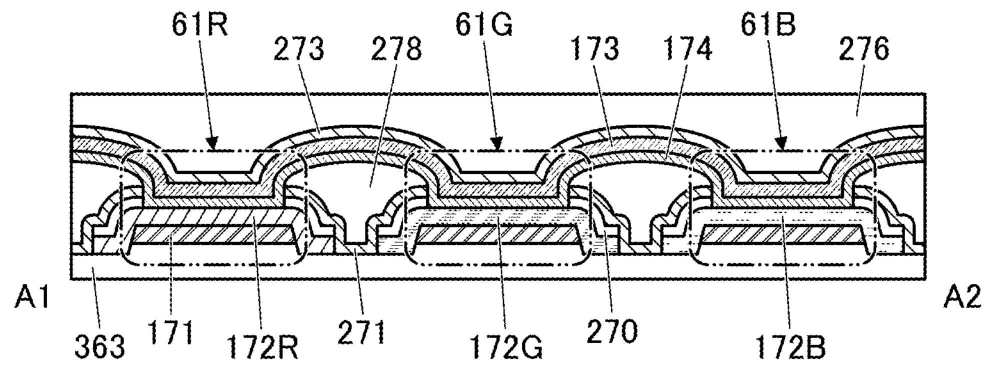
FIG. 61A and FIG. 61B are diagrams illustrating structure examples of light-emitting elements.

FIG. 61A illustrates an example different from the above example. Specifically, in the structure illustrated in FIG. 61A, the EL layer 172 extends beyond the end portions of the conductive layer 171 in each of the light-emitting element 61R, the light-emitting element 61G, and the light-emitting element 61B. For example, in the light-emitting element 61R, the EL layer 172R extends beyond the end portions of the conductive layer 171. In the light-emitting element 61G, the EL layer 172G extends beyond the end portions of the conductive layer 171. In the light-emitting element 61B, the EL layer 172B extends beyond the end portions of the conductive layer 171.

The light-emitting element 61R, the light-emitting element 61G, and the light-emitting element 61B each include a region where the EL layer 172 overlaps with the protective layer 271 with an insulating layer 270 therebetween. In a region between adjacent light-emitting elements 61, an insulating layer 278 is provided over the protective layer 271.

Examples of the insulating layer 278 include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. Alternatively, a photoresist may be used as the insulating layer 278. The photoresist used as the insulating layer 278 may be a positive photoresist or a negative photoresist.

A common layer 174 is provided over the light-emitting element 61R, the light-emitting element 61G, the light-emitting element 61B, and the insulating layer 278, and the conductive layer 173 is provided over the common layer 174. The common layer 174 includes a region in contact with the EL layer 172R, a region in contact with the EL layer 172G, and a region in contact with the EL layer 172B. The common layer 174 is shared by the light-emitting element 61R, the light-emitting element 61G, and the light-emitting element 61B.

As the common layer 174, one or more of a hole-injection layer, a hole-transport layer, a hole-blocking layer, an electron-blocking layer, an electron-transport layer, and an electron-injection layer can be used. For example, the common layer 174 may be a carrier-injection layer (a hole-injection layer or an electron-injection layer). The common layer 174 can also be regarded as part of the EL layer 172. Note that the common layer 174 is provided as necessary. In the case where the common layer 174 is provided, a layer having the same function as the common layer 174 among the layers included in the EL layer 172 is not necessarily provided.

The protective layer 273 is provided over the conductive layer 173, and the insulating layer 276 is provided over the protective layer 273.

Figure 61B:
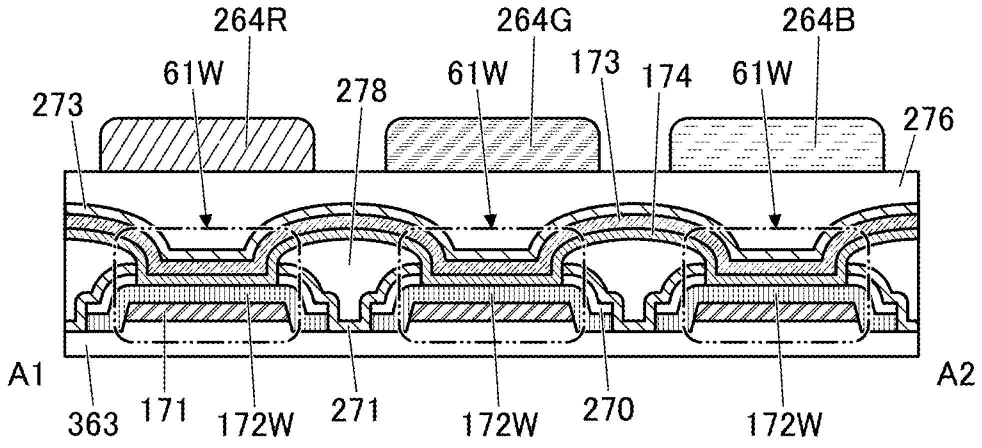

FIG. 61B illustrates an example different from the above example. Specifically, the structure illustrated in FIG. 61B includes three light-emitting elements 61W instead of the light-emitting element 61R, the light-emitting element 61G, and the light-emitting element 61B in the structure illustrated in FIG. 61A. In addition, the insulating layer 276 is provided over the three light-emitting elements 61W, and the coloring layer 264R, the coloring layer 264G, and the coloring layer 264B are provided over the insulating layer 276. Specifically, the coloring layer 264R that transmits red light is provided at a position overlapping with the left light-emitting element 61W, the coloring layer 264G that transmits green light is provided at a position overlapping with the middle light-emitting element 61W, and the coloring layer 264B that transmits blue light is provided at a position overlapping with the right light-emitting element 61W. Thus, the display device can display color images. The structure illustrated in FIG. 61B is also a modification example of the structure illustrated in FIG. 60C.

Figure 62A:
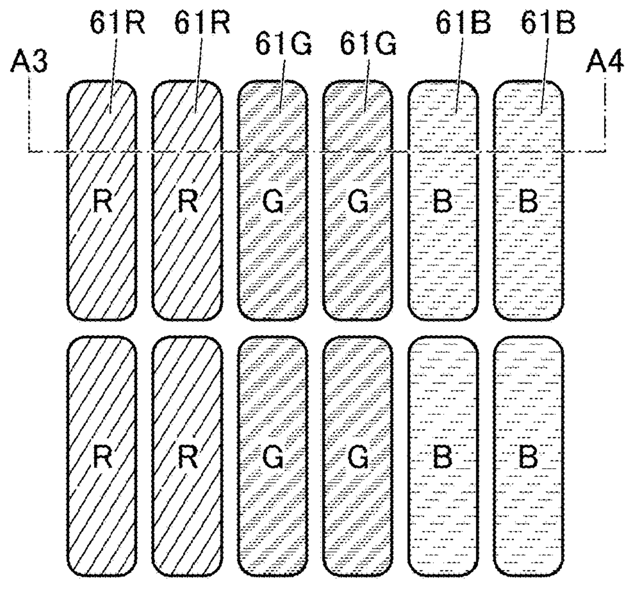
FIG. 62A to FIG. 62C are diagrams illustrating structure examples of light-emitting elements.

FIG. 62A illustrates a schematic top view of the light-emitting elements 61. Like FIG. 57A1, FIG. 62A illustrates an example in which the plurality of light-emitting elements 61 of the same emission color are provided adjacent to each other. In FIG. 62A, two light-emitting elements 61R are adjacent to each other, two light-emitting elements 61G are adjacent to each other, and two light-emitting elements 61B are adjacent to each other. Note that three or more light-emitting elements 61 of the same emission color may be adjacent to each other. Although FIG. 62A illustrates the structure having three emission colors of red (R), green (G), and blue (B), one embodiment of the present invention is not limited thereto. For example, the structure may have four or more emission colors.

Although FIG. 62A illustrates the light-emitting elements 61 that employ stripe arrangement, the arrangement method of the light-emitting elements 61 is not limited thereto. As the arrangement method of the light-emitting elements 61, delta arrangement, zig-zag arrangement, S stripe arrangement, pentile arrangement, or the like can be employed.

Figure 62B:
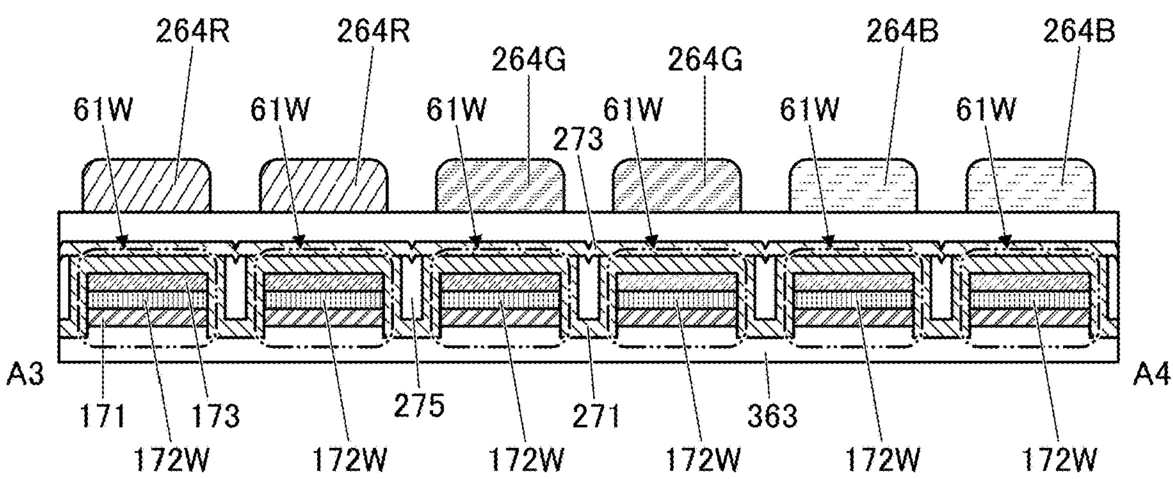
Figure 62C:
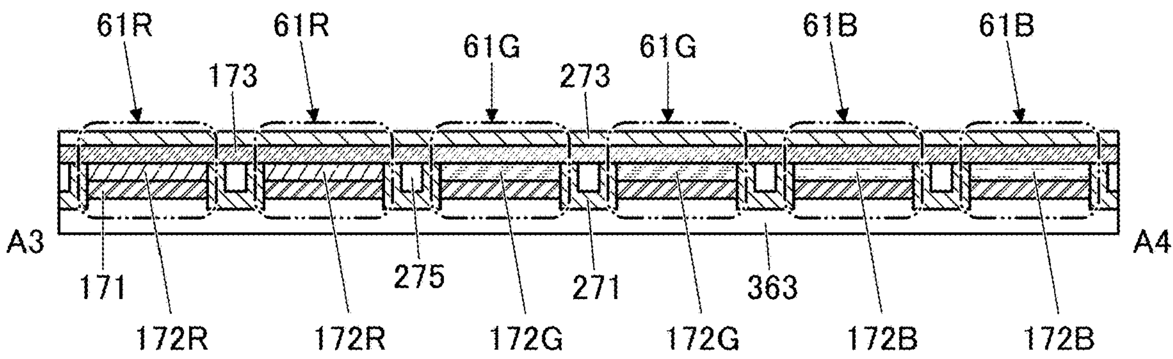

FIG. 62B and FIG. 62C are schematic cross-sectional views taken along the dashed-dotted line A3-A4 in FIG. 62A. FIG. 62B corresponds to a modification example of the structure illustrated in FIG. 60C. FIG. 62C corresponds to a modification example of the structure illustrated in FIG. 60D.

When the plurality of light-emitting elements 61 of the same emission color are collectively used as one subpixel, the number of reproducible gray levels can be increased. Consequently, the display quality of the display device can be improved.

The structure described in this embodiment can be used in an appropriate combination with any of the structures described in the other embodiments and examples.

Embodiment 9

In this embodiment, stacked-layer structure examples of the display device 10 will be described.

Figure 63A:
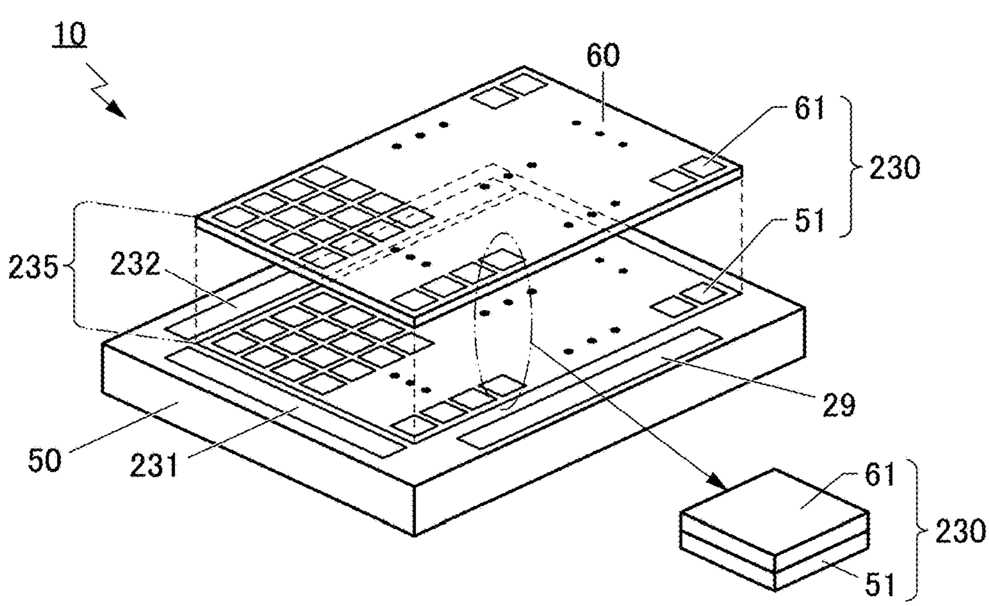
FIG. 63A and FIG. 63B are perspective views of a display device.
Figure 63B:
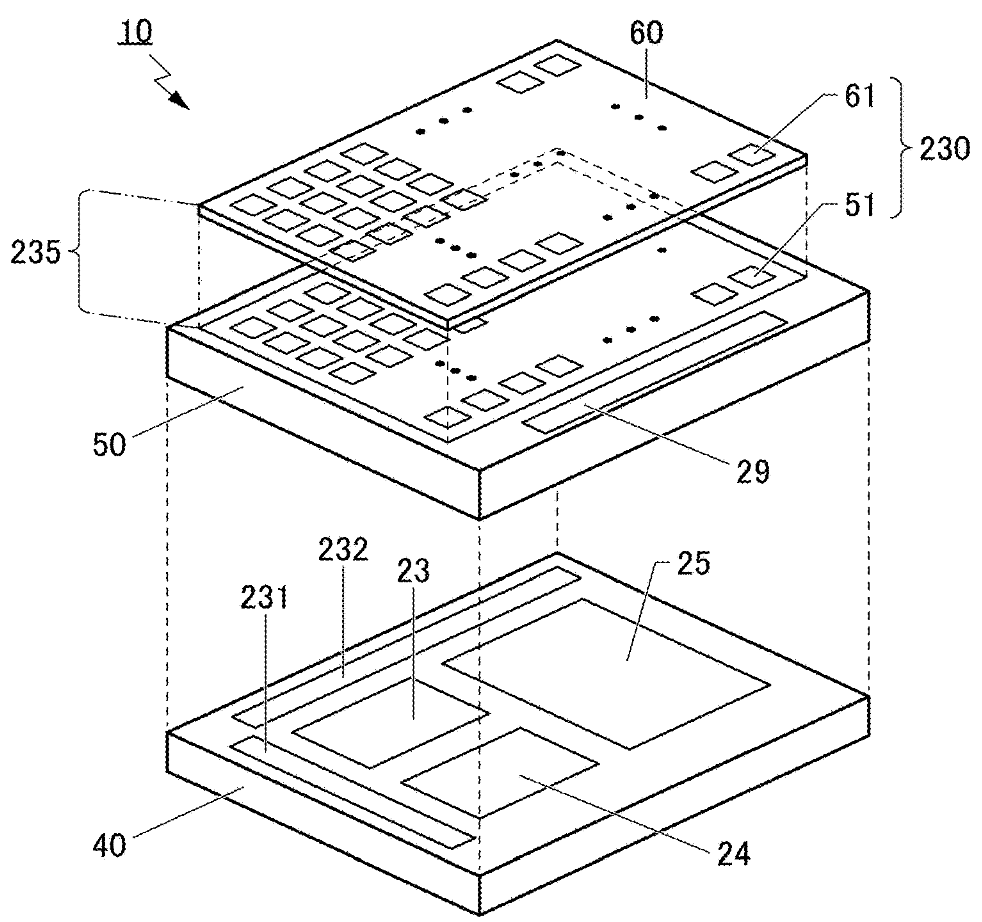

FIG. 63A and FIG. 63B are perspective views of the display device 10. The display device 10 illustrated in FIG. 63A includes the layer 60 overlapping with the layer 50. The layer 50 includes a plurality of pixel circuits 51 arranged in a matrix, the first driver circuit portion 231, the second driver circuit portion 232, and an input/output terminal portion 29. The layer 60 includes the plurality of light-emitting elements 61 arranged in a matrix.

In the display device 10 illustrated in FIG. 63A and FIG. 63B, one pixel circuit 51 and one light-emitting element 61 are electrically connected to each other to function as one pixel 230. Thus, a region where the plurality of pixel circuits 51 included in the layer 50 and the plurality of light-emitting elements 61 included in the layer 60 overlap with each other functions as the display region 235. As each of the pixels 230 included in the display device 10 illustrated in FIG. 63A and FIG. 63B, any of the semiconductor device 100A, the semiconductor device 100B, and the semiconductor device 100C described in the above embodiments can be used, for example.

Power, a signal, and the like necessary for the operation of the display device 10 are supplied to the display device 10 through the input/output terminal portion 29. In the display device 10 illustrated in FIG. 63A, the transistors included in the peripheral driver circuit can be formed in the same steps as the transistors included in the pixels 230.

The display device 10 may have a structure illustrated in FIG. 63B in which the layer 40, the layer 50, and the layer 60 are provided to overlap with one another. In FIG. 63B, the plurality of pixel circuits 51 arranged in a matrix are provided in the layer 50, and the first driver circuit portion 231 and the second driver circuit portion 232 are provided in the layer 40. Providing the first driver circuit portion 231 and the second driver circuit portion 232 in the layer different from the layer where the pixel circuits 51 are provided can reduce the width of the bezel around the display region 235, which can increase the area occupied by the display region 235.

An increase in the area occupied by the display region 235 can increase the resolution of the display region 235. Under a fixed resolution of the display region 235, the occupation area per pixel can be increased. Thus, the emission luminance of the display region 235 can be increased. In addition, the proportion of the light-emitting area to the occupation area per pixel (also referred to as "aperture ratio") can be increased. For example, the pixel aperture ratio can be greater than or equal to 40% and less than 100%, preferably greater than or equal to 50% and less than or equal to 95%, further preferably greater than or equal to 60% and less than or equal to 95%. An increase in the occupation area per pixel can lower the density of current supplied to the light-emitting elements 61. Thus, the load applied to the light-emitting elements 61 is reduced, so that the reliability of the semiconductor device 100 can be increased. Accordingly, the reliability of the display device 10 including the semiconductor device 100 can be increased.

Stacking the display region 235, the peripheral driver circuit, and the like can shorten a wiring electrically connecting them. Thus, the wiring resistance and the parasitic capacitance can be lowered, and the operation speed of the semiconductor device 100 can be increased. In addition, the power consumption of the semiconductor device 100 is reduced.

The layer 40 may include a CPU 23 (Central Processing Unit), a GPU 24 (Graphics Processing Unit), and a memory circuit portion 25, in addition to the peripheral driver circuit. In this embodiment and the like, the CPU 23, the GPU 24, the memory circuit portion 25, and the like are sometimes collectively referred to as a "functional circuit".

For example, the CPU 23 has a function of controlling the operations of the GPU 24 and the circuits provided in the layer 40 in accordance with a program stored in the memory circuit portion 25. The GPU 24 has a function of performing arithmetic processing for generating image data. Furthermore, the GPU 24 can perform a large number of matrix operations (product-sum operations) in parallel and thus can perform arithmetic processing using a neural network at high speed, for example. The GPU 24 has a function of correcting image data using correction data stored in the memory circuit portion 25, for example. The GPU 24 has a function of generating image data in which brightness, hue, contrast, and/or the like are/is corrected, for example.

Upconversion or downconversion of image data may be performed using the GPU 24. A super-resolution circuit may be provided in the layer 40. The super-resolution circuit has a function of determining a potential of any pixel included in the display region 235 by a product-sum operation of weights and potentials of pixels in the periphery of the pixel. The super-resolution circuit has a function of upconverting image data with a resolution lower than that of the display region 235. The super-resolution circuit has a function of downconverting image data with a resolution higher than that of the display region 235.

Providing the super-resolution circuit can reduce the load on the GPU 24. For example, the GPU 24 executes processing up to 2K resolution (or 4K resolution) and the super-resolution circuit performs upconversion to 4K resolution (or 8K resolution), whereby the load on the GPU 24 can be reduced. Downconversion can be performed in a similar manner.

Note that the functional circuit included in the layer 40 does not necessarily include all of these components, and may include another component. For example, a potential generation circuit that generates a plurality of different potentials, a power management circuit that controls supply and stop of power for each circuit included in the display device 10, and/or the like may be provided.

The supply and stop of power may be performed for each circuit included in the CPU 23. For example, power consumption can be reduced by stopping power supply to a circuit, which is determined not to be used for a while, of the circuits included in the CPU 23 and restarting power supply to the circuit as needed. Data necessary for restarting power supply is stored in a memory circuit in the CPU 23, the memory circuit portion 25, or the like before the circuit is stopped. By storing data necessary for recovery of the circuit, high-speed recovery of the circuit stopped can be performed. Note that supply of a clock signal may be stopped to stop the circuit operation.

As the functional circuit, a DSP circuit, a sensor circuit, a communication circuit, an FPGA (Field Programmable Gate Array), and/or the like may be included.

In the case where the peripheral driver circuit and the display region 235 are provided to overlap with each other, a conductive layer 701 may be provided between the peripheral driver circuit and the display region 235. In the case where the peripheral driver circuit and the functional circuit are provided to overlap with the display region 235, the conductive layer 701 may be provided between the display region 235 and each of the peripheral driver circuit and the functional circuit.

Figure 64A:
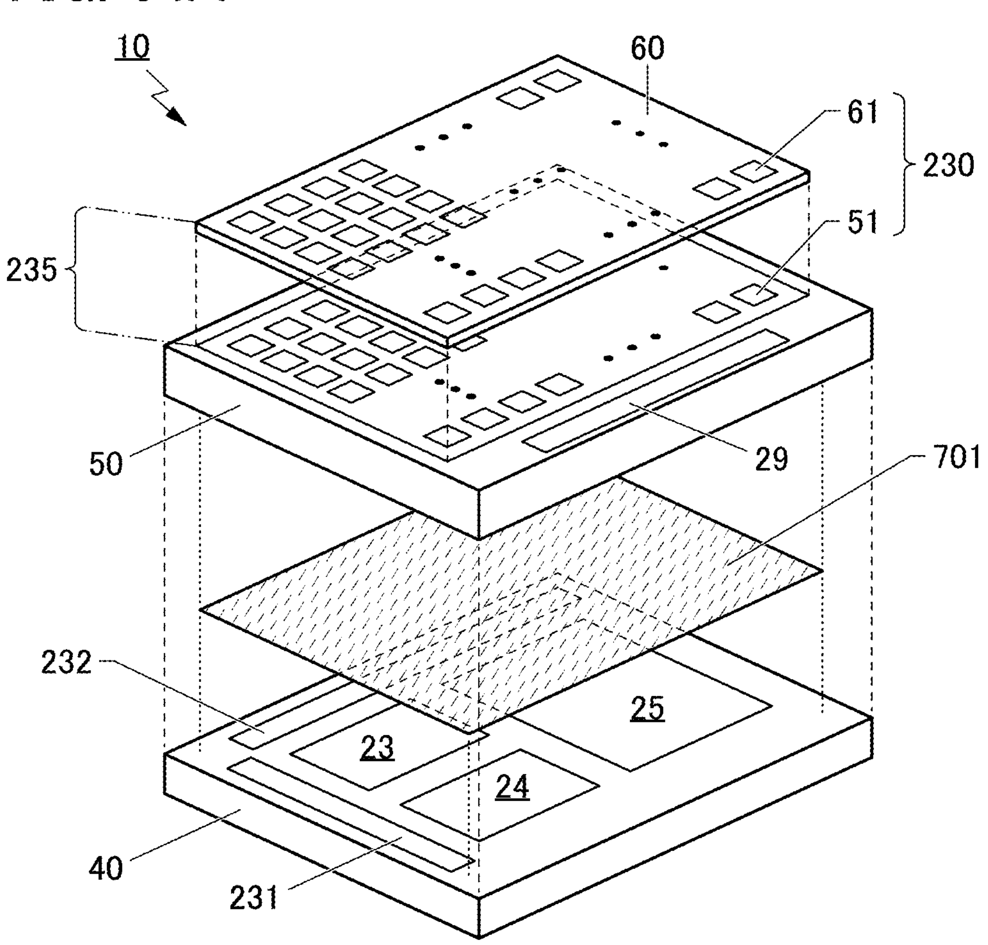
FIG. 64A is a perspective view of a display device.
Figure 64B:
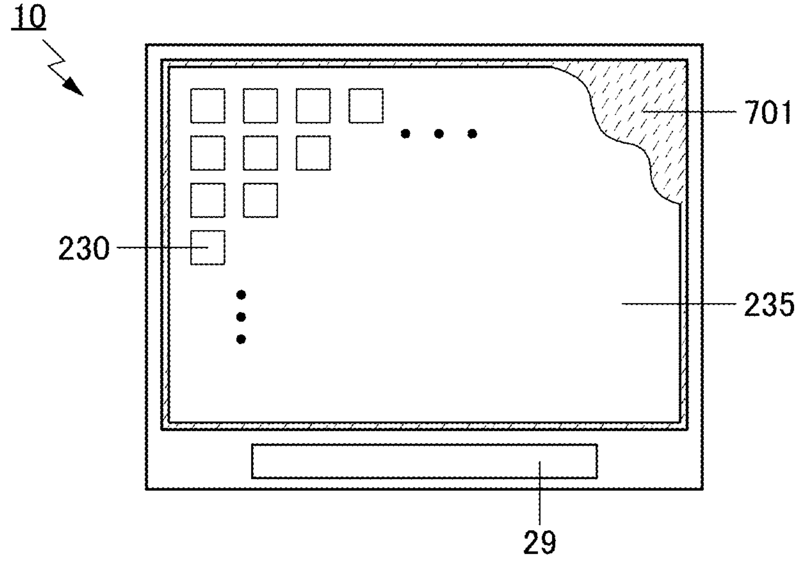
FIG. 64B is a plan view of the display device.

FIG. 64A is a perspective view of the display device 10 including the conductive layer 701 between the display region 235 and each of the peripheral driver circuit and the functional circuit. FIG. 64B is a plan view seen from the display region 235 side of the display device 10 illustrated in FIG. 64A. For easy understanding of the relationship between the display region 235 and the conductive layer 701, part of the display region 235 is not illustrated in FIG. 64B.

Each of the peripheral driver circuit and the functional circuit might cause electromagnetic noise in operation. The electromagnetic noise reaching the display region 235 might decrease the display quality of the display device 10. Specifically, the electromagnetic noise influences the floating nodes (the nodes ND1 to ND4) of the pixel circuits 51 included in the display region 235, thereby preventing accurate potential retention in some cases. Consequently, the pixel circuits 51 cannot be operated stably; thus, the display quality of the display device 10 is decreased.

The conductive layer 701 provided between the display region 235 and each of the peripheral driver circuit and the functional circuit can block the electromagnetic noise generated at the time of the operations of the peripheral driver circuit and the functional circuit, so that a decrease in display quality can be prevented. Blocking the electromagnetic noise stabilizes the operations of the pixel circuits 51 and thus can achieve more accurate potential control. Consequently, the display quality of the display device 10 can be improved.

When seen from the conductive layer 701 side, it is preferable that the conductive layer 701 cover the entire display region 235. Thus, it is preferable that the conductive layer 701 and the display region 235 have an overlapping region. The display region 235 includes the plurality of pixel circuits 51. Thus, it is preferable that the conductive layer 701 and the plurality of pixel circuits 51 have overlapping regions.

Note that the conductive layer 701 is not limited to having a planar shape and may have a net-like shape, a stripe shape, or the like. In the case where the internal stress of the conductive layer 701 is high, providing the conductive layer 701 having a planar shape in a wide range sometimes causes distortion in the layers included in the display device 10, which reduces the reliability of the display device 10. The conductive layer 701 having a net-like shape, a stripe shape, or the like can block the electromagnetic noise and relieve the stress of the conductive layer 701.

Figure 65:
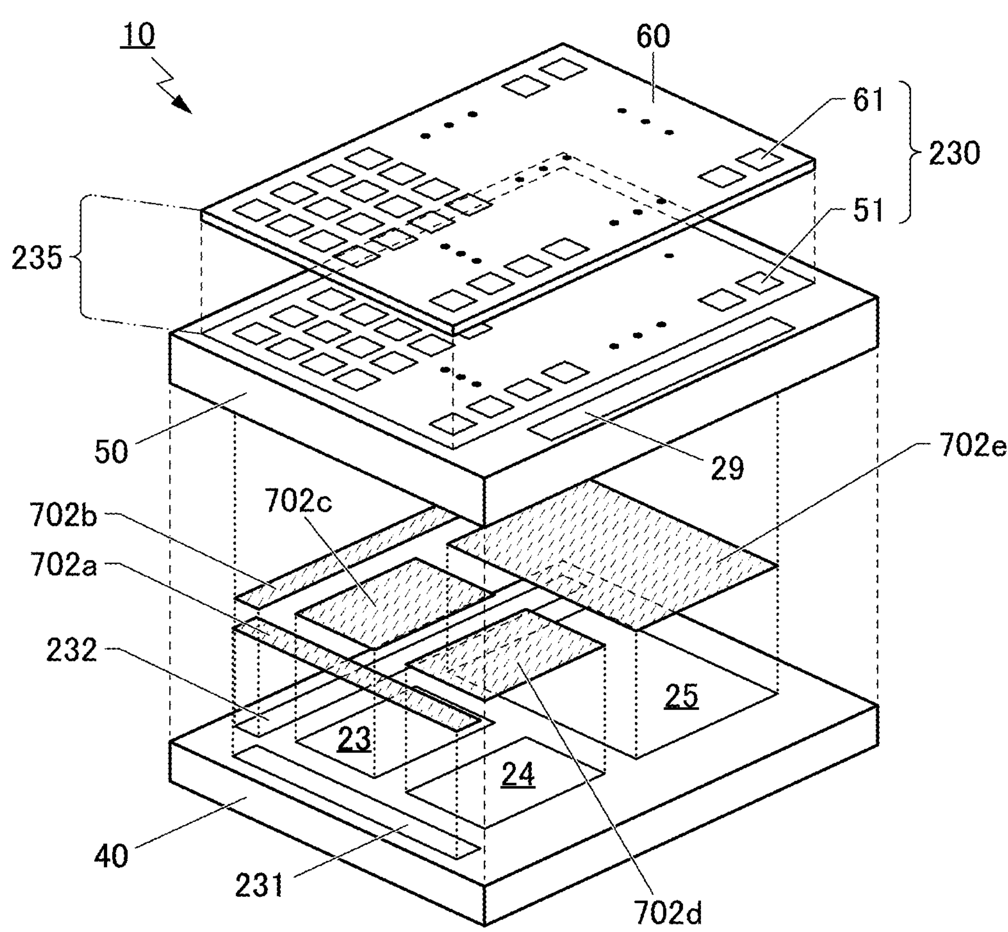
FIG. 65 is a perspective view of a display device.

FIG. 65 is a perspective view of the display device 10 including a conductive layer 702 (a conductive layer 702_a_, a conductive layer 702_b_, a conductive layer 702_c_, a conductive layer 702_d_, and a conductive layer 702_e_) between the display region 235 and each of the peripheral driver circuit and the functional circuit. FIG. 65 illustrates an example in which the conductive layer 702_a_ is provided to overlap with the first driver circuit portion 231, the conductive layer 702_b_ is provided to overlap with the second driver circuit portion 232, the conductive layer 702_c_ is provided to overlap with the CPU 23, the conductive layer 702_d_ is provided to overlap with the GPU 24, and the conductive layer 702_e_ is provided to overlap with the memory circuit portion 25. It is preferable that the conductive layers 702 completely cover the peripheral driver circuit and the functional circuit. Alternatively, the peripheral driver circuit and the functional circuit may be partly covered.

Figure 66A:
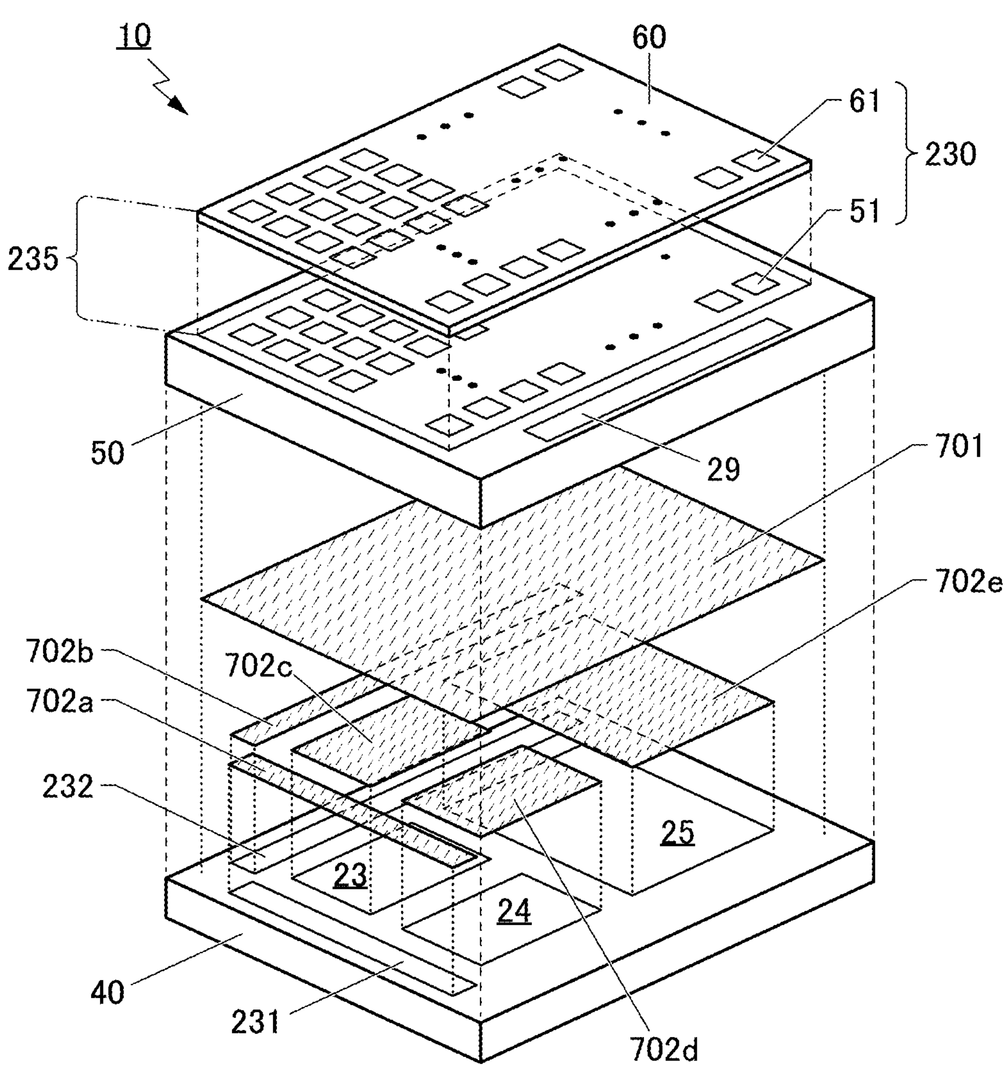
FIG. 66A is a perspective view of a display device.

FIG. 66A is a perspective view of the display device 10 including the conductive layer 701 and the conductive layer 702 between the display region 235 and each of the peripheral driver circuit and the functional circuit. The conductive layer 701 provided in addition to the conductive layer 702 can enhance an effect of blocking the electromagnetic noise.

In this manner, the conductive layer 701 and the conductive layer 702 each function as an electromagnetic shield (sometimes referred to as a "shielding layer" or a "blocking layer"). The conductive layer 701 and the conductive layer 702 may be in a floating state but are preferably supplied with a fixed potential such as a high power supply potential VDD, a low power supply potential VSS, a common potential COM, or a ground potential GND. For example, the ground potential GND is supplied to the conductive layer 701 and the conductive layer 702. In the case where the display device 10 includes both the conductive layer 701 and the conductive layer 702, the conductive layer 701 and the conductive layer 702 may have the same potential or different potentials. One of the conductive layer 701 and the conductive layer 702 may be in a floating state.

Although FIG. 66A illustrates an example in which the display device 10 includes two conductors functioning as electromagnetic shields, three or more conductors functioning as electromagnetic shields may be included. Multiple electromagnetic shields can enhance an effect of blocking the electromagnetic noise. In the case where the multiple electromagnetic shields are provided, layers of the electromagnetic shields are stacked with an insulator therebetween.

Figure 66B:
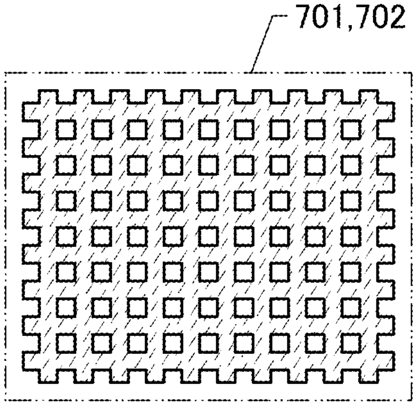
FIG. 66B and FIG. 66C are diagrams illustrating examples of conductive layers.
Figure 66C:
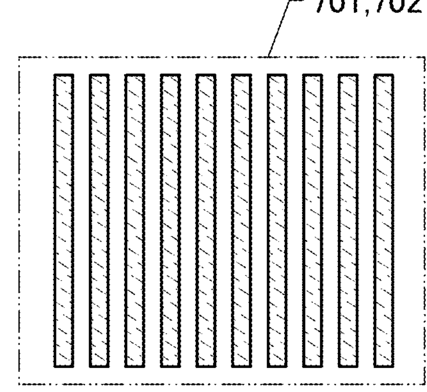

Like the conductive layer 701, the conductive layer 702 is not limited to having a planar shape and may have a net-like shape (see FIG. 66B), a stripe shape (see FIG. 66C), or the like.

Instead of the conductive layer 701 and the conductive layer 702, a conductive layer functioning as a wiring may be used as an electromagnetic shield. For example, a wiring that supplies a fixed potential such as an anode potential or a cathode potential and is formed below the plurality of pixel circuits 51 may be used as the electromagnetic shield. The use of the conductive layer functioning as the wiring as the electromagnetic shield can reduce the number of layers included in the display device 10. Accordingly, the productivity of the display device 10 can be improved.

Some of the transistors in the functional circuit included in the layer 40 may be provided in the layer 50. Moreover, some of the transistors in the pixel circuits 51 included in the layer 50 may be provided in the layer 40. Thus, the functional circuit may include the Si transistor and the OS transistor. In addition, the pixel circuits 51 may each include the Si transistor and the OS transistor.

The transistors included in the display device 10 may be either n-channel transistors or p-channel transistors. Both n-channel transistors and p-channel transistors may be used. For example, a CMOS structure in which n-channel transistors and p-channel transistors are combined may be employed for each of the circuits included in the display device 10.

Figure 67:
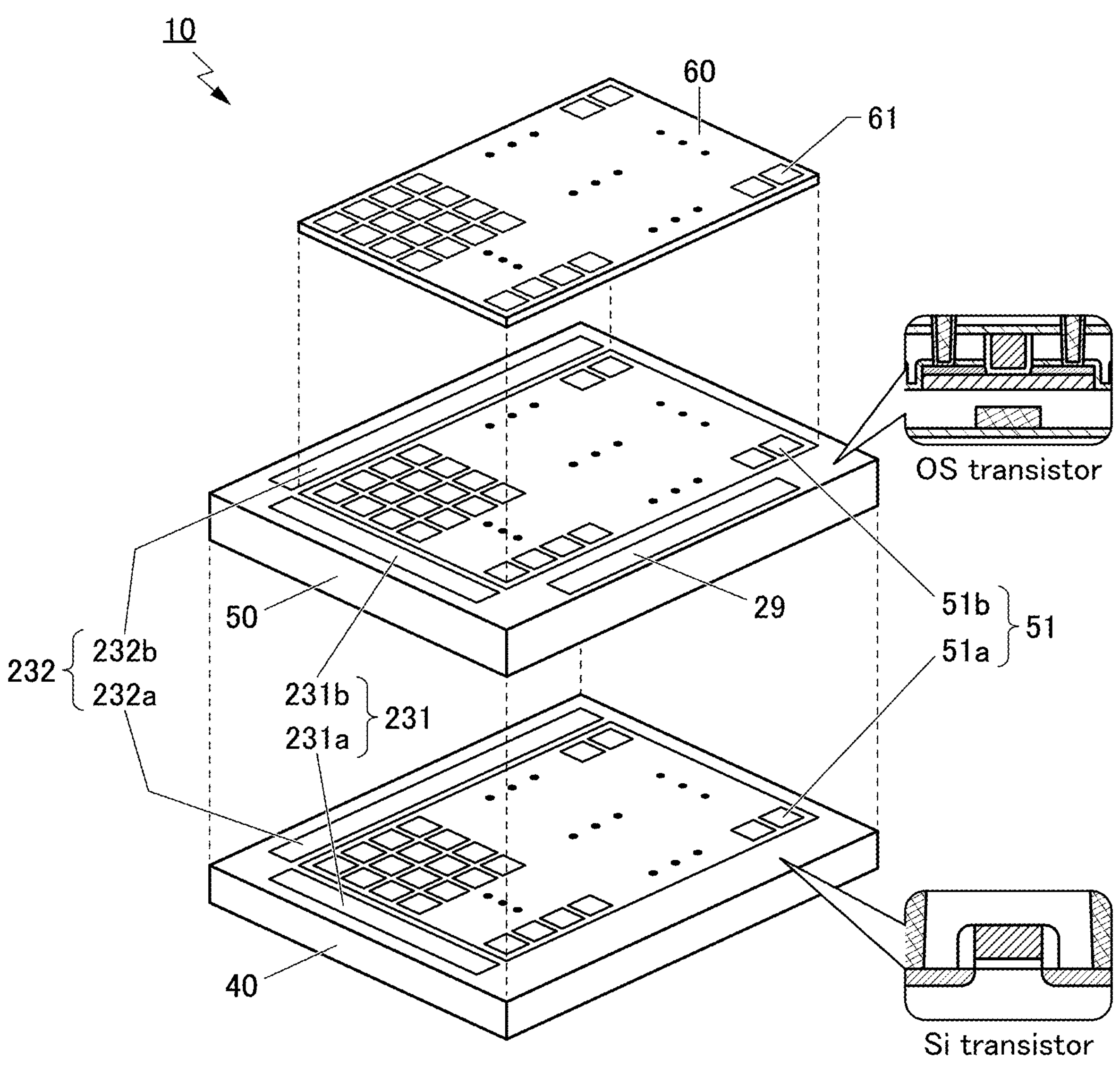
FIG. 67 is a perspective view of a display device.

In the case where the pixel circuits 51 each include a plurality of kinds of transistors using different semiconductor materials, for example, the transistors may be provided in different layers for each kind of transistor. For example, in the case where the pixel circuits 51 each include the region 51*a* including the Si transistor and the region 51*b* including the OS transistor, the region 51*a* is formed in the layer 40 and the region 51*b* is formed in the layer 50 (see FIG. 67). When the region 51*a* and the region 51*b* are provided to overlap with each other, the area occupied by the pixel circuits 51 is reduced. Thus, the definition of the display device 10 can be improved.

Note that a transistor containing low-temperature polysilicon (LTPS) in its semiconductor layer (hereinafter, also referred to as an LTPS transistor) may be used as the transistor included in the region 51*a*. The LTPS transistor has high field-effect mobility and excellent frequency characteristics. A structure in which the LTPS transistor and the OS transistor are combined is referred to as LTPO in some cases.

The transistors included in the region 51*a* and the region 51*b* may have different conductivity types or the same conductivity type. For example, the region 51*a* may include a p-channel transistor and the region 51*b* may include an n-channel transistor. The region 51*a* and the region 51*b* may each include an n-channel transistor. The region 51*a* and the region 51*b* may each include an n-channel transistor and a p-channel transistor.

In the case where the peripheral driver circuit includes a plurality of kinds of transistors using different semiconductor materials, for example, the transistors may be provided in different layers for each kind of transistor. For example, in the case where the first driver circuit portion 231 includes a region 231*a* including the Si transistor and a region 231*b* including the OS transistor, the region 231*a* is formed in the layer 40 and the region 231*b* is formed in the layer 50. For another example, in the case where the second driver circuit portion 232 includes a region 232*a* including the Si transistor and a region 232*b* including the OS transistor, the region 232*a* is formed in the layer 40 and the region 232*b* is formed in the layer 50. The peripheral driver circuit may be formed using LTPO, for example.

The transistors included in the region 231*a* and the region 231*b* may have different conductivity types or the same conductivity type. For example, the region 231*a* may include a p-channel transistor and the region 231*b* may include an n-channel transistor. The region 231*a* and the region 231*b* may each include an n-channel transistor. The region 231*a* and the region 231*b* may each include an n-channel transistor and a p-channel transistor.

The transistors included in the region 232*a* and the region 232*b* may have different conductivity types or the same conductivity type. For example, the region 232*a* may include a p-channel transistor and the region 232*b* may include an n-channel transistor. The region 232*a* and the region 232*b* may each include an n-channel transistor and a p-channel transistor.

Figure 68A:
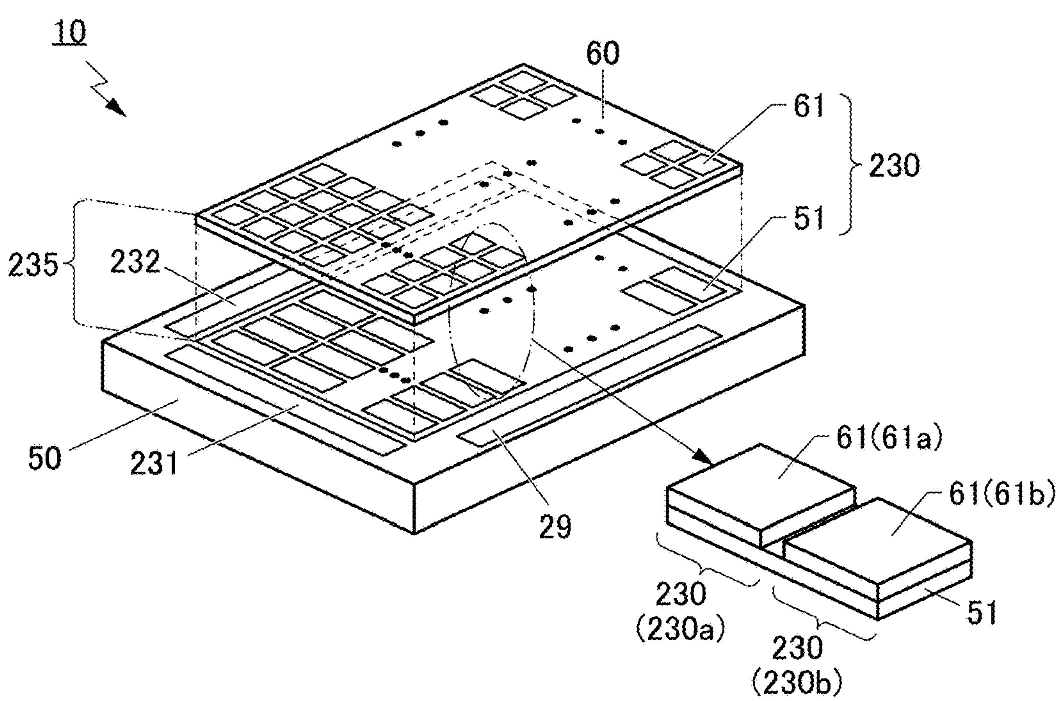
FIG. 68A and FIG. 68B are perspective views of a display device.
Figure 68B:
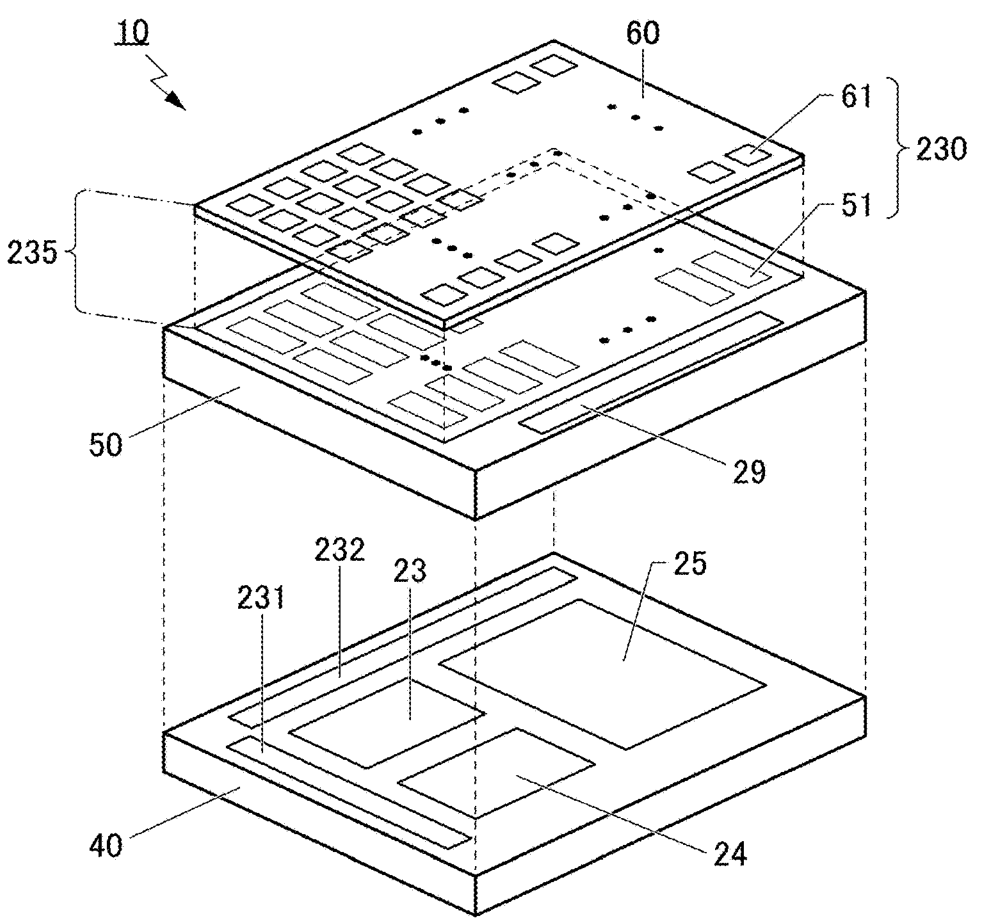

FIG. 68A and FIG. 68B illustrate modification examples of the display device 10 illustrated in FIG. 63A and FIG. 63B, respectively. The display device 10 illustrated in FIG. 68A has a structure in which one pixel circuit 51 is electrically connected to two light-emitting elements 61 (the light-emitting element 61*a* and the light-emitting element 61*b*). The one pixel circuit 51 can control light emission from the two light-emitting elements 61 alternately. That is, the one pixel circuit 51 can control the operations of two pixels 230 (the pixel 230*a* and the pixel 230*b*). When the light-emitting element 61*a* and the light-emitting element 61*b* emit light at the same time, the one pixel circuit 51 and the two light-emitting elements 61 can function as one pixel 230.

As each of the pixels 230 included in the display device 10 illustrated in FIG. 68A and FIG. 68B, for example, any of the semiconductor device 100F, the semiconductor device 10G, and the semiconductor device 100H described in the above embodiments can be used. As described above, the semiconductor device 100F, the semiconductor device 100G, and the semiconductor device 100H are suitable for a display device with a high pixel density.

As in the display device 10 illustrated in FIG. 63B, the layer 40 may be provided in the display device 10 illustrated in FIG. 68A (see FIG. 68B).

Note that the structure in which the one pixel circuit 51 controls the two light-emitting elements 61 is described in this embodiment; however, the one pixel circuit 51 can control three or more light-emitting elements 61.

<Structure Example of Display Module>

Next, a structure example of a display module including the display device of one embodiment of the present invention will be described.

Figure 69A:
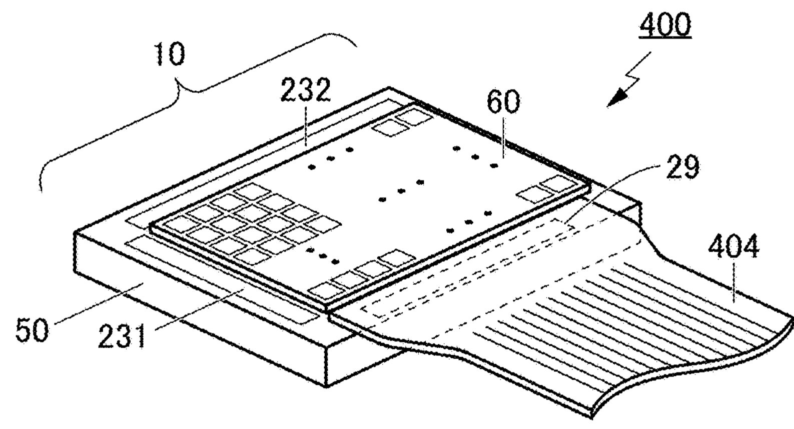
FIG. 69A to FIG. 69C are schematic perspective views of a display module.
Figure 69B:
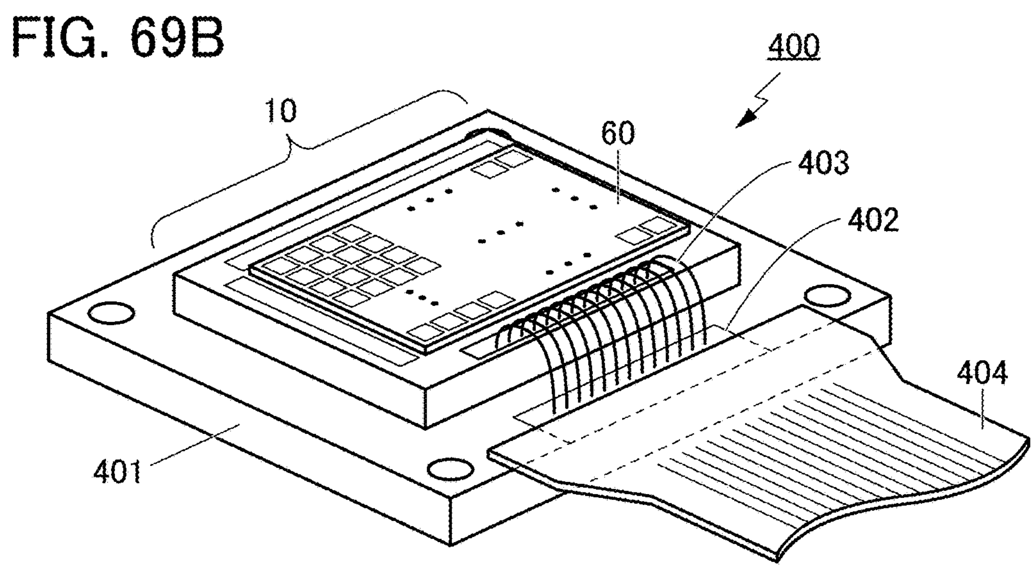
Figure 69C:
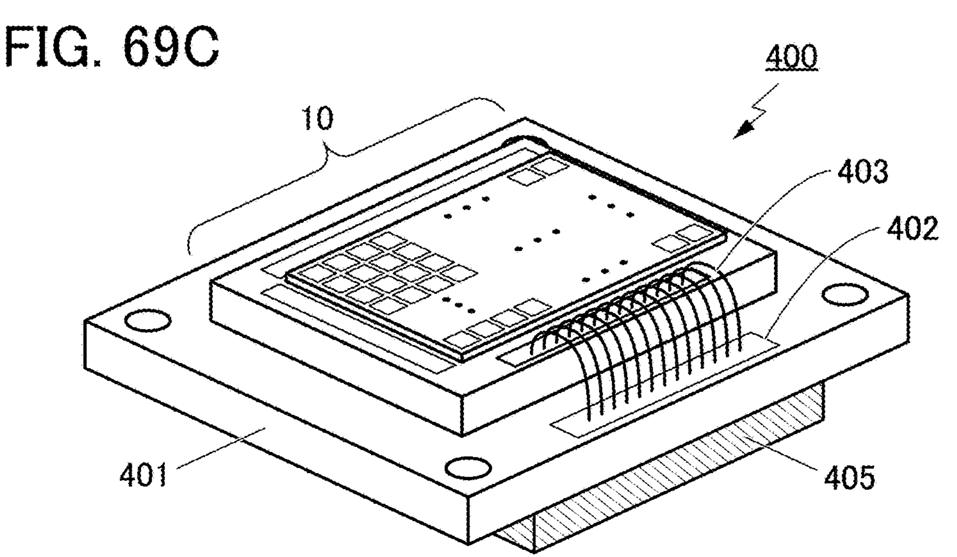

FIG. 69A to FIG. 69C are schematic perspective views of a display module 400. The display module 400 has a structure in which an FPC (Flexible printed circuits) 404 is provided on the input/output terminal portion 29 of the display device 10. The FPC 404 has a structure in which a film formed of an insulator is provided with a wiring. The FPC 404 is flexible. The FPC 404 functions as a wiring for supplying a video signal, a control signal, a power supply potential, and the like to the display device 10 from the outside. An IC may be mounted on the FPC 404.

The display module 400 illustrated in FIG. 69B includes the display device 10 over a printed wiring board 401. The printed wiring board 401 includes wirings inside a substrate formed of an insulator and/or on the surface of the substrate.

In the display module 400 illustrated in FIG. 69B, the input/output terminal portion 29 of the display device 10 is electrically connected to a terminal portion 402 of the printed wiring board 401 through a wire 403. The wire 403 can be formed in wire bonding. Ball bonding or wedge bonding can be used as the wire bonding.

After the wire 403 is formed, the wire 403 may be covered with a resin material or the like. Note that the display device 10 and the printed wiring board 401 may be electrically connected to each other by a method other than the wire bonding. For example, the display device 10 and the printed wiring board 401 may be electrically connected to each other using an anisotropic conductive adhesive, a bump, or the like.

In the display module 400 illustrated in FIG. 69B, the terminal portion 402 of the printed wiring board 401 is electrically connected to the FPC 404. In the case where the electrode pitch in the input/output terminal portion 29 of the display device 10 is different from the electrode pitch in the FPC 404, for example, the input/output terminal portion 29 may be electrically connected to the FPC 404 through the printed wiring board 401. Specifically, the distance (pitch) between electrodes included in the input/output terminal portion 29 can be converted into the distance between electrodes included in the terminal portion 402 with the use of wirings formed on the printed wiring board 401. That is, even when the electrode pitch in the input/output terminal portion 29 is different from the electrode pitch in the FPC 404, electrical connection between the electrodes can be achieved.

The printed wiring board 401 can be provided with a variety of elements such as a resistor, a capacitor, and a semiconductor element.

As in the display module 400 illustrated in FIG. 69C, the terminal portion 402 may be electrically connected to a connection portion 405 provided on the bottom surface (the surface where the display device 10 is not provided) of the printed wiring board 401. When the connection portion 405 is a socket-type connection portion, for example, the display module 400 can be easily attached to and detached from another device.

Figure 70:
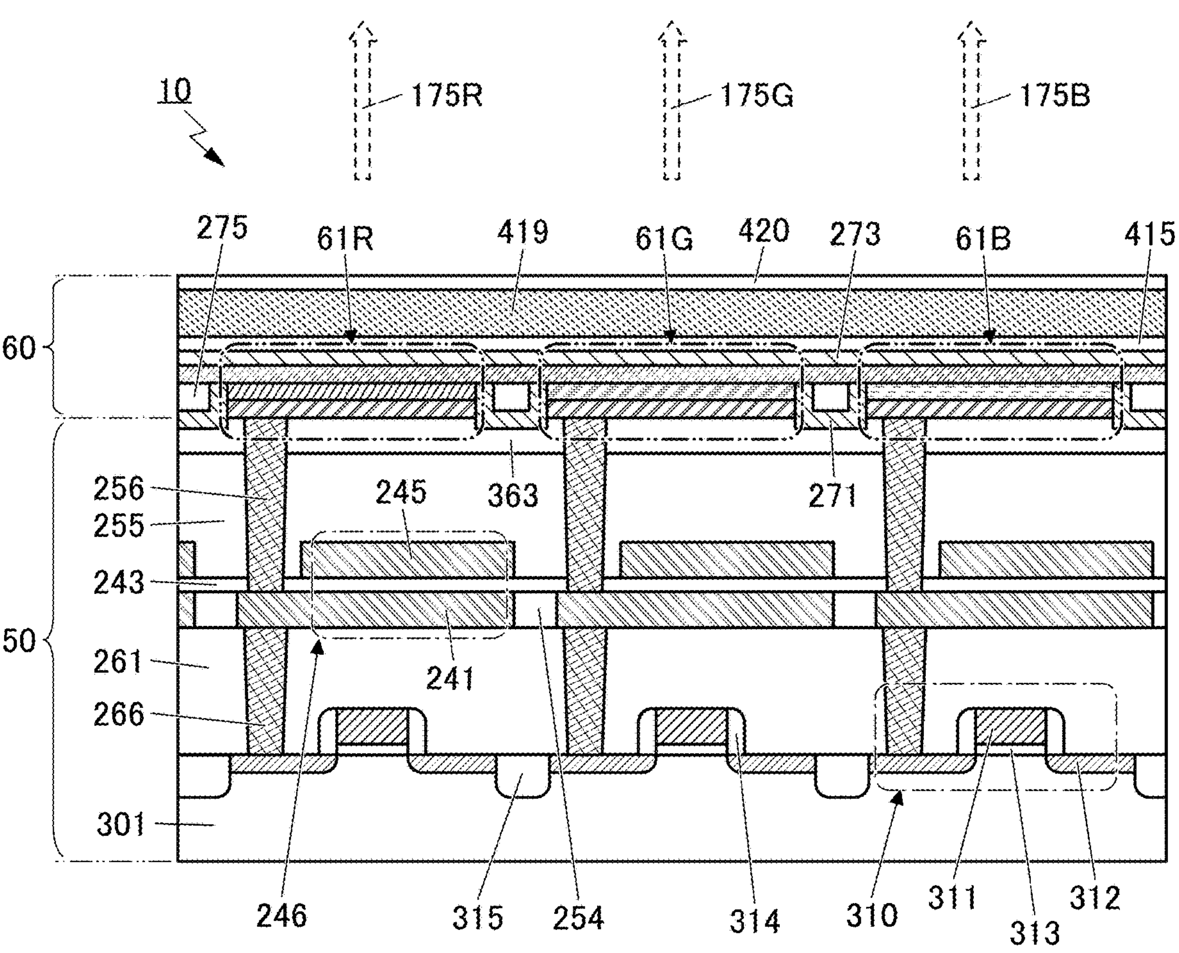
FIG. 70 is a cross-sectional view illustrating an example of a display device.

FIG. 70 illustrates a cross-sectional structure example of part of the display device 10 illustrated in FIG. 63A. The display device 10 illustrated in FIG. 70 includes the layer 50 including a substrate 301, a capacitor 246, and a transistor 310 and the layer 60 including the light-emitting element 61R, the light-emitting element 61G, and the light-emitting element 61B. The layer 60 is provided over the insulating layer 363 included in the layer 50.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance regions 312 are regions where the substrate 301 is doped with an impurity, and function as a source and a drain. The insulating layer 314 is provided to cover the side surface of the conductive layer 311 and functions as an insulating layer.

An element isolation layer 315 is provided between two adjacent transistors 310 to be embedded in the substrate 301.

An insulating layer 261 is provided to cover the transistor 310, and the capacitor 246 is provided over the insulating layer 261.

The capacitor 246 includes a conductive layer 241, a conductive layer 245, and an insulating layer 243 positioned therebetween. The conductive layer 241 functions as one electrode of the capacitor 246, the conductive layer 245 functions as the other electrode of the capacitor 246, and the insulating layer 243 functions as a dielectric of the capacitor 246.

The conductive layer 241 is provided over the insulating layer 261 and is embedded in an insulating layer 254. The conductive layer 241 is electrically connected to one of the source and the drain of the transistor 310 through a plug 266 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255 is provided to cover the capacitor 246, the insulating layer 363 is provided over the insulating layer 255, and the light-emitting element 61R, the light-emitting element 61G, and the light-emitting element 61B are provided over the insulating layer 363. A protective layer 415 is provided over the light-emitting element 61R, the light-emitting element 61G, and the light-emitting element 61B, and a substrate 420 is provided over the top surface of the protective layer 415 with a resin layer 419 therebetween.

The pixel electrode of the light-emitting element is electrically connected to one of the source and the drain of the transistor 310 through a plug 256 embedded in the insulating layer 255 and the insulating layer 363, the conductive layer 241 embedded in the insulating layer 254, and the plug 266 embedded in the insulating layer 261.

Figure 71:
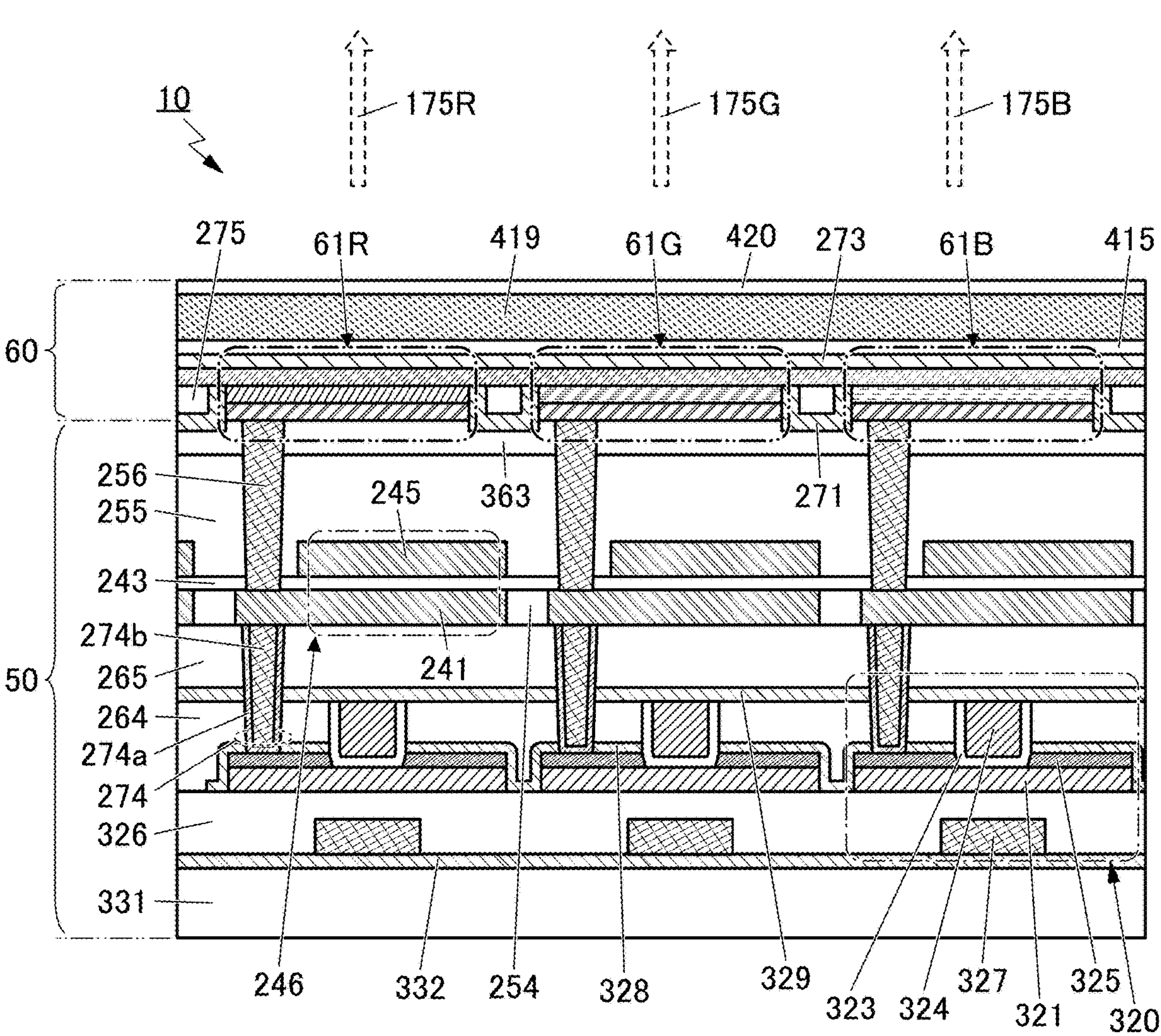
FIG. 71 is a cross-sectional view illustrating an example of a display device.

FIG. 71 illustrates a modification example of the cross-sectional structure example illustrated in FIG. 70. The cross-sectional structure example of the display device 10 illustrated in FIG. 71 is different from the cross-sectional structure example illustrated in FIG. 70 mainly in that a transistor 320 is provided instead of the transistor 310. Note that portions similar to those in FIG. 70 are not described in some cases.

The transistor 320 is a transistor in which a metal oxide (also referred to as an oxide semiconductor) is used in a semiconductor layer where a channel is formed.

The transistor 320 includes a semiconductor layer 321, an insulating layer 323, a conductive layer 324, a pair of conductive layers 325, an insulating layer 326, and a conductive layer 327.

As a substrate 331, an insulating substrate or a semiconductor substrate can be used.

An insulating layer 332 is provided over the substrate 331. The insulating layer 332 functions as a barrier layer that prevents diffusion of impurities such as water or hydrogen from the substrate 331 into the transistor 320 and release of oxygen from the semiconductor layer 321 to the insulating layer 332 side. As the insulating layer 332, for example, a film through which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide (also referred to as an oxide semiconductor) film having semiconductor characteristics. A material that can be suitably used for the semiconductor layer 321 will be described in detail later.

The pair of conductive layers 325 is provided over and in contact with the semiconductor layer 321, and functions as a source electrode and a drain electrode.

An insulating layer 328 is provided to cover the top and side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water or hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325, and the top surface of the semiconductor layer 321 and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized such that they are substantially level with each other, and an insulating layer 329 and an insulating layer 265 are provided to cover them.

The insulating layer 264 and the insulating layer 265 each function as an interlayer insulating layer. The insulating layer 329 functions as a barrier layer that prevents diffusion of impurities such as water or hydrogen from the insulating layer 265 and the like into the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274*a* that covers the side surface of an opening in the insulating layer 265, the insulating layer 329, the insulating layer 264, and the insulating layer 328 and part of the top surface of the conductive layer 325, and a conductive layer 274*b* in contact with the top surface of the conductive layer 274*a*. In that case, a conductive material in which hydrogen and oxygen are less likely to diffuse is preferably used for the conductive layer 274*a*.

Figure 72:
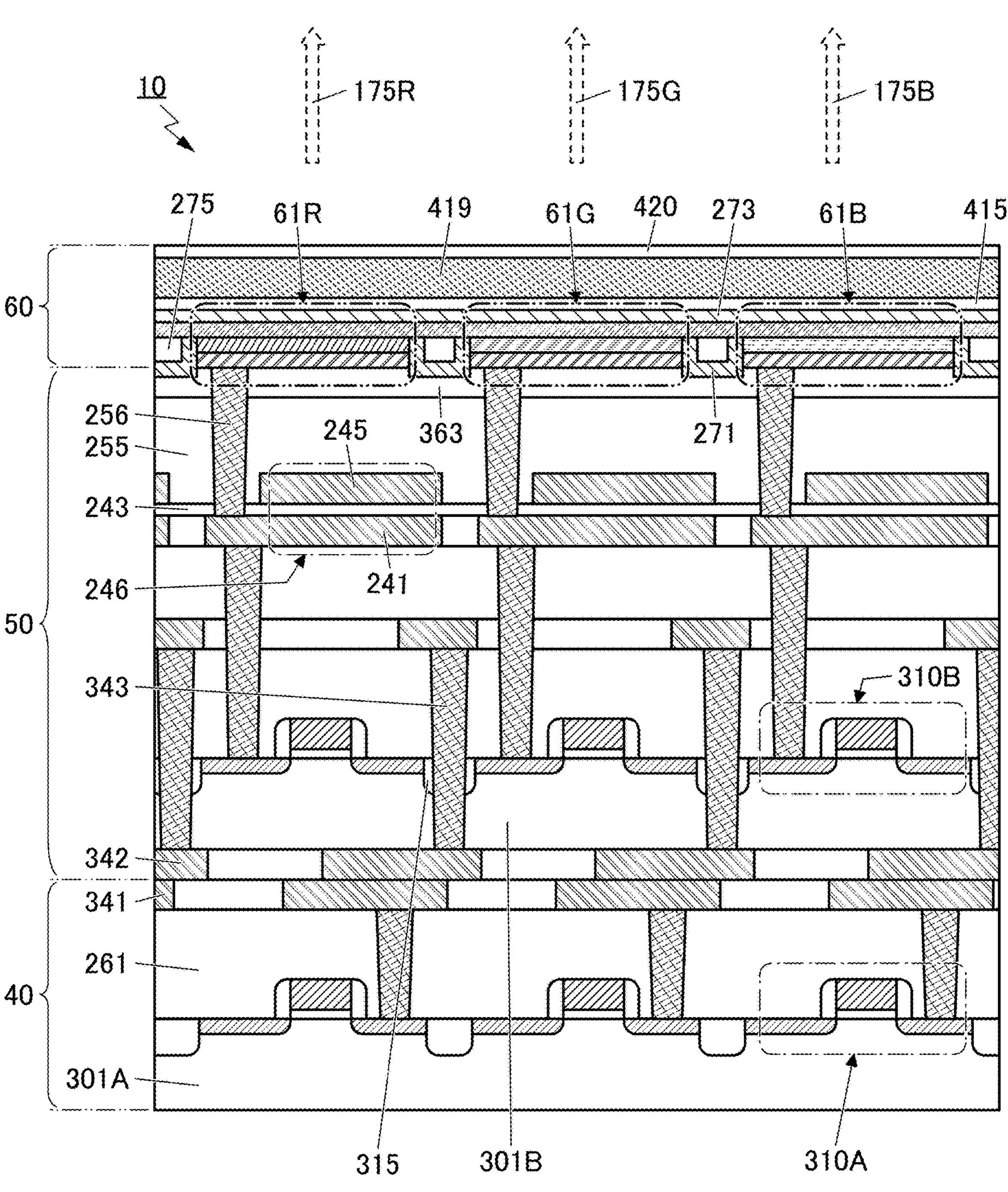
FIG. 72 is a cross-sectional view illustrating an example of a display device.

FIG. 72 illustrates a cross-sectional structure example of part of the display device 10 illustrated in FIG. 63B. The display device 10 illustrated in FIG. 72 has a structure in which a transistor 310A whose channel is formed in a substrate 301A included in the layer 40 and a transistor 310B whose channel is formed in the substrate 301A included in the layer 40 are stacked. A material similar to that for the substrate 301 can be used for the substrate 301A.

The display device 10 illustrated in FIG. 72 has a structure in which the layer 60 including the light-emitting element 61, the layer 50 including a substrate 301B, the transistor 310B, and the capacitor 246, and the layer 40 including the substrate 301A and the transistor 310A are attached to each other.

The substrate 301B is provided with a plug 343 that penetrates the substrate 301B. The plug 343 functions as a Si through electrode (TSV: Through Silicon Via). The plug 343 is electrically connected to a conductive layer 342 provided on the back surface (the surface on the side opposite to the substrate 420 side) of the substrate 301B. A conductive layer 341 is provided over the insulating layer 261 over the substrate 301A.

The conductive layer 341 and the conductive layer 342 are bonded to each other, whereby the layer 40 and the layer 50 are electrically connected to each other.

The conductive layer 341 and the conductive layer 342 are preferably formed using the same conductive material. For example, a metal film containing an element selected from A1, Cr, Cu, Ta, Sn, Zn, Au, Ag, Pt, Ti, Mo, and W, a metal nitride film containing the above element as its component (a titanium nitride film, a molybdenum nitride film, or a tungsten nitride film), or the like can be used. It is particularly preferable to use copper for the conductive layer 341 and the conductive layer 342. Accordingly, it is possible to employ a Cu—Cu (copper-to-copper) direct bonding technique (a technique for achieving electrical continuity by connecting Cu (copper) pads). Note that the conductive layer 341 and the conductive layer 342 may be bonded to each other with a bump therebetween.

Figure 73:
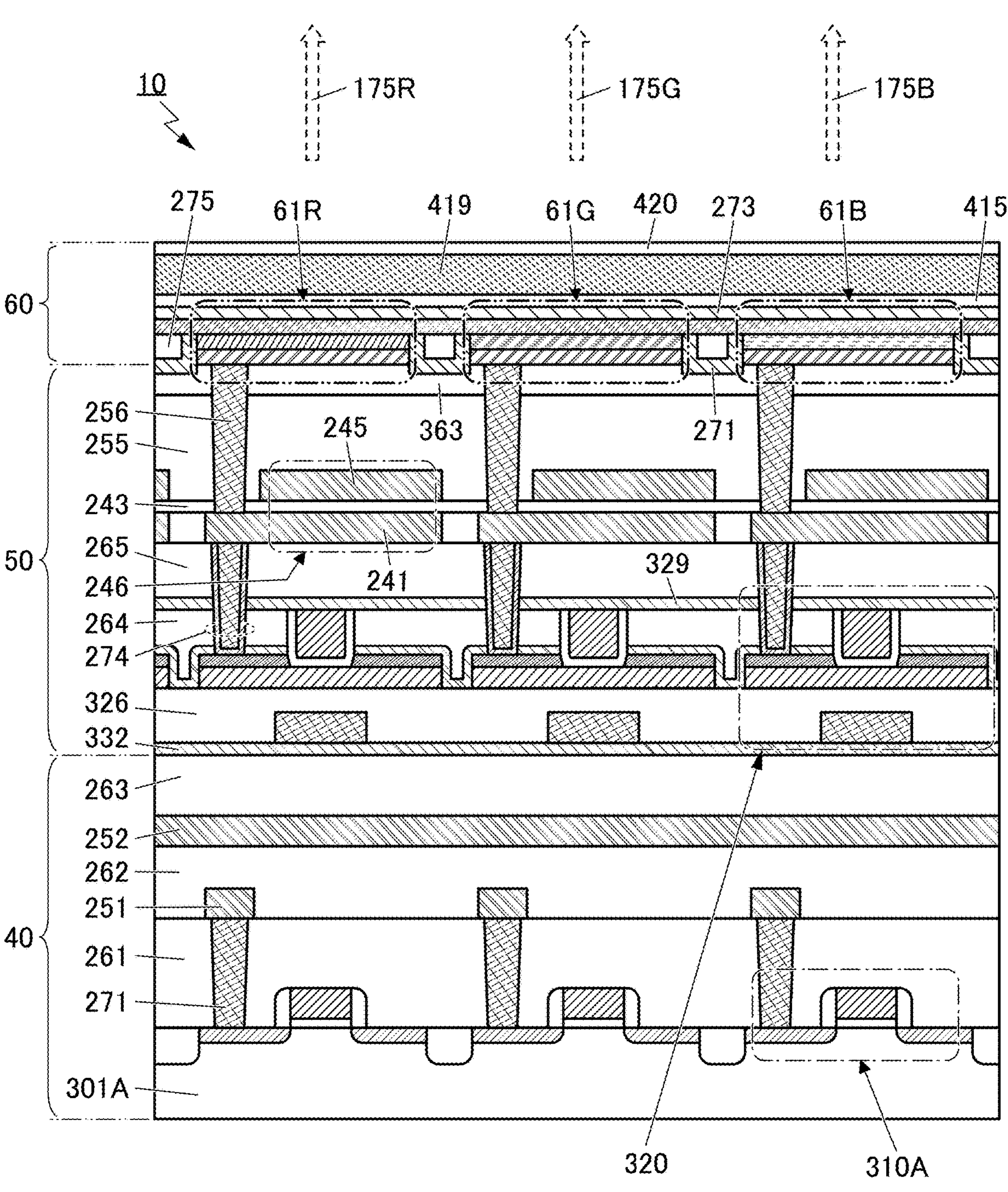
FIG. 73 is a cross-sectional view illustrating an example of a display device.

FIG. 73 illustrates a modification example of the cross-sectional structure example illustrated in FIG. 72. In the cross-sectional structure example of the display device 10 illustrated in FIG. 73, the transistor 310A whose channel is formed in the substrate 301A and the transistor 320 including a metal oxide in the semiconductor layer where the channel is formed are stacked. Note that portions similar to those in FIG. 70 to FIG. 72 are not described in some cases.

The layer 50 illustrated in FIG. 73 has a structure in which the substrate 331 is removed from the layer 50 illustrated in FIG. 71. In the layer 40 illustrated in FIG. 73, the insulating layer 261 is provided to cover the transistor 310A, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 246 is provided over the insulating layer 265. The capacitor 246 and the transistor 320 are electrically connected to each other through the plug 274. The layer 50 is provided to overlap with the insulating layer 263 included in the layer 40.

The transistor 320 can be used as the transistors included in the pixel circuits 51. The transistor 310 can be used as the transistors included in the pixel circuits 51 or the transistors included in the peripheral driver circuit. The transistor 310 and the transistor 320 can also be used as transistors included in a functional circuit such as an arithmetic circuit or a memory circuit.

With such a structure, not only the pixel circuits 51 but also the peripheral driver circuit or the like can be formed directly under the layer 60 including the light-emitting element 61. Thus, the display device can be downsized as compared with the case where the driver circuit is provided around a display region.

Figure 74:
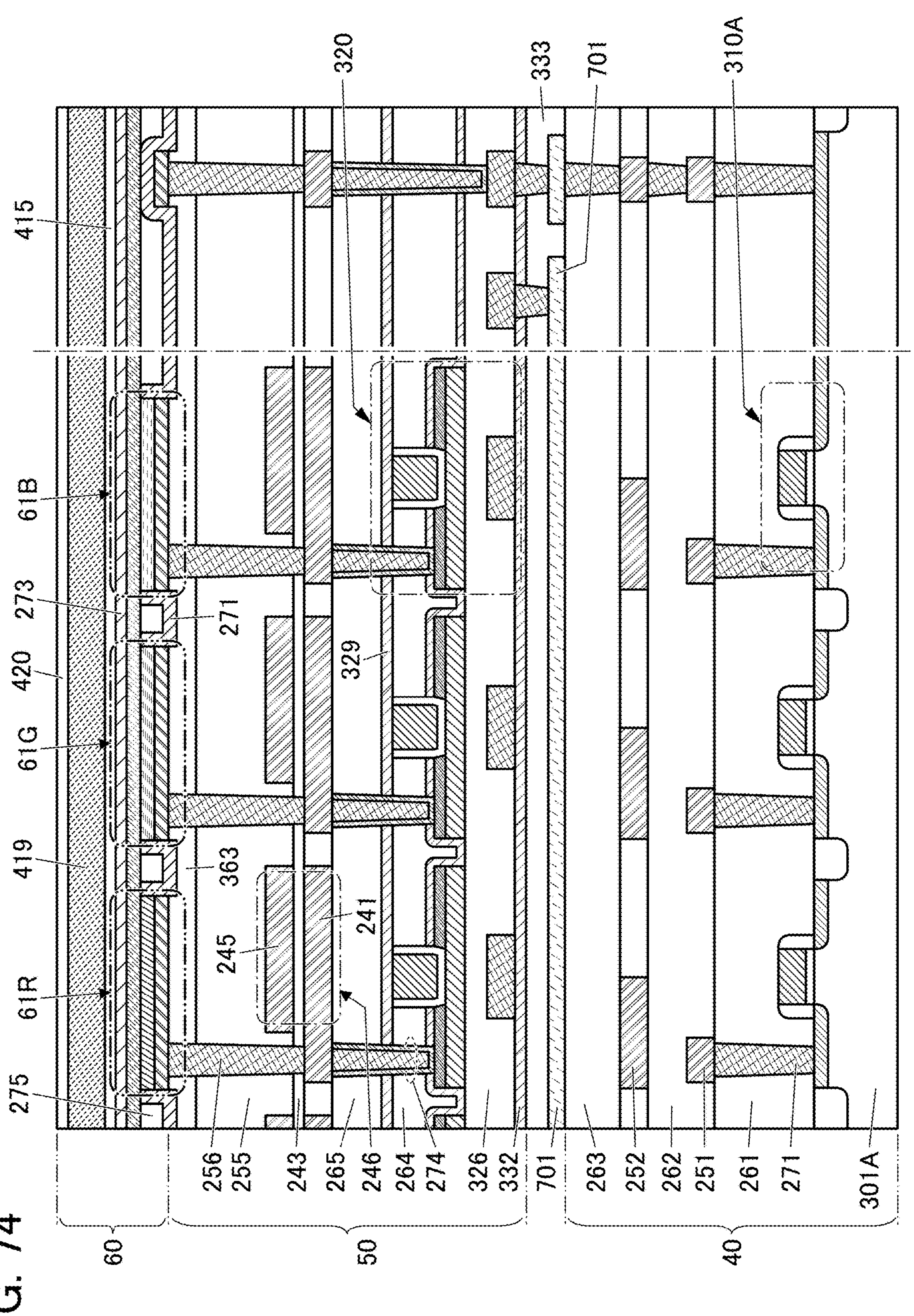
FIG. 74 is a cross-sectional view illustrating an example of a display device.

FIG. 74 illustrates a cross-sectional structure example of part of the display device 10 illustrated in FIG. 64A and FIG. 64B. FIG. 74 is a modification example of the cross-sectional structure example illustrated in FIG. 70. In FIG. 74, the conductive layer 701 is provided over the insulating layer 263, and an insulating layer 333 is provided over the conductive layer 701. The insulating layer 332 is provided over the insulating layer 333.

The conductive layer 701 is not electrically connected to a conductor (e.g., a plug) for supplying a signal from the circuit included in the layer 40 to the circuit included in the layer 50. Similarly, the conductive layer 701 is not electrically connected to a conductor (e.g., a plug) for supplying a signal from the circuit included in the layer 50 to the circuit included in the layer 40.

Although FIG. 74 illustrates the cross-sectional structure example in which the conductive layer 701 is provided between the layer 40 and the layer 50, the conductive layer 701 may be provided in the layer 40 or the layer 50.

Figure 75:
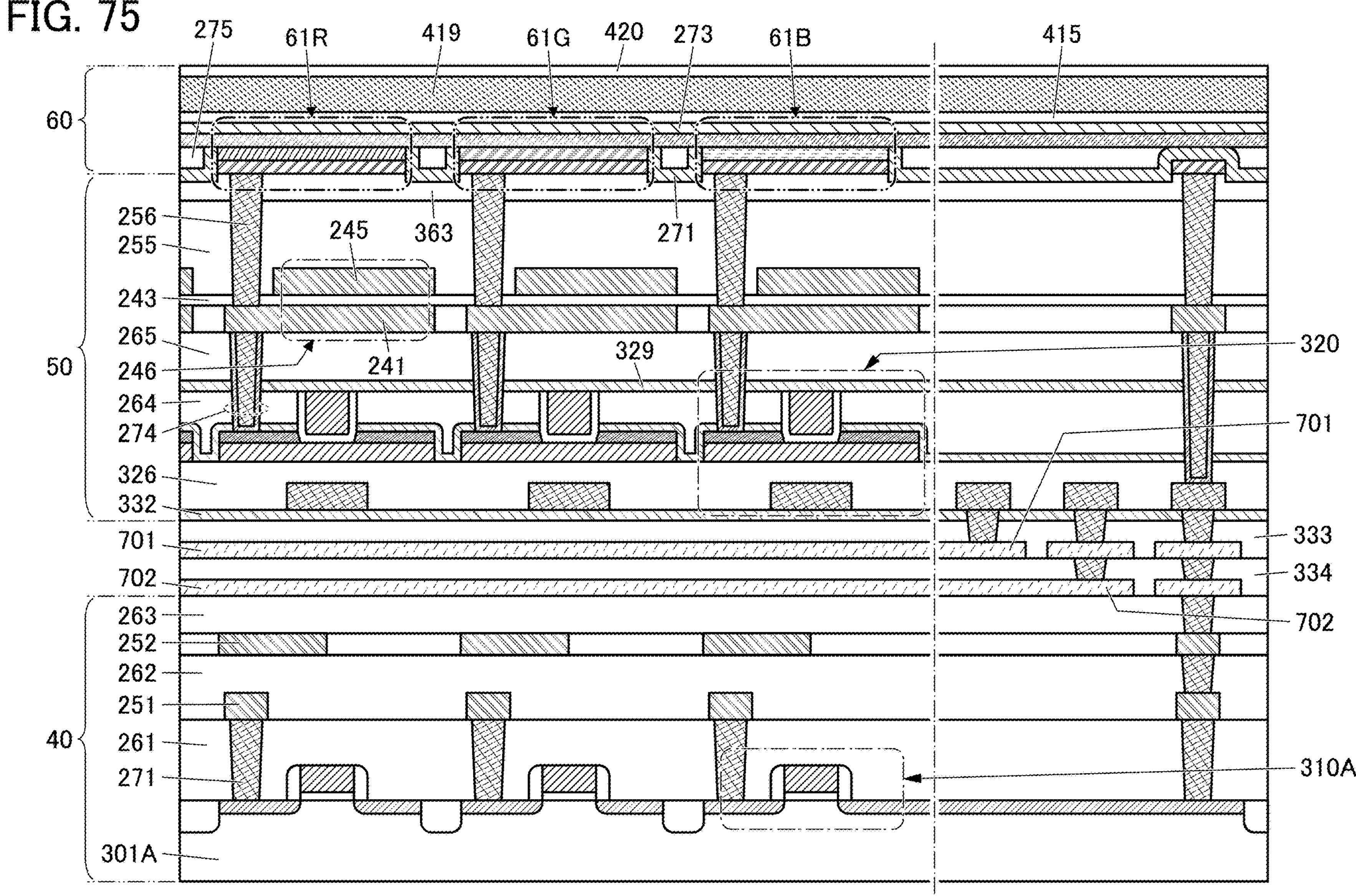
FIG. 75 is a cross-sectional view illustrating an example of a display device.

FIG. 75 illustrates a cross-sectional structure example of part of the display device 10 illustrated in FIG. 66. FIG. 75 is also a modification example of the cross-sectional structure example illustrated in FIG. 74. In FIG. 75, the conductive layer 702 is provided over the insulating layer 263, and an insulating layer 334 is provided over the conductive layer 702. In addition, the conductive layer 701 is provided over the insulating layer 334, and the insulating layer 333 is provided over the conductive layer 701. The insulating layer 332 is provided over the insulating layer 333.

Like the conductive layer 701, the conductive layer 702 is not electrically connected to a conductor (e.g., a plug) for supplying a signal from the circuit included in the layer 40 to the circuit included in the layer 50. In addition, the conductive layer 702 is not electrically connected to a conductor (e.g., a plug) for supplying a signal from the circuit included in the layer 50 to the circuit included in the layer 40. Note that the conductive layer 701 and the conductive layer 702 may be electrically connected to each other.

Although FIG. 75 illustrates the cross-sectional structure example in which the conductive layer 701 and the conductive layer 702 are provided between the layer 40 and the layer 50, the conductive layer 701 and the conductive layer 702 may be provided in the layer 40 or the layer 50. Alternatively, the conductive layer 702 may be provided in the layer 40 and the conductive layer 701 may be provided in the layer 50.

The structure described in this embodiment can be used in an appropriate combination with any of the structures described in the other embodiments and examples.

Embodiment 10

The display device 10 of one embodiment of the present invention can display an image utilizing interlace driving. In this embodiment, interlace driving of the display device 10 will be described.

[Driving Method 1]

Figure 76A:
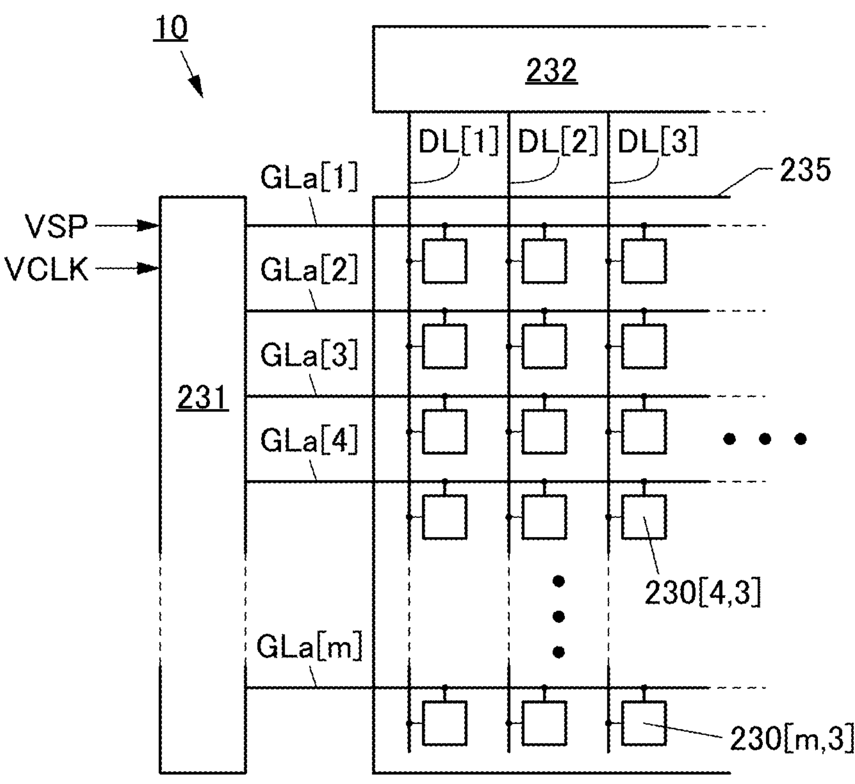
FIG. 76A is a block diagram of a display device.

FIG. 76A is a block diagram of the display device 10. FIG. 76A illustrates the pixels 230 in four rows and three columns among the pixels 230 arranged in a matrix of m rows and n columns. The pixels 230 in the first row are electrically connected to the first driver circuit portion 231 through a wiring GLa[1]. The pixels 230 in the second row are electrically connected to the first driver circuit portion 231 through a wiring GLa[2]. The pixels 230 in the third row are electrically connected to the first driver circuit portion 231 through a wiring GLa[3]. The pixels 230 in the fourth row are electrically connected to the first driver circuit portion 231 through a wiring GLa[4]. The wirings GLa function as scan lines.

The pixels 230 in the first column are electrically connected to the second driver circuit portion 232 through a wiring DL[1]. The pixels 230 in the second column are electrically connected to the second driver circuit portion 232 through a wiring DL[2]. The pixels 230 in the third column are electrically connected to the second driver circuit portion 232 through a wiring DL[3]. The wirings DL function as video signal lines.

In FIG. 76A, the pixel 230 in the fourth row and the third column is denoted as a pixel 230[4, 3]. The pixel 230 in the m-th row and the third column is denoted as a pixel 230[*m*, 3]. Note that wirings other than the wirings GLa and the wirings DL are not illustrated in FIG. 76A.

A start pulse VSP and a clock signal VCLK are supplied to the first driver circuit portion 231.

Figure 76B:
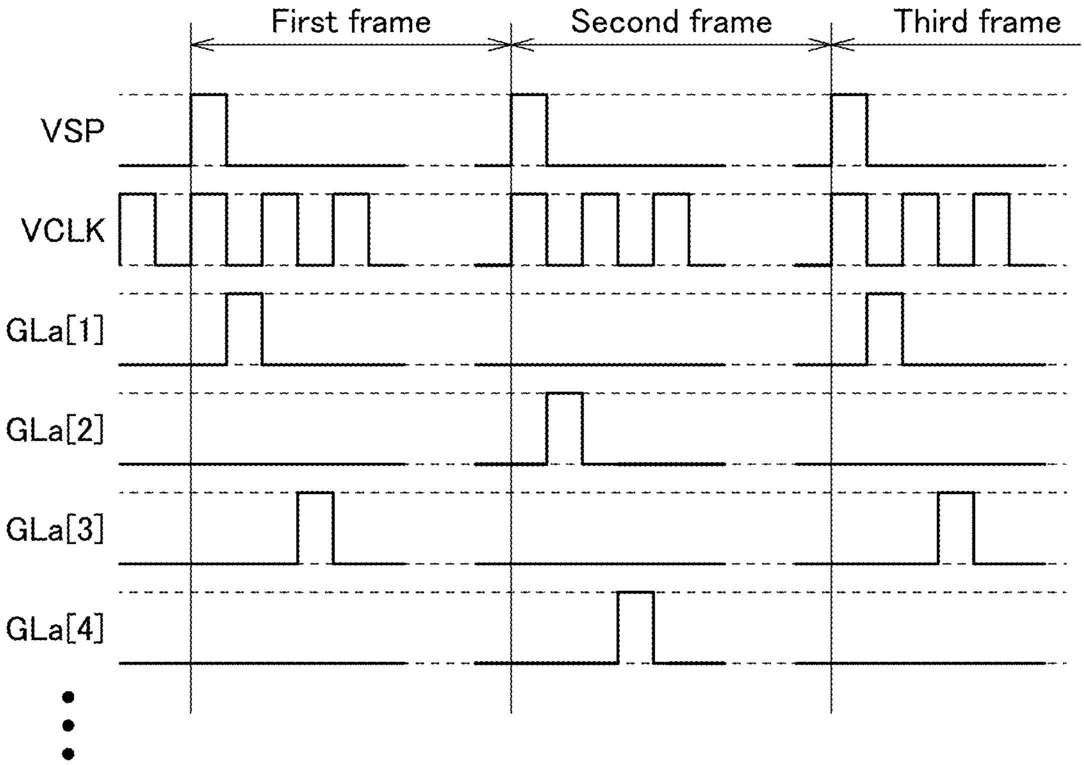
FIG. 76B is a timing chart showing an operation of the display device.

FIG. 76B is a timing chart showing the operation of the display device 10 illustrated in FIG. 76A. When the start pulse VSP is supplied to the first driver circuit portion 231, the wirings GLa are sequentially selected in synchronization with the clock signal VCLK. In a period during which the wirings GLa are selected, video signals are supplied from the second driver circuit portion 232 to the pixels 230. The period during which the wiring GLa[1] to a wiring GLa[m] are sequentially selected is referred to as a "frame" or a "frame period". In general, the selection from the wiring GLa[1] to the wiring GLa[m] is repeated in an image display period. Thus, the start pulse VSP is supplied every frame period.

Depending on a video source or the like to be displayed, a pixel density lower than the pixel density of the display device 10 sometimes offers comparable display quality, for example. In that case, the selection of the wirings GLa in the odd-numbered rows and the selection of the wirings GLa in the even-numbered rows are switched every frame, so that the load on the light-emitting elements 61 can be reduced while the display quality is being maintained. Thus, the reliability of the display device 10 can be improved.

The timing chart in FIG. 76B shows an operation example in which the wirings GLa in the odd-numbered rows are sequentially selected and the wirings GLa in the even-numbered rows are not selected in a first frame (an odd-numbered frame). In addition, an operation example is shown in which the wirings GLa in the even-numbered rows are sequentially selected and the wirings GLa in the odd-numbered rows are not selected in a second frame (an even-numbered frame). Note that the wirings GLa in the even-numbered rows may be sequentially selected in the odd-numbered frame, and the wirings GLa in the odd-numbered rows may be sequentially selected in the even-numbered frame. A driving method in which rows to which video signals are written are switched every frame in this manner is referred to as “interlace” or “interlace driving”. Moreover, a driving method in which video signals are written to all the pixels in one frame is referred to as “progressive” or “progressive driving”.

In the case where emission luminance is to be increased, for example, a display operation is performed by the progressive driving, instead of the interlace driving, to make the light-emitting element 61*a* and the light-emitting element 61*b* emit light at the same time. Alternatively, the frame frequency at the time of the interlace driving may be increased. The frame frequency is preferably higher than or equal to 60 Hz, further preferably higher than or equal to 120 Hz, still further preferably higher than or equal to 240 Hz. The interlace driving and the progressive driving can be switched as appropriate.

[Driving Method 2]

Next, the interlace driving performed when the semiconductor device 100F or the semiconductor device 100G is used as the pixel 230 will be described with reference to FIG. 77. In order to reduce repeated description, portions different from those in FIG. 76 are mainly described.

As described in the above embodiments, the semiconductor device 100F and the semiconductor device 100G each include the light-emitting element 61*a* whose cathode is electrically connected to the wiring 104*a* and the light-emitting element 61*b* whose cathode is electrically connected to the wiring 104*b*.

Figure 77A:
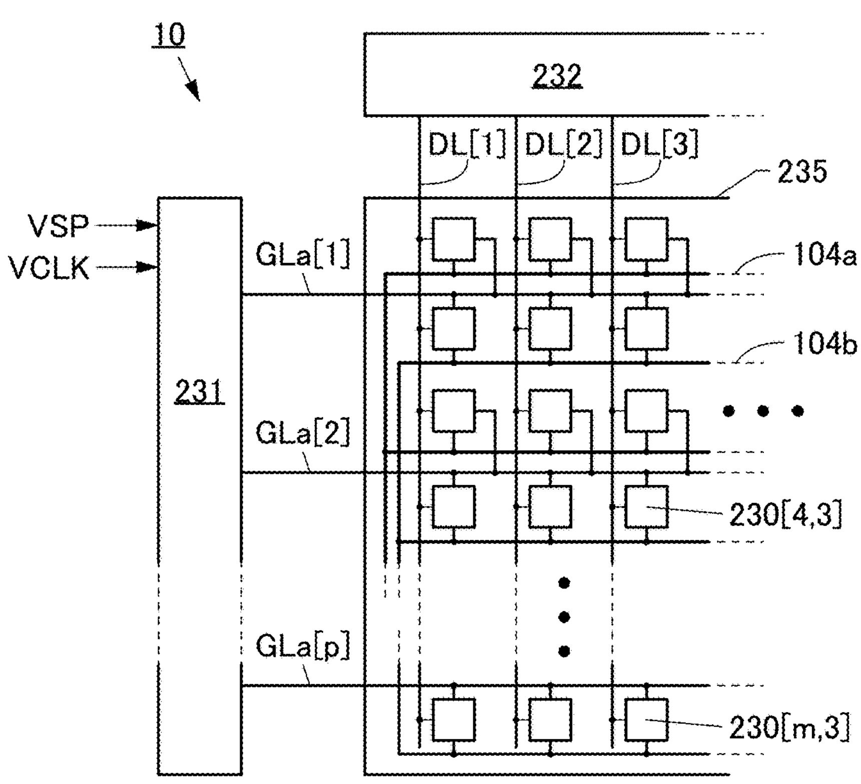
FIG. 77A is a block diagram of a display device.

FIG. 77A is a block diagram of the display device 10 using the semiconductor device 100F or the semiconductor device 100G as the pixel 230. In FIG. 77A, the pixels 230 in the odd-numbered rows are electrically connected to the wiring 104*a*, and the pixels 230 in the even-numbered rows are electrically connected to the wiring 104*b*. Note that the pixels 230 in the even-numbered rows may be electrically connected to the wiring 104*a* and the pixels 230 in the odd-numbered rows may be electrically connected to the wiring 104*b*.

Note that wirings other than the wirings GLa and the wirings DL are not illustrated in FIG. 77A.

In each of the semiconductor device 100F and the semiconductor device 100G, the light-emitting element 61*a* and the light-emitting element 61*b* can be driven by one pixel circuit 51; thus, the number of wirings GLa can be reduced by half. In FIG. 77A, the pixels 230 in the first row and the pixels 230 in the second row are electrically connected to the wiring GLa[1], which is the first wiring GLa, and the pixels 230 in the third row and the pixels 230 in the fourth row are electrically connected to the wiring GLa[2], which is the second wiring GLa.

In FIG. 77A, the wiring GLa electrically connected to the pixels 230 in the m-th row is denoted as a wiring GLa[p]. In the case where m is an even number, p is the half of m, and in the case where m is an odd number, p is the half of m+1.

The light-emitting elements 61*a* are used in the pixels 230 in the odd-numbered rows, and the light-emitting elements 61*b* are used in the pixels 230 in the even-numbered rows. Note that the light-emitting elements 61*a* may be used in the pixels 230 in the even-numbered rows and the light-emitting elements 61*b* may be used in the pixels 230 in the odd-numbered rows.

Figure 77B:
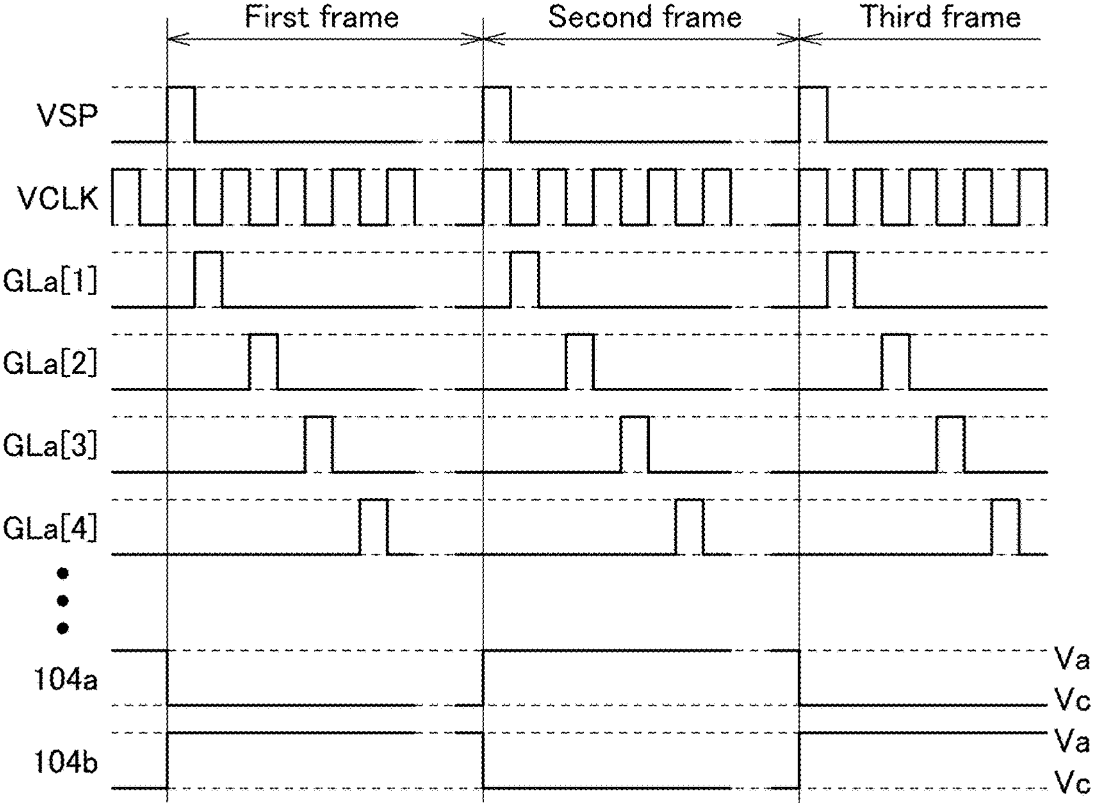
FIG. 77B is a timing chart showing an operation of the display device.

FIG. 77B is a timing chart showing the operation of the display device 10 illustrated in FIG. 77A. The first top-th wirings GLa are sequentially selected every frame in synchronization with the clock signal VCLK. In a first frame (an odd-numbered frame), the potential Vc is supplied to the wiring 104*a* and the potential Va is supplied to the wiring 104*b*. In a second frame (an even-numbered frame), the potential Va is supplied to the wiring 104*a* and the potential Vc is supplied to the wiring 104*b*. In this manner, the interlace driving can be achieved.

As described in the above embodiments, the semiconductor device 100F and the semiconductor device 100G have small areas occupied by the pixel circuit 51F and the pixel circuit 51G that control light emission from the light-emitting element 61 and thus are suitable for improving the definition of the display device. When the display device 10 using the semiconductor device 100F or the semiconductor device 100G as the pixel 230 is operated by the interlace driving, the display device can have a high pixel density.

[Driving Method 3]

Next, the interlace driving performed when the semiconductor device 100H is used as the pixel 230 will be described with reference to FIG. 78. Note that FIG. 78 is a modification example of FIG. 77. Thus, in order to reduce repeated description, portions different from those in FIG. 77 are mainly described.

As described in the above embodiment, the semiconductor device 100H includes the circuit 52*a*, the circuit 52*b*, the light-emitting element 61*a*, and the light-emitting element 61*b*. The circuit 52*a* functions as a switch that selects whether the light-emitting element 61*a* emits light, and the circuit 52*b* functions as a switch that selects whether the light-emitting element 61*b* emits light. The circuit 52*a* is electrically connected to the wiring GLc, and the circuit 52*b* is electrically connected to the wiring GLd.

In the case where the light-emitting elements 61*a* are used in the pixels 230 in the odd-numbered rows, the wiring GLc is electrically connected to the pixels 230 in the odd-numbered rows. In the case where the light-emitting elements 61*b* are used in the pixels 230 in the even-numbered rows, the wiring GLd is electrically connected to the pixels 230 in the even-numbered rows.

Figure 78A:
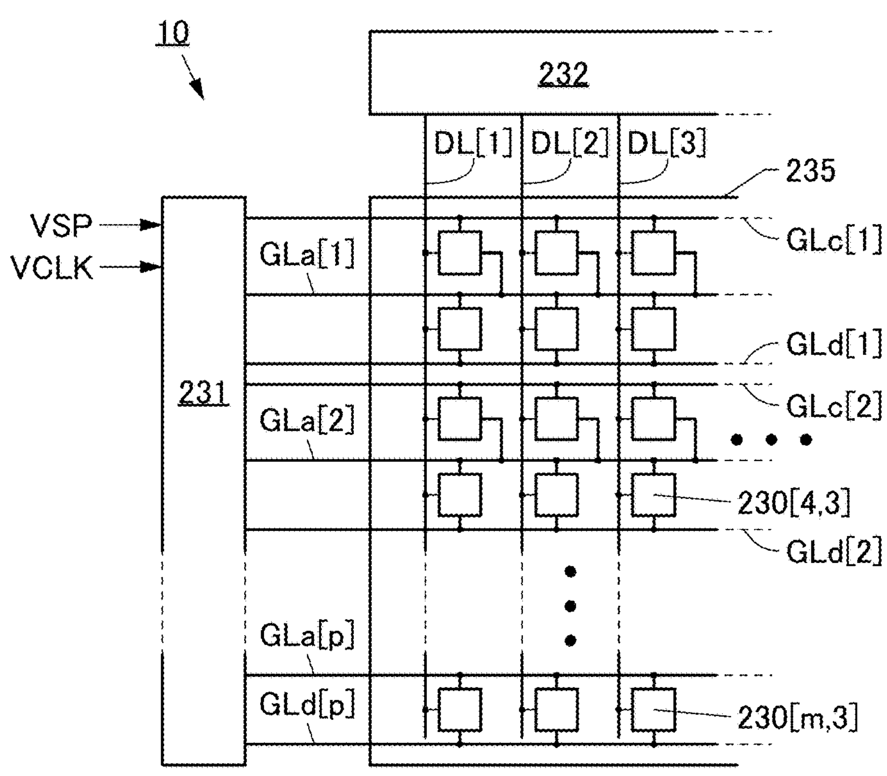
FIG. 78A is a block diagram of a display device.
Figure 78B:
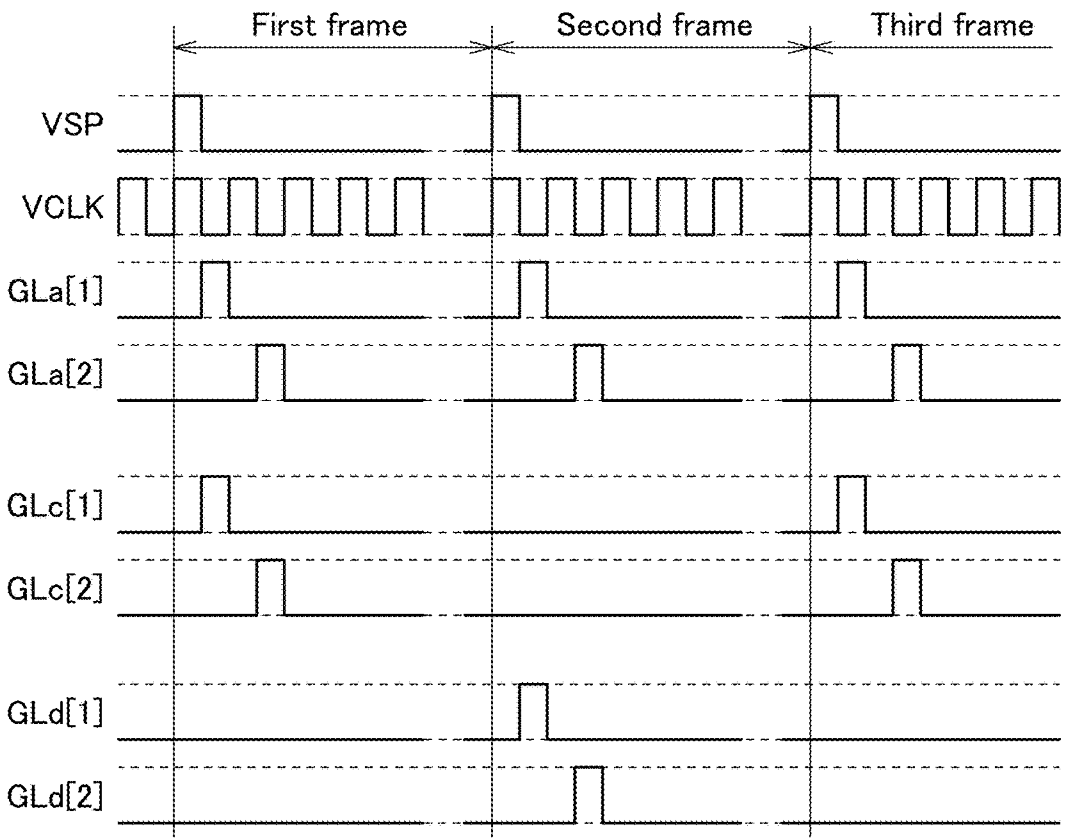
FIG. 78B is a timing chart showing an operation of the display device.

FIG. 78B is a timing chart showing the operation of the display device 10 illustrated in FIG. 78A. The first top-th wirings GLa are sequentially selected every frame in synchronization with the clock signal VCLK. The wirings GLc are sequentially selected in synchronization with the wirings GLa in a first frame (an odd-numbered frame). For example, in the case where the wiring GLa[1] is selected, the wiring GLc[1] is also selected. No wirings GLd are selected in the first frame (the odd-numbered frame). Thus, the light-emitting elements 61*a* emit light but the light-emitting elements 61*b* do not emit light.

The wirings GLd are sequentially selected in synchronization with the wirings GLa in a second frame (an even-numbered frame). For example, in the case where the wiring GLa[1] is selected, a wiring GLd[1] is also selected. No wirings GLc are selected in the second frame (the even-numbered frame). Thus, the light-emitting elements 61*b* emit light but the light-emitting elements 61*a* do not emit light. In this manner, the interlace driving can be achieved.

The structure described in this embodiment can be used in an appropriate combination with any of the structures described in the other embodiments and examples.

Embodiment 11

In this embodiment, a transistor that can be used in the semiconductor device of one embodiment of the present invention will be described.

<Structure Example of Transistor>

Figure 79A:
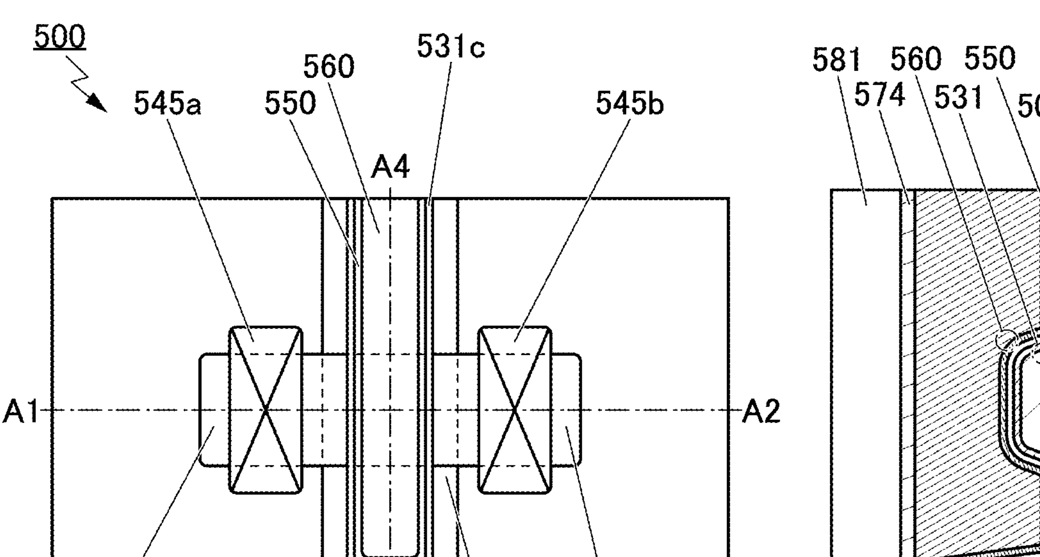
FIG. 79A is a top view illustrating a structure example of a transistor.
Figure 79C:
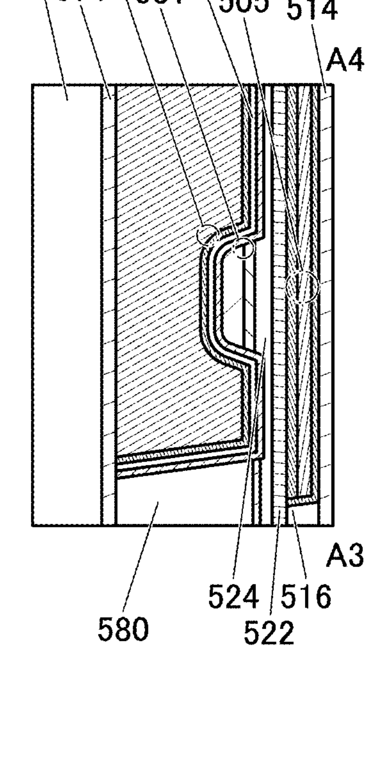
FIG. 79B and FIG. 79C are cross-sectional views illustrating the structure example of the transistor.
Figure 79B:
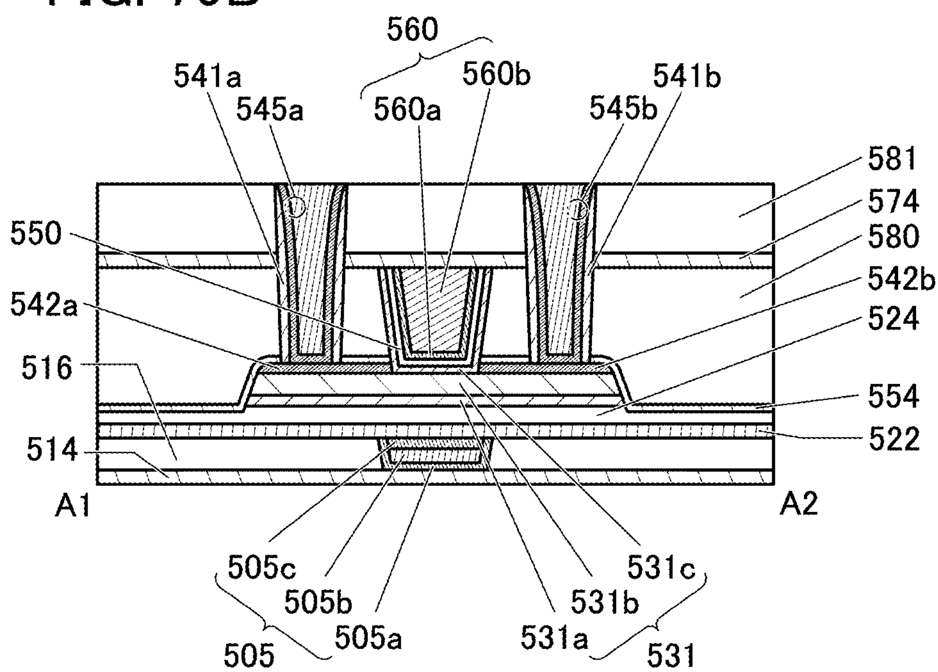

FIG. 79A, FIG. 79B, and FIG. 79C are a top view and cross-sectional views of a transistor 500 that can be used in the semiconductor device of one embodiment of the present invention. The transistor 500 can be used in the semiconductor device of one embodiment of the present invention.

FIG. 79A is the top view of the transistor 500. FIG. 79B and FIG. 79C are the cross-sectional views of the transistor 500. Here, FIG. 79B is a cross-sectional view of a portion indicated by the dashed-dotted line A1-A2 in FIG. 79A and is a cross-sectional view of the transistor 500 in the channel length direction. FIG. 79C is a cross-sectional view of a portion indicated by the dashed-dotted line A3-A4 in FIG. 79A and is a cross-sectional view of the transistor 500 in the channel width direction. Note that some components are omitted in the top view of FIG. 79A for clarity of the drawing.

As illustrated in FIG. 79, the transistor 500 includes a metal oxide 531*a* placed over a substrate (not illustrated); a metal oxide 531*b* placed over the metal oxide 531*a*; a conductor 542*a* and a conductor 542*b* that are placed apart from each other over the metal oxide 531*b*; an insulator 580 that is placed over the conductor 542*a* and the conductor 542*b* and has an opening between the conductor 542*a* and the conductor 542*b*; a conductor 560 placed in the opening; an insulator 550 placed between the conductor 560 and the metal oxide 531*b*, the conductor 542*a*, the conductor 542*b*, and the insulator 580; and a metal oxide 531*c* placed between the insulator 550 and the metal oxide 531*b*, the conductor 542*a*, the conductor 542*b*, and the insulator 580. Here, as illustrated in FIG. 79B and FIG. 79C, it is preferable that the top surface of the conductor 560 be substantially aligned with the top surfaces of the insulator 550, an insulator 554, the metal oxide 531*c*, and the insulator 580. Hereinafter, the metal oxide 531*a*, the metal oxide 531*b*, and the metal oxide 531*c* may be collectively referred to as a metal oxide 531. The conductor 542*a* and the conductor 542*b* may be collectively referred to as a conductor 542.

In the transistor 500 illustrated in FIG. 79, the side surfaces of the conductor 542*a* and the conductor 542*b* on the conductor 560 side are substantially perpendicular. Note that the transistor 500 illustrated in FIG. 79 is not limited thereto, and the angle formed between the side surfaces and the bottom surfaces of the conductor 542*a* and the conductor 542*b* may be greater than or equal to 10° and less than or equal to 80°, preferably greater than or equal to 30° and less than or equal to 60°. The side surfaces of the conductor 542*a* and the conductor 542*b* that face each other may have a plurality of surfaces.

As illustrated in FIG. 79, the insulator 554 is preferably placed between the insulator 580 and an insulator 524, the metal oxide 531*a*, the metal oxide 531*b*, the conductor 542*a*, the conductor 542*b*, and the metal oxide 531*c*. Here, as illustrated in FIG. 79B and FIG. 79C, the insulator 554 is preferably in contact with the side surface of the metal oxide 531*c*, the top surface and the side surface of the conductor 542*a*, the top surface and the side surface of the conductor 542*b*, the side surfaces of the metal oxide 531*a* and the metal oxide 531*b*, and the top surface of the insulator 524.

In the transistor 500, three layers of the metal oxide 531*a*, the metal oxide 531*b*, and the metal oxide 531*c* are stacked in and around a region where a channel is formed (hereinafter, also referred to as a channel formation region); however, the present invention is not limited thereto. For example, a two-layer structure of the metal oxide 531*b* and the metal oxide 531*c* or a stacked-layer structure of four or more layers may be employed. Although the conductor 560 is illustrated to have a stacked-layer structure of two layers in the transistor 500, the present invention is not limited thereto. For example, the conductor 560 may have a single-layer structure or a stacked-layer structure of three or more layers. Furthermore, each of the metal oxide 531*a*, the metal oxide 531*b*, and the metal oxide 531*c* may have a stacked-layer structure of two or more layers.

For example, in the case where the metal oxide 531*c* has a stacked-layer structure including a first metal oxide and a second metal oxide over the first metal oxide, it is preferable that the first metal oxide have a composition similar to that of the metal oxide 531*b* and the second metal oxide have a composition similar to that of the metal oxide 531*a*.

Here, the conductor 560 functions as a gate electrode of the transistor, and the conductor 542*a* and the conductor 542*b* function as a source electrode and a drain electrode. As described above, the conductor 560 is formed to be embedded in the opening of the insulator 580 and the region sandwiched between the conductor 542*a* and the conductor 542*b*. Here, the positions of the conductor 560, the conductor 542*a*, and the conductor 542*b* are selected in a self-aligned manner with respect to the opening of the insulator 580. That is, in the transistor 500, the gate electrode can be placed between the source electrode and the drain electrode in a self-aligned manner. Thus, the conductor 560 can be formed without an alignment margin, resulting in a reduction in the area occupied by the transistor 500. Accordingly, the display device can have higher definition. In addition, the display device can have a narrow bezel.

As illustrated in FIG. 79, the conductor 560 preferably includes a conductor 560*a* provided inside the insulator 550 and a conductor 560*b* provided to be embedded inside the conductor 560*a*.

The transistor 500 preferably includes an insulator 514 placed over the substrate (not illustrated); an insulator 516 placed over the insulator 514; a conductor 505 placed to be embedded in the insulator 516; an insulator 522 placed over the insulator 516 and the conductor 505; and the insulator 524 placed over the insulator 522. The metal oxide 531*a* is preferably placed over the insulator 524.

An insulator 574 and an insulator 581 functioning as interlayer films are preferably placed over the transistor 500. Here, the insulator 574 is preferably placed in contact with the top surfaces of the conductor 560, the insulator 550, the insulator 554, the metal oxide 531*c*, and the insulator 580.

The insulator 522, the insulator 554, and the insulator 574 preferably have a function of inhibiting diffusion of hydrogen (e.g., at least one of a hydrogen atom, a hydrogen molecule, and the like). For example, the insulator 522, the insulator 554, and the insulator 574 preferably have a lower hydrogen permeability than the insulator 524, the insulator 550, and the insulator 580. Moreover, the insulator 522 and the insulator 554 preferably have a function of inhibiting diffusion of oxygen (e.g., at least one of an oxygen atom, an oxygen molecule, and the like). For example, the insulator 522 and the insulator 554 preferably have a lower oxygen permeability than the insulator 524, the insulator 550, and the insulator 580.

Here, the insulator 524, the metal oxide 531, and the insulator 550 are separated from the insulator 580 and the insulator 581 by the insulator 554 and the insulator 574. This can inhibit entry of impurities such as hydrogen contained in the insulator 580 and the insulator 581 and excess oxygen into the insulator 524, the metal oxide 531, and the insulator 550.

A conductor 545 (a conductor 545*a* and a conductor 545*b*) that is electrically connected to the transistor 500 and functions as a plug is preferably provided. Note that an insulator 541 (an insulator 541*a* and an insulator 541*b*) is provided in contact with the side surface of the conductor 545 functioning as a plug. That is, the insulator 541 is provided in contact with the inner wall of an opening in the insulator 554, the insulator 580, the insulator 574, and the insulator 581. In addition, a structure may be employed in which a first conductor of the conductor 545 is provided in contact with the side surface of the insulator 541 and a second conductor of the conductor 545 is provided on the inner side of the first conductor. Here, the top surface of the conductor 545 and the top surface of the insulator 581 can be substantially level with each other. Although the transistor 500 has a structure in which the first conductor of the conductor 545 and the second conductor of the conductor 545 are stacked, the present invention is not limited thereto. For example, the conductor 545 may have a single-layer structure or a stacked-layer structure of three or more layers. In the case where a component has a stacked-layer structure, layers may be distinguished by ordinal numbers corresponding to the formation order.

In the transistor 500, a metal oxide functioning as an oxide semiconductor (hereinafter, also referred to as an oxide semiconductor) is preferably used as the metal oxide 531 including the channel formation region (the metal oxide 531*a*, the metal oxide 531*b*, and the metal oxide 531*c*). For example, it is preferable to use a metal oxide having a band gap of 2 eV or more, preferably 2.5 eV or more as the metal oxide to be the channel formation region of the metal oxide 531.

The metal oxide preferably contains at least indium (In) or zinc (Zn). In particular, indium (In) and zinc (Zn) are preferably contained. In addition to them, an element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). The element M further preferably contains one or both of Ga and Sn.

As illustrated in FIG. 79B, the metal oxide 531*b* in a region that does not overlap with the conductor 542 sometimes has a smaller thickness than the metal oxide 531*b* in a region that overlaps with the conductor 542. The thin region is formed when part of the top surface of the metal oxide 531*b* is removed at the time of forming the conductor 542*a* and the conductor 542*b*. When a conductive film to be the conductor 542 is formed, a low-resistance region is sometimes formed on the top surface of the metal oxide 531*b* in the vicinity of the interface with the conductive film. Removing the low-resistance region positioned between the conductor 542*a* and the conductor 542*b* on the top surface of the metal oxide 531*b* in the above manner can prevent formation of the channel in the region.

According to one embodiment of the present invention, a display device that includes small-size transistors and has high definition can be provided. A display device that includes a transistor with a high on-state current and has high luminance can be provided. A display device that includes a transistor operating at high speed and thus operates at high speed can be provided. A display device that includes a transistor having stable electrical characteristics and is highly reliable can be provided. A display device that includes a transistor with a low off-state current and has low power consumption can be provided.

The structure of the transistor 500 that can be used in the display device of one embodiment of the present invention will be described in detail.

The conductor 505 is placed to include a region overlapping with the metal oxide 531 and the conductor 560. Furthermore, the conductor 505 is preferably provided to be embedded in the insulator 516.

The conductor 505 includes a conductor 505*a*, a conductor 505*b*, and a conductor 505*c*. The conductor 505*a* is provided in contact with the bottom surface and the sidewall of the opening provided in the insulator 516. The conductor 505*b* is provided to be embedded in a recessed portion formed in the conductor 505*a*. Here, the top surface of the conductor 505*b* is lower in level than the top surface of the conductor 505*a* and the top surface of the insulator 516. The conductor 505*c* is provided in contact with the top surface of the conductor 505*b* and the side surface of the conductor 505*a*. Here, the top surface of the conductor 505*c* is substantially level with the top surface of the conductor 505*a* and the top surface of the insulator 516. That is, the conductor 505*b* is surrounded by the conductor 505*a* and the conductor 505*c*.

Here, for the conductor 505*a* and the conductor 505*c*, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 505*a* and the conductor 505*c* are formed using a conductive material having a function of inhibiting diffusion of hydrogen, impurities such as hydrogen contained in the conductor 505*b* can be inhibited from diffusing into the metal oxide 531 through the insulator 524 and the like. When the conductor 505*a* and the conductor 505*c* are formed using a conductive material having a function of inhibiting diffusion of oxygen, the conductivity of the conductor 505*b* can be inhibited from being lowered because of oxidation. As the conductive material having a function of inhibiting diffusion of oxygen, for example, titanium, titanium nitride, tantalum, tantalum nitride, ruthenium, ruthenium oxide, or the like is preferably used. Thus, the conductor 505*a* is a single layer or stacked layers of the above conductive materials. For example, titanium nitride is used for the conductor 505*a*.

For the conductor 505*b*, a conductive material containing tungsten, copper, or aluminum as its main component is preferably used. For example, tungsten is used for the conductor 505*b*.

The conductor 560 sometimes functions as a first gate (also referred to as top gate) electrode. The conductor 505 sometimes functions as a second gate (also referred to as bottom gate) electrode. In that case, by changing a potential applied to the conductor 505 not in synchronization with but independently of a potential applied to the conductor 560, Vth of the transistor 500 can be controlled. In particular, by applying a negative potential to the conductor 505, Vth of the transistor 500 can be higher than 0 V and the off-state current can be made low. Thus, a drain current at the time when a potential applied to the conductor 560 is 0 V can be lower in the case where a negative potential is applied to the conductor 505 than in the case where the negative potential is not applied to the conductor 505.

The conductor 505 is preferably provided to be larger than the channel formation region in the metal oxide 531. In particular, it is preferable that the conductor 505 extend beyond an end portion of the metal oxide 531 that intersects with the channel width direction, as illustrated in FIG. 79C. That is, the conductor 505 and the conductor 560 preferably overlap with each other with the insulator therebetween, in a region outside the side surface of the metal oxide 531 in the channel width direction.

With the above structure, the channel formation region of the metal oxide 531 can be electrically surrounded by an electric field of the conductor 560 having a function of the first gate electrode and an electric field of the conductor 505 having a function of the second gate electrode.

As illustrated in FIG. 79C, the conductor 505 extends to function as a wiring as well. However, without limitation to this structure, a structure in which a conductor functioning as a wiring is provided below the conductor 505 may be employed.

The insulator 514 preferably functions as a barrier insulating film that inhibits entry of impurities such as water or hydrogen into the transistor 500 from the substrate side. Accordingly, it is preferable to use, for the insulator 514, an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom (an insulating material through which the impurities are less likely to pass). Alternatively, it is preferable to use an insulating material having a function of inhibiting diffusion of oxygen (e.g., at least one of an oxygen atom, an oxygen molecule, and the like) (an insulating material through which the oxygen is less likely to pass).

For example, aluminum oxide, silicon nitride, or the like is preferably used as the insulator 514. Accordingly, it is possible to inhibit diffusion of impurities such as water or hydrogen to the transistor 500 side from the substrate side through the insulator 514. Alternatively, it is possible to inhibit diffusion of oxygen contained in the insulator 524 and the like to the substrate side through the insulator 514.

The permittivity of each of the insulator 516, the insulator 580, and the insulator 581 functioning as an interlayer film is preferably lower than that of the insulator 514. When a material with a low permittivity is used for an interlayer film, the parasitic capacitance generated between wirings can be reduced. As the insulator 516, the insulator 580, and the insulator 581, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 522 and the insulator 524 have a function of a gate insulator.

Here, the insulator 524 in contact with the metal oxide 531 preferably releases oxygen by heating. In this specification, oxygen that is released by heating is referred to as excess oxygen in some cases. For example, silicon oxide, silicon oxynitride, or the like can be used as appropriate for the insulator 524. When an insulator containing oxygen is provided in contact with the metal oxide 531, oxygen vacancies in the metal oxide 531 can be reduced, leading to improved reliability of the transistor 500.

Specifically, an oxide material that releases part of oxygen by heating is preferably used for the insulator 524. An oxide that releases oxygen by heating is an oxide film in which the amount of released oxygen converted into oxygen atoms is greater than or equal to $1.0\times10^{18}$ atoms/$cm^3$, preferably greater than or equal to $1.0\times10^{19}$ atoms/$cm^3$, further preferably greater than or equal to $2.0\times10^{19}$ atoms/$cm^3$ or greater than or equal to $3.0\times10^{20}$ atoms/$cm^3$ in TDS (Thermal Desorption Spectroscopy) analysis. Note that the temperature of the film surface in the TDS analysis is preferably in the range of 100° C. to 700° C., inclusive or 100° C. to 400° C., inclusive.

As illustrated in FIG. 79C, the insulator 524 is sometimes thinner in a region that overlaps with neither the insulator 554 nor the metal oxide 531*b* than in the other regions. In the insulator 524, the region that overlaps with neither the insulator 554 nor the metal oxide 531*b* preferably has a thickness with which the above oxygen can be adequately diffused.

Like the insulator 514 and the like, the insulator 522 preferably functions as a barrier insulating film that inhibits entry of impurities such as water or hydrogen into the transistor 500 from the substrate side. For example, the insulator 522 preferably has a lower hydrogen permeability than the insulator 524. When the insulator 524, the metal oxide 531, the insulator 550, and the like are surrounded by the insulator 522, the insulator 554, and the insulator 574, entry of impurities such as water or hydrogen into the transistor 500 from the outside can be inhibited.

Furthermore, it is preferable that the insulator 522 have a function of inhibiting diffusion of oxygen (e.g., at least one of an oxygen atom, an oxygen molecule, and the like) (it is preferable that the oxygen be less likely to pass through the insulator 522). For example, the insulator 522 preferably has a lower oxygen permeability than the insulator 524. The insulator 522 preferably has a function of inhibiting diffusion of oxygen and impurities, in which case oxygen contained in the metal oxide 531 is less likely to diffuse to the substrate side. Moreover, the conductor 505 can be inhibited from reacting with oxygen contained in the insulator 524 and the metal oxide 531.

As the insulator 522, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer inhibiting release of oxygen from the metal oxide 531 and entry of impurities such as hydrogen into the metal oxide 531 from the periphery of the transistor 500.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

The insulator 522 may be a single layer or a stacked layer using an insulator containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST), for example. With scaling down and higher integration of transistors, a problem such as leakage current may arise because of a thinned gate insulator. When a high-k material is used for the insulator functioning as a gate insulator, a gate potential at the time of the operation of the transistor can be reduced while the physical thickness is maintained.

Note that the insulator 522 and the insulator 524 may each have a stacked-layer structure of two or more layers. In that case, without limitation to a stacked-layer structure formed of the same material, a stacked-layer structure formed of different materials may be employed. For example, an insulator similar to the insulator 524 may be provided below the insulator 522.

The metal oxide 531 includes the metal oxide 53Ta, the metal oxide 531*b* over the metal oxide 531*a*, and the metal oxide 531*c* over the metal oxide 531*b*. When the metal oxide 531 includes the metal oxide 531*a* under the metal oxide 531*b*, it is possible to inhibit diffusion of impurities into the metal oxide 531*b* from the components formed below the metal oxide 531*a*. Moreover, when the metal oxide 531 includes the metal oxide 531*c* over the metal oxide 531*b*, it is possible to inhibit diffusion of impurities into the metal oxide 531*b* from the components formed above the metal oxide 531*c*.

Note that the metal oxide 531 preferably has a stacked-layer structure of a plurality of oxide layers that differ in the atomic ratio of metal atoms. For example, in the case where the metal oxide 531 contains at least indium (In) and the element M, the proportion of the number of atoms of the element M contained in the metal oxide 531*a* to the number of atoms of all elements that constitute the metal oxide 531*a* is preferably higher than the proportion of the number of atoms of the element M contained in the metal oxide 531*b* to the number of atoms of all elements that constitute the metal oxide 531*b*. In addition, the atomic ratio of the element M to In in the metal oxide 531*a* is preferably greater than the atomic ratio of the element M to In in the metal oxide 531*b*. Here, a metal oxide that can be used as the metal oxide 531*a* or the metal oxide 531*b* can be used as the metal oxide 531*c*.

The energy of the conduction band minimum of each of the metal oxide 531*a* and the metal oxide 531*c* is preferably higher than the energy of the conduction band minimum of the metal oxide 531*b*. In other words, the electron affinity of each of the metal oxide 531*a* and the metal oxide 531*c* is preferably smaller than the electron affinity of the metal oxide 531*b*. In this case, a metal oxide that can be used as the metal oxide 531*a* is preferably used as the metal oxide 531*c*. Specifically, the proportion of the number of atoms of the element M contained in the metal oxide 531*c* to the number of atoms of all elements that constitute the metal oxide 531*c* is preferably higher than the proportion of the number of atoms of the element M contained in the metal oxide 531*b* to the number of atoms of all elements that constitute the metal oxide 531*b*. In addition, the atomic ratio of the element M to In in the metal oxide 531*c* is preferably greater than the atomic ratio of the element M to In in the metal oxide 531*b*.

Here, the energy level of the conduction band minimum gently changes at junction portions between the metal oxide 531*a*, the metal oxide 531*b*, and the metal oxide 531*c*. In other words, at the junction portions between the metal oxide 531*a*, the metal oxide 531*b*, and the metal oxide 531*c*, the energy level of the conduction band minimum continuously changes or the energy levels are continuously connected. This can be achieved by decreasing the density of defect states in a mixed layer formed at the interface between the metal oxide 531*a* and the metal oxide 531*b* and the interface between the metal oxide 531*b* and the metal oxide 531*c*.

Specifically, when the metal oxide 531*a* and the metal oxide 531*b* or the metal oxide 531*b* and the metal oxide 531*c* contain the same element (as a main component) in addition to oxygen, a mixed layer with a low density of defect states can be formed. In the case where the metal oxide 531*b* is an In—Ga—Zn oxide, for example, an In—Ga—Zn oxide, a Ga—Zn oxide, gallium oxide, or the like may be used as the metal oxide 531*a* and the metal oxide 531*c*. The metal oxide 531*c* may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 531*c* may have a stacked-layer structure of an In—Ga—Zn oxide and an oxide that does not contain In.

Specifically, as the metal oxide 531*a*, a metal oxide with In:Ga:Zn=1:3:4 [atomic ratio] or 1:1:0.5 [atomic ratio] can be used. As the metal oxide 531*b*, a metal oxide with In:Ga:Zn=4:2:3 [atomic ratio] or 3:1:2 [atomic ratio] can be used. As the metal oxide 531*c*, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Specific examples of a stacked-layer structure of the metal oxide 531*c* include a stacked-layer structure of a layer with In:Ga:Zn=4:2:3 [atomic ratio] and a layer with Ga:Zn=2:1 [atomic ratio], a stacked-layer structure of a layer with In:Ga:Zn=4:2:3 [atomic ratio] and a layer with Ga:Zn=2:5 [atomic ratio], and a stacked-layer structure of a layer with In:Ga:Zn=4:2:3 [atomic ratio] and a layer of gallium oxide.

At this time, the metal oxide 531*b* serves as a main carrier path. When the metal oxide 531*a* and the metal oxide 531*c* have the above structure, the density of defect states at the interface between the metal oxide 531*a* and the metal oxide 531*b* and the interface between the metal oxide 531*b* and the metal oxide 531*c* can be made low. This reduces the influence of interface scattering on carrier conduction, and the transistor 500 can have a high on-state current and high frequency characteristics. Note that in the case where the metal oxide 531*c* has a stacked-layer structure, not only the effect of reducing the density of defect states at the interface between the metal oxide 531*b* and the metal oxide 531*c*, but also the effect of inhibiting diffusion of the constituent element contained in the metal oxide 531*c* to the insulator 550 side can be expected. Specifically, the metal oxide 531*c* has a stacked-layer structure in which an oxide not containing In is positioned in the upper layer of the stacked-layer structure, whereby the diffusion of In to the insulator 550 side can be inhibited. Since the insulator 550 functions as a gate insulator, the transistor has defects in characteristics when In diffuses. Thus, the metal oxide 531*c* having a stacked-layer structure allows a highly reliable display device to be provided.

The conductor 542 (the conductor 542*a* and the conductor 542*b*) functioning as the source electrode and the drain electrode is provided over the metal oxide 531*b*. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen.

When the conductor 542 is provided in contact with the metal oxide 531, the oxygen concentration of the metal oxide 531 in the vicinity of the conductor 542 sometimes decreases. In addition, a metal compound layer that contains the metal contained in the conductor 542 and the component of the metal oxide 531 is sometimes formed in the metal oxide 531 in the vicinity of the conductor 542. In such cases, the carrier concentration of the region in the metal oxide 531 in the vicinity of the conductor 542 increases, and the region becomes a low-resistance region.

Here, the region between the conductor 542*a* and the conductor 542*b* is formed to overlap with the opening of the insulator 580. Accordingly, the conductor 560 can be placed in a self-aligned manner between the conductor 542*a* and the conductor 542*b*.

The insulator 550 functions as a gate insulator. The insulator 550 is preferably placed in contact with the top surface of the metal oxide 531*c*. For the insulator 550, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 524, the concentration of impurities such as water or hydrogen in the insulator 550 is preferably reduced. The thickness of the insulator 550 is preferably greater than or equal to 1 nm and less than or equal to 20 nm.

A metal oxide may be provided between the insulator 550 and the conductor 560. The metal oxide preferably inhibits oxygen diffusion from the insulator 550 to the conductor 560. Accordingly, oxidation of the conductor 560 due to oxygen in the insulator 550 can be inhibited.

The metal oxide functions as part of the gate insulator in some cases. Thus, when silicon oxide, silicon oxynitride, or the like is used for the insulator 550, a metal oxide that is a high-k material with a high dielectric constant is preferably used as the metal oxide. When the gate insulator has a stacked-layer structure of the insulator 550 and the metal oxide, the stacked-layer structure can be thermally stable and have a high dielectric constant. Accordingly, a gate potential applied during the operation of the transistor can be reduced while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

Although the conductor 560 is illustrated to have a two-layer structure in FIG. 79, the conductor 560 may have a single-layer structure or a stacked-layer structure of three or more layers.

The conductor 560*a* is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 560*a* has a function of inhibiting diffusion of oxygen, the conductivity of the conductor 560*b* can be inhibited from being lowered because of oxidation due to oxygen contained in the insulator 550. As a conductive material having a function of inhibiting oxygen diffusion, for example, tantalum, tantalum nitride, ruthenium, ruthenium oxide, or the like is preferably used.

A conductive material containing tungsten, copper, or aluminum as its main component is preferably used for the conductor 560*b*. The conductor 560 also functions as a wiring and thus is preferably formed using a conductor having high conductivity. For example, a conductive material containing tungsten, copper, or aluminum as its main component can be used. The conductor 560*b* may have a stacked-layer structure, for example, a stacked-layer structure of titanium or titanium nitride and the above conductive material.

As illustrated in FIG. 79A and FIG. 79C, the side surface of the metal oxide 531 is covered with the conductor 560 in a region where the metal oxide 531*b* does not overlap with the conductor 542, that is, the channel formation region of the metal oxide 531. Accordingly, an electric field of the conductor 560 functioning as the first gate electrode is likely to act on the side surface of the metal oxide 531. Thus, the on-state current of the transistor 500 can be increased and the frequency characteristics can be improved.

The insulator 554, like the insulator 514 and the like, preferably functions as a barrier insulating film that inhibits entry of impurities such as water or hydrogen into the transistor 500 from the insulator 580 side. The insulator 554 preferably has a lower hydrogen permeability than the insulator 524, for example. Furthermore, as illustrated in FIG. 79B and FIG. 79C, the insulator 554 is preferably in contact with the side surface of the metal oxide 531*c*, the top and side surfaces of the conductor 542*a*, the top and side surfaces of the conductor 542*b*, the side surfaces of the metal oxide 531*a* and the metal oxide 531*b*, and the top surface of the insulator 524. Such a structure can inhibit entry of hydrogen contained in the insulator 580 into the metal oxide 531 through the top surfaces or side surfaces of the conductor 542*a*, the conductor 542*b*, the metal oxide 531*a*, the metal oxide 531*b*, and the insulator 524.

Furthermore, it is preferable that the insulator 554 have a function of inhibiting diffusion of oxygen (e.g., at least one of an oxygen atom, an oxygen molecule, and the like) (it is preferable that the oxygen be less likely to pass through the insulator 554). For example, the insulator 554 preferably has a lower oxygen permeability than the insulator 580 or the insulator 524.

The insulator 554 is preferably formed by a sputtering method. When the insulator 554 is formed by a sputtering method in an oxygen-containing atmosphere, oxygen can be added to the vicinity of a region of the insulator 524 that is in contact with the insulator 554. Thus, oxygen can be supplied from the region to the metal oxide 531 through the insulator 524. Here, with the insulator 554 having a function of inhibiting upward diffusion of oxygen, oxygen can be prevented from diffusing from the metal oxide 531 into the insulator 580. Moreover, with the insulator 522 having a function of inhibiting downward diffusion of oxygen, oxygen can be prevented from diffusing from the metal oxide 531 to the substrate side. In the above manner, oxygen is supplied to the channel formation region of the metal oxide 531. Accordingly, oxygen vacancies in the metal oxide 531 can be reduced, so that the transistor can be inhibited from having normally-on characteristics.

As the insulator 554, an insulator containing an oxide of one or both of aluminum and hafnium is preferably formed, for example. Note that as the insulator containing an oxide of one or both of aluminum and hafnium, aluminum oxide, hafnium oxide, an oxide containing aluminum and hafnium (hafnium aluminate), or the like is preferably used.

The insulator 524, the insulator 550, and the metal oxide 531 are covered with the insulator 554 having a barrier property against hydrogen, whereby the insulator 580 is separated from the insulator 524, the metal oxide 531, and the insulator 550 by the insulator 554. This can inhibit entry of impurities such as hydrogen from the outside of the transistor 500, resulting in excellent electrical characteristics and high reliability of the transistor 500.

The insulator 580 is provided over the insulator 524, the metal oxide 531, and the conductor 542 with the insulator 554 therebetween. The insulator 580 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride, which are thermally stable, are preferable. In particular, materials such as silicon oxide, silicon oxynitride, and porous silicon oxide are preferably used, in which case a region containing oxygen to be released by heating can be easily formed.

The concentration of impurities such as water or hydrogen in the insulator 580 is preferably reduced. In addition, the top surface of the insulator 580 may be planarized.

Like the insulator 514 and the like, the insulator 574 preferably functions as a barrier insulating film that inhibits entry of impurities such as water or hydrogen into the insulator 580 from the above. As the insulator 574, for example, the insulator that can be used as the insulator 514, the insulator 554, and the like can be used.

The insulator 581 functioning as an interlayer film is preferably provided over the insulator 574. As in the insulator 524 or the like, the concentration of impurities such as water or hydrogen in the insulator 581 is preferably reduced.

The conductor 545*a* and the conductor 545*b* are placed in openings formed in the insulator 581, the insulator 574, the insulator 580, and the insulator 554. The conductor 545*a* and the conductor 545*b* are provided to face each other with the conductor 560 therebetween. Note that the top surfaces of the conductor 545*a* and the conductor 545*b* may be on the same plane as the top surface of the insulator 581.

The insulator 541*a* is provided in contact with the inner wall of the opening in the insulator 581, the insulator 574, the insulator 580, and the insulator 554, and a first conductor of the conductor 545*a* is formed in contact with the side surface of the insulator 541*a*. The conductor 542*a* is positioned on at least part of the bottom portion of the opening, and the conductor 545*a* is in contact with the conductor 542*a*. Similarly, the insulator 541*b* is provided in contact with the inner wall of the opening in the insulator 581, the insulator 574, the insulator 580, and the insulator 554, and a first conductor of the conductor 545*b* is formed in contact with the side surface of the insulator 541*b*. The conductor 542*b* is positioned on at least part of the bottom portion of the opening, and the conductor 545*b* is in contact with the conductor 542*b*.

The conductor 545*a* and the conductor 545*b* are preferably formed using a conductive material containing tungsten, copper, or aluminum as its main component. The conductor 545*a* and the conductor 545*b* may each have a stacked-layer structure.

In the case where the conductor 545 has a stacked-layer structure, the aforementioned conductor having a function of inhibiting diffusion of impurities such as water or hydrogen is preferably used as the conductor in contact with the metal oxide 531*a*, the metal oxide 531*b*, the conductor 542, the insulator 554, the insulator 580, the insulator 574, and the insulator 581. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or stacked layers. The use of the conductive material can inhibit oxygen added to the insulator 580 from being absorbed by the conductor 545*a* and the conductor 545*b*. Moreover, impurities such as water or hydrogen can be inhibited from entering the metal oxide 531 through the conductor 545*a* and the conductor 545*b* from a layer above the insulator 581.

As the insulator 541*a* and the insulator 541*b*, for example, the insulator that can be used as the insulator 554 or the like can be used. Since the insulator 541*a* and the insulator 541*b* are provided in contact with the insulator 554, impurities such as water or hydrogen in the insulator 580 or the like can be inhibited from entering the metal oxide 531 through the conductor 545*a* and the conductor 545*b*. Furthermore, oxygen contained in the insulator 580 can be inhibited from being absorbed by the conductor 545*a* and the conductor 545*b*.

Although not illustrated, a conductor functioning as a wiring may be placed in contact with the top surface of the conductor 545*a* and the top surface of the conductor 545*b*. For the conductor functioning as a wiring, a conductive material containing tungsten, copper, or aluminum as its main component is preferably used. Furthermore, the conductor may have a stacked-layer structure and may be a stack of titanium or titanium nitride and the above conductive material, for example. Note that the conductor may be formed to be embedded in an opening provided in an insulator.

<Materials for Transistor>

Materials that can be used for the transistor will be described.

[Substrate]

As a substrate where the transistor 500 is formed, an insulator substrate, a semiconductor substrate, or a conductor substrate may be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the elements provided for the substrates include a capacitor, a resistor, a switching element, a light-emitting element, and a memory element.

[Insulator]

Examples of an insulator include an oxide, a nitride, an oxynitride, a nitride oxide, a metal oxide, a metal oxynitride, and a metal nitride oxide, each of which has an insulating property.

With scaling down and higher integration of transistors, for example, a problem such as leakage current may arise because of a thinned gate insulator. When a high-k material is used for the insulator functioning as a gate insulator, the voltage at the time of the operation of the transistor can be reduced while the physical thickness is maintained. By contrast, when a material with a low dielectric constant is used for the insulator functioning as an interlayer film, the parasitic capacitance generated between wirings can be reduced. Thus, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting passage of oxygen and impurities such as hydrogen (e.g., the insulator 514, the insulator 522, the insulator 554, and the insulator 574), the electrical characteristics of the transistor can be stable. An insulator having a function of inhibiting passage of oxygen and impurities such as hydrogen can be formed to have a single layer or a stacked layer including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator is preferably an insulator including a region containing oxygen to be released by heating. For example, when a structure is employed in which silicon oxide or silicon oxynitride that includes a region containing oxygen to be released by heating is in contact with the metal oxide 531, oxygen vacancies included in the metal oxide 531 can be filled.

[Conductor]

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used.

A plurality of conductors formed using any of the above materials may be stacked. For example, a stacked-layer structure combining a material containing the above metal element and a conductive material containing oxygen may be employed. In addition, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably employs a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide where the channel is formed. A conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

At least part of this embodiment can be implemented in combination with any of the other embodiments described in this specification as appropriate.

The structure described in this embodiment can be used in an appropriate combination with any of the structures described in the other embodiments and examples.

Embodiment 12

In this embodiment, a metal oxide (hereinafter, also referred to as an oxide semiconductor) that can be used in an OS transistor described in the above embodiment will be described.

<Classification of Crystal Structure>

First, the classification of crystal structures of an oxide semiconductor will be described with reference to FIG. 80A. FIG. 80A is a diagram showing the classification of the crystal structures of an oxide semiconductor, typically IGZO (a metal oxide containing In, Ga, and Zn).

As shown in FIG. 80A, an oxide semiconductor is roughly classified into “Amorphous”, “Crystalline”, and “Crystal”. The term “Amorphous” includes completely amorphous. The term “Crystalline” includes CAAC (c-axis-aligned crystalline), nc (nanocrystalline), and CAC (cloud-aligned composite) (excluding single crystal and poly crystal). Note that in the classification of “Crystalline”, single crystal, poly crystal, and completely amorphous are excluded. The term “Crystal” includes single crystal and poly crystal.

Note that the structures in the thick frame in FIG. 80A are in an intermediate state between “Amorphous” and “Crystal”, and belong to a new crystalline phase. That is, these structures are completely different from “Crystal” and “Amorphous”, which is energetically unstable.

Note that a crystal structure of a film or a substrate can be evaluated with an X-ray diffraction (XRD) spectrum. Here, FIG. 80B shows an XRD spectrum, which is obtained by GIXD (Grazing-Incidence XRD) measurement, of a CAAC-IGZO film classified into “Crystalline”. Note that a GIXD method is also referred to as a thin film method or a Seemann-Bohlin method. The XRD spectrum that is shown in FIG. 80B and obtained by GIXD measurement is hereinafter simply referred to as an XRD spectrum. The CAAC-IGZO film in FIG. 80B has a composition in the vicinity of In:Ga:Zn=4:2:3 [atomic ratio]. The CAAC-IGZO film in FIG. 80B has a thickness of 500 nm.

As shown in FIG. 80B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 80B, the peak at 2θ of around 31° is asymmetric with respect to the axis of the angle at which the peak intensity (Intensity) is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 80C shows a diffraction pattern of the CAAC-IGZO film. FIG. 80C shows a diffraction pattern observed by NBED in which an electron beam is incident in the direction parallel to the substrate. The CAAC-IGZO film in FIG. 80C has a composition in the vicinity of In:Ga:Zn=4:2:3 [atomic ratio]. In the nanobeam electron diffraction method, electron diffraction is performed with a probe diameter of 1 nm.

As shown in FIG. 80C, a plurality of spots indicating c-axis alignment are observed in the diffraction pattern of the CAAC-IGZO film.

[Structure of Oxide Semiconductor]

Oxide semiconductors may be classified in a manner different from that in FIG. 80A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the CAAC-OS, the nc-OS, and the a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Note that indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, and/or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

[Structure of Oxide Semiconductor]

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has [In] higher than [In] in the second region and has [Ga] lower than [Ga] in the second region. Moreover, the second region has [Ga] higher than [Ga] in the first region and has [In] lower than [In] in the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor.

Separation of the conducting function and the insulating function can maximize each function. Accordingly, when the CAC-OS is used for a transistor, a high on-state current ($I_{on}$), high field-effect mobility (μ), and excellent switching operation can be achieved.

An oxide semiconductor has various structures with different properties. Two or more kinds of the amorphous oxide semiconductor, the polycrystalline oxide semiconductor, the a-like OS, the CAC-OS, the nc-OS, and the CAAC-OS may be included in the oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

It is particularly preferable to use an oxide containing indium (In), gallium (Ga), and zinc (Zn) (also referred to as "IGZO") for a semiconductor layer where a channel is formed. Alternatively, an oxide containing indium (In), aluminum (Al), and zinc (Zn) (also referred to as "IAZO") may be used for the semiconductor layer. Alternatively, an oxide containing indium (In), aluminum (Al), gallium (Ga), and zinc (Zn) (also referred to as "IAGZO") may be used for the semiconductor layer.

An oxide semiconductor with a low carrier concentration is preferably used for a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration in an oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor has a low density of defect states and accordingly has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon and/or carbon, which are each one of Group 14 elements, is contained in the oxide semiconductor, defect states are formed in the oxide semiconductor. Thus, the concentration of silicon and carbon in the oxide semiconductor and the concentration of silicon and carbon in the vicinity of an interface with the oxide semiconductor (the concentrations obtained by SIMS) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Accordingly, a transistor using an oxide semiconductor that contains an alkali metal or an alkaline earth metal tends to have normally-on characteristics. Thus, the concentration of an alkali metal or an alkaline earth metal in the oxide semiconductor, which is obtained by SIMS, is set lower than or equal to $1\times10^{18}$ atoms/$cm^3$, preferably lower than or equal to $2\times10^{16}$ atoms/$cm^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

The structure described in this embodiment can be used in an appropriate combination with any of the structures described in the other embodiments and examples.

Embodiment 13

In this embodiment, electronic devices in which the semiconductor device of one embodiment of the present invention can be used will be described.

The semiconductor device of one embodiment of the present invention can be used for a display portion of an electronic device. Thus, an electronic device having high display quality can be obtained. Alternatively, an electronic device with extremely high definition can be obtained. Alternatively, a highly reliable electronic device can be obtained.

Examples of electronic devices using the semiconductor device or the like of one embodiment of the present invention include display devices such as televisions and monitors, lighting devices, desktop or laptop personal computers, word processors, image reproduction devices that reproduce still images and moving images stored in recording media such as DVDs (Digital Versatile Discs), portable CD players, radios, tape recorders, headphone stereos, stereos, table clocks, wall clocks, cordless phone handsets, transceivers, car phones, mobile phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as chain saws, smoke detectors, and medical equipment such as dialyzers. Other examples include industrial equipment such as guide lights, traffic lights, belt conveyors, elevators, escalators, industrial robots, power storage systems, and power storage devices for leveling the amount of power supply and smart grid. In addition, moving objects and the like driven by fuel engines and electric motors using power from power storage units may also be included in the category of electronic devices. Examples of the moving objects include electric vehicles (EVs), hybrid electric vehicles (HVs) that include both an internal-combustion engine and a motor, plug-in hybrid electric vehicles (PHVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The electronic device of one embodiment of the present invention may include a secondary battery (battery), and it is preferable that the secondary battery be capable of being charged by contactless power transmission.

Examples of the secondary battery include a lithium-ion secondary battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. With the antenna receiving a signal, the electronic device can display a video, information, and the like on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radiation, a flow rate, humidity, gradient, oscillation, a smell, or infrared rays).

The electronic device of one embodiment of the present invention can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading a program or data stored in a recording medium.

Furthermore, an electronic device including a plurality of display portions can have a function of displaying image information mainly on one display portion while displaying text information mainly on another display portion, a function of displaying a three-dimensional image by displaying images on the plurality of display portions with a parallax taken into account, or the like. Furthermore, an electronic device including an image receiving portion can have a function of taking a still image or a moving image, a function of automatically or manually correcting a taken image, a function of storing a taken image in a recording medium (an external recording medium or a recording medium incorporated in the electronic device), a function of displaying a taken image on a display portion, or the like. Note that the functions of the electronic device of one embodiment of the present invention are not limited to these, and the electronic device can have a variety of functions.

The semiconductor device of one embodiment of the present invention can display a high-definition image. Thus, the semiconductor device can be suitably used especially for a portable electronic device, a wearable electronic device (wearable device), an e-book reader, and the like. For example, the semiconductor device can be suitably used for xR devices such as a VR device and an AR device.

Figure 81A:
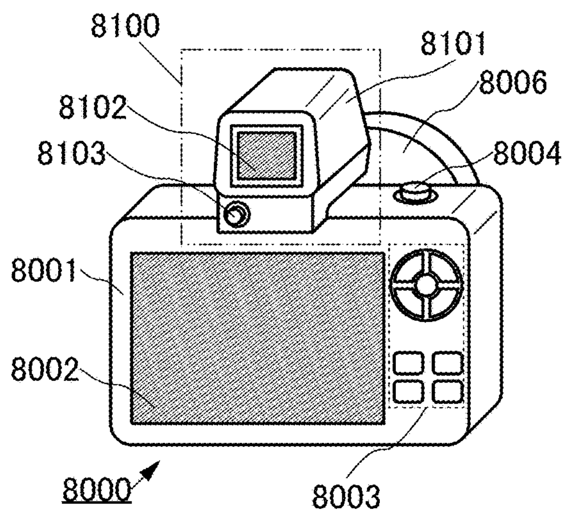
FIG. 81A to FIG. 81F are diagrams illustrating examples of electronic devices.

FIG. 81A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display a video and the like received from the camera 8000 on the display portion 8102.

The button 8103 functions as a power button or the like.

The semiconductor device of one embodiment of the present invention can be used in the display portion 8002 of the camera 8000 and the display portion 8102 of the finder 8100. Note that the finder 8100 may be incorporated in the camera 8000.

Figure 81B:
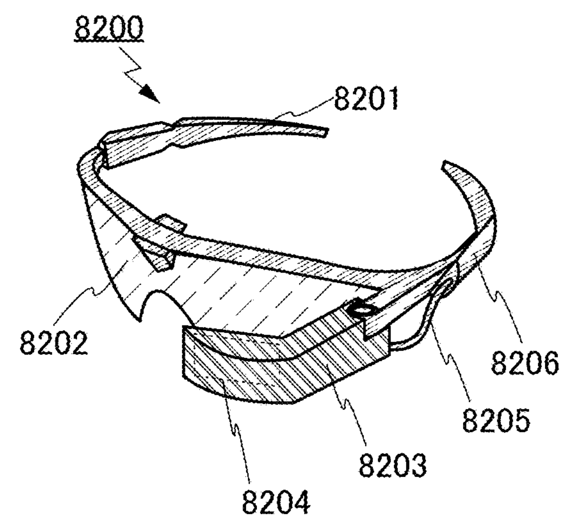

FIG. 81B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies power from the battery 8206 to the main body 8203. The main body 8203 includes a wireless receiver or the like to receive video information and display it on the display portion 8204. The main body 8203 includes a camera, and information on the movement of the eyeballs or the eyelids of the user can be used as an input means.

The mounting portion 8201 may include a plurality of electrodes capable of sensing current flowing in response to the movement of the user's eyeball at a position in contact with the user to recognize the user's sight line. The mounting portion 8201 may also have a function of monitoring the user's pulse with the use of current flowing through the electrodes. The mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, and the like.

The semiconductor device of one embodiment of the present invention can be used in the display portion 8204.

Figure 81C:
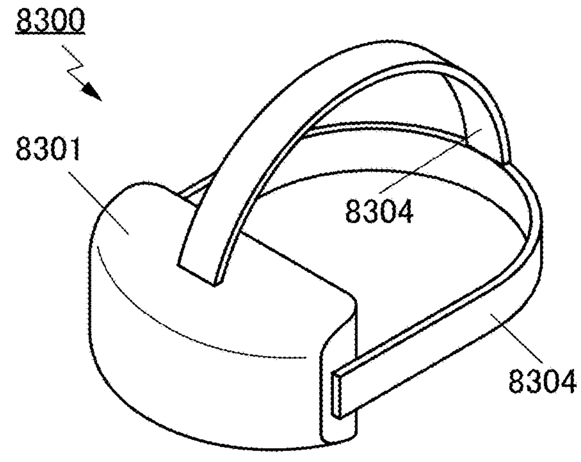
Figure 81D:
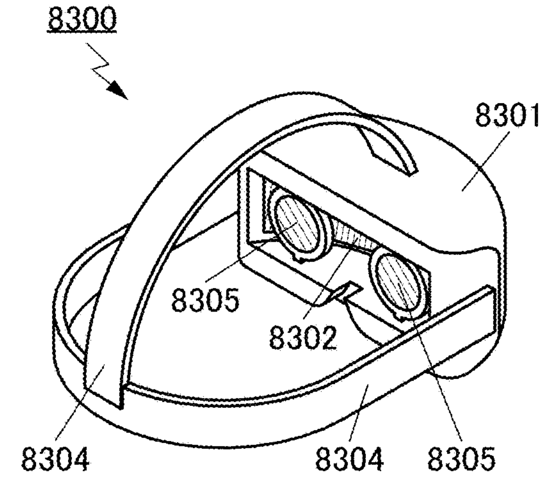
Figure 81E:
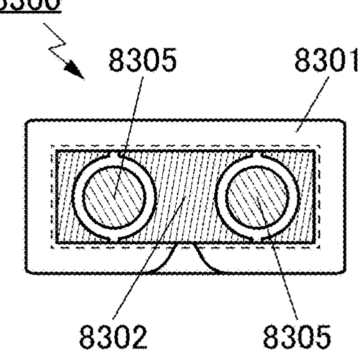

FIG. 81C to FIG. 81E are external views of a head-mounted display 8300. The head-mounted display 8300 includes a housing 8301, a display portion 8302, a band-like fixing member 8304, and a pair of lenses 8305.

A user can see display on the display portion 8302 through the lenses 8305. The display portion 8302 is preferably curved because the user can feel a high realistic sensation. Another image displayed on another region of the display portion 8302 is viewed through the lenses 8305, so that three-dimensional display using parallax or the like can be performed. Note that the number of display portions 8302 is not limited to one; two display portions 8302 may be provided for the user's respective eyes.

The semiconductor device of one embodiment of the present invention can be used for the display portion 8302. The semiconductor device of one embodiment of the present invention can achieve extremely high definition. For example, a pixel is not easily seen by the user even when the user sees display that is magnified by the lenses 8305 as illustrated in FIG. 81E. That is, a video with a strong sense of reality can be seen by the user with the use of the display portion 8302.

Figure 81F:
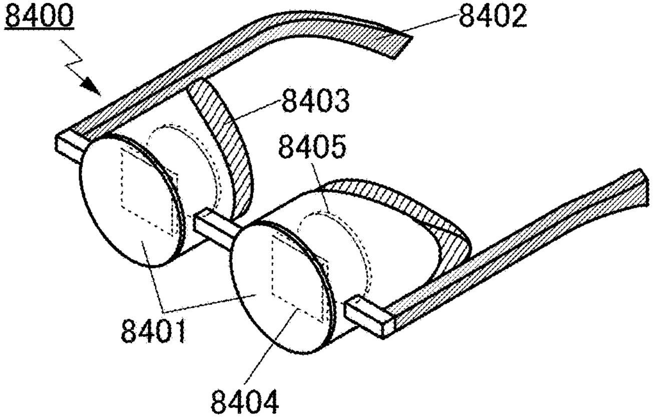

FIG. 81F is an external view of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. Furthermore, when the pair of display portions 8404 display different images, three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has plasticity and elasticity so as to be adjusted to fit the size of the user's face and not to slide down. In addition, part of the mounting portion 8402 preferably has a vibration mechanism functioning as a bone conduction earphone. Thus, audio devices such as an earphone and a speaker are not necessarily provided separately, and the user can enjoy videos and sounds only by wearing the head-mounted display 8400. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

Figures 82A, 82B, 82C, 82D, 82E, 82F:
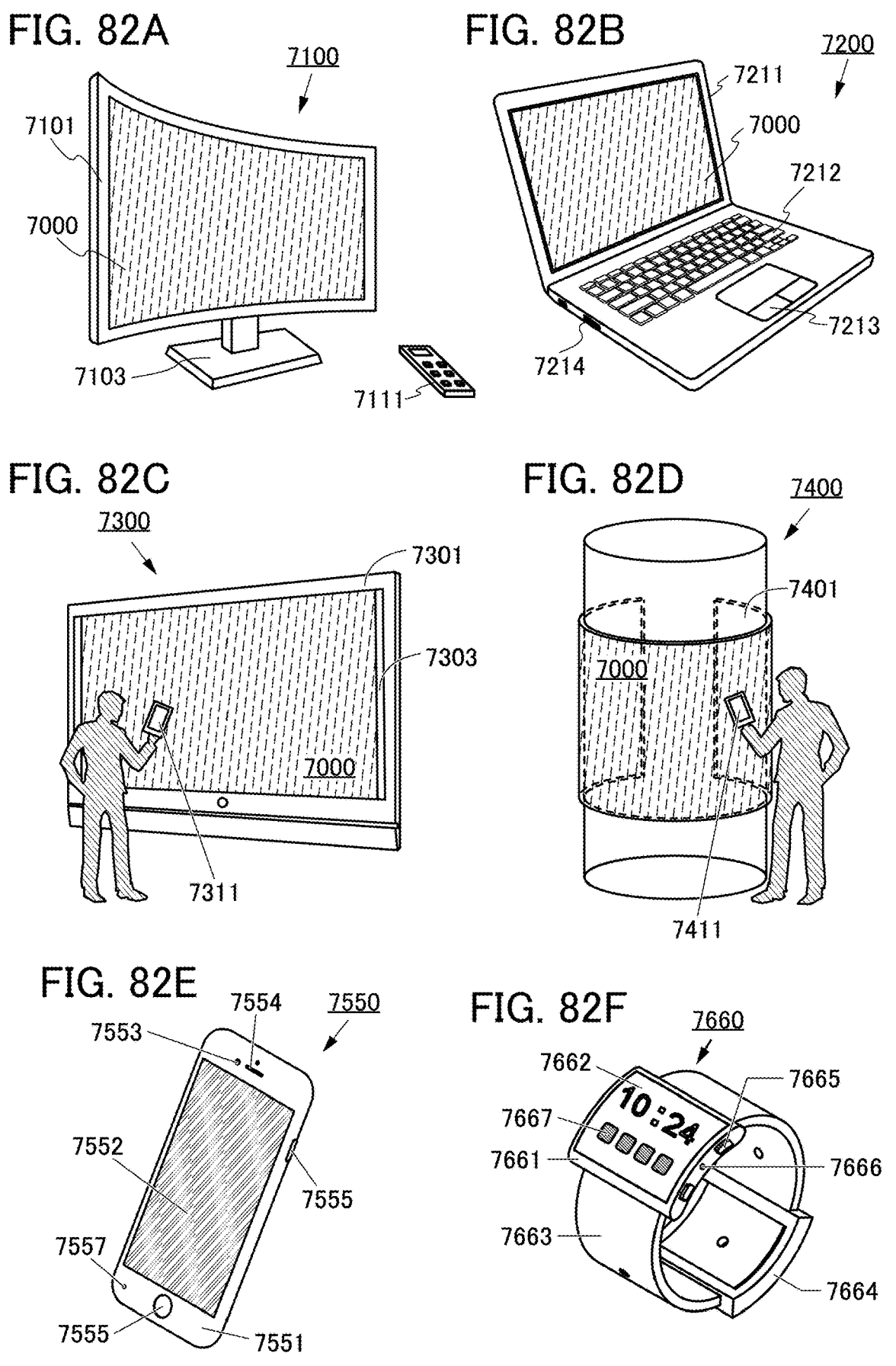

FIG. 82A illustrates an example of a television device. In a television device 7100, a display portion 7000 is incorporated in a housing 7101. Here, the housing 7101 is supported by a stand 7103.

The semiconductor device of one embodiment of the present invention can be used for the display portion 7000.

Operation of the television device 7100 illustrated in FIG. 82A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) information communication can be performed.

FIG. 82B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The semiconductor device of one embodiment of the present invention can be used for the display portion 7000.

FIG. 82C and FIG. 82D illustrate examples of digital signage.

Digital signage 7300 illustrated in FIG. 82C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 82D illustrates digital signage 7400 attached to a cylindrical pillar 7401. The digital signage 7400 includes the display portion 7000 provided along a curved surface of the pillar 7401.

In FIG. 82C and FIG. 82D, the semiconductor device of one embodiment of the present invention can be used for the display portion 7000.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 82C and FIG. 82D, it is preferable that the digital signage 7300 or the digital signage 7400 be capable of working with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

An information terminal 7550 illustrated in FIG. 82E includes a housing 7551, a display portion 7552, a microphone 7557, a speaker portion 7554, a camera 7553, operation switches 7555, and the like. The semiconductor device of one embodiment of the present invention can be used for the display portion 7552. The display portion 7552 has a touch panel function. The information terminal 7550 also includes an antenna, a battery, and the like inside the housing 7551. The information terminal 7550 can be used as, for example, a smartphone, a mobile phone, a tablet information terminal, a tablet personal computer, an e-book reader, or the like.

FIG. 82F illustrates an example of a watch-type information terminal. An information terminal 7660 includes a housing 7661, a display portion 7662, a band 7663, a buckle 7664, an operation switch 7665, an input/output terminal 7666, and the like. The information terminal 7660 also includes an antenna, a battery, and the like inside the housing 7661. The information terminal 7660 is capable of executing a variety of applications such as mobile phone calls, e-mailing, text viewing and editing, music reproduction, Internet communication, and computer games.

The display portion 7662 includes a touch sensor, and operation can be performed by touching the screen with a finger, a stylus, or the like. For example, by touching an icon 7667 displayed on the display portion 7662, an application can be started. With the operation switch 7665, a variety of functions such as time setting, power on/off, on/off of wireless communication, setting and cancellation of a silent mode, and setting and cancellation of a power saving mode can be performed. For example, the functions of the operation switch 7665 can be set by the operating system incorporated in the information terminal 7660.

The information terminal 7660 can execute near field communication conformable to a communication standard. For example, mutual communication between the information terminal 7660 and a headset capable of wireless communication enables hands-free calling. The information terminal 7660 includes the input/output terminal 7666, and can perform data transmission and reception with another information terminal through the input/output terminal 7666. Charging through the input/output terminal 7666 is also possible. Note that the charging operation may be performed by wireless power feeding without using the input/output terminal 7666.

Figures 83A, 83B:
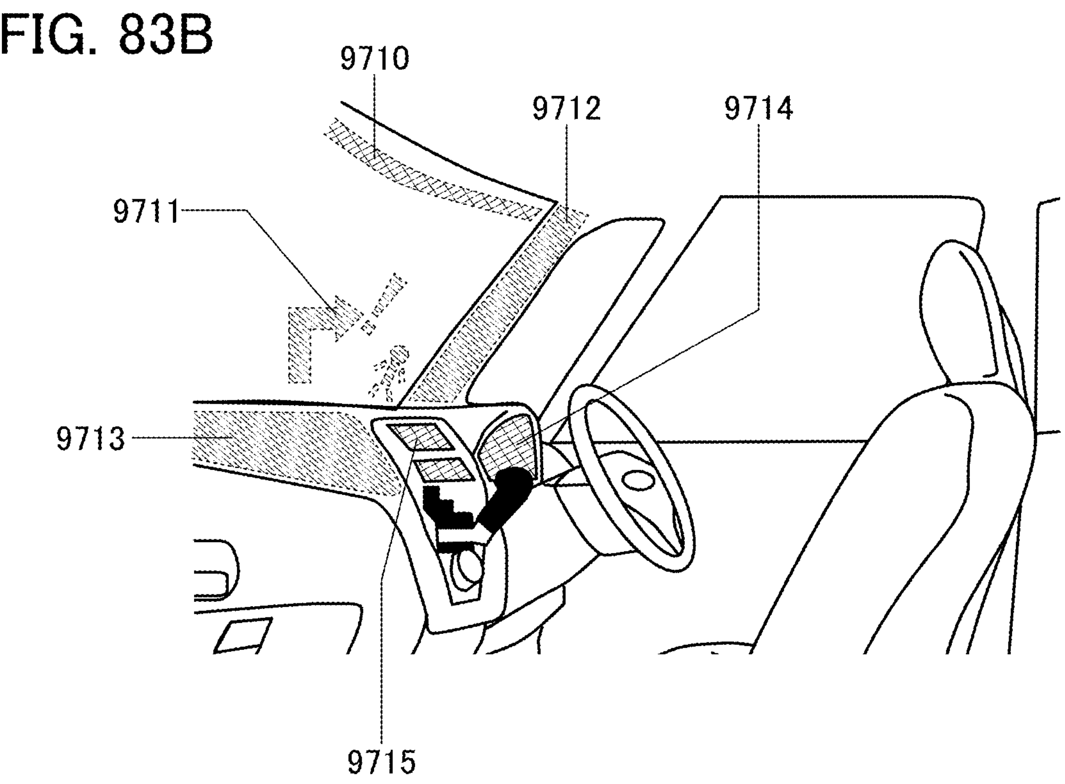
FIG. 83A and FIG. 83B are diagrams illustrating examples of electronic devices.

FIG. 83A is an external view of an automobile 9700. FIG. 83B illustrates a driver's seat of the automobile 9700. The automobile 9700 includes a car body 9701, wheels 9702, a dashboard 9703, lights 9704, and the like. The display device of one embodiment of the present invention can be used in a display portion of the automobile 9700 or the like. For example, the display device of one embodiment of the present invention can be provided for a display portion 9710 to a display portion 9715 illustrated in FIG. 83B.

The display portion 9710 and the display portion 9711 are display devices provided in an automobile windshield. The display device of one embodiment of the present invention can be what is called a see-through display device, through which the opposite side can be seen, by using a light-transmitting conductive material for electrodes of the display device. Such a see-through display device does not hinder driver's vision during the driving of the automobile 9700. Thus, the display device of one embodiment of the present invention can be provided in the windshield of the automobile 9700. Note that in the case where a transistor or the like for driving the display device is provided in the display device, a transistor having a light-transmitting property, such as an organic transistor using an organic semiconductor material or a transistor using an oxide semiconductor, is preferably used.

The display portion 9712 is a display device provided on a pillar portion. For example, the display portion 9712 can compensate for the view hindered by the pillar by displaying a video taken by an imaging means provided on the car body. The display portion 9713 is a display device provided on a dashboard portion. For example, the display portion 9713 can compensate for the view hindered by the dashboard by displaying a video taken by the imaging means provided on the car body. That is, display of a video taken by the imaging means provided on the exterior of the automobile can compensate for blind areas and enhance safety. Display of a video that complements for a portion that cannot be seen makes it possible to confirm safety more naturally and comfortably.

Figure 84:
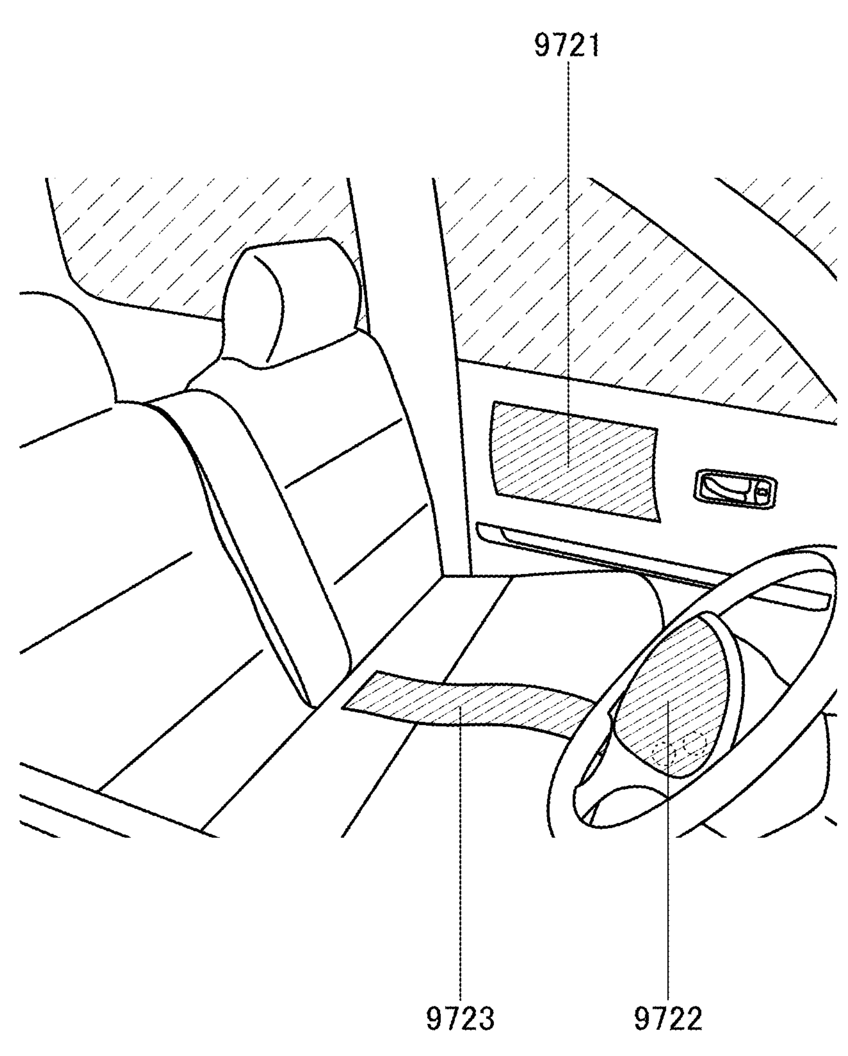
FIG. 84 is a diagram illustrating examples of electronic devices.

FIG. 84 illustrates the inside of an automobile in which a bench seat is used as a driver's seat and a front passenger's seat. A display portion 9721 is a display device provided in a door portion. For example, the display portion 9721 can compensate for the view hindered by the door by displaying a video taken by an imaging means provided on the car body. A display portion 9722 is a display device provided in a steering wheel. A display portion 9723 is a display device provided in the middle of a seating face of the bench seat.

The display portion 9714, the display portion 9715, and the display portion 9722 can provide a variety of kinds of information by displaying navigation information, speed, the number of engine revolutions, a mileage, the remaining amount of fuel, a gearshift state, air-condition setting, and the like. The content, layout, and the like of the display on the display portions can be changed freely by a user as appropriate. The above information can also be displayed on the display portion 9710 to the display portion 9713, the display portion 9721, and the display portion 9723. The display portion 9710 to the display portion 9715 and the display portion 9721 to the display portion 9723 can also be used as lighting devices.

The structure described in this embodiment can be used in an appropriate combination with any of the structures described in the other embodiments and examples.

EXAMPLE 1

In this example, evaluation results of Id-Vd characteristics of a Si transistor assumed by simulation and actually fabricated OS transistors will be described.

Figure 85A:
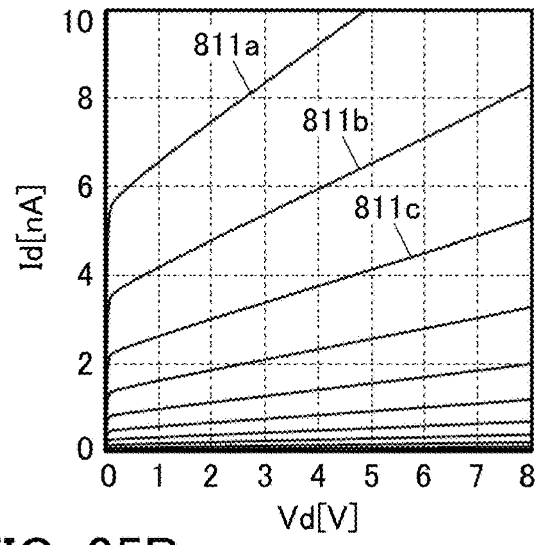
FIG. 85A to FIG. 85C are diagrams showing evaluation results of Id-Vd characteristics of transistors.
Figure 85A:
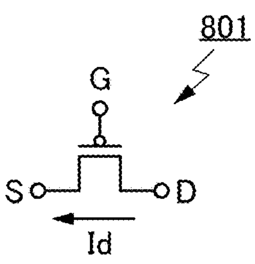
Figure 85B:
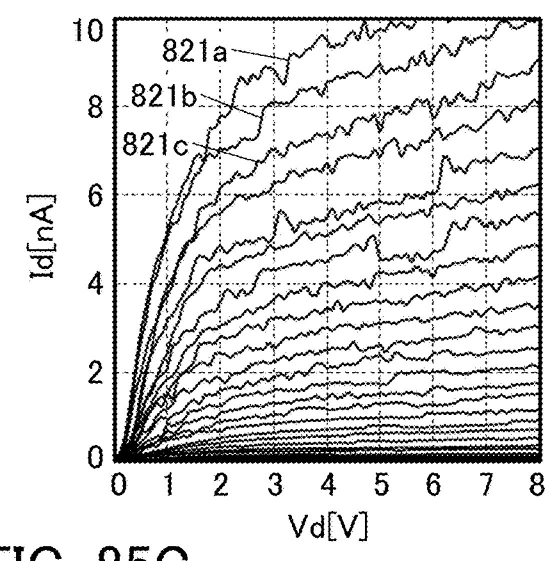
Figure 85B:
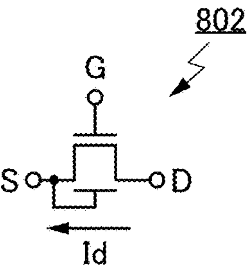
Figure 85C:
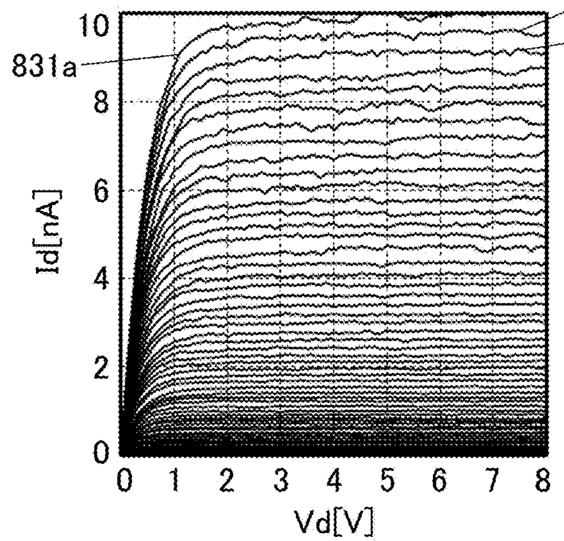
Figure 85C:
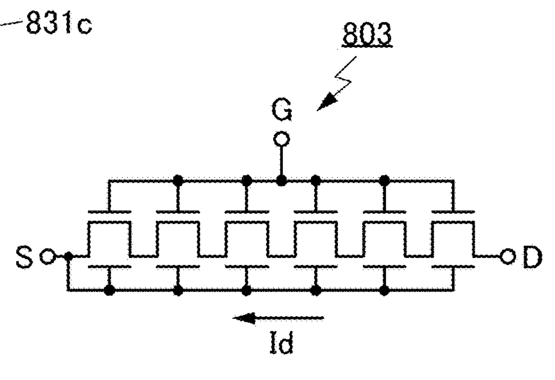

FIG. 85A, FIG. 85B, and FIG. 85C are graphs showing the evaluation results of the Id-Vd characteristics. In each of FIG. 85A, FIG. 85B, and FIG. 85C, the horizontal axis represents the absolute value of source-drain voltage (also referred to as "voltage Vd"), and the vertical axis represents the absolute value of source-drain current (also referred to as "current Id"). Each of FIG. 85A, FIG. 85B, and FIG. 85C shows a plurality of Id-Vd characteristics evaluated when source-gate voltage (also referred to as "voltage Vg") was changed in steps of 0.025 V.

FIG. 85A shows the calculation results of the Id-Vd characteristics of a Si transistor 801 assumed by simulation. The Si transistor 801 is a single-gate p-channel transistor with a channel length L of 1.5 μm and a channel width W of 1.4 μm. Note that SPICE was used as simulation software.

An Id-Vd curve 811*a* in FIG. 85A shows the Id-Vd characteristics at a voltage Vg of 0.775 V. An Id-Vd curve 811*b* shows the Id-Vd characteristics at a voltage Vg of 0.750 V. An Id-Vd curve 811*c* shows the Id-Vd characteristics at a voltage Vg of 0.725 V. Besides, FIG. 85A shows a plurality of calculation results of the Id-Vd characteristics obtained by changing the voltage Vg in steps of 0.025 V.

FIG. 85B shows the measurement results of the Id-Vd characteristics of an actually fabricated OS transistor 802. The OS transistor 802 is a single-gate n-channel transistor with a channel length L of 200 nm and a channel width W of 60 nm. The OS transistor 802 has a back gate electrically connected to a terminal functioning as a source of the OS transistor 802.

An Id-Vd curve 821*a* in FIG. 85B shows the Id-Vd characteristics at a voltage Vg of 0.925 V. An Id-Vd curve 821*b* shows the Id-Vd characteristics at a voltage Vg of 0.900 V. An Id-Vd curve 821*c* shows the Id-Vd characteristics at a voltage Vg of 0.875 V. Besides, FIG. 85B shows a plurality of measured Id-Vd characteristics obtained by changing the voltage Vg in steps of 0.025 V.

FIG. 85C shows the measurement results of the Id-Vd characteristics of an actually fabricated OS transistor 803. The OS transistor 803 is a multi-gate transistor in which six single-gate n-channel OS transistors each with a channel length L of 200 nm and a channel width W of 60 nm are connected in series and their gates are electrically connected to one another. The six transistors included in the OS transistor 803 each have a back gate. Each of the back gates is electrically connected to a terminal functioning as a source of the OS transistor 803.

An Id-Vd curve 831*a* in FIG. 85C shows the Id-Vd characteristics at a voltage Vg of 2.125 V. An Id-Vd curve 831*b* shows the Id-Vd characteristics at a voltage Vg of 2.100 V. An Id-Vd curve 831*c* shows the Id-Vd characteristics at a voltage Vg of 2.075 V. Besides, FIG. 85C shows a plurality of measured Id-Vd characteristics obtained by changing the voltage Vg in steps of 0.025 V.

It is found from FIG. 85A and FIG. 85B that the OS transistor 802 has more noise components than the Si transistor 801 but the current Id of both the transistors can be controlled with the voltage Vg. On the other hand, the current Id of both the transistors is easily influenced by a voltage Vd change and thus excellent saturation characteristics are not obtained.

FIG. 85C reveals that the OS transistor 803 that is the multi-gate transistor has a smaller current Id change depending on the voltage Vd change than the Si transistor 801 and the OS transistor 802. That is, the OS transistor 803 that is the multi-gate transistor has better saturation characteristics than the Si transistor 801 and the OS transistor 802.

In addition, the OS transistor 803 has fewer noise components than the OS transistor 802 and thus enables more accurate control of the current Id with the voltage Vg. For example, with the use of the OS transistor 803 as the transistor M2 described in the above embodiments, the emission luminance of the light-emitting element 61 can be controlled more precisely.

As the transistor M2, a single-gate transistor such as the Si transistor 801 or the OS transistor 802 may be used, but a multi-gate transistor such as the OS transistor 803 is preferably used. The number of transistors (connected in series) in the multi-gate transistor is preferably more than or equal to 2, further preferably more than or equal to 4, still further preferably more than or equal to 6.

EXAMPLE 2

In this example, evaluation results of the source-drain breakdown voltage of an actually fabricated OS transistor will be described.

Figure 86:
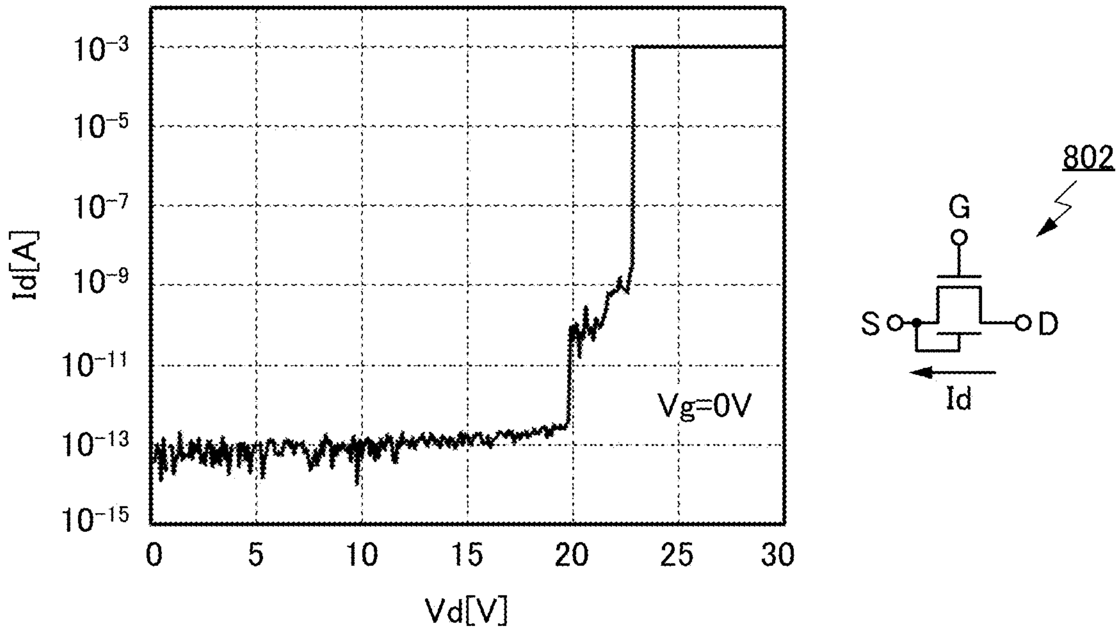
FIG. 86 is a diagram showing evaluation results of the breakdown voltage of a transistor.

FIG. 86 is a graph showing the evaluation results of the breakdown voltage of the actually fabricated OS transistor 802. As described in the above example, the OS transistor 802 is the single-gate n-channel transistor with a channel length L of 200 nm and a channel width W of 60 nm. The OS transistor 802 has the back gate electrically connected to the terminal functioning as the source of the OS transistor 802.

In FIG. 86, the horizontal axis represents the voltage Vd and the vertical axis represents the current Id. FIG. 86 shows a current Id change when the voltage Vg was set to 0 V and the voltage Vd was changed from 0 V to 30 V. That is, a current Id change depending on the voltage Vd at the time when the OS transistor 802 is in an off state is shown.

FIG. 86 shows that dielectric breakdown occurs at a voltage Vd of approximately 20 V in the OS transistor 802. In addition, it is found that even when the voltage Vd increases, the current Id hardly increases until the dielectric breakdown occurs. This indicates that the OS transistor has a small increase in its off-state current even when the voltage Vd increases, and demonstrates that the OS transistor has a high source-drain breakdown voltage.

For example, it is preferable to use the OS transistor as one or both of the transistor M2 and the transistor M5 described in the above embodiments. With the use of the OS transistor, the operation of the semiconductor device can be stable even when the potential difference between the potential Va and the potential Vc described in the above embodiment is large, so that the semiconductor device can have high reliability.

REFERENCE NUMERALS

10: display device, 23: CPU, 24: GPU, 25: memory circuit portion, 29: input/output terminal portion, 40: layer, 50: layer, 51: pixel circuit, 60: layer, 61: light-emitting element, 100: semiconductor device, 101: wiring, 102:

wiring, 103: wiring, 104: wiring, 105: wiring, 171: conductive layer, 172: EL layer, 173: conductive layer, 230: pixel

The invention claimed is:

1. A semiconductor device comprising first and second transistors, first to fifth switches, first to third capacitors, and a display element, wherein the first transistor comprises a back gate, wherein a gate of the first transistor is electrically connected to the first switch, wherein the second switch and the first capacitor are provided between the gate and a source of the first transistor, wherein the back gate of the first transistor is electrically connected to the third switch, wherein the second capacitor is provided between the back gate and the source of the first transistor, wherein the source of the first transistor is electrically connected to the fourth switch and a drain of the second transistor, wherein a gate of the second transistor is electrically connected to the fifth switch, wherein the third capacitor is provided between the gate and a source of the second transistor, wherein the source of the second transistor is electrically connected to one terminal of the display element, and wherein one of a source and a drain of the third switch is supplied with a same potential as one of a source and a drain of the fifth switch.

2. The semiconductor device according to claim 1, wherein the first switch is configured to select whether to establish electrical continuity between a first wiring and the gate of the first transistor, wherein the second switch is configured to select whether to establish electrical continuity between the gate and the source of the first transistor, wherein the third switch is configured to select whether to establish electrical continuity between a second wiring and the back gate of the first transistor, wherein the fourth switch is configured to select whether to establish electrical continuity between a third wiring and the source of the first transistor, and wherein the fifth switch is configured to select whether to establish electrical continuity between the second wiring and the gate of the second transistor.

3. The semiconductor device according to claim 1, wherein the first to fifth switches are transistors.

4. The semiconductor device according to claim 1, wherein the fourth switch and the fifth switch are p-channel transistors.

5. The semiconductor device according to claim 1, wherein the fourth switch and the fifth switch are transistors each comprising silicon in a semiconductor layer where a channel is formed.

6. The semiconductor device according to claim 1, wherein the first transistor and the second transistor each comprise an oxide semiconductor in a semiconductor layer where a channel is formed.

7. The semiconductor device according to claim 6, wherein the oxide semiconductor comprises at least one of indium and zinc.

8. The semiconductor device according to claim 1, wherein the display element is an organic electroluminescence element with a tandem structure.

9. A semiconductor device comprising first and second transistors, first to sixth switches, first to third capacitors, and a display element, wherein the first transistor comprises a back gate, wherein a gate of the first transistor is electrically connected to the first switch, wherein the second switch and the first capacitor are provided between the gate and a source of the first transistor, wherein the back gate of the first transistor is electrically connected to the third switch, wherein the second capacitor is provided between the back gate and the source of the first transistor, wherein the source of the first transistor is electrically connected to the fourth switch and a drain of the second transistor, wherein a gate of the second transistor is electrically connected to the fifth switch and the sixth switch, wherein the third capacitor is provided between the gate and a source of the second transistor, wherein the source of the second transistor is electrically connected to the display element, and wherein one of a source and a drain of the third switch is supplied with a same potential as one of a source and a drain of the fifth switch.

10. The semiconductor device according to claim 9, wherein the first switch is configured to select whether to establish electrical continuity between a first wiring and the gate of the first transistor, wherein the second switch is configured to select whether to establish electrical continuity between the gate and the source of the first transistor, wherein the third switch is configured to select whether to establish electrical continuity between a second wiring and the back gate of the first transistor, wherein the fourth switch is configured to select whether to establish electrical continuity between a third wiring and the source of the first transistor, wherein the fifth switch is configured to select whether to establish electrical continuity between the second wiring and the gate of the second transistor, and wherein the sixth switch is configured to select whether to establish electrical continuity between the third wiring and the gate of the second transistor.

11. The semiconductor device according to claim 9, wherein the first capacitor is configured to retain a potential difference between the gate and the source of the first transistor, wherein the second capacitor is configured to retain a potential difference between the back gate and the source of the first transistor, and wherein the third capacitor is configured to retain a potential difference between the gate and the source of the second transistor.

12. The semiconductor device according to claim 9, wherein a semiconductor where a channel of the first transistor is formed comprises an oxide semiconductor.

13. The semiconductor device according to claim 12, wherein the oxide semiconductor comprises at least one of indium and zinc.

14. The semiconductor device according to claim 9, wherein a semiconductor where a channel of the second transistor is formed comprises an oxide semiconductor.

15. The semiconductor device according to claim 14, wherein the oxide semiconductor comprises at least one of indium and zinc.

16. The semiconductor device according to claim 9, wherein the display element is an organic electroluminescence element with a tandem structure.

* * * * *